US010903222B2

(12) United States Patent
Sakakibara et al.

(10) Patent No.: US 10,903,222 B2
(45) Date of Patent: Jan. 26, 2021

(54) THREE-DIMENSIONAL MEMORY DEVICE CONTAINING A CARBON-DOPED SOURCE CONTACT LAYER AND METHODS FOR MAKING THE SAME

(71) Applicant: SANDISK TECHNOLOGIES LLC, Addison, TX (US)

(72) Inventors: Kiyohiko Sakakibara, Yokkaichi (JP); Masaaki Higashitani, Cupertino, CA (US); Masanori Tsutsumi, Yokkaichi (JP); Zhixin Cui, Nagoya (JP)

(73) Assignee: SANDISK TECHNOLOGIES LLC, Addison, TX (US)

( * ) Notice: Subject to any disclaimer, the term of this patent is extended or adjusted under 35 U.S.C. 154(b) by 0 days.

(21) Appl. No.: 16/408,722

(22) Filed: May 10, 2019

(65) Prior Publication Data
US 2020/0251479 A1 Aug. 6, 2020

Related U.S. Application Data

(63) Continuation-in-part of application No. 16/268,183, filed on Feb. 5, 2019, now Pat. No. 10,748,925.

(51) Int. Cl.
*H01L 27/1157* (2017.01)
*H01L 27/11524* (2017.01)
(Continued)

(52) U.S. Cl.
CPC .... *H01L 27/1157* (2013.01); *H01L 21/28525* (2013.01); *H01L 21/76816* (2013.01);
(Continued)

(58) Field of Classification Search
CPC ........... H01L 27/1157; H01L 27/11524; H01L 27/11556; H01L 27/11582
See application file for complete search history.

(56) References Cited

U.S. PATENT DOCUMENTS 5,915,167 A 6/1999 Leedy
8,569,827 B2 * 10/2013 Lee .................... H01L 27/11582
257/324
(Continued)

OTHER PUBLICATIONS

Notification of Transmittal of the International Search Report and Written Opinion of the International Search Authority or International Patent Application No. PCT/US2019/063106, dated Mar. 25, 2020, 11 pages.
(Continued)

*Primary Examiner* — Quoc D Hoang
(74) *Attorney, Agent, or Firm* — The Marbury Law Group PLLC

(57) ABSTRACT

A three-dimensional memory device includes source-level material layers located over a substrate and including a lower semiconductor layer, a source contact layer, and an upper semiconductor layer. The lower semiconductor layer includes a first boron-doped semiconductor material, the upper semiconductor layer includes carbon doped second boron-doped semiconductor material, and the source contact layer includes a boron-doped semiconductor material. An alternating stack of insulating layers and electrically conductive layers is located over the source-level material layers. Memory stack structures vertically extend through the alternating stack, the upper semiconductor layer, and the source contact layer. Each of the memory stack structures includes a respective memory film and a respective vertical semiconductor channel that contacts the source contact layer. Carbon atoms in the upper semiconductor layer and optionally the lower semiconductor layer suppress diffusion of boron atoms into the vertical semiconductor channel.

16 Claims, 131 Drawing Sheets

(51) Int. Cl.

| | | |
|---|---|---|
| *H01L 27/11556* | (2017.01) | |
| *H01L 27/11582* | (2017.01) | |
| *H01L 23/535* | (2006.01) | |
| *H01L 21/285* | (2006.01) | |
| *H01L 23/528* | (2006.01) | |
| *H01L 23/532* | (2006.01) | |
| *H01L 21/768* | (2006.01) | |
| *H01L 23/522* | (2006.01) | |

(52) U.S. Cl.
CPC .. *H01L 21/76877* (2013.01); *H01L 21/76895* (2013.01); *H01L 23/5226* (2013.01); *H01L 23/5283* (2013.01); *H01L 23/535* (2013.01); *H01L 23/53271* (2013.01); *H01L 27/11524* (2013.01); *H01L 27/11556* (2013.01); *H01L 27/11582* (2013.01)

(56) References Cited

U.S. PATENT DOCUMENTS

| | | |
|---|---|---|
| 9,647,123 B1 | 5/2017 | Balakrishnan et al. |
| 9,659,956 B1 | 5/2017 | Pachamuthu et al. |
| 9,679,906 B2 | 6/2017 | Lu et al. |
| 9,754,958 B2 | 9/2017 | Pachamuthu et al. |
| 9,799,670 B2 | 10/2017 | Nishikawa et al. |
| 9,824,966 B1 | 11/2017 | Kanakamedala et al. |
| 9,831,266 B2 | 11/2017 | Kai et al. |
| 9,842,851 B2 | 12/2017 | Pachamuthu et al. |
| 9,917,100 B2 | 3/2018 | Zhang et al. |
| 10,074,666 B2 | 9/2018 | Ge et al. |
| 10,103,169 B1 | 10/2018 | Ge et al. |
| 10,115,681 B1 | 10/2018 | Ariyoshi |
| 10,115,730 B1 | 10/2018 | Baraskar et al. |
| 10,199,359 B1 | 2/2019 | Sakakibara et al. |
| 2016/0071860 A1 | 3/2016 | Kai et al. |
| 2016/0071876 A1 | 3/2016 | Mizuno et al. |
| 2017/0047334 A1 | 2/2017 | Lu et al. |
| 2017/0062456 A1 | 3/2017 | Sugino et al. |
| 2017/0125437 A1 | 5/2017 | Pachamuthu et al. |
| 2017/0125438 A1 | 5/2017 | Pachamuthu et al. |
| 2017/0148800 A1 | 5/2017 | Nishikawa et al. |
| 2017/0148810 A1 | 5/2017 | Kai et al. |
| 2017/0148811 A1 | 5/2017 | Zhang et al. |
| 2018/0122904 A1 | 5/2018 | Matsumoto et al. |
| 2018/0122905 A1 | 5/2018 | Ogawa et al. |
| 2018/0122906 A1 | 5/2018 | Yu et al. |
| 2018/0197876 A1 | 7/2018 | Ge et al. |
| 2018/0366486 A1 | 12/2018 | Hada et al. |
| 2018/0374866 A1 | 12/2018 | Makala et al. |
| 2019/0088589 A1 | 3/2019 | Zhu et al. |

OTHER PUBLICATIONS

USPTO Office Communication, Non-Final Office Action, for U.S. Appl. No. 16/268,132, dated Jun. 25, 2020, 12 pages.

Tsutsumi, M. et al., "Three-Dimensional Memory Device Containing Channels with Laterally Pegged Dielectric Cores and Methods for Making the Same," U.S. Appl. No. 16/268,183, filed Feb. 5, 2019.

USPTO Office Communication, Notice of Allowance and Fee(s) Due, for U.S. Appl. No. 16/268,183, dated Jun. 15, 2020, 16 pages.

R. Delhougne, et al., "First demonstration of monocrystalline silicon macaroni channel for 3-D NAND memory devices", Proceedings of 2018 Symposium on VLSI Technology, pp. 203-204, Jun. 18 to 22, 2018, Honolulu, HI.

Endoh et al., titled "Novel Ultra High Density Memory With a Stacked-Surrounding Gate Transistor (S-SGT) Structured Cell", IEDM Proc. (2001) 33-36.

U.S. Appl. No. 15/715,629, filed Sep. 26, 2017, SanDisk Technologies LLC.

U.S. Appl. No. 15/840,090, filed Dec. 13, 2017, SanDisk Technologies LLC.

U.S. Appl. No. 15/888,714, filed Feb. 5, 2018, SanDisk Technologies LLC.

U.S. Appl. No. 15/950,356, filed Apr. 11, 2018, SanDisk Technologies LLC.

U.S. Appl. No. 15/997,194, filed Jun. 4, 2018, SanDisk Technologies LLC.

U.S. Appl. No. 16/023,035, filed Jun. 29, 2018, SanDisk Technologies LLC.

U.S. Appl. No. 16/196,026, filed Nov. 20, 2018, SanDisk Technologies LLC.

U.S. Appl. No. 16/200,115, filed Nov. 26, 2018, SanDisk Technologies LLC.

U.S. Appl. No. 16/268,132, filed Feb. 5, 2019, SanDisk Technologies LLC.

\* cited by examiner

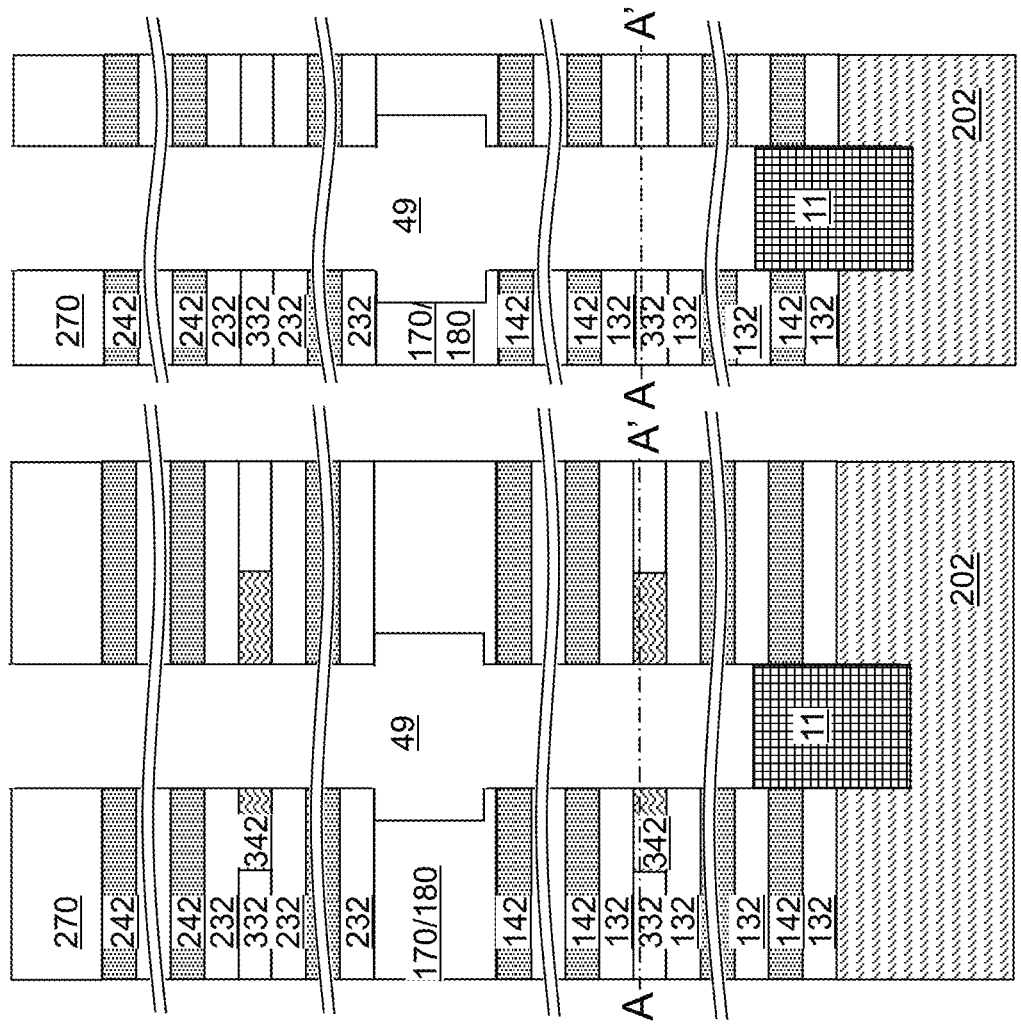
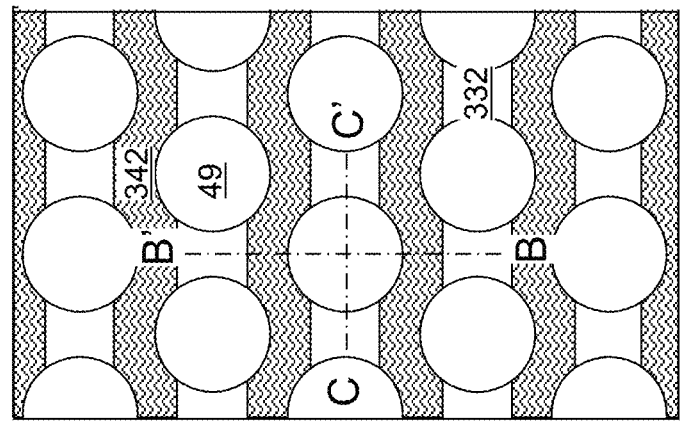
FIG. 9C  FIG. 9B  FIG. 9A

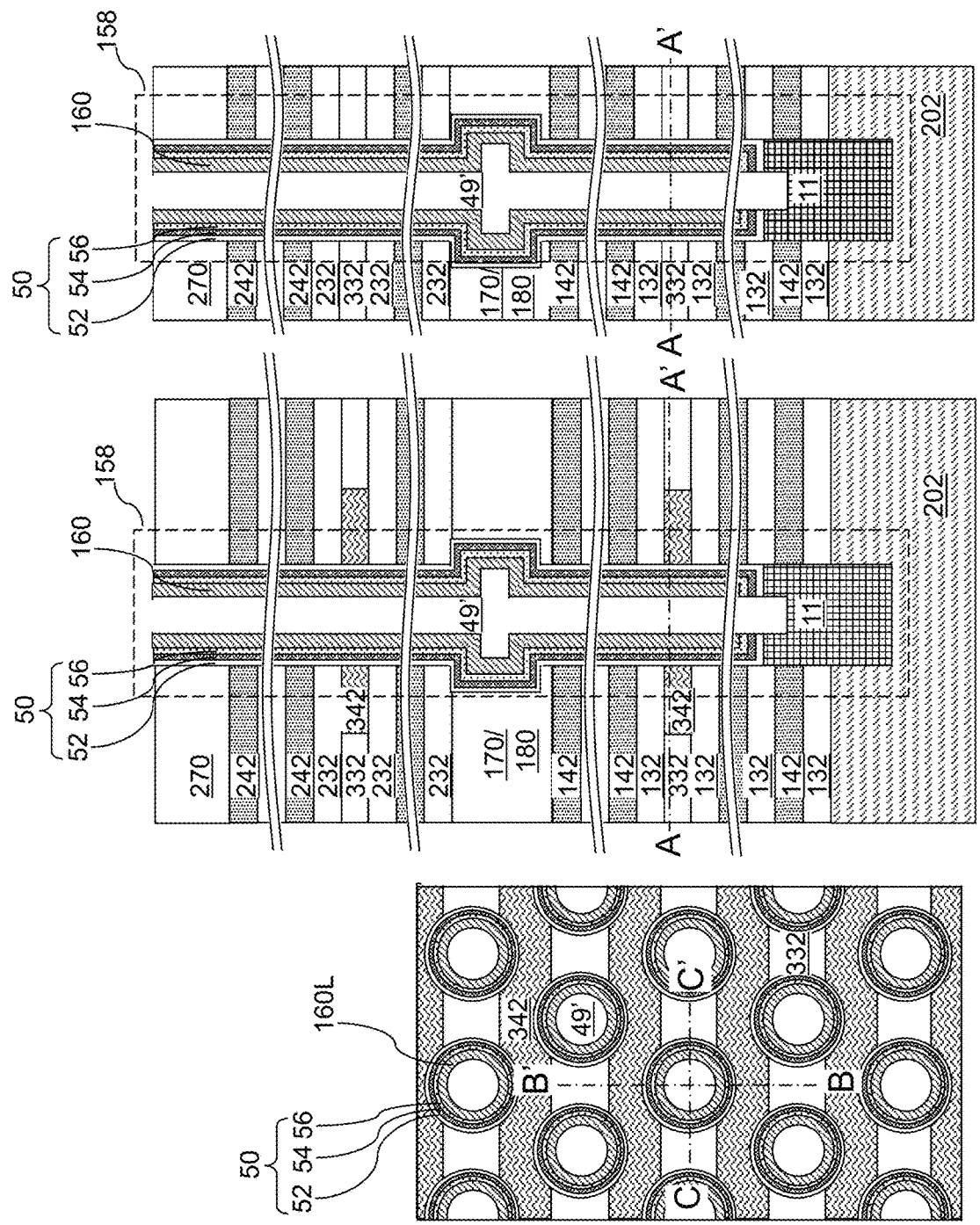

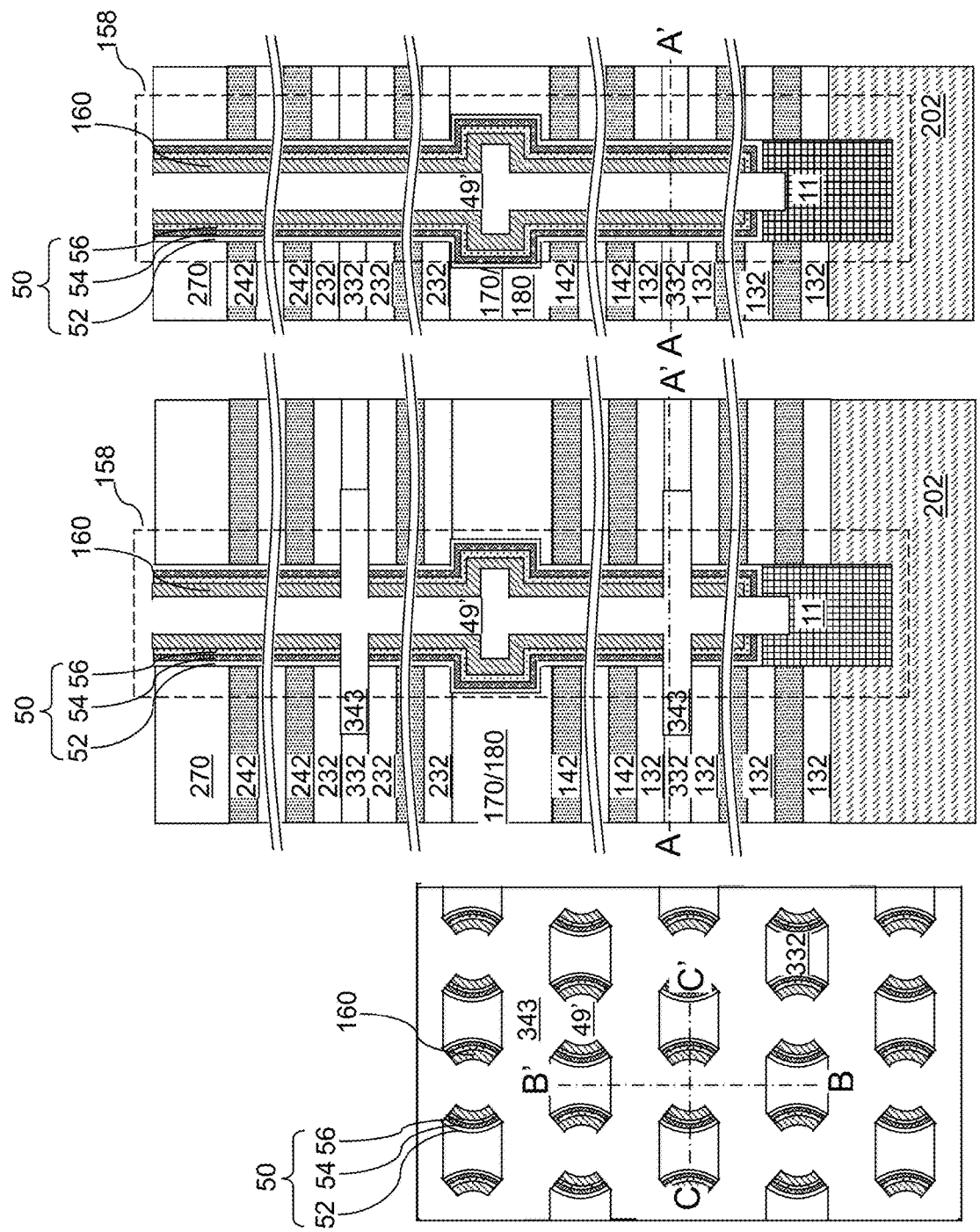

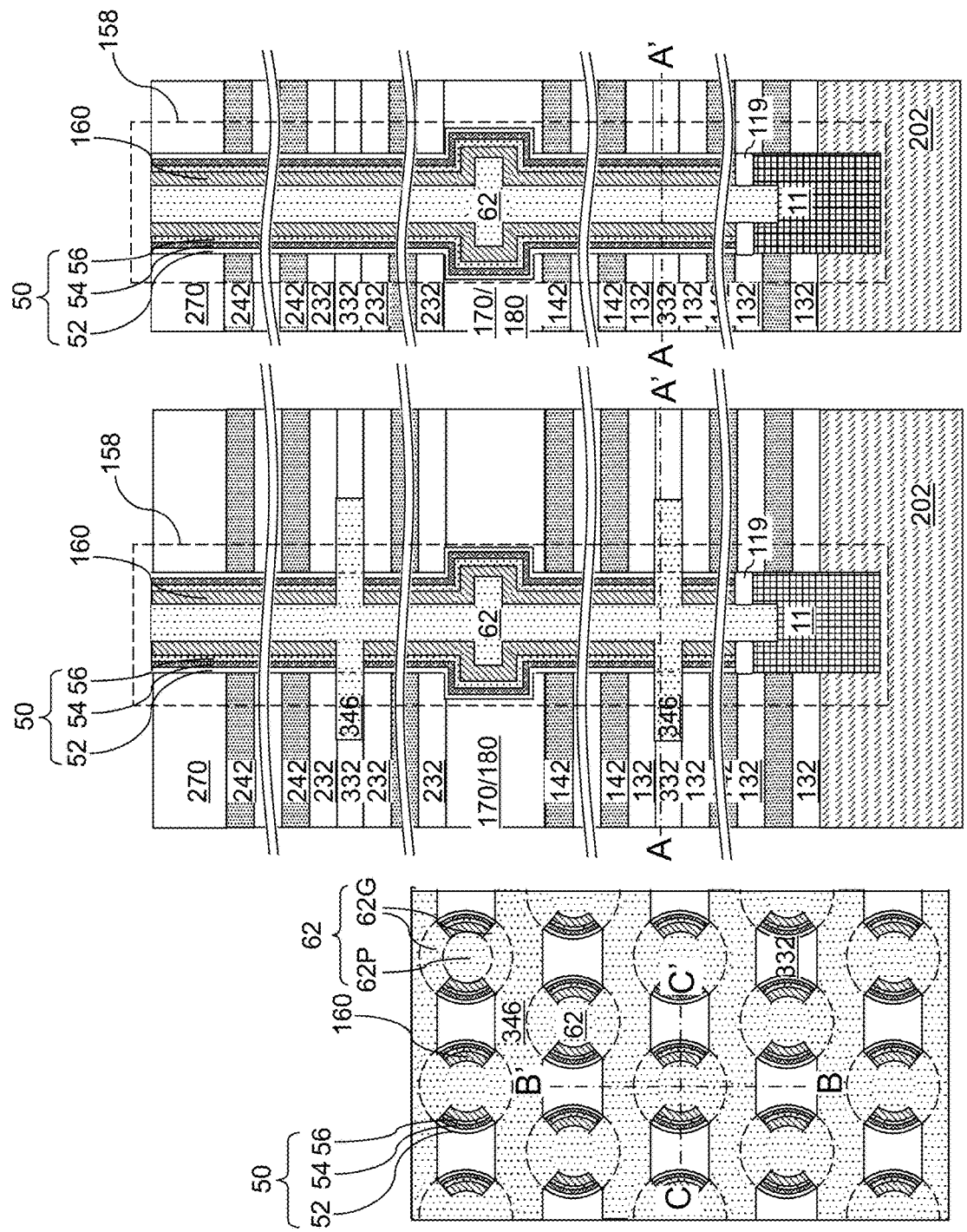

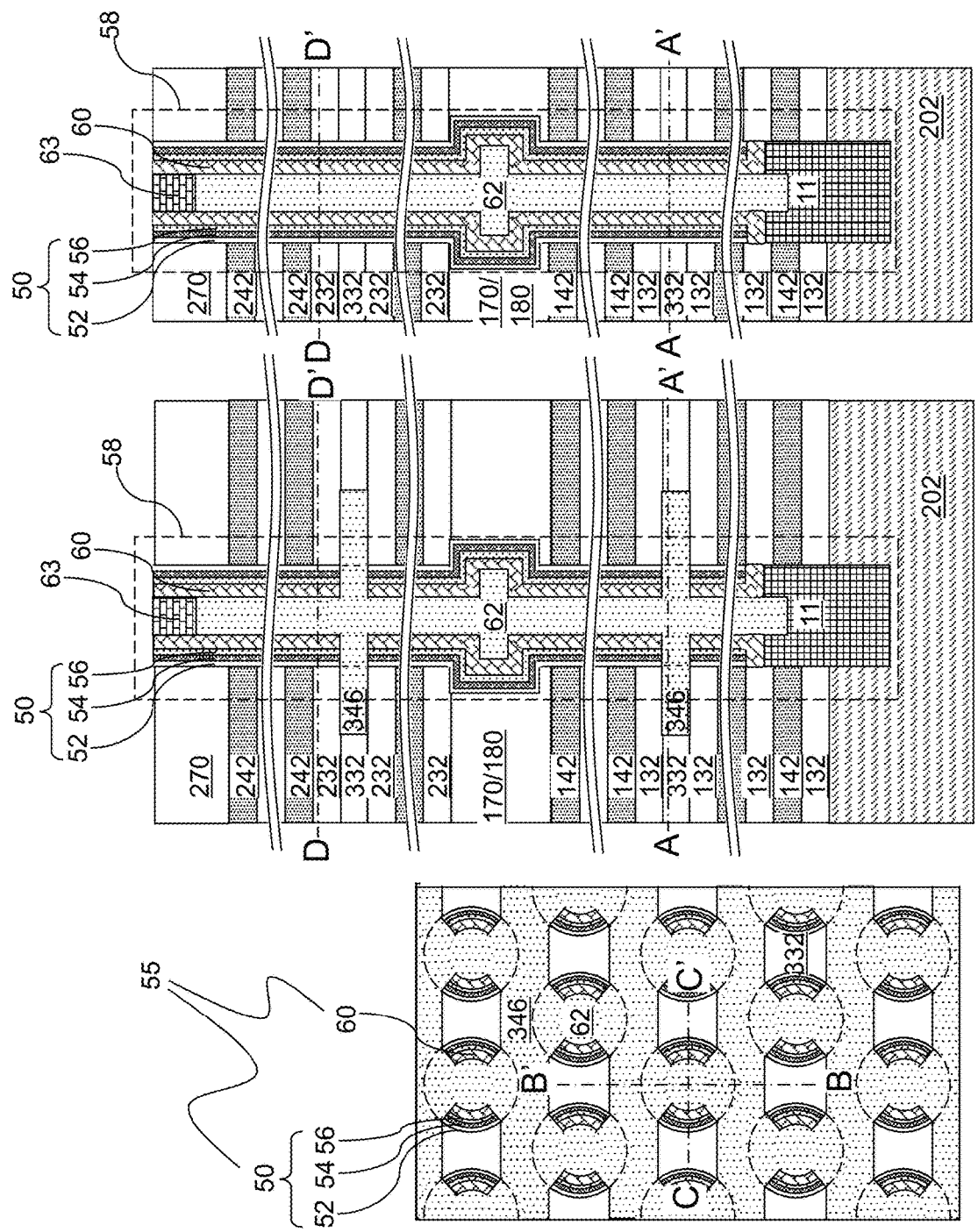

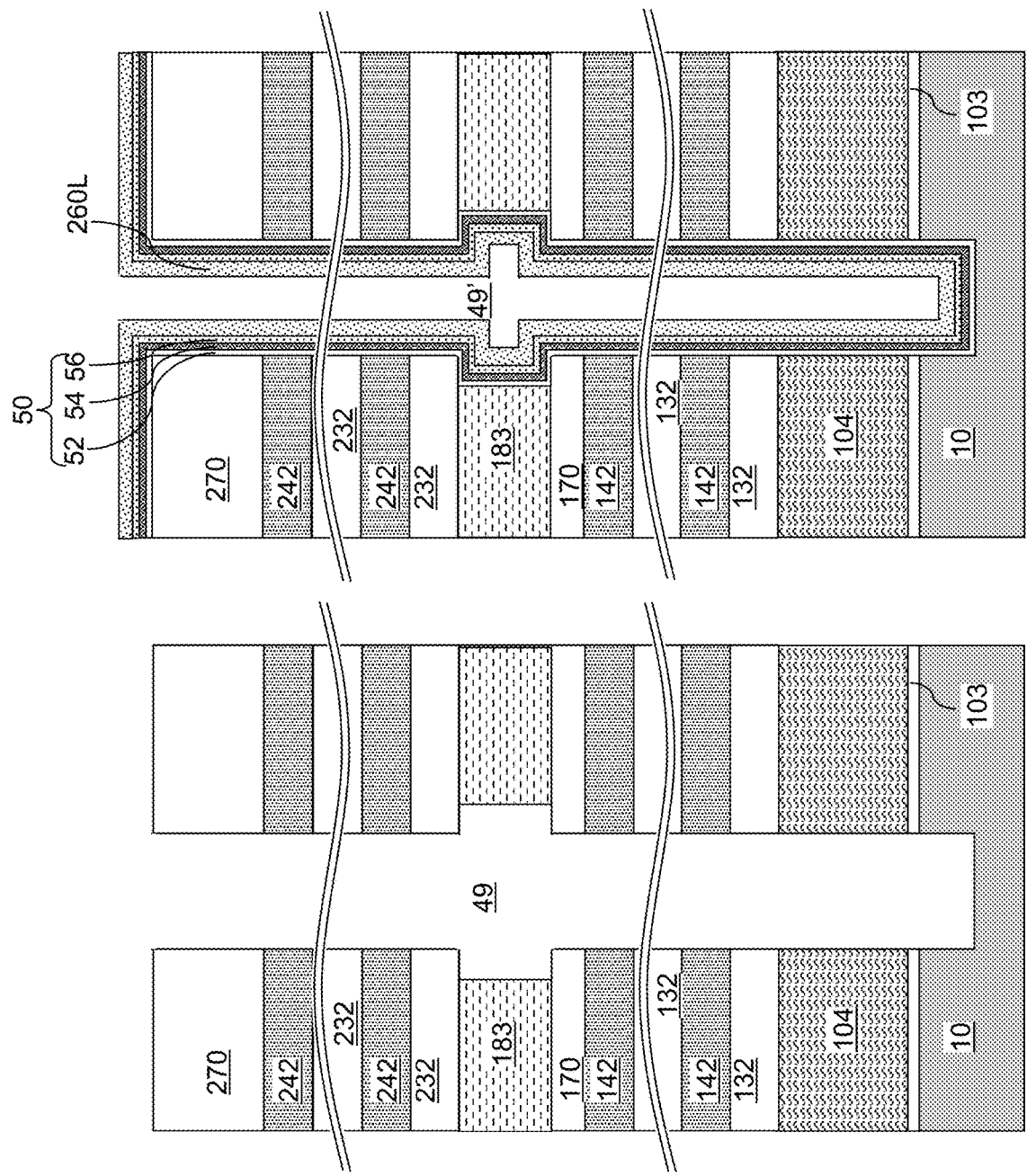

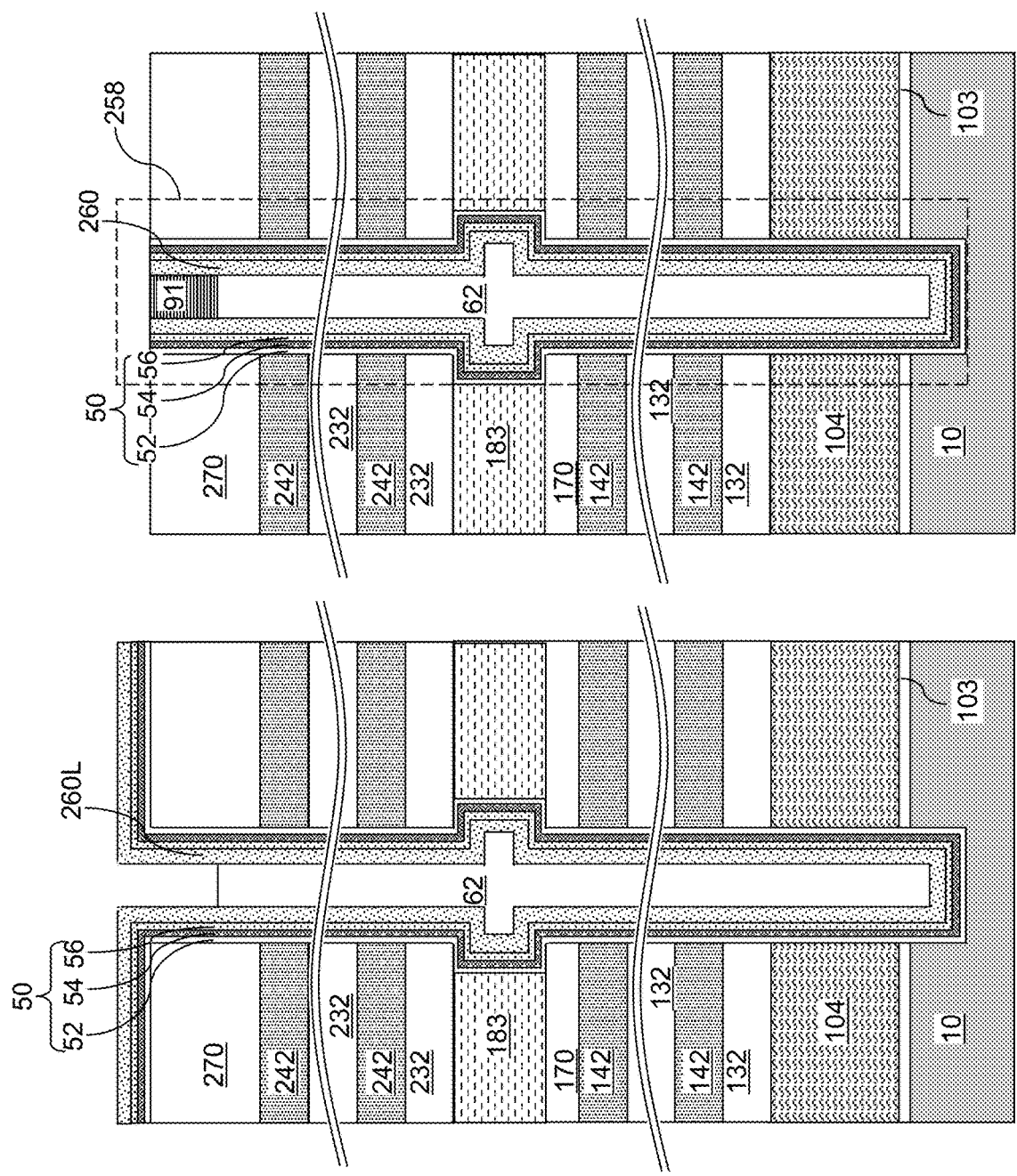

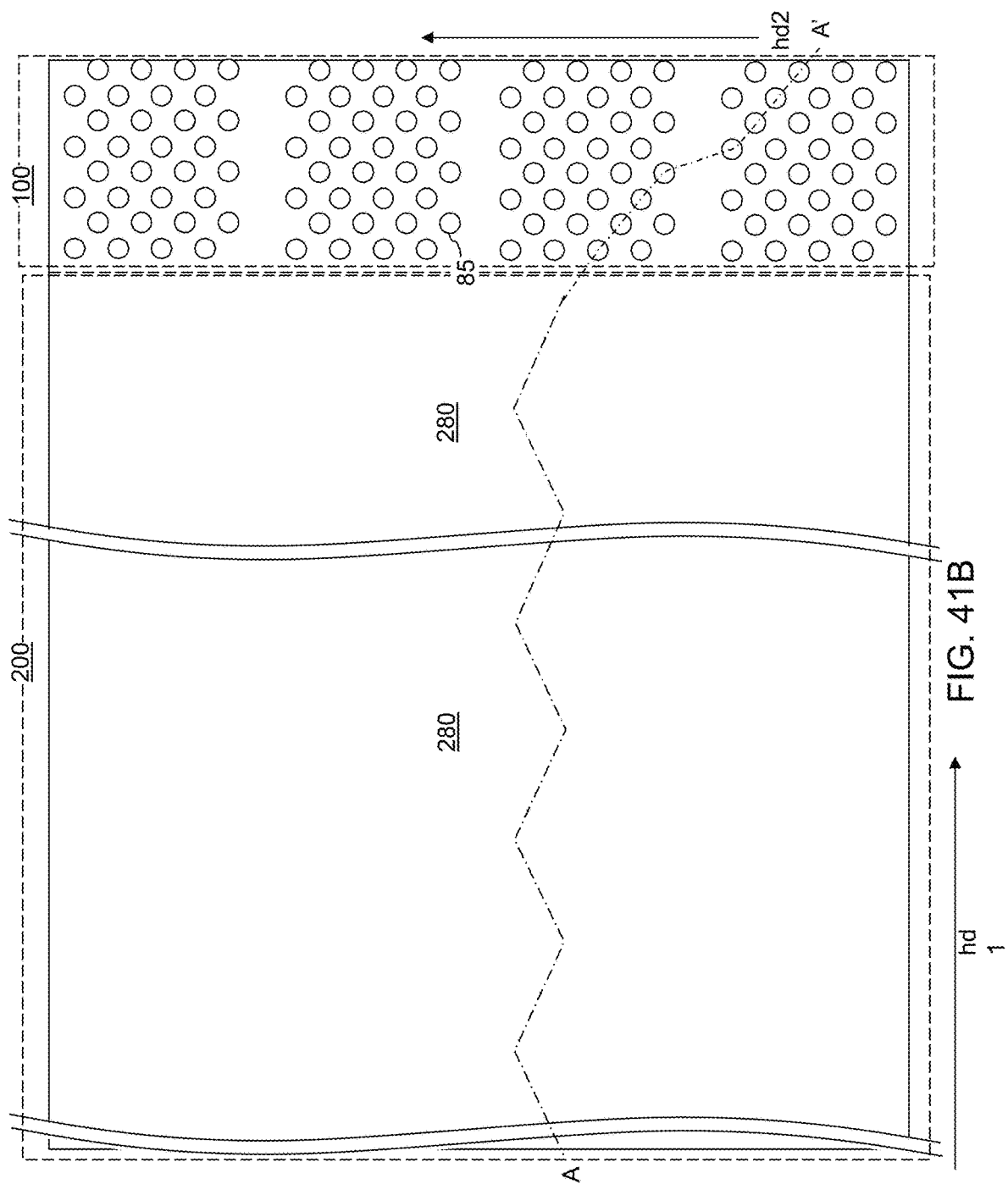

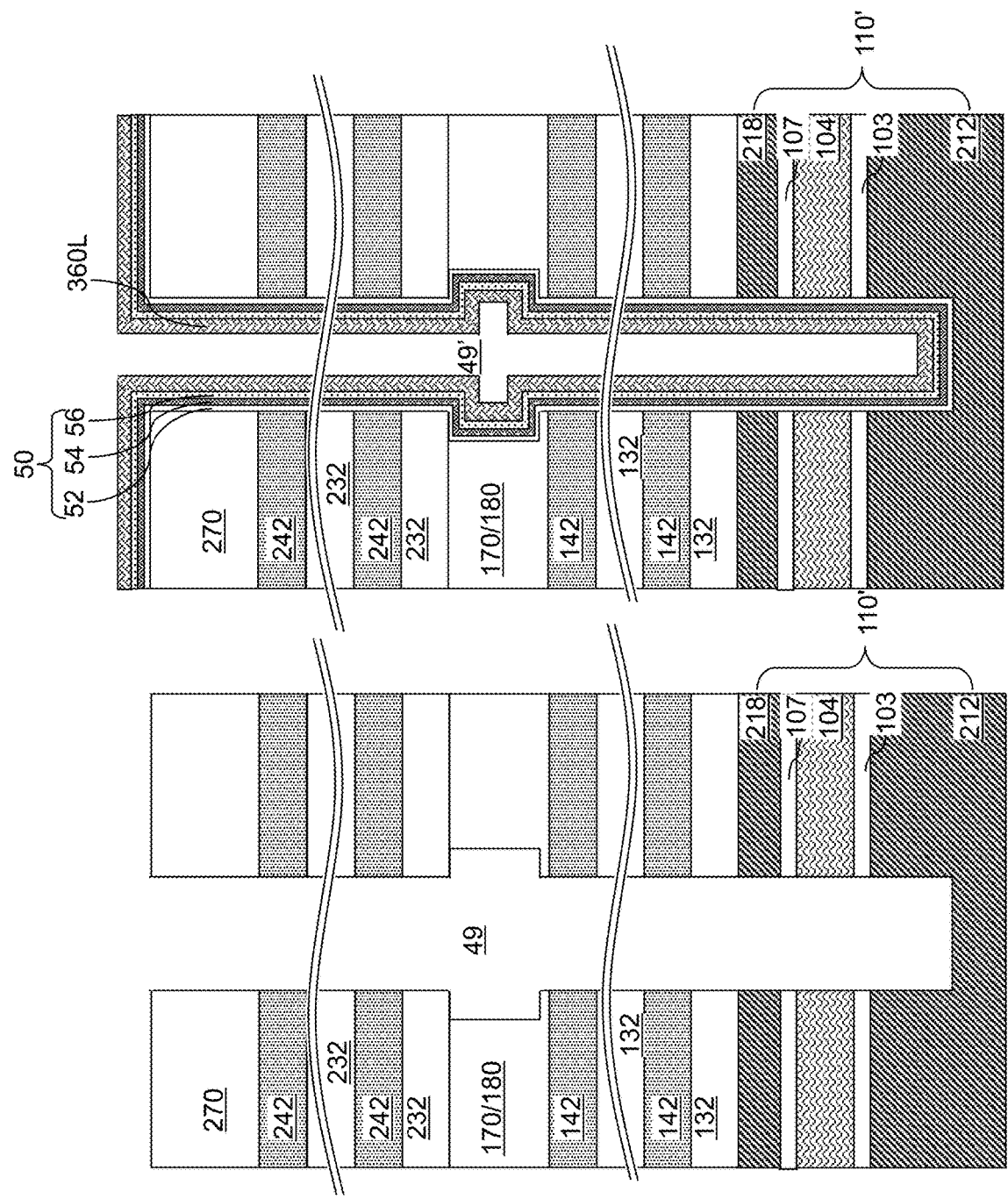

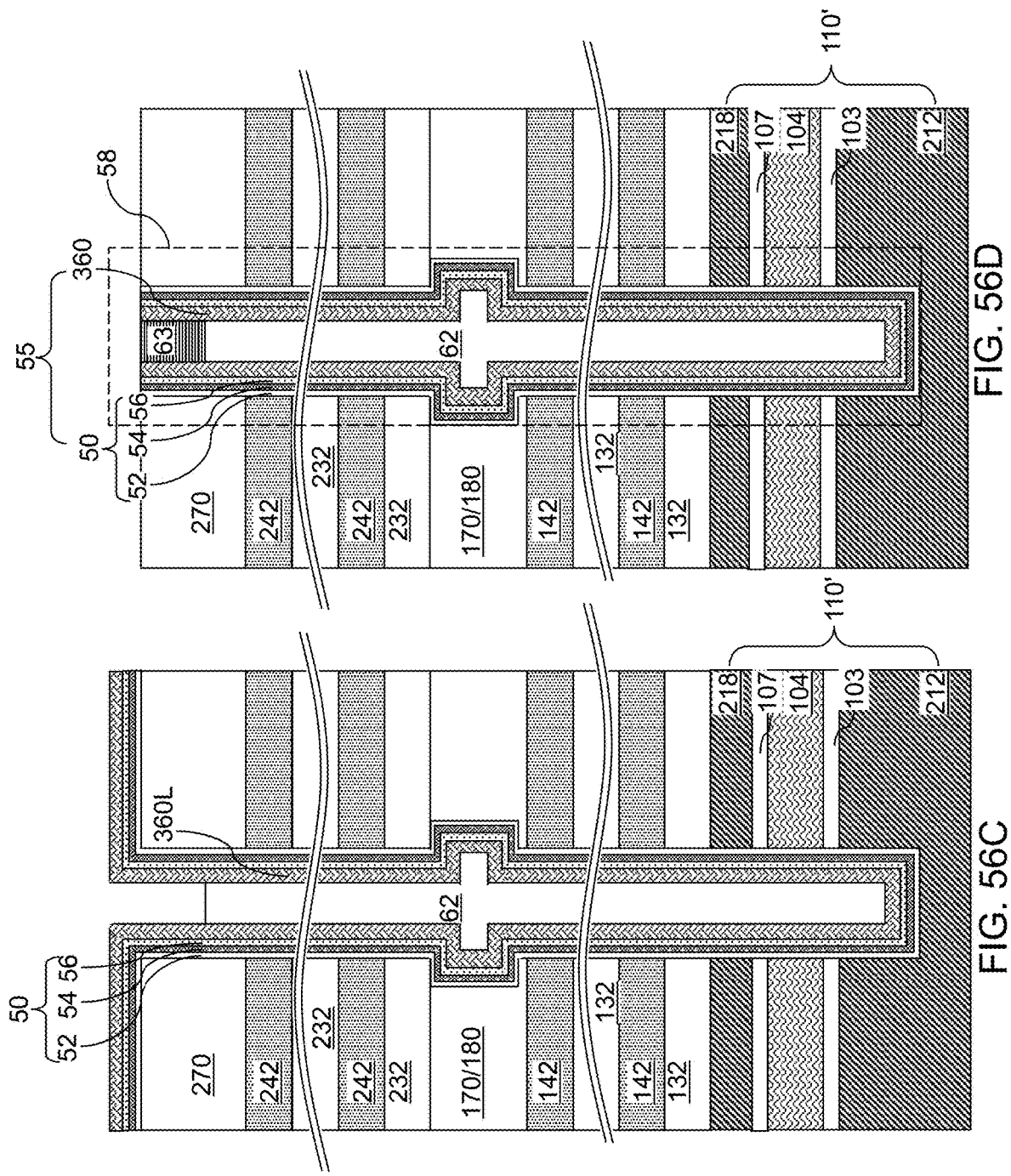

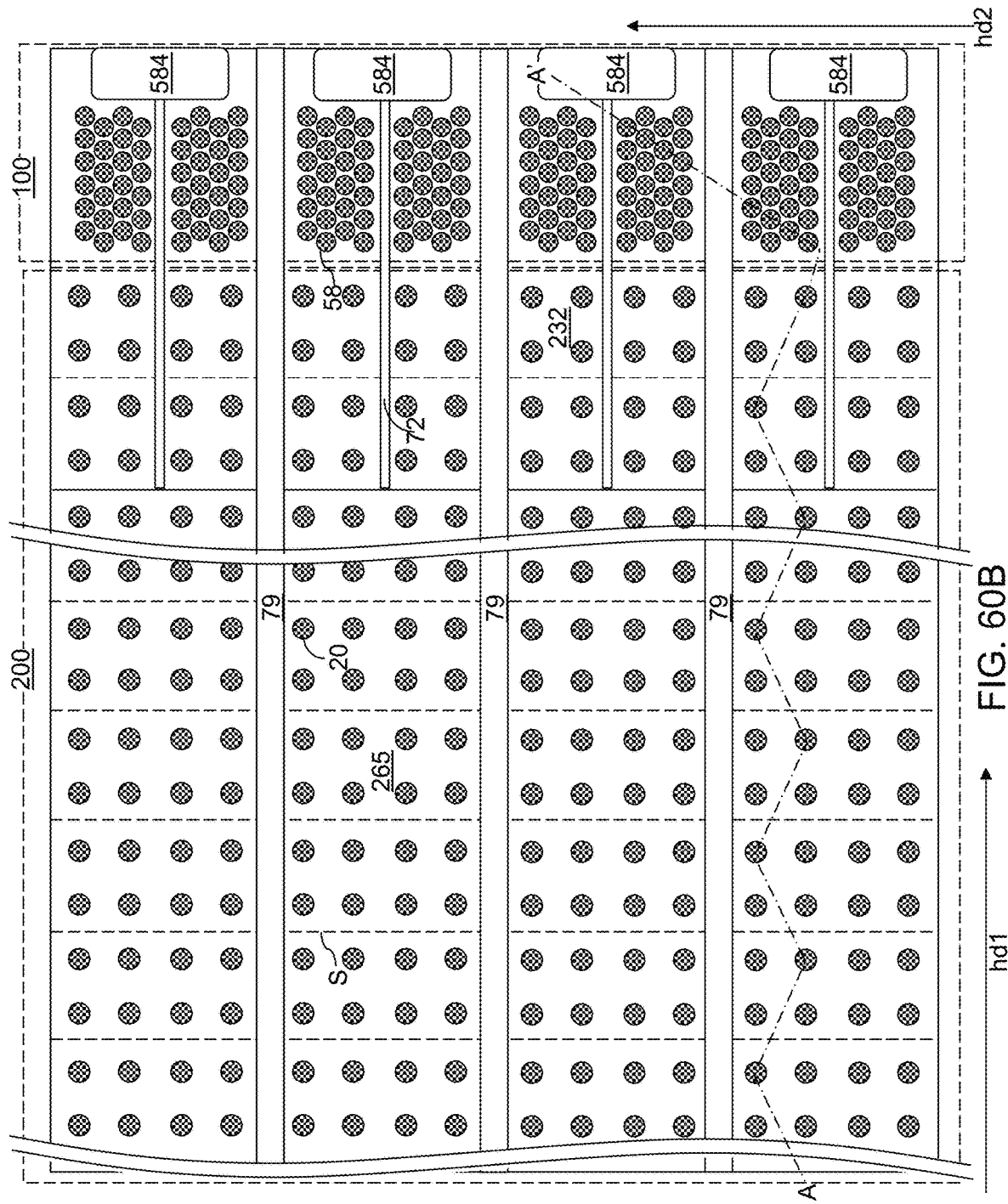

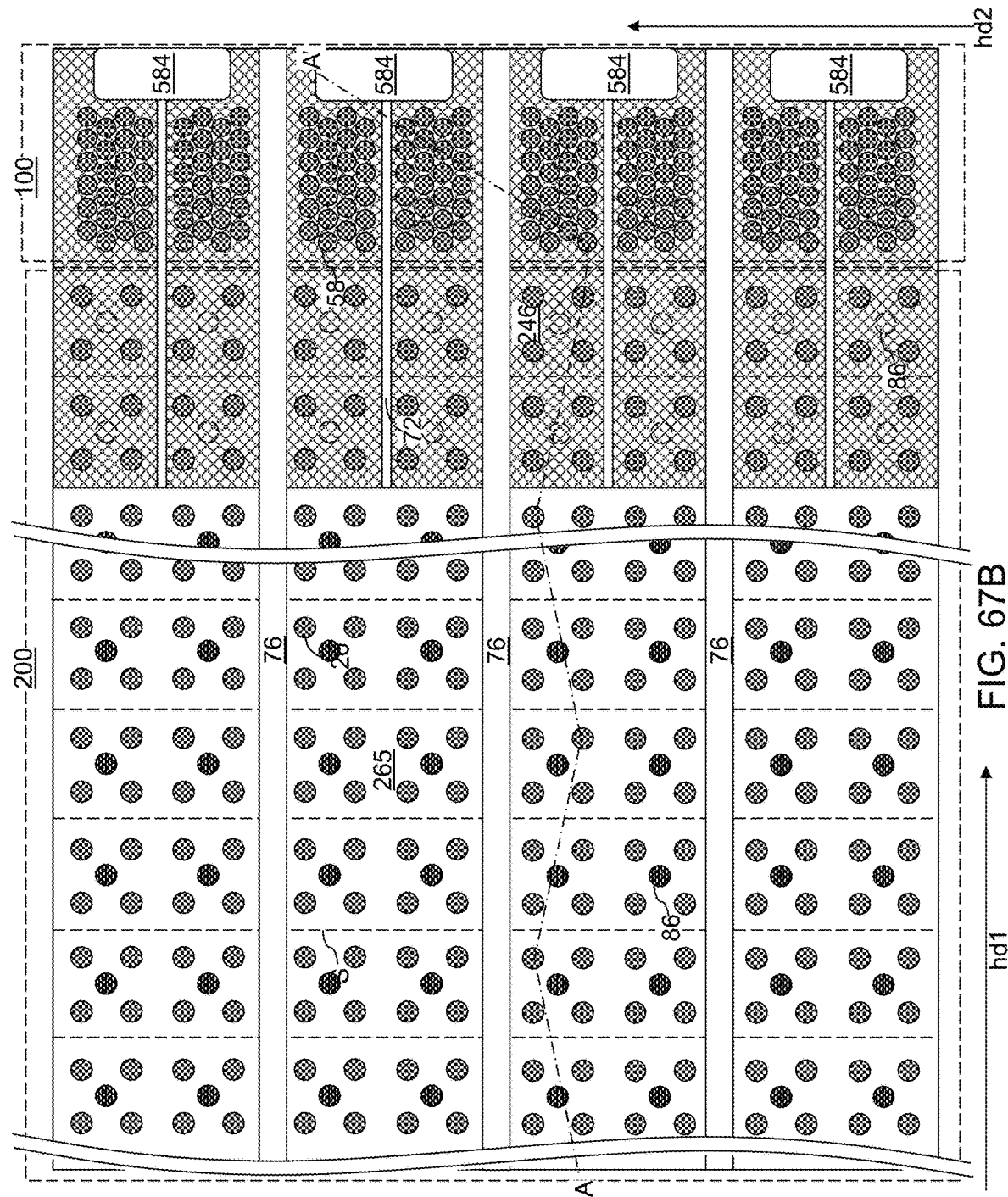

THREE-DIMENSIONAL MEMORY DEVICE CONTAINING A CARBON-DOPED SOURCE CONTACT LAYER AND METHODS FOR MAKING THE SAME

RELATED APPLICATIONS

The instant application is a continuation-in-part application of U.S. patent application Ser. No. 16/268,183 filed on Feb. 5, 2019, the entire contents of which are incorporated herein by reference.

FIELD

The present disclosure relates generally to the field of semiconductor devices, and in particular to a three-dimensional memory device including a carbon-doped source contact layer and methods of manufacturing the same.

BACKGROUND

A three-dimensional memory device including three-dimensional vertical NAND strings having one bit per cell are disclosed in an article by T. Endoh et al., titled "Novel Ultra High Density Memory With A Stacked-Surrounding Gate Transistor (S-SGT) Structured Cell", IEDM Proc. (2001) 33-36.

SUMMARY

According to an aspect of the present disclosure, a three-dimensional memory device is provided, which comprises: source-level material layers located over a substrate and comprising a lower semiconductor layer, a source contact layer, and an upper semiconductor layer, wherein the lower semiconductor layer comprises a first boron-doped semiconductor material, the upper semiconductor layer comprises a carbon doped second boron-doped semiconductor material, and the source contact layer comprises a third boron-doped semiconductor material; an alternating stack of insulating layers and electrically conductive layers located over the source-level material layers; and memory stack structures vertically extending through the alternating stack, the upper semiconductor layer, and the source contact layer, wherein each of the memory stack structures comprises a respective memory film and a respective vertical semiconductor channel that contacts the source contact layer.

According to an aspect of the present disclosure, a three-dimensional memory device is provided, which comprises: source-level material layers located over a substrate and comprising a lower semiconductor layer, a source contact layer, and an upper semiconductor layer, wherein the substrate comprises a single crystalline semiconductor material, and the lower semiconductor layer comprises a first boron-doped semiconductor material that includes a doped single crystalline semiconductor material that is epitaxially aligned to the single crystalline semiconductor material of the substrate; an alternating stack of insulating layers and electrically conductive layers located over the source-level material layers; and memory stack structures vertically extending through the alternating stack, the upper semiconductor layer, and the source contact layer, wherein each of the memory stack structures comprises a respective memory film and a respective vertical semiconductor channel that contacts the source contact layer.

According to another aspect of the present disclosure, a method of forming a semiconductor structure is provided, which comprises: forming a lower semiconductor layer comprising a first boron-doped semiconductor material over a substrate; forming a sacrificial source-level material layer over the lower semiconductor layer; forming an upper semiconductor layer comprising a carbon doped second boron-doped semiconductor material over the sacrificial source-level material layer; forming an alternating stack of insulating layers and spacer material layers over the upper semiconductor layer, wherein the spacer material layers are formed as, or are subsequently replaced with, electrically conductive layers; forming memory stack structures through the alternating stack, the upper semiconductor layer, and the source contact layer, and into the lower semiconductor layer, wherein each of the memory stack structures comprises a respective memory film and a respective vertical semiconductor channel that contacts the source contact layer; and replacing the sacrificial source-level material layer with a source contact layer comprising a third boron-doped semiconductor material.

According to an aspect of the present disclosure, a three-dimensional memory device comprises a first alternating stack of first insulating layers and first electrically conductive layers located over a substrate, a second alternating stack of second insulating layers and second electrically conductive layers located over, and spaced from, the first alternating stack, memory openings vertically extending through the first alternating stack and the second alternating stack, wherein each of the memory openings comprises one or more side apertures located between the first alternating stack and the second alternating stack, and memory opening fill structures located in a respective one of the memory openings and comprising a memory film, a semiconductor channel, and a dielectric core comprising a dielectric fill material, wherein the dielectric core comprises a dielectric pillar portion and one or more dielectric peg portions laterally extending from the dielectric pillar portion through one or more holes in the semiconductor channel and adjoined to respective side apertures.

According to another aspect of the present disclosure, a method of forming a three-dimensional memory device is provided, which comprises: forming a first alternating stack of first-tier insulating layers and first sacrificial material layers located over a single crystalline semiconductor material layer; forming a laterally alternating sequence of insulating material strips and sacrificial material strips over the first alternating sack; forming a second alternating stack of second insulating layers and second electrically conductive layers over the laterally alternating sequence, wherein the first sacrificial material layers and the second material layers are subsequently replaced with electrically conductive layers; forming memory openings extending through the first alternating stack, the laterally alternating sequence, and the second alternating stack; forming a memory film and a sacrificial conformal spacer within each memory opening; forming a network of cavities by removing the sacrificial material strips and the sacrificial conformal spacers; depositing a dielectric fill material in the network of cavities, wherein a dielectric core is formed in each memory opening and dielectric strips are formed in volumes of the sacrificial material strips; forming a channel cavity in each memory opening by removing the sacrificial conformal spacers selective to the dielectric cores and the memory films; and forming an epitaxial semiconductor channel that is epitaxially aligned to the single crystalline semiconductor material layer within each of the channel cavities.

According to another aspect of the present disclosure, a three-dimensional memory device comprises a first-tier alternating stack of first-tier insulating layers and first-tier electrically conductive layers located over a substrate, an inter-tier insulating assembly located over the first-tier alternating stack and including a plurality of dielectric strips, wherein each of the plurality of dielectric strips includes dielectric peg portions that laterally protrude from a dielectric rail portion, a second-tier alternating stack of second-tier insulating layers and second-tier electrically conductive layers located over the inter-tier insulating assembly, memory openings vertically extending through the first-tier alternating stack, the inter-tier insulating assembly, and the second-tier alternating stack, wherein each of the memory openings comprises a side aperture through which a respective one of the dielectric peg portions extend inward, and memory opening fill structures located in a respective one of the memory openings and comprising a memory film, a semiconductor channel, and a dielectric core comprising a dielectric fill material and adjoined to the respective one of the dielectric peg portions.

According to another aspect of the present disclosure, a method of forming a three-dimensional memory device is provided, which comprises: forming a first-tier alternating stack of first-tier insulating layers and first-tier sacrificial material layers over a single crystalline semiconductor material layer; forming a laterally alternating stack of insulating material strips and sacrificial material strips over the first-tier alternating stack; forming a second-tier alternating stack of second-tier insulating layers and second-tier sacrificial material layers located over laterally alternating stack, wherein the first-tier sacrificial material layers and the second-tier sacrificial material layers are subsequently replaced with electrically conductive layers; forming memory openings through the first-tier alternating stack, the laterally alternating stack, and the second-tier alternating stack; and forming an in-process memory opening fill structure in each memory opening, wherein the in-process memory opening fill structure comprises a memory film, a sacrificial conformal spacer, and a dielectric core; forming laterally-extending cavities by removing the sacrificial material strips; removing portions of the memory films and the sacrificial conformal spacers that are adjacent to the laterally-extending cavities; forming dielectric strips in the laterally-extending cavities and in volumes from which the portions of the memory films and the sacrificial conformal spacers are removed; and replacing the sacrificial conformal spacers with epitaxial semiconductor channels.

BRIEF DESCRIPTION OF THE DRAWINGS

FIG. 9A is a horizontal cross-sectional view of a region of the first exemplary structure at the level of the laterally alternating sequence of insulating material strips and sacrificial material strips after formation of memory openings according to the first embodiment of the present disclosure.

FIG. 9B is a vertical cross-sectional view along the vertical plane B-B' of FIG. 9A. The horizontal cross-sectional plane A-A' is the plane of the horizontal cross-sectional view of FIG. 9A.

FIG. 9C is a vertical cross-sectional view along the vertical plane C-C' of FIG. 9A. The horizontal cross-sectional plane A-A' is the plane of the horizontal cross-sectional view of FIG. 9A.

FIG. 11A is a horizontal cross-sectional view of a region of the first exemplary structure at the level of the laterally alternating sequence of insulating material strips and sacrificial material strips after formation of memory films and sacrificial conformal spacers according to the first embodiment of the present disclosure.

FIG. 11B is a vertical cross-sectional view along the vertical plane B-B' of FIG. 11A. The horizontal cross-sectional plane A-A' is the plane of the horizontal cross-sectional view of FIG. 11A.

FIG. 11C is a vertical cross-sectional view along the vertical plane C-C' of FIG. 11A. The horizontal cross-sectional plane A-A' is the plane of the horizontal cross-sectional view of FIG. 11A.

FIG. 15A is a horizontal cross-sectional view of a region of the first exemplary structure at the level of the laterally alternating sequence of insulating material strips and laterally extending cavities after formation of a network of cavities by removal of portions of the memory films and the sacrificial conformal spacers located adjacent to the laterally-extending cavities according to the first embodiment of the present disclosure.

FIG. 15B is a vertical cross-sectional view along the vertical plane B-B' of FIG. 15A. The horizontal cross-sectional plane A-A' is the plane of the horizontal cross-sectional view of FIG. 15A.

FIG. 15C is a vertical cross-sectional view along the vertical plane C-C' of FIG. 15A. The horizontal cross-sectional plane A-A' is the plane of the horizontal cross-sectional view of FIG. 15A.

FIG. 17A is a horizontal cross-sectional view of a region of the first exemplary structure at the level of the laterally alternating sequence of insulating material strips and dielectric strips of a dielectric fill material after deposition of the dielectric fill material in the laterally-extending cavities and the memory cavities within the memory openings according to the first embodiment of the present disclosure.

FIG. 17B is a vertical cross-sectional view along the vertical plane B-B' of FIG. 17A. The horizontal cross-sectional plane A-A' is the plane of the horizontal cross-sectional view of FIG. 17A.

FIG. 17C is a vertical cross-sectional view along the vertical plane C-C' of FIG. 17A. The horizontal cross-sectional plane A-A' is the plane of the horizontal cross-sectional view of FIG. 17A.

FIG. 19A is a horizontal cross-sectional view of a region of the first exemplary structure at the level of the laterally alternating sequence of insulating material strips and dielectric strips of the dielectric fill material after formation of epitaxial semiconductor channels and drain regions according to the first embodiment of the present disclosure.

FIG. 19B is a vertical cross-sectional view along the vertical plane B-B' of FIG. 19A. The horizontal cross-sectional plane A-A' is the plane of the horizontal cross-sectional view of FIG. 19A.

FIG. 19C is a vertical cross-sectional view along the vertical plane C-C' of FIG. 19A. The horizontal cross-sectional plane A-A' is the plane of the horizontal cross-sectional view of FIG. 19A.

FIGS. 33A-33D illustrate sequential vertical cross-sectional views of a memory opening during formation of an in-process memory opening fill structure according to the second embodiment of the present disclosure.

FIG. 41B is a top-down view of the second exemplary structure along the horizontal plane B-B' of FIG. 40A. The hinged vertical plane A-A' corresponds to the plane of the vertical cross-sectional view of FIG. 40A.

FIGS. 56A-56D illustrate sequential vertical cross-sectional views of a memory opening during formation of a memory opening fill structure according to the third embodiment of the present disclosure.

FIG. 57 is a vertical cross-sectional view of the third exemplary structure after formation of memory opening fill structures and support pillar structures according to the third embodiment of the present disclosure.

FIG. 58A is a vertical cross-sectional view of the third exemplary structure after formation of pillar cavities according to the third embodiment of the present disclosure.

FIG. 58B is a horizontal cross-sectional view of the third exemplary structure along the horizontal plane B-B' of FIG. 58A. The hinged vertical plane A-A' corresponds to the plane of the vertical cross-sectional view of FIG. 58A.

FIG. 59 is a vertical cross-sectional view of the third exemplary structure after formation of dielectric pillar structures according to the third embodiment of the present disclosure.

FIG. 60A is a vertical cross-sectional view of the third exemplary structure after formation of a first contact level dielectric layer and backside trenches according to the third embodiment of the present disclosure.

FIG. 60B is a horizontal cross-sectional view of the third exemplary structure along the horizontal plane B-B' of FIG. 60A. The hinged vertical plane A-A' corresponds to the plane of the vertical cross-sectional view of FIG. 60A.

FIG. 61 is a vertical cross-sectional view of the third exemplary structure after formation of backside trench spacers according to the third embodiment of the present disclosure.

FIGS. 62A-62E illustrate sequential vertical cross-sectional views of memory opening fill structures and a backside trench during formation of source-level material layers according to the third embodiment of the present disclosure.

FIG. 63 is a vertical cross-sectional view of the third exemplary structure after formation of source-level material layers according to the third embodiment of the present disclosure.

FIG. 64 is a vertical cross-sectional view of the third exemplary structure after formation of backside recesses according to the third embodiment of the present disclosure.

FIG. 65A is a vertical cross-sectional view of the third exemplary structure after formation of electrically conductive layers according to the third embodiment of the present disclosure.

FIG. 65B is a vertical cross-sectional view of a region of the third exemplary structure of FIG. 65A that includes a backside trench and two memory opening fill structures.

Figure 66A:
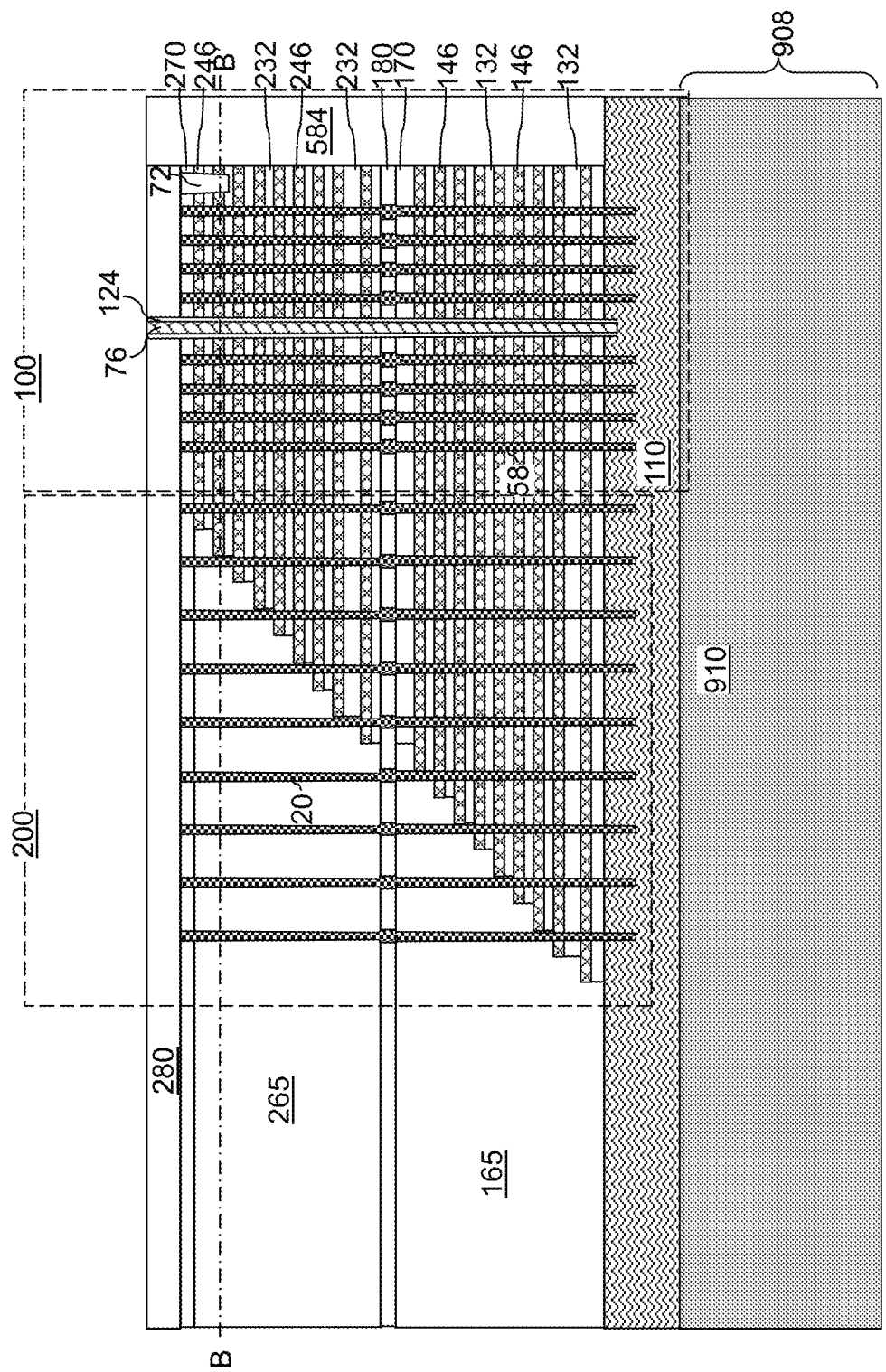

FIG. 66A is a vertical cross-sectional view of the third exemplary structure after formation of an insulating spacer and a backside contact via structure in each backside trench according to the third embodiment of the present disclosure.

Figure 66B:
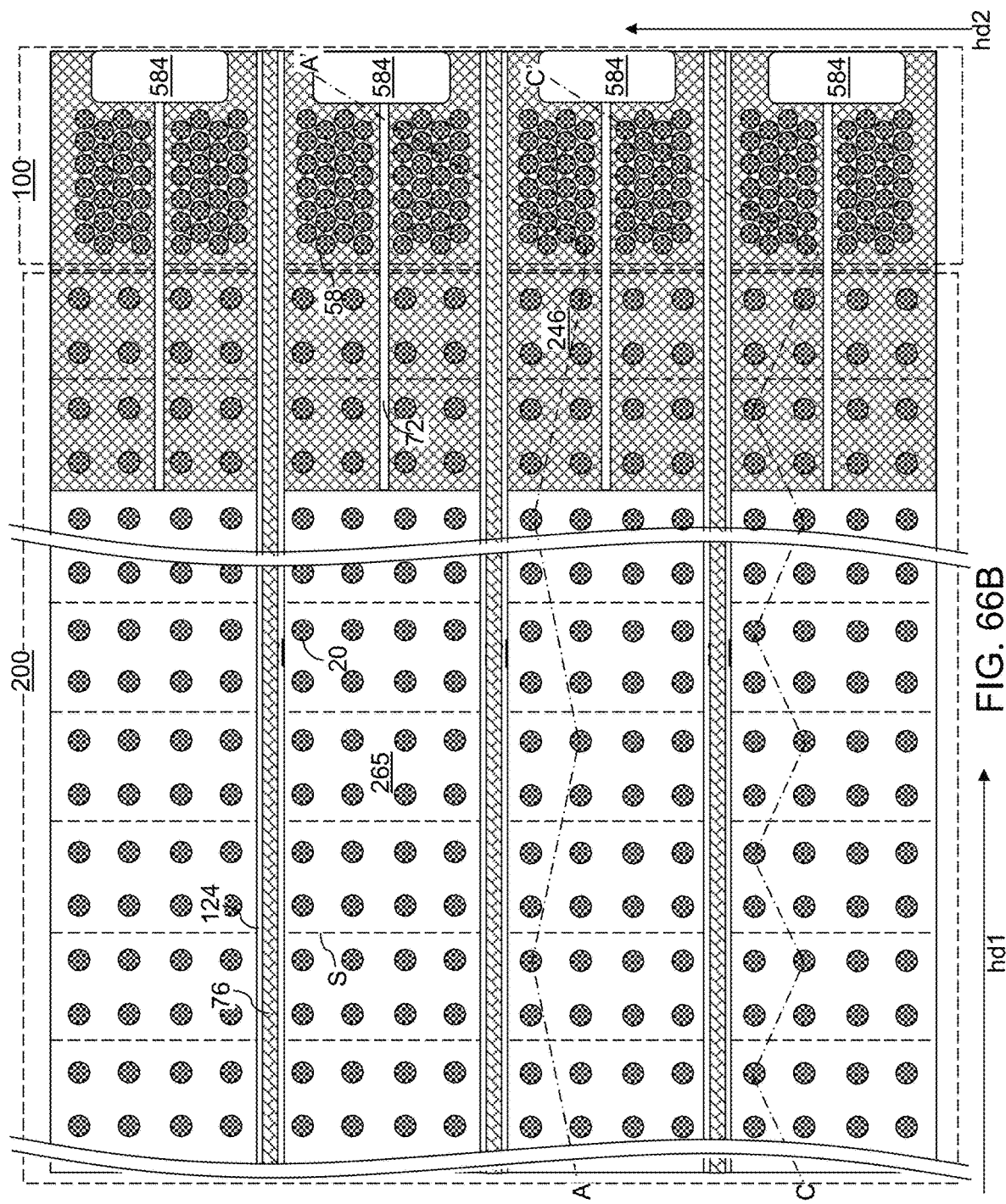

FIG. 66B is a horizontal cross-sectional view of the third exemplary structure along the horizontal plane B-B' of FIG. 66A. The hinged vertical plane A-A' corresponds to the plane of the vertical cross-sectional view of FIG. 66A.

Figure 66C:
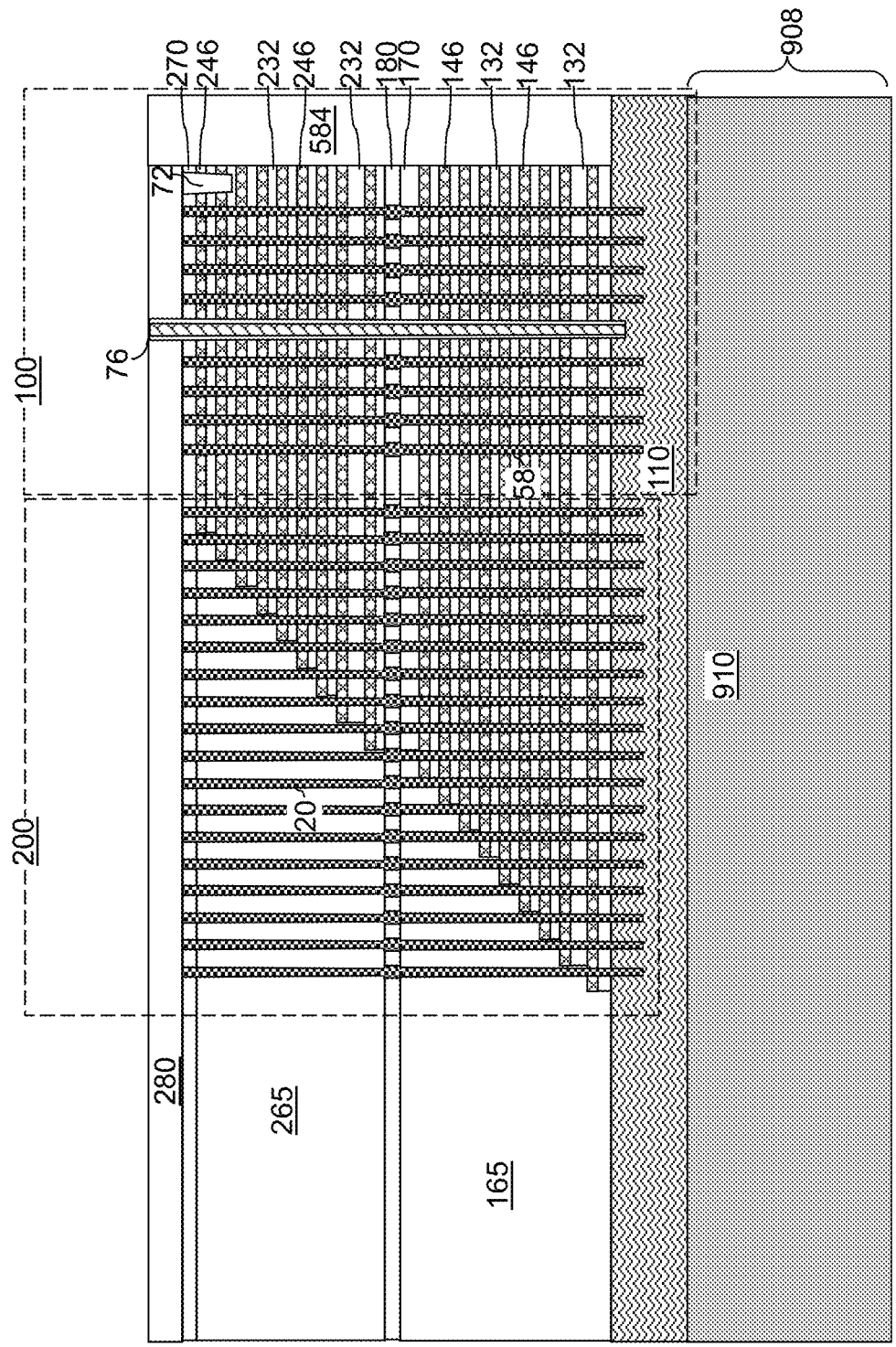

FIG. 66C is a vertical cross-sectional view of the third exemplary structure along the vertical plane C-C' of FIG. 66B.

Figure 66D:
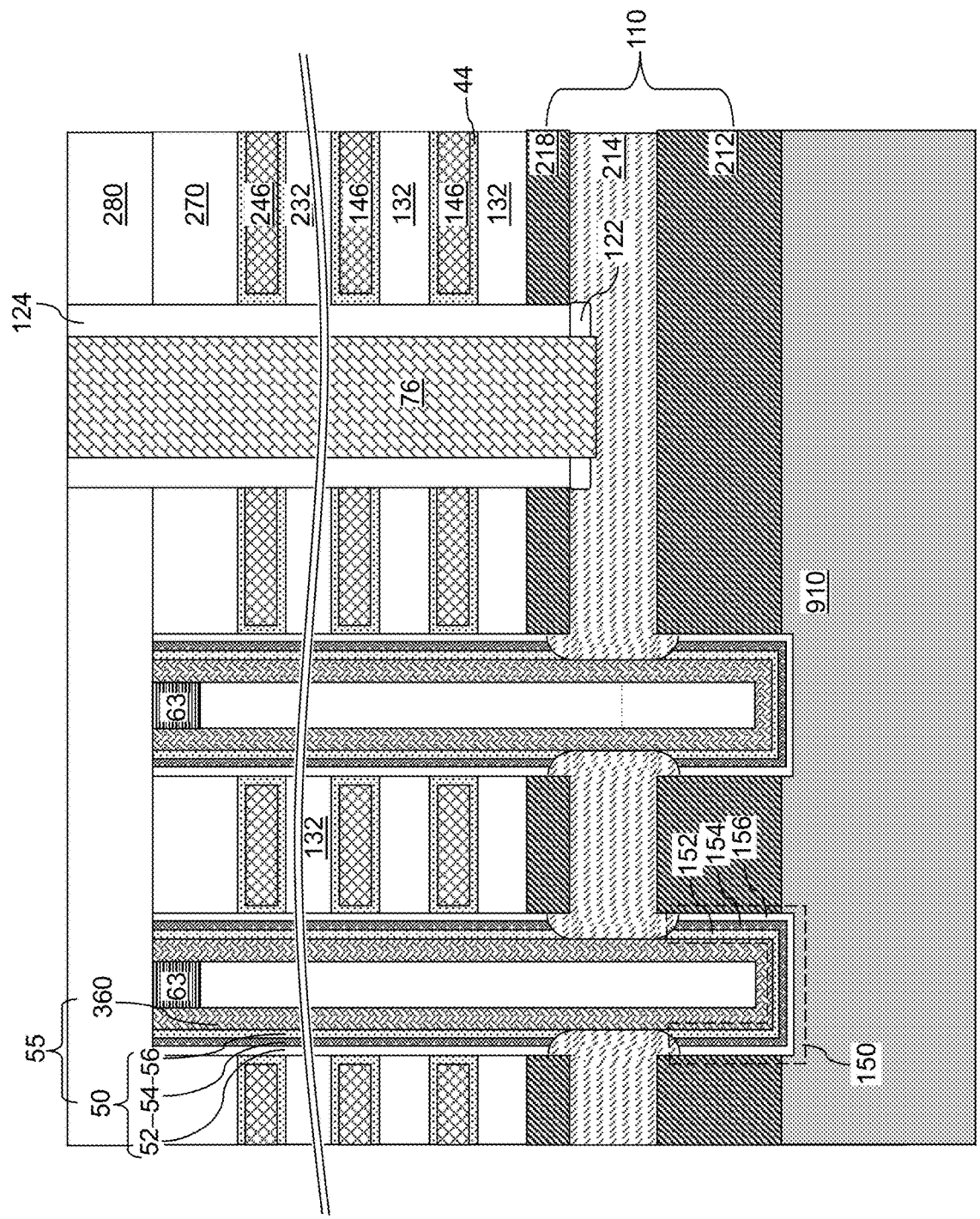

FIG. 66D is a vertical cross-sectional view of a region of the third exemplary structure of FIGS. 66A-66C that includes a backside trench and two memory opening fill structures.

Figure 67A:
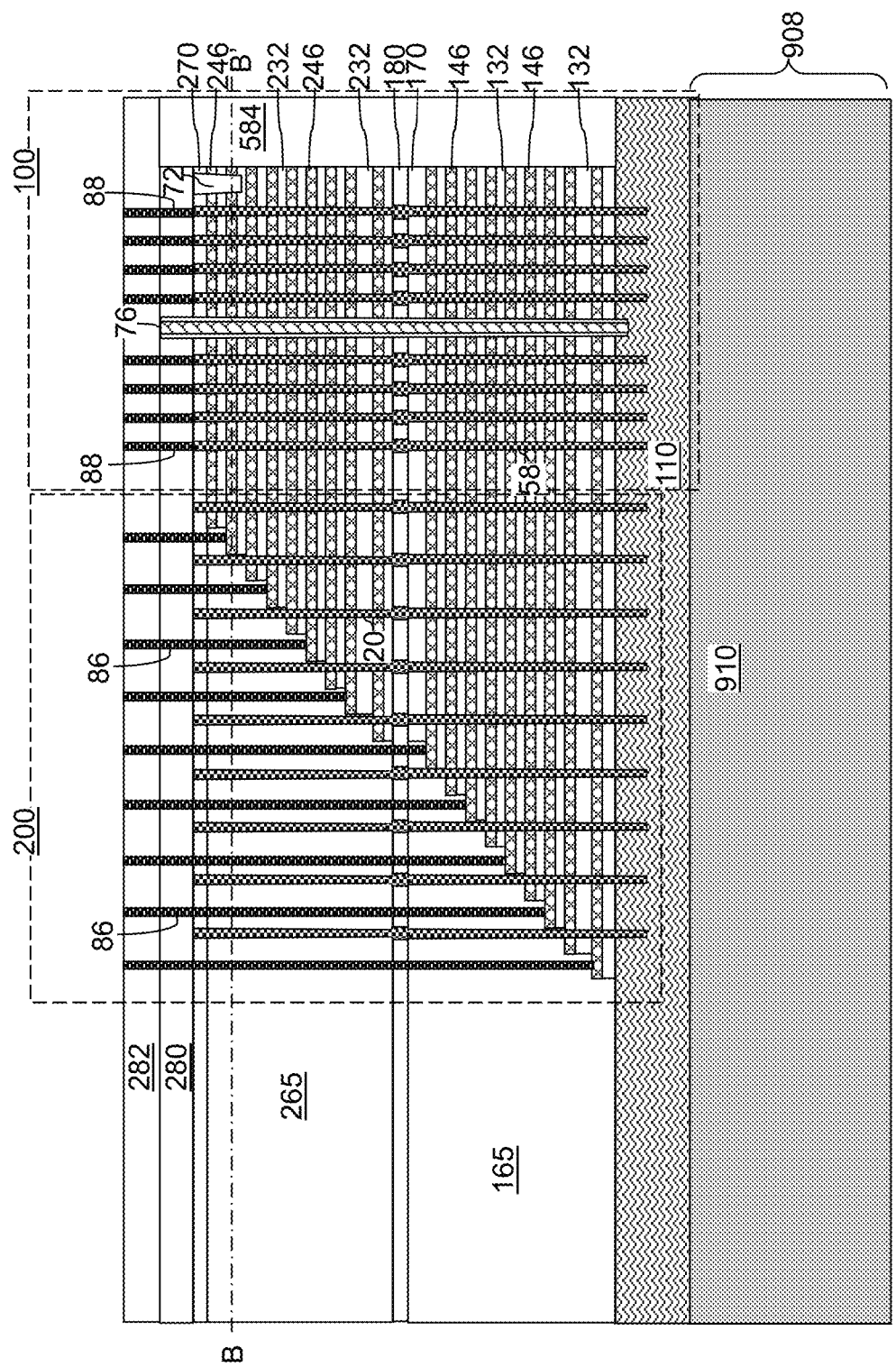

FIG. 67A is a vertical cross-sectional view of the third exemplary structure after formation of a second contact level dielectric layer and various contact via structures according to the third embodiment of the present disclosure.

FIG. 67B is a horizontal cross-sectional view of the third exemplary structure along the vertical plane B-B' of FIG. 67A. The hinged vertical plane A-A' corresponds to the plane of the vertical cross-sectional view of FIG. 67A.

Figure 68:
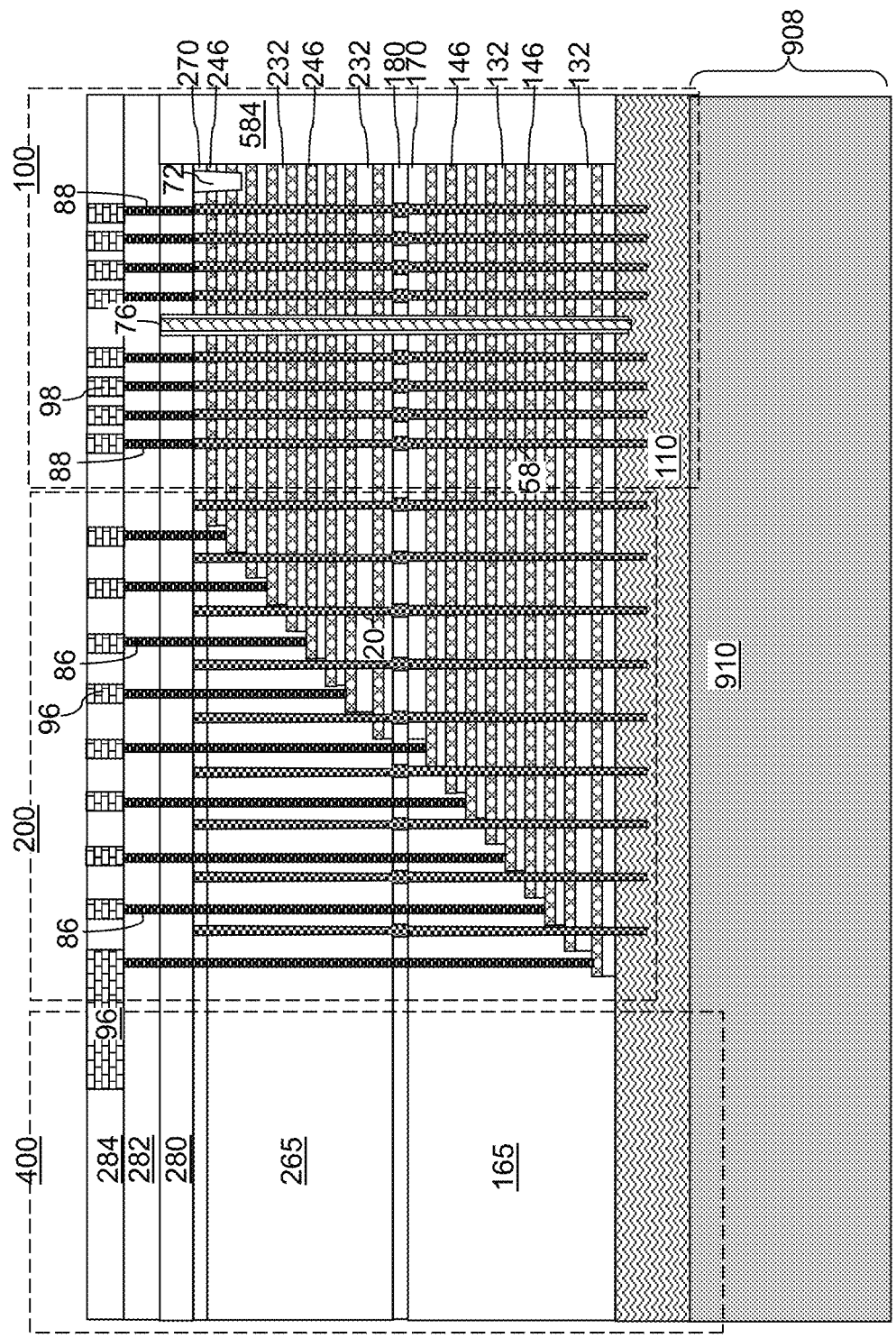

FIG. 68 is a vertical cross-sectional view of the third exemplary structure after formation of upper metal line structures according to the third embodiment of the present disclosure.

DETAILED DESCRIPTION

Various embodiments provide three-dimensional memory devices and methods of making such devices that include carbon and boron doped source contact layers. The carbon doping reduces boron diffusion from the source contact layers into the semiconductor channels. The embodiments of the present disclosure can be used to form various semiconductor devices such as three-dimensional monolithic memory array devices comprising a plurality of NAND memory strings. The drawings are not drawn to scale.

The drawings are not drawn to scale. Multiple instances of an element may be duplicated where a single instance of the element is illustrated, unless absence of duplication of elements is expressly described or clearly indicated otherwise. Ordinals such as "first," "second," and "third" are used merely to identify similar elements, and different ordinals may be used across the specification and the claims of the instant disclosure. The same reference numerals refer to the same element or similar element. Unless otherwise indicated, elements having the same reference numerals are presumed to have the same composition and the same function. Unless otherwise indicated, a "contact" between elements refers to a direct contact between elements that provides an edge or a surface shared by the elements. As used herein, a first element located "on" a second element can be located on the exterior side of a surface of the second element or on the interior side of the second element. As used herein, a first element is located "directly on" a second element if there exist a physical contact between a surface of the first element and a surface of the second element. As used herein, a "prototype" structure or an "in-process" structure refers to a transient structure that is subsequently modified in the shape or composition of at least one component therein.

As used herein, a "layer" refers to a material portion including a region having a thickness. A layer may extend over the entirety of an underlying or overlying structure, or may have an extent less than the extent of an underlying or overlying structure. Further, a layer may be a region of a homogeneous or inhomogeneous continuous structure that has a thickness less than the thickness of the continuous structure. For example, a layer may be located between any pair of horizontal planes between, or at, a top surface and a bottom surface of the continuous structure. A layer may extend horizontally, vertically, and/or along a tapered surface. A substrate may be a layer, may include one or more layers therein, or may have one or more layer thereupon, thereabove, and/or therebelow.

As used herein, a first surface and a second surface are "vertically coincident" with each other if the second surface overlies or underlies the first surface and there exists a vertical plane or a substantially vertical plane that includes the first surface and the second surface. A substantially vertical plane is a plane that extends straight along a direction that deviates from a vertical direction by an angle less than 5 degrees. A vertical plane or a substantially vertical plane is straight along a vertical direction or a substantially vertical direction, and may, or may not, include a curvature along a direction that is perpendicular to the vertical direction or the substantially vertical direction.

As used herein, a "memory level" or a "memory array level" refers to the level corresponding to a general region between a first horizontal plane (i.e., a plane parallel to the top surface of the substrate) including topmost surfaces of an array of memory elements and a second horizontal plane including bottommost surfaces of the array of memory elements. As used herein, a "through-stack" element refers to an element that vertically extends through a memory level.

As used herein, a "semiconducting material" refers to a material having electrical conductivity in the range from $1.0 \times 10^{-5}$ S/m to $1.0 \times 10^5$ S/m. As used herein, a "semiconductor material" refers to a material having electrical conductivity in the range from $1.0 \times 10^{-5}$ S/m to 1.0 S/m in the absence of electrical dopants therein, and is capable of producing a doped material having electrical conductivity in a range from 1.0 S/m to $1.0 \times 10^5$ S/m upon suitable doping with an electrical dopant. As used herein, an "electrical dopant" refers to a p-type dopant that adds a hole to a valence band within a band structure, or an n-type dopant that adds an electron to a conduction band within a band structure. As used herein, a "conductive material" refers to a material having electrical conductivity greater than $1.0 \times 10^5$ S/m. As used herein, an "insulator material" or a "dielectric material" refers to a material having electrical conductivity less than $1.0 \times 10^{-5}$ S/m. As used herein, a "heavily doped semiconductor material" refers to a semiconductor material that is doped with electrical dopant at a sufficiently high atomic concentration to become a conductive material either as formed as a crystalline material or if converted into a crystalline material through an anneal process (for example, from an initial amorphous state), i.e., to have electrical conductivity greater than $1.0 \times 10^5$ S/m. A "doped semiconductor material" may be a heavily doped semiconductor material, or may be a semiconductor material that includes electrical dopants (i.e., p-type dopants and/or n-type dopants) at a concentration that provides electrical conductivity in the range from $1.0 \times 10^{-5}$ S/m to $1.0 \times 10^5$ S/m. An "intrinsic semiconductor material" refers to a semiconductor material that is not doped with electrical dopants. Thus, a semiconductor material may be semiconducting or conductive, and may be an intrinsic semiconductor material or a doped semiconductor material. A doped semiconductor material can be semiconducting or conductive depending on the atomic concentration of electrical dopants therein. As used herein, a "metallic material" refers to a conductive material including at least one metallic element therein. All measurements for electrical conductivities are made at the standard condition.

A monolithic three-dimensional memory array is one in which multiple memory levels are formed above a single substrate, such as a semiconductor wafer, with no intervening substrates. The term "monolithic" means that layers of each level of the array are directly deposited on the layers of each underlying level of the array. In contrast, two dimensional arrays may be formed separately and then packaged together to form a non-monolithic memory device. For example, non-monolithic stacked memories have been constructed by forming memory levels on separate substrates and vertically stacking the memory levels, as described in U.S. Pat. No. 5,915,167 titled "Three-dimensional Structure Memory." The substrates may be thinned or removed from the memory levels before bonding, but as the memory levels are initially formed over separate substrates, such memories are not true monolithic three-dimensional memory arrays. The substrate may include integrated circuits fabricated thereon, such as driver circuits for a memory device Three-dimensional memory devices of various embodiments of the present disclosure include a monolithic three-dimensional NAND string memory device, and can be fabricated using the various embodiment methods described herein. The monolithic three-dimensional NAND string is located in a monolithic, three-dimensional array of NAND strings located over the substrate. At least one memory cell in the first device level of the three-dimensional array of NAND strings is located over another memory cell in the second device level of the three-dimensional array of NAND strings.

Generally, a semiconductor package (or a "package") refers to a unit semiconductor device that can be attached to a circuit board through a set of pins or solder balls. A semiconductor package may include a semiconductor chip (or a "chip") or a plurality of semiconductor chips that are bonded thereamongst, for example, by flip-chip bonding or another chip-to-chip bonding. A package or a chip may include a single semiconductor die (or a "die") or a plurality of semiconductor dies. A die is the smallest unit that can independently execute external commands or report status. Typically, a package or a chip with multiple dies is capable of simultaneously executing as many external commands as the total number of planes therein. Each die includes one or more planes. Identical concurrent operations can be executed in each plane within a same die, although there may be some restrictions. In case a die is a memory die, i.e., a die including memory elements, concurrent read operations, concurrent write operations, or concurrent erase operations can be performed in each plane within a same memory die. In a memory die, each plane contains a number of memory blocks (or "blocks"), which are the smallest unit that can be erased by in a single erase operation. Each memory block contains a number of pages, which are the smallest units that can be selected for programming. A page is also the smallest unit that can be selected to a read operation.

Figure 1A:
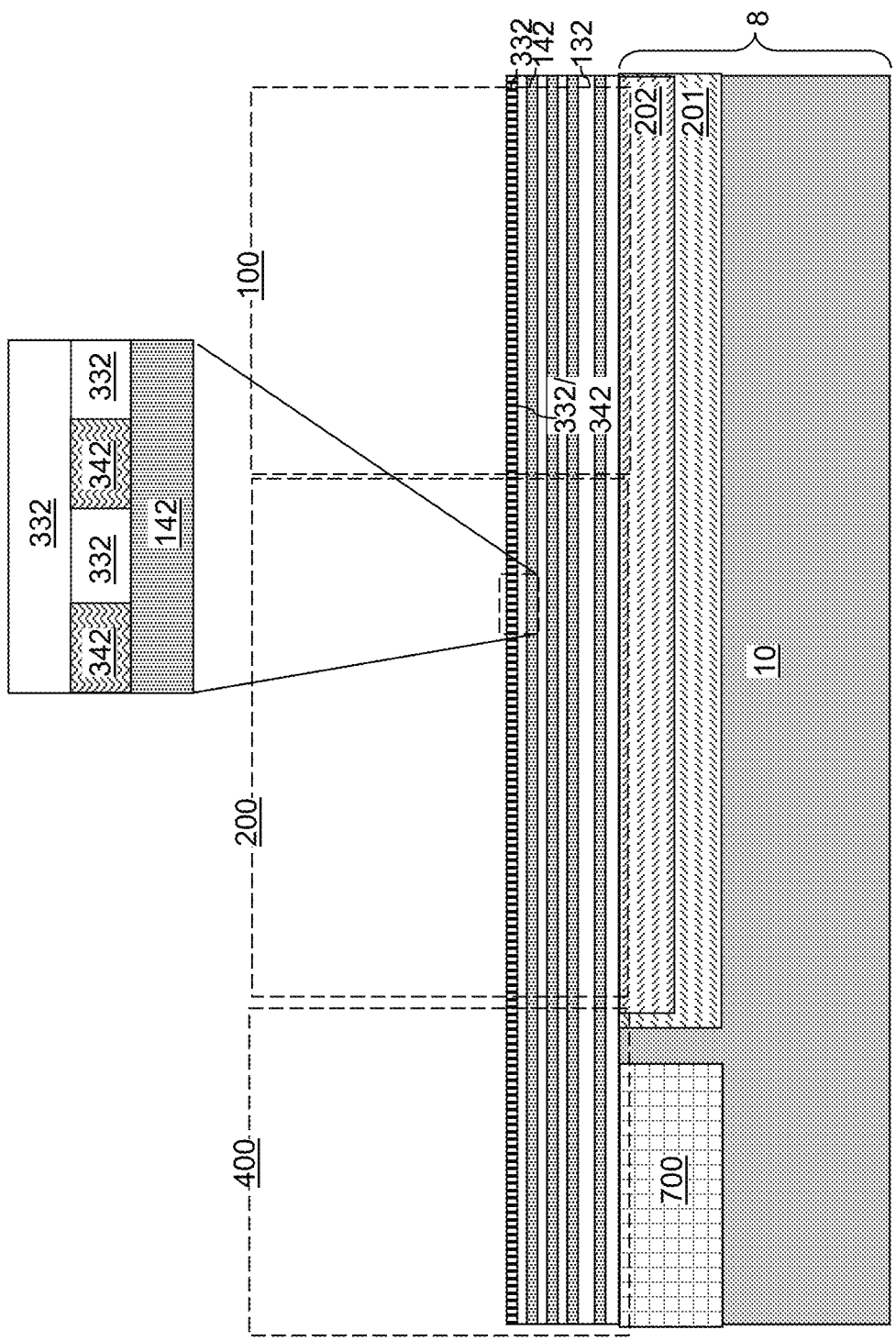
FIG. 1A is a vertical cross-sectional view of a first exemplary structure after formation of a first alternating stack of first-tier insulating layers and first-tier sacrificial material layers and a first laterally alternating sequence of insulating material strips and sacrificial material strips according to a first embodiment of the present disclosure.
Figure 1B:
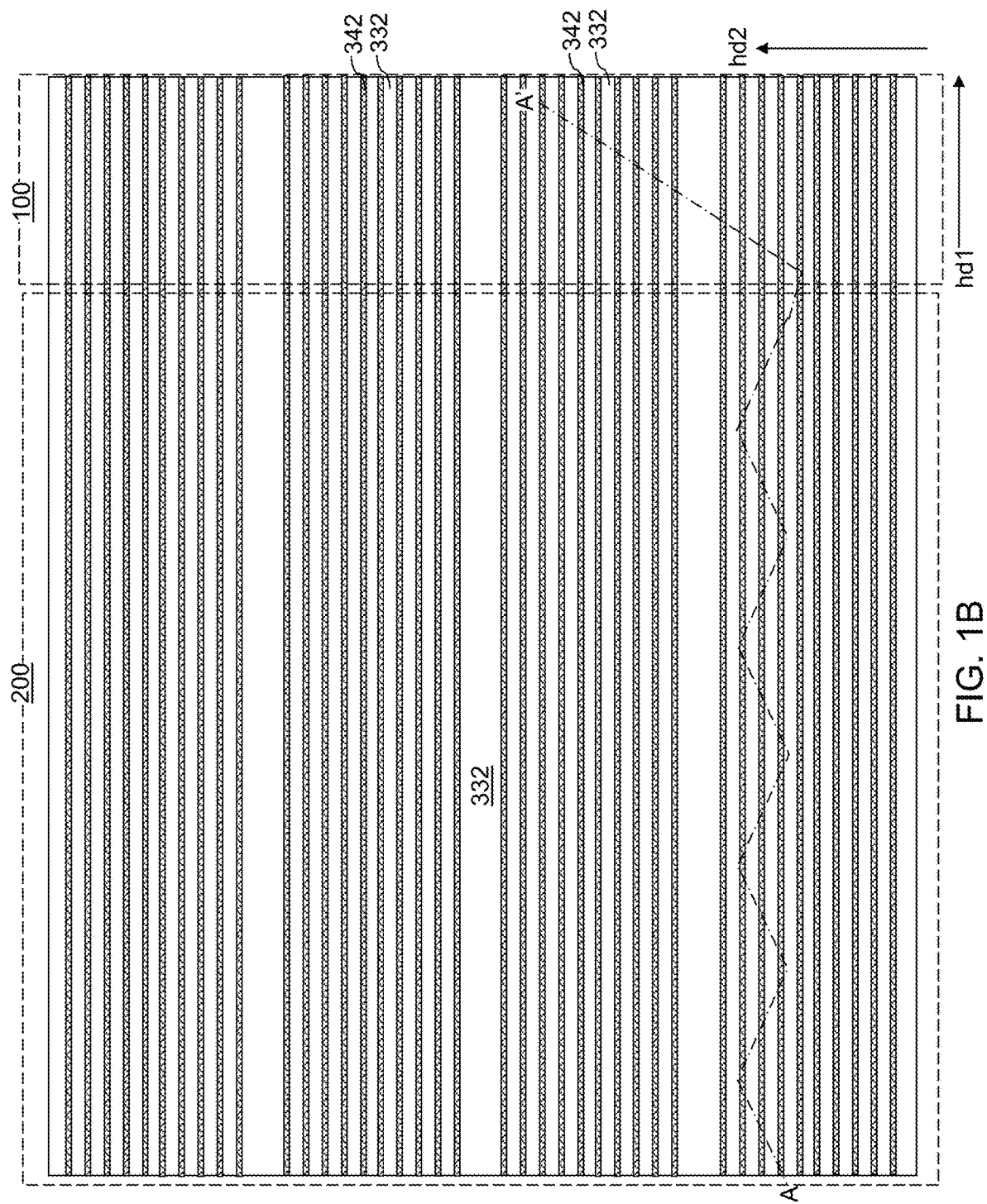
FIG. 1B is a top-down view of the first exemplary structure of FIG. 1A.

Referring to FIGS. 1A and 1B, a first exemplary structure according to an embodiment of the present disclosure is illustrated, which includes a substrate 8. The substrate 8 includes a substrate semiconductor layer 10. The substrate 8 may comprise a commercially available semiconductor wafer such as a single crystalline silicon wafer, and the substrate semiconductor layer 10 may be a single crystalline semiconductor material layer such as a single crystalline silicon layer.

The substrate semiconductor layer 10 is a doped semiconductor layer having a doping of a first conductivity type, which may be p-type or n-type. The substrate semiconductor layer 10 may include electrical dopants of the first conductivity type at an atomic concentration in a range from $1.0 \times 10^{14}/cm^3$ to $1.0 \times 10^{18}/cm^3$, although lesser and greater atomic concentrations may also be used. Optionally, portions of the substrate semiconductor layer 10 may be vertically recessed in a peripheral device region 400, and peripheral semiconductor devices 700 may be formed on a recessed surface of the substrate semiconductor layer 10. A memory array region 100 in which a three-dimensional array of memory devices is to be subsequently formed is provided outside of the peripheral device region 400. A staircase region 200 may be provided between the memory array region 100 and the peripheral device region 400.

A second-conductivity-type doped well 201 having a doping of a second conductivity type can be formed in an upper portion of the substrate semiconductor layer 10 by implantation of dopants of the second conductivity type. The second conductivity type is the opposite of the first conductivity type. For example, if the first conductivity type is p-type, the second conductivity type is n-type, and vice versa.

A first-conductivity-type doped well 202 having a doping of the first conductivity type can be formed in an upper portion of the second-conductivity-type doped well 201 by implantation of dopants of the first conductivity type. The combination of the remaining portion of the substrate semiconductor layer 10, the second-conductivity-type doped well 201, and the first-conductivity-type doped well 202 forms a nested p-n-p junction structure or a nested n-p-n junction structure so that the first-conductivity-type doped well 202 can be independently electrically biased from the substrate semiconductor layer 10. In one embodiment, the substrate 8 can include a single crystalline semiconductor material layer (such as a single crystalline silicon layer) such the each of the substrate semiconductor layer 10, the second-conductivity-type doped well 201, and the first-conductivity-type doped well 202 are portions of the single crystalline semiconductor material layer.

A first alternating stack of first material layers and second material layers is formed over the substrate 8. In one embodiment, the first material layers and the second material layers may be first-tier insulating layers 132 and first-tier sacrificial material layers 142, respectively. In one embodiment, each first-tier insulating layer 132 may include a first insulating material, and each first-tier sacrificial material layer 142 may include a first sacrificial material. As used herein, a "sacrificial material" refers to a material that is removed during a subsequent processing step.

As used herein, an alternating stack of first elements and second elements refers to a structure in which instances of the first elements and instances of the second elements alternate. Each instance of the first elements that is not an end element of the alternating plurality is adjoined by two instances of the second elements on both sides, and each instance of the second elements that is not an end element of the alternating plurality is adjoined by two instances of the first elements on both ends. The first elements may have the same thickness throughout, or may have different thicknesses. The second elements may have the same thickness throughout, or may have different thicknesses. The alternating plurality of first material layers and second material layers may begin with an instance of the first material layers or with an instance of the second material layers, and may end with an instance of the first material layers or with an instance of the second material layers. In one embodiment, an instance of the first elements and an instance of the second elements may form a unit that is repeated with periodicity within the alternating plurality.

The first material of the first-tier insulating layers 132 may be at least one insulating material. Insulating materials that may be used for the first-tier insulating layers 132 include, but are not limited to silicon oxide (including doped or undoped silicate glass), silicon nitride, silicon oxynitride, organosilicate glass (OSG), spin-on dielectric materials, dielectric metal oxides that are commonly known as high dielectric constant (high-k) dielectric oxides (e.g., aluminum oxide, hafnium oxide, etc.) and silicates thereof, dielectric metal oxynitrides and silicates thereof, and organic insulating materials. In one embodiment, the first material of the first-tier insulating layers 132 may be silicon oxide.

The second material of the first-tier sacrificial material layers 142 is a sacrificial material that may be removed selective to the first material of the first-tier insulating layers 132. As used herein, a removal of a first material is "selective to" a second material if the removal process removes the first material at a rate that is at least twice the rate of removal of the second material. The ratio of the rate of removal of the first material to the rate of removal of the second material is herein referred to as a "selectivity" of the removal process for the first material with respect to the second material.

The first-tier sacrificial material layers 142 may comprise an insulating material, a semiconductor material, or a conductive material. The second material of the first-tier sacrificial material layers 142 may be subsequently replaced with electrically conductive electrodes which may function, for example, as control gate electrodes of a vertical NAND device. In one embodiment, the first-tier sacrificial material layers 142 may be material layers that comprise silicon nitride.

In one embodiment, the first-tier insulating layers 132 may include silicon oxide, and sacrificial material layers may include silicon nitride. The first material of the first-tier insulating layers 132 may be deposited, for example, by chemical vapor deposition (CVD). For example, if silicon oxide is used for the first-tier insulating layers 132, tetraethylorthosilicate (TEOS) may be used as the precursor material for the CVD process. The second material of the first-tier sacrificial material layers 142 may be formed, for example, CVD or atomic layer deposition (ALD).

The thicknesses of the first-tier insulating layers 132 and the first-tier sacrificial material layers 142 may be in a range from 20 nm to 50 nm, although lesser and greater thicknesses may be used for each first-tier insulating layer 132 and for each first-tier sacrificial material layer 142. The number of repetitions of the pairs of a first-tier insulating layer 132 and a first-tier sacrificial material layer 142 in the first alternating stack (132, 142) may be in a range from 2 to 256, and typically from 8 to 64, although a greater number of repetitions may also be used. In one embodiment, each first-tier sacrificial material layer 142 in the first-tier alternating stack (132, 142) may have a uniform thickness that is substantially the same throughout each respective first-tier sacrificial material layer 142.

The first alternating sequence (132, 142) terminates with a first-tier insulating layer 132. A first laterally alternating sequence of insulating material strips 332 and sacrificial material strips 342 is formed over the topmost first-tier insulating layer 132. Each of the insulating material strips 332 and sacrificial material strips 342 can laterally extend along a first horizontal direction hd1 with a respective uniform width, and can be laterally spaced one from another along a second horizontal direction hd2 that is perpendicular to the first horizontal direction hd1.

The first laterally alternating sequence of insulating material strips 332 and sacrificial material strips 342 can be formed by depositing a blanket (unpatterned) insulating material layer including the material of the insulating material strips 332, by forming line trenches having the pattern of the sacrificial material strips 342 through the insulating material layer by a combination of a lithographic patterning process and an anisotropic etch process, and by depositing a sacrificial material that is different from the material of the first-tier sacrificial material layers 142 in the line trenches. Excess portions of the sacrificial material can be removed from above the horizontal plane including the top surface of the remaining portions of the insulating material layer by a planarization process. The remaining portions of the insulating material layer constitute the insulating material strips. Alternatively, the first laterally alternating sequence of insulating material strips 332 and sacrificial material strips 342 can be formed by depositing a blanket (unpatterned) material layer including the material of the sacrificial material strips 342, by forming line trenches having the pattern of the insulating material strips 332 by a combination of a lithographic patterning process and an anisotropic etch process, and by depositing an insulating material in the line trenches.

In one embodiment, the insulating material of the insulating material strips 332 can include undoped silicate glass or a doped silicate glass, and the sacrificial material of the sacrificial material strips 342 can include a semiconductor material such as amorphous silicon, polysilicon, or a silicon-germanium alloy. In one embodiment, the insulating material strips 332 can include undoped silicate glass, and the sacrificial material strips 342 can include undoped amorphous silicon.

Figure 2:
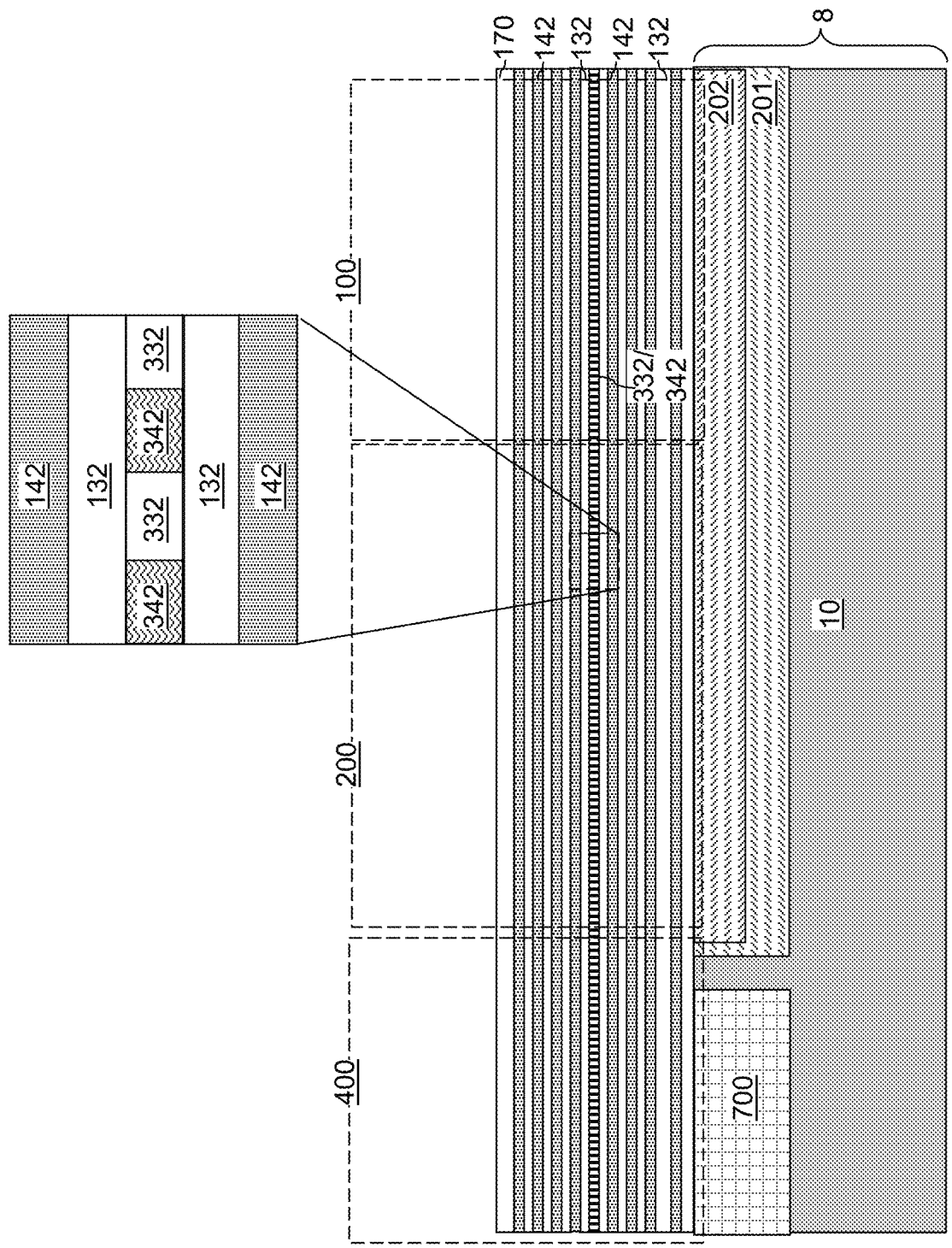
FIG. 2 is a vertical cross-sectional view of the first exemplary structure after formation of formation of a second alternating stack of first-tier insulating layers and first-tier sacrificial material layers according to the first embodiment of the present disclosure.

Referring to FIG. 2, a second alternating stack of additional first-tier insulating layers 132 and additional first-tier sacrificial material layers 142 can be formed over the first laterally alternating sequence of insulating material strips 332 and sacrificial material strips 342. The processing steps for forming the first laterally alternating sequence of insulating material strips 332 and sacrificial material strips 342 can be repeated to form the second alternating stack of additional first-tier insulating layers 132 and additional first-tier sacrificial material layers 142. The second alternating stack of additional first-tier insulating layers 132 and additional first-tier sacrificial material layers 142 can include a first-tier insulating layer 132 as a bottommost layer that contacts the first laterally alternating sequence of insulating material strips 332 and sacrificial material strips 342. The number of repetitions of the pairs of a first-tier insulating layer 132 and a first-tier sacrificial material layer 142 in the second alternating stack (132, 142) may be in a range from 2 to 256, and typically from 8 to 64, although a greater number of repetitions may also be used.

Optionally, the processing steps for forming the first laterally alternating sequence of insulating material strips 332 and sacrificial material strips 342 and the processing steps for forming the second alternating stack of additional first-tier insulating layers 132 and additional first-tier sacrificial material layers 142 may be repeated to provide more than one laterally alternating sequence of insulating material strips 332 and sacrificial material strips 342.

A first-tier insulating cap layer 170 is subsequently formed over the second alternating stack of additional first-tier insulating layers 132 and additional first-tier sacrificial material layers 142 (and any additional alternating stack, if present). The first-tier insulating cap layer 170 includes a dielectric material, which may be any dielectric material that may be used for the first-tier insulating layers 132. In one embodiment, the first-tier insulating cap layer 170 includes the same dielectric material as the first-tier insulating layers 132. The thickness of the first-tier insulating cap layer 170 may be in a range from 20 nm to 300 nm, although lesser and greater thicknesses may also be used. The layers within the first-tier insulating cap layer 170, the alternating stacks (132, 142) of the first-tier insulating layers 132 and first-tier sacrificial material layers 142, and a layer including the first laterally alternating sequence of insulating material strips 332 and sacrificial material strips 342 are collectively referred to as first-tier material layers (132, 142, 332, 342, 170).

Figure 3:
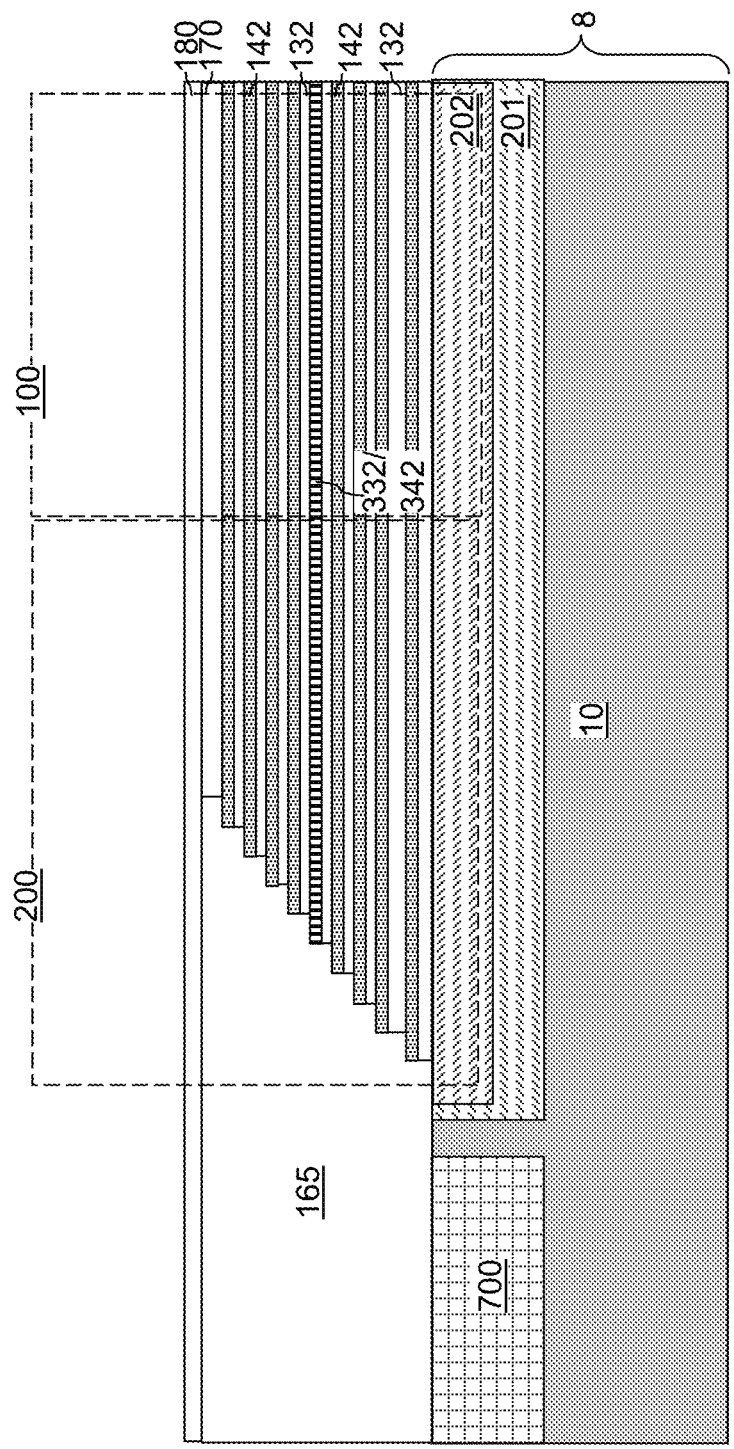
FIG. 3 is a vertical cross-sectional view of the first exemplary structure after formation of a first-tier staircase region, a first retro-stepped dielectric material portion, and an inter-tier dielectric layer according to the first embodiment of the present disclosure.

Referring to FIG. 3, the first-tier insulating cap layer 170, the alternating stacks (132, 142) of the first-tier insulating layers 132 and first-tier sacrificial material layers 142, and the first laterally alternating sequence of insulating material strips 332 and sacrificial material strips 342 may be patterned to form first-tier stepped surfaces in the staircase region 200. The staircase region 200 may include a respective first stepped area in which the first-tier stepped surfaces are formed, and a second stepped area in which additional stepped surfaces are to be subsequently formed in a second-tier structure (to be subsequently formed over a first-tier structure) and/or additional tier structures. The first-tier stepped surfaces may be formed, for example, by forming a mask layer with an opening therein, etching a cavity within the levels of the first-tier insulating cap layer 170, and iteratively expanding the etched area and vertically recessing the cavity by etching an underlying pair of material layers within the first-tier material layers (132, 142, 332, 342, 170) that is located directly underneath the bottom surface of the etched cavity. In one embodiment, top surfaces of the first-tier sacrificial material layers 142 may be physically exposed at the first-tier stepped surfaces. The cavity overlying the first-tier stepped surfaces is herein referred to as a first stepped cavity.

A dielectric fill material (such as undoped silicate glass or doped silicate glass) may be deposited to fill the first stepped cavity. Excess portions of the dielectric fill material may be removed from above the horizontal plane including the top surface of the first-tier insulating cap layer 170. A remaining portion of the dielectric fill material that fills the region overlying the first-tier stepped surfaces constitutes a first stepped dielectric material portion 165. As used herein, a "stepped" element refers to an element that has stepped surfaces and a horizontal cross-sectional area that increases monotonically as a function of a vertical distance from a top surface of a substrate on which the element is present. The first-tier material layers (132, 142, 332, 342, 170) and the first stepped dielectric material portion 165 collectively constitute a first-tier structure, which is an in-process structure that is subsequently modified.

An inter-tier dielectric layer 180 may be optionally deposited over the first-tier structure (132, 142, 332, 342, 170, 165). The inter-tier dielectric layer 180 includes a dielectric material such as silicon oxide. In one embodiment, the inter-tier dielectric layer 180 may include a doped silicate glass having a greater etch rate than the material of the first-tier insulating layers 132 (which may include an undoped silicate glass). For example, the inter-tier dielectric layer 180 may include phosphosilicate glass. The thickness of the inter-tier dielectric layer 180 may be in a range from 30 nm to 300 nm, although lesser and greater thicknesses may also be used.

Figure 4A:
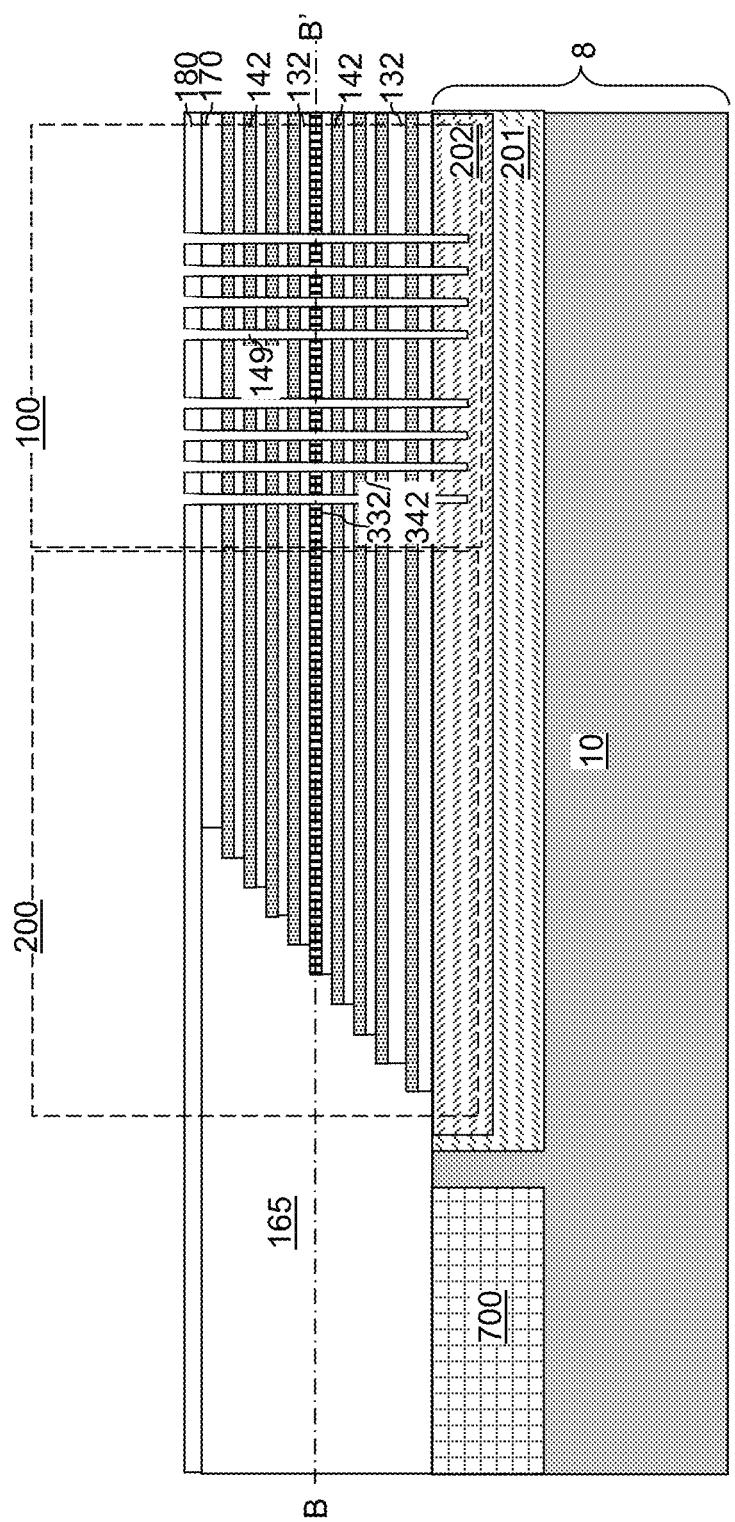
FIG. 4A is a vertical cross-sectional view of the first exemplary structure after formation of first-tier memory openings according to the first embodiment of the present disclosure.
Figure 4B:
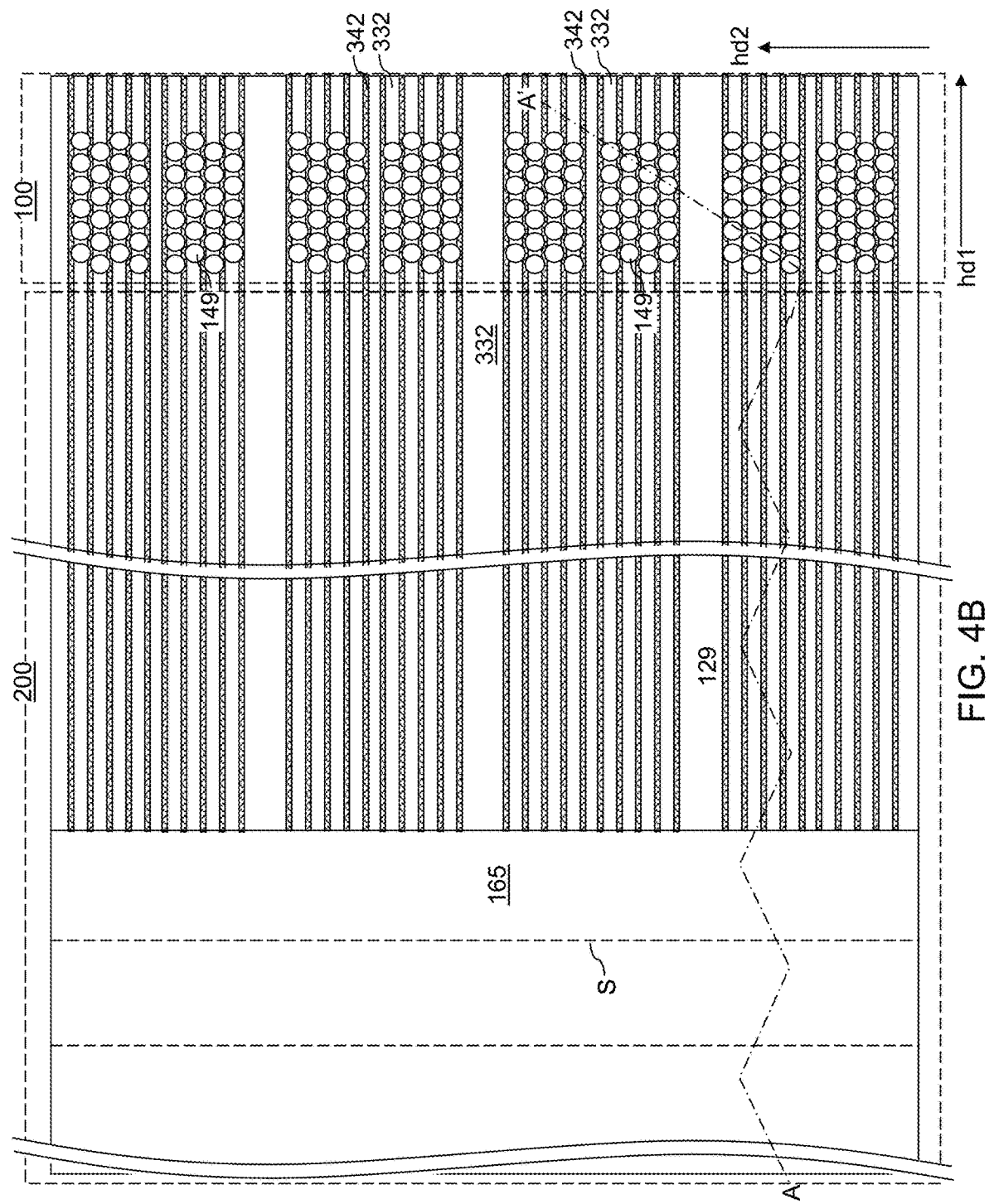
FIG. 4B is a horizontal cross-sectional view of the first exemplary structure of FIG. 4A. The hinged vertical plane A-A' corresponds to the plane of the vertical cross-sectional view of FIG. 4A.

Referring to FIGS. 4A and 4B, first-tier memory openings 149 may be formed through the first-tier material layers (132, 142, 332, 342, 170) and into the first-conductivity-type doped well 202 in the memory array region 100. A photoresist layer (not shown) may be applied over the inter-tier dielectric layer 180, and may be lithographically patterned to form various openings therethrough. The pattern of openings in the photoresist layer may be transferred through the first-tier material layers (132, 142, 332, 342, 170) and into the first-conductivity-type doped well 202 by a first anisotropic etch process to form the first-tier memory openings 149. Locations of steps S in the first-tier alternating stack (132, 142) are illustrated as dotted lines in FIG. 4B.

The first-tier memory openings 149 are openings that are formed in the memory array region 100 through each layer within the first-tier alternating stack (132, 142) and are subsequently used to form memory stack structures therein. The first-tier memory openings 149 may be formed in clusters of first-tier memory openings 149 that are laterally spaced apart along the second horizontal direction hd2. Each cluster of first-tier memory openings 149 may be formed as a two-dimensional array of first-tier memory openings 149.

According to an aspect of the present disclosure, the first-tier memory openings 149 can be formed in rows that laterally extend along the first horizontal direction hd1. In one embodiment, each row of first-tier memory openings 149 can be formed as a one-dimensional periodic array having a periodic center-to-center pitch along the first horizontal direction hd1 between geometrical centers of each neighboring pair of first-tier memory openings 149 within the row. In one embodiment, the first-tier memory openings 149 can be formed as two-dimensional periodic arrays of first-tier memory openings 149. In this case, the rows of first-tier memory openings 149 within a two-dimensional periodic array of first-tier memory openings 149 can have a uniform row-to-row pitch along the second horizontal direction hd2. Remaining portions of each insulating material strip 332 include insulating material platelets located between a neighboring pair of memory openings 149 within a row of memory openings 49 that are arranged along the first horizontal direction hd1.

According to an embodiment of the present disclosure, the pattern of the sacrificial material strips 342 can be selected such that each group of the sacrificial material strips 342 has a periodic pitch along the second horizontal direction hd2 that is the same as the row-to-row pitch of a group of first-tier memory openings 149 located within the same area. Further, the pattern of the sacrificial material strips 342 can be selected such that each first-tier memory opening 149 extends between, and cuts through, a neighboring pair of sacrificial material strips 342. Thus, each first-tier memory opening 149 can include a pair of sidewalls of the sacrificial material strips 342 that are laterally spaced apart along the second horizontal direction hd2. Further, each first-tier memory opening 149 can include a pair of sidewalls of an insulating material strip 332 that are laterally spaced apart along the first horizontal direction hd1.

The processing steps of the first anisotropic etch process can include etch chemistries for etching through each material in the first-tier material layers (132, 142, 332, 342, 170). The first anisotropic etch process may use, for example, a series of reactive ion etch processes or a single reaction etch process (e.g., $CF_4/O_2/Ar$ etch). The sidewalls of the first-tier memory openings 149 may be substantially vertical, or may be tapered. The photoresist layer may be subsequently removed, for example, by ashing.

Optionally, the portions of the first-tier memory openings 149 at the level of the inter-tier dielectric layer 180 may be laterally expanded by an isotropic etch. In this case, the inter-tier dielectric layer 180 may comprise a dielectric material (such as borosilicate glass) having a greater etch rate than the first-tier insulating layers 132 (that may include undoped silicate glass) in dilute hydrofluoric acid. An isotropic etch (such as a wet etch using HF) may be used to expand the lateral dimensions of the first-tier memory openings 149 at the level of the inter-tier dielectric layer 180. The portions of the first-tier memory openings 149 located at the level of the inter-tier dielectric layer 180 may be optionally widened to provide a larger landing pad for second-tier memory openings to be subsequently formed through a second-tier alternating stack (to be subsequently formed prior to formation of the second-tier memory openings).

Figure 5:
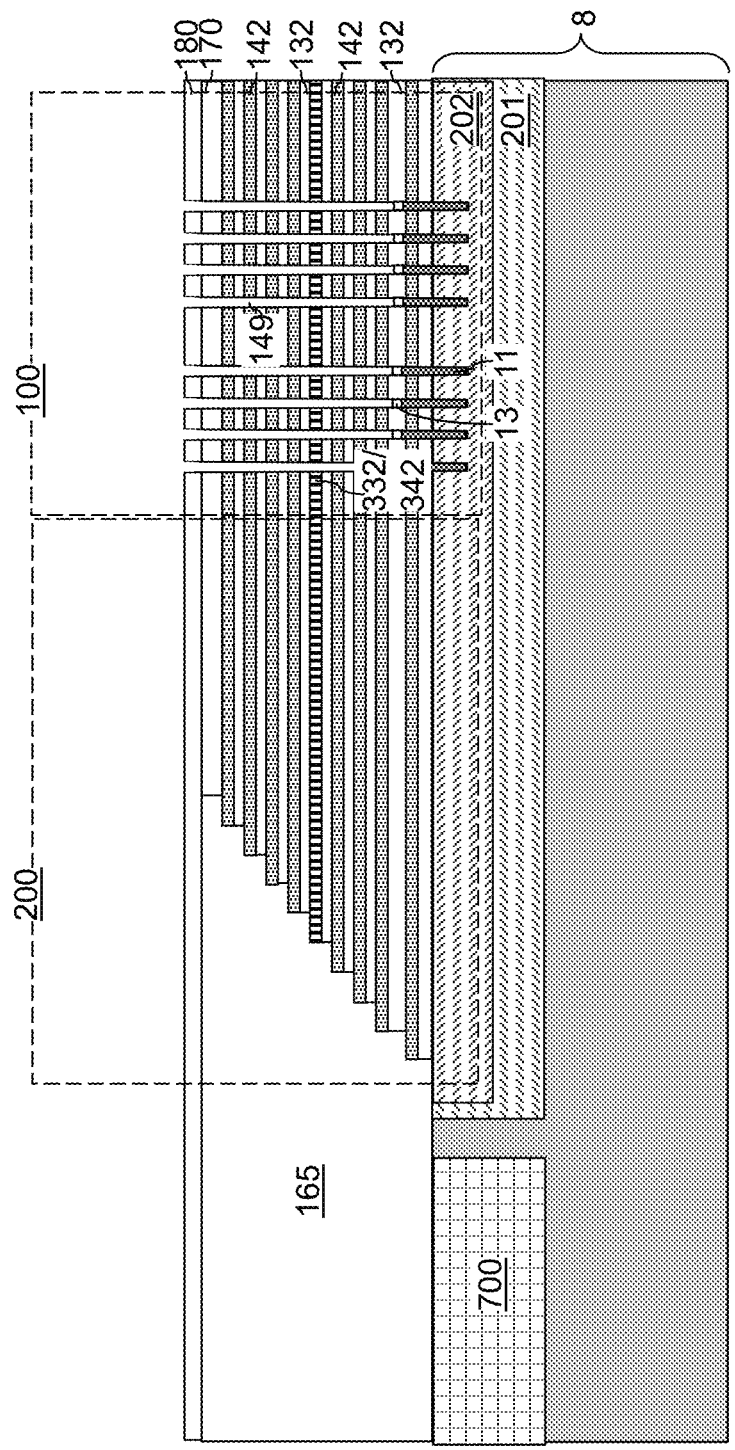
FIG. 5 is a vertical cross-sectional view of the first exemplary structure after formation of epitaxial pedestal channel portions and sacrificial semiconductor oxide plates according to the first embodiment of the present disclosure.

Referring to FIG. 5, in case the sacrificial material strips 342 include a semiconductor material, physically exposed surfaces of the sacrificial material strips 342 can be converted into semiconductor oxide surfaces. An anisotropic etch process can be performed to remove any semiconductor oxide material from the bottom surface of each first-tier memory opening 149. A selective semiconductor deposition process (such as selective epitaxy or a selective polycrystalline semiconductor deposition process) may be performed to grow a doped semiconductor material having a doping of the first conductivity type. The first exemplary structure may be placed in a vacuum-tight chemical vapor deposition (CVD) chamber, and a combination of a semiconductor precursor gas (such as silane, disilane, dichlorosilane, trichlorosilane, silicon tetrachloride, germane, or a precursor gas for a compound semiconductor material), a dopant gas including atoms of electrical dopants of the first conductivity type (which may be, for example, diborane for p-type dopants or phosphine, arsine, or stibine for n-type dopants), and an etchant gas (such as hydrogen chloride) is flowed into the CVD chamber while the first exemplary structure is at an elevated temperature. The elevated temperature may be in a range from 500 degrees Celsius to 900 degrees Celsius. An epitaxial pedestal channel portion 11 may grow from the physically exposed semiconductor surface of the first-conductivity-type doped well 202 at the bottom of each first-tier memory opening 149.

In one embodiment, top surfaces of the epitaxial pedestal channel portions 11 may be formed above a horizontal plane including the top surface of a bottommost first-tier sacrificial material layer 142. In this case, a source select gate electrode may be subsequently formed by replacing the bottommost first-tier sacrificial material layer 142 with a conductive material layer. The epitaxial pedestal channel portion 11 may be a portion of a transistor channel that extends between a source region to be subsequently formed in the first-conductivity-type doped well 202 and a drain region to be subsequently formed at an upper end of each epitaxial semiconductor channel. In one embodiment, the epitaxial pedestal channel portion 11 may have a doping of the first conductivity type, which is the same as the conductivity type of the first-conductivity-type doped well 202. The epitaxial pedestal channel portions 11 may include electrical dopants of the first conductivity type at an atomic concentration in a range from $1.0 \times 10^{14}/cm^3$ to $1.0 \times 10^{18}/cm^3$, although lesser and greater atomic concentrations may also be used.

An oxidation process may be performed to convert upper surface regions of the epitaxial pedestal channel portions 11 into semiconductor oxide plates 13. A thermal oxidation process or a plasma oxidation process may be used to convert the upper surface regions of the epitaxial pedestal channel portions 11 into the semiconductor oxide plates 13. Each semiconductor oxide plate 13 may have a vertical thickness in a range from 3 nm to 10 nm, such as from 4 nm to 8 nm, although lesser and greater thicknesses may also be used. The semiconductor oxide plates 13 may be formed within each of the first-tier memory openings 149, and may contact sidewalls of the first-tier insulating layer 132 that contacts a top surface of the bottommost one of the first-tier sacrificial material layers 142. In other words, the semiconductor oxide plates 13 may contact sidewalls of a second bottommost one of the first-tier insulating layers 132. In one embodiment, the semiconductor oxide plates 13 may consist essentially of silicon oxide.

Figure 6:
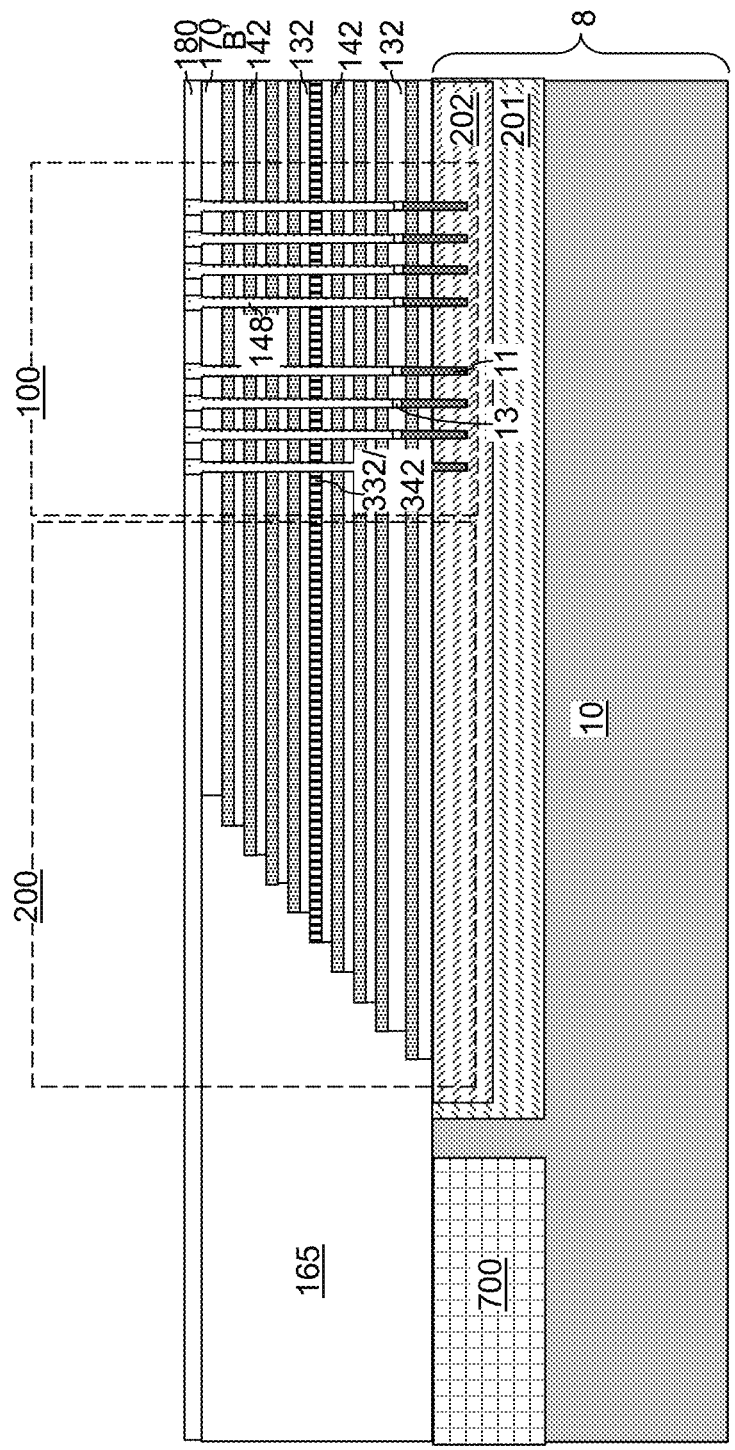
FIG. 6 is a vertical cross-sectional view of the first exemplary structure after formation of various sacrificial fill structures according to the first embodiment of the present disclosure.

Referring to FIG. 6, sacrificial first-tier memory opening fill portions 148 may be formed in the first-tier memory openings 149 directly on, and over, the semiconductor oxide plates 13. For example, a sacrificial first-tier fill material is deposited concurrently deposited in each of the first-tier memory openings 149. The sacrificial first-tier fill material includes a material that may be subsequently removed selective to the materials of the first-tier insulating layers 132 and the first-tier sacrificial material layers 142. A subset of the semiconductor oxide plates 13 provided in the staircase region 200 may be used as etch stop structures in a subsequent etch process.

In one embodiment, the sacrificial first-tier fill material may include a semiconductor material such as silicon (e.g., a-Si or polysilicon), a silicon-germanium alloy, germanium, a III-V compound semiconductor material, or a combination thereof. In one embodiment, the sacrificial first-tier fill material may include amorphous silicon or a carbon-containing material (such as amorphous carbon or diamond-like carbon) that may be subsequently removed by ashing, or a silicon-based polymer that may be subsequently removed selective to the materials of the first-tier insulating layers 132 and first-tier sacrificial material layers 142.

Excess portions of the deposited sacrificial first-tier fill material may be removed from above the inter-tier dielectric layer 180. For example, the sacrificial first-tier fill material may be recessed to a top surface of the inter-tier dielectric layer 180 using a planarization process. The planarization process may include a recess etch, chemical mechanical planarization (CMP), or a combination thereof. The top surface of the inter-tier dielectric layer 180 may be used as an etch stop layer or a planarization stop layer.

Each remaining portion of the sacrificial material in a first-tier memory opening 149 constitutes a sacrificial first-tier memory opening fill portion 148. The top surfaces of the sacrificial first-tier memory opening fill portions 148 may be coplanar with the top surface of the inter-tier dielectric layer 180. Each of the sacrificial first-tier memory opening fill portions 148 may, or may not, include cavities therein.

Figure 7:
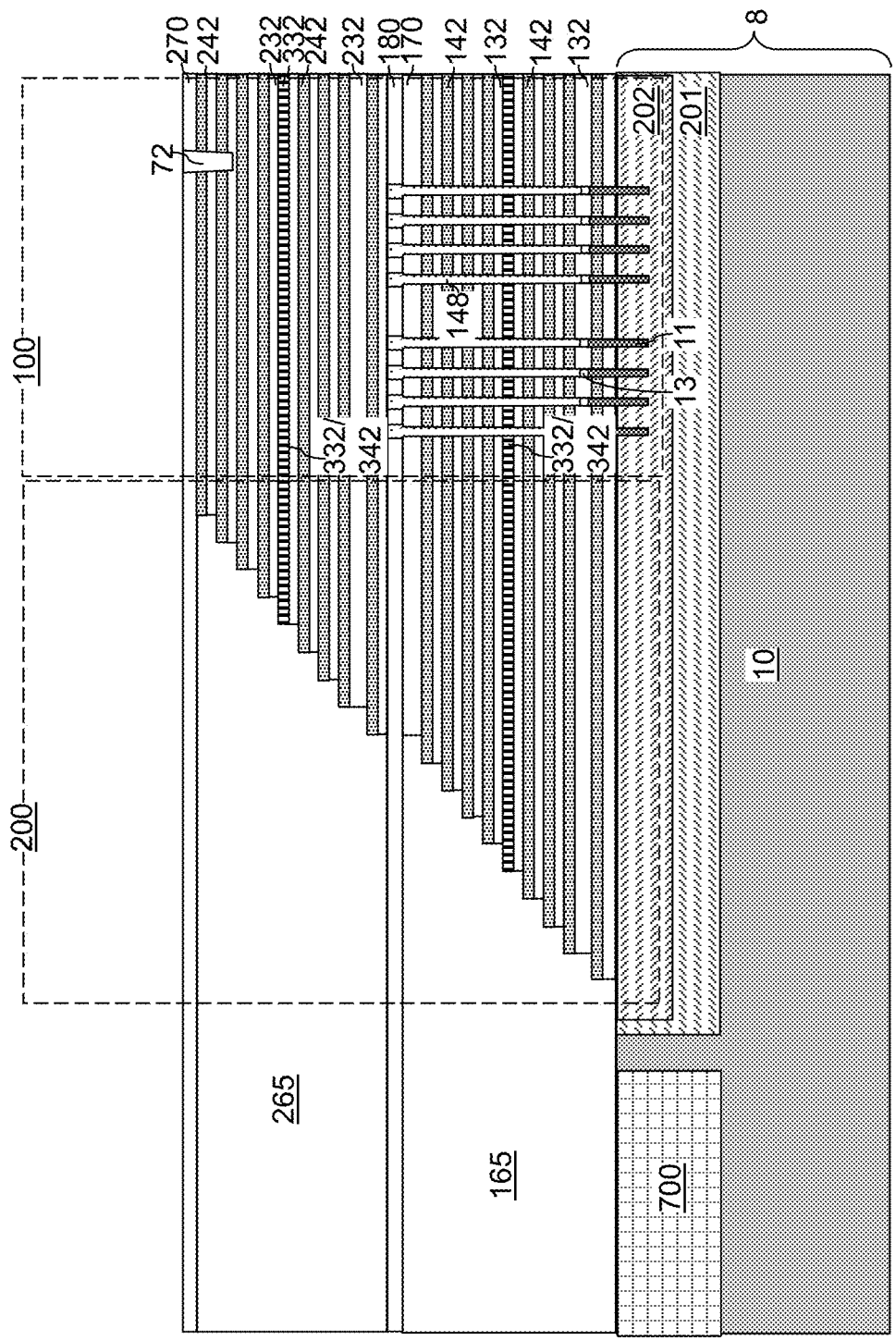
FIG. 7 is a vertical cross-sectional view of the first exemplary structure after formation of two alternating stacks of second-tier insulating layers and second-tier sacrificial material layers with another laterally alternating sequence of insulating material strips and sacrificial material strips therebetween, second-tier stepped surfaces, a second retro-stepped dielectric material portion, and a second-tier insulating cap layer according to the first embodiment of the present disclosure.

Referring to FIG. 7, the processing steps of FIGS. 1A and 1B and 2 can be repeated to form a third alternating sequence of second-tier insulating layers 232 and second-tier sacrificial material layers 242, a second laterally alternating sequence of insulating material strips 332 and sacrificial material strips 342, and a fourth alternating sequence of second-tier insulating layers 232 and second-tier sacrificial material layers 242. The second-tier insulating layers 232 can have the same material composition and the same thickness as the first-tier insulating layers 132. The second-tier sacrificial material layers 242 can have the same material composition and the same thickness as the second-tier sacrificial material layers 242. The number of repetitions of the pairs of a second-tier insulating layer 232 and a second-tier sacrificial material layer 242 in the third alternating stack (232, 242) or in the fourth alternating stack (232, 242) may be in a range from 2 to 256, and typically from 8 to 64. although a greater number of repetitions may also be used. The second laterally alternating sequence of insulating material strips 332 and sacrificial material strips 342 can have the same pattern, the same thickness, and the same material compositions, as the first laterally alternating sequence of insulating material strips 332 and sacrificial material strips 342.

The processing steps of FIG. 3 can be performed to pattern the layer stack including the alternating stacks (232, 242) of the second-tier insulating layers 232 and second-tier sacrificial material layers 242 and a layer including the second laterally alternating sequence of insulating material strips 332 and sacrificial material strips 342, thereby forming second stepped surfaces thereupon. A dielectric material can be deposited and planarized to form a second retro-stepped dielectric material portion 265.

A second-tier insulating cap layer 270 may be subsequently formed over the alternating stacks (232, 242) of the second-tier insulating layers 232 and second-tier sacrificial material layers 242. The second-tier insulating cap layer 270 includes a dielectric material that is different from the material of the second-tier sacrificial material layers 242. In one embodiment, the second-tier insulating cap layer 270 may include silicon oxide.

Optionally, drain-select-level isolation structures 72 may be formed through a subset of layers in an upper portion of the fourth alternating stack (232, 242). The second-tier sacrificial material layers 242 that are cut by the drain-select-level isolation structures 72 correspond to the levels in which drain-select-level electrically conductive layers are subsequently formed. The drain-select-level isolation structures 72 include a dielectric material such as silicon oxide. The drain-select-level isolation structures 72 may laterally extend along a first horizontal direction hd1, and may be laterally spaced apart along a second horizontal direction hd2 that is perpendicular to the first horizontal direction hd1.

The layers within the second-tier insulating cap layer 270, the alternating stacks (232, 242) of the second-tier insulating layers 232 and second-tier sacrificial material layers 342, and a layer including the second laterally alternating sequence of insulating material strips 332 and sacrificial material strips 342 are collectively referred to as second-tier material layers (232, 242, 332, 342, 270). The combination of the second-tier material layers (232, 242, 332, 342, 270), the second stepped dielectric material portion 265, and the optional drain-select-level isolation structures 72 collectively constitute a second-tier structure (232, 242, 332, 342, 270, 265, 72).

Figure 8A:
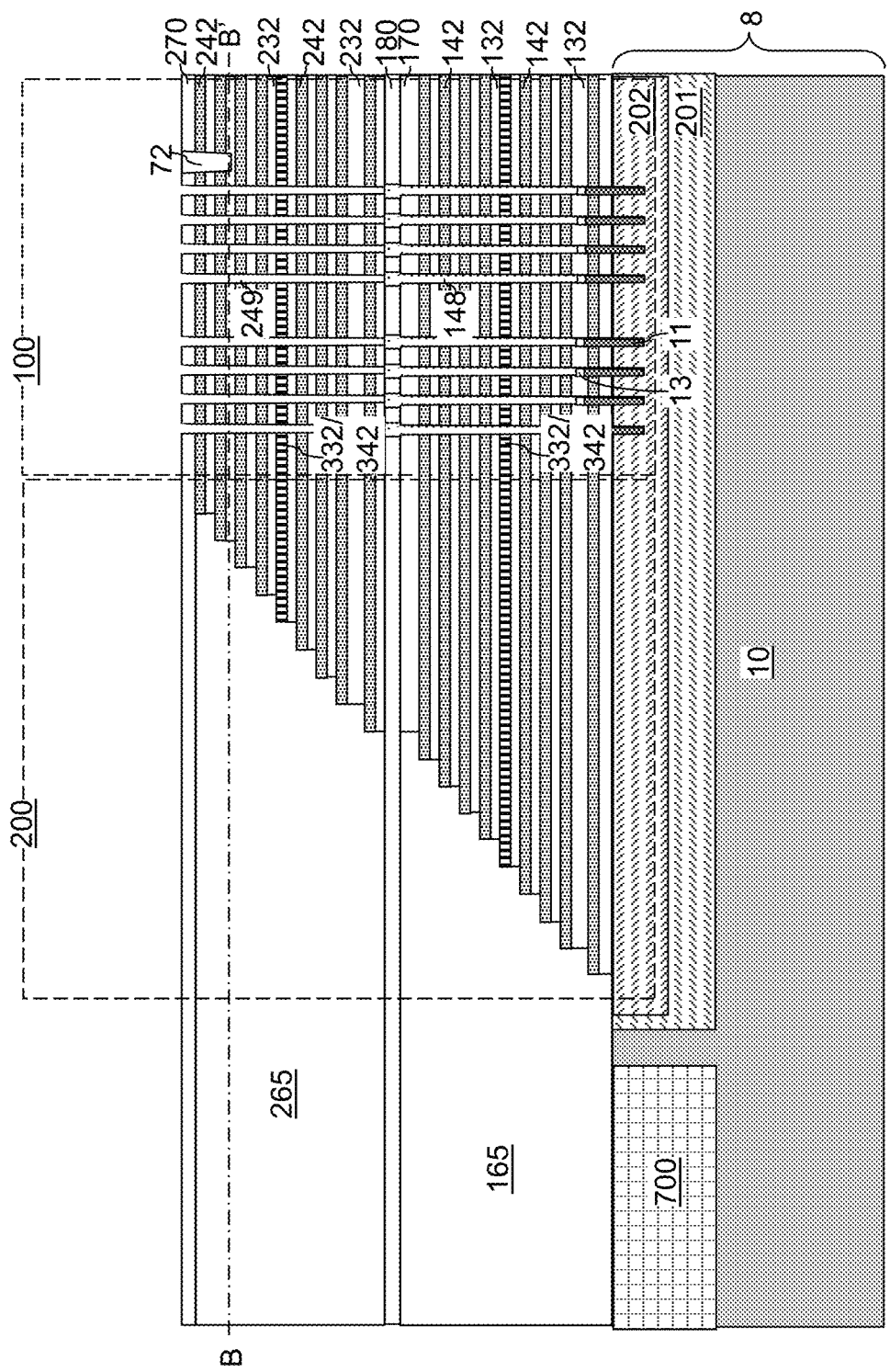
FIG. 8A is a vertical cross-sectional view of the first exemplary structure after formation of second-tier memory openings according to the first embodiment of the present disclosure.
Figure 8B:
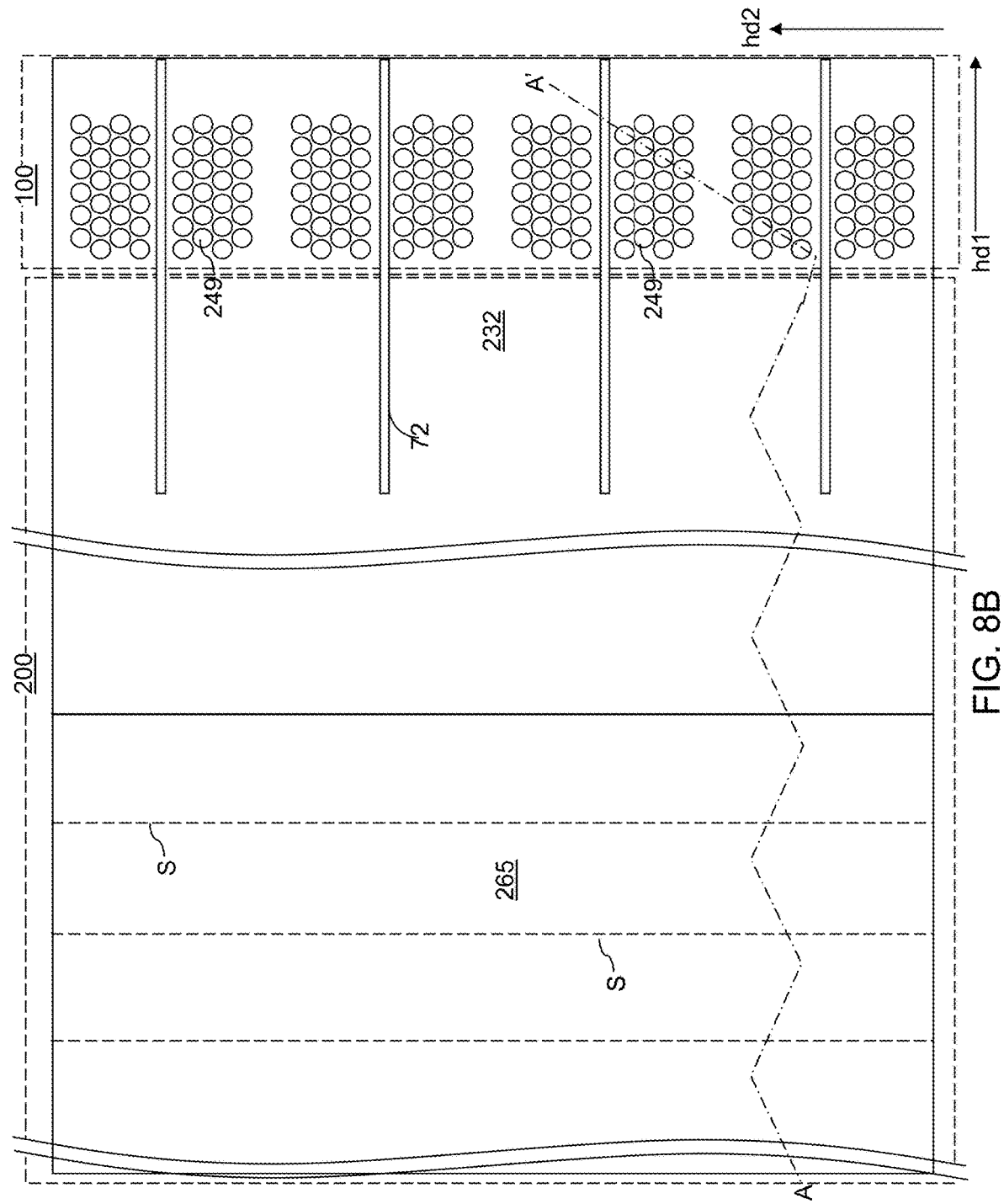
FIG. 8B is a horizontal cross-sectional view of the first exemplary structure along the horizontal plane B-B' of FIG. 8A. The hinged vertical plane A-A' corresponds to the plane of the vertical cross-sectional view of FIG. 8A.
Figure 9D:
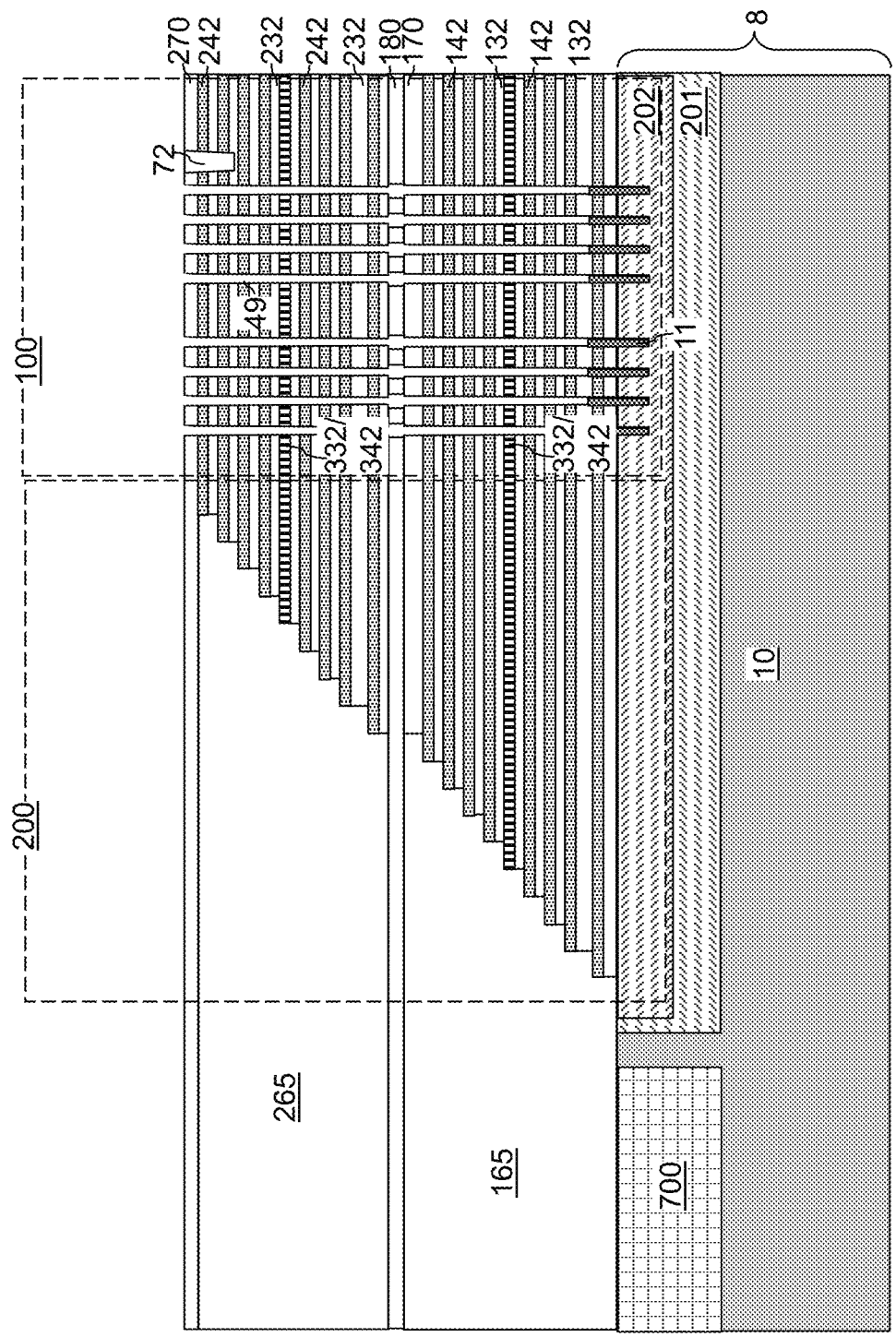
FIG. 9D is a vertical cross-sectional view of the first exemplary structure at the processing steps of FIGS. 9A-9C.
Figures 10A, 10B, 10C:
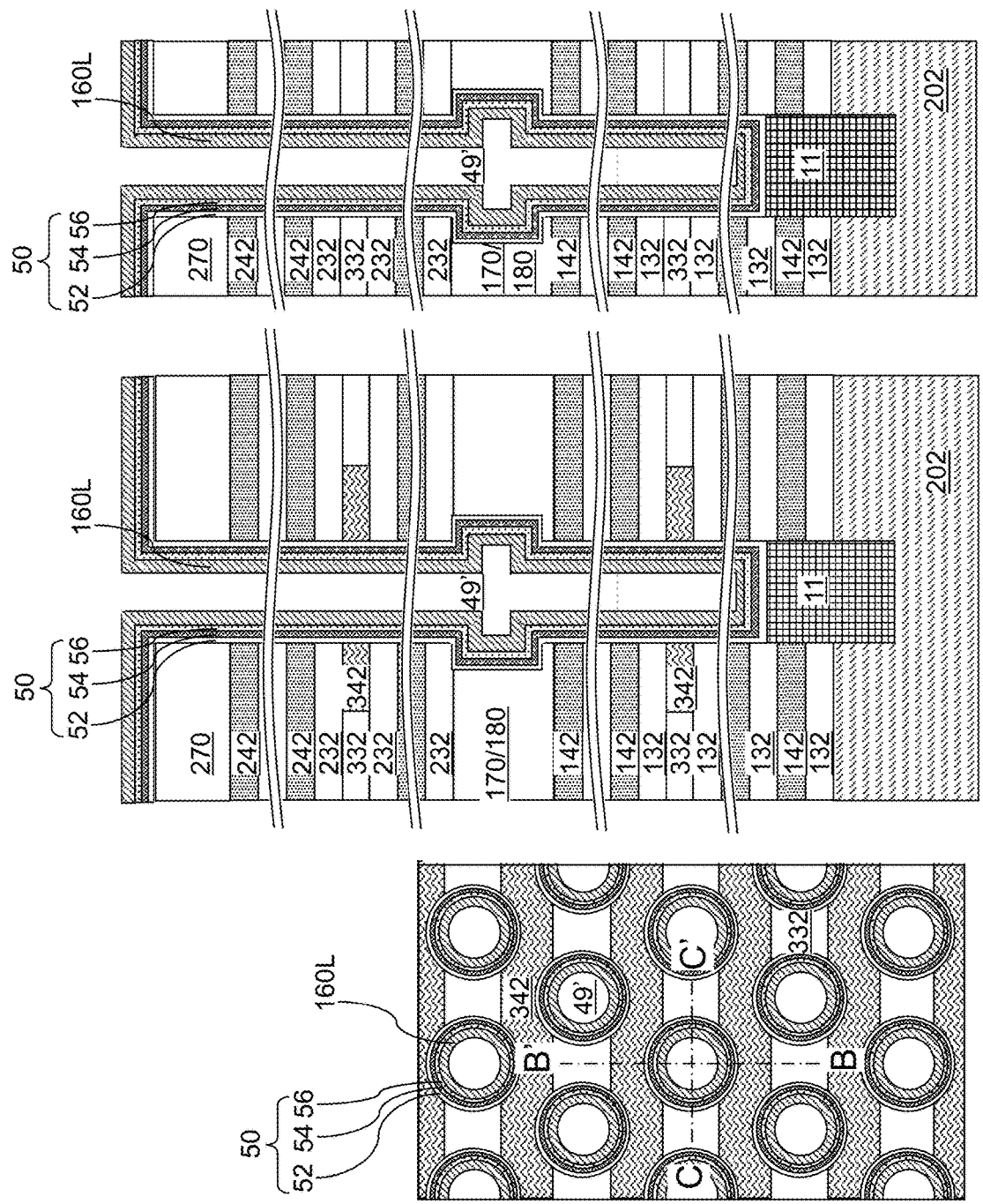
FIG. 10A is a horizontal cross-sectional view of a region of the first exemplary structure at the level of the laterally alternating sequence of insulating material strips and sacrificial material strips after formation of continuous memory film stack and a continuous sacrificial spacer material layer according to the first embodiment of the present disclosure.
FIG. 10B is a vertical cross-sectional view along the vertical plane B-B' of FIG. 10A. The horizontal cross-sectional plane A-A' is the plane of the horizontal cross-sectional view of FIG. 10A.
FIG. 10C is a vertical cross-sectional view along the vertical plane C-C' of FIG. 10A. The horizontal cross-sectional plane A-A' is the plane of the horizontal cross-sectional view of FIG. 10A.
Figure 10D:
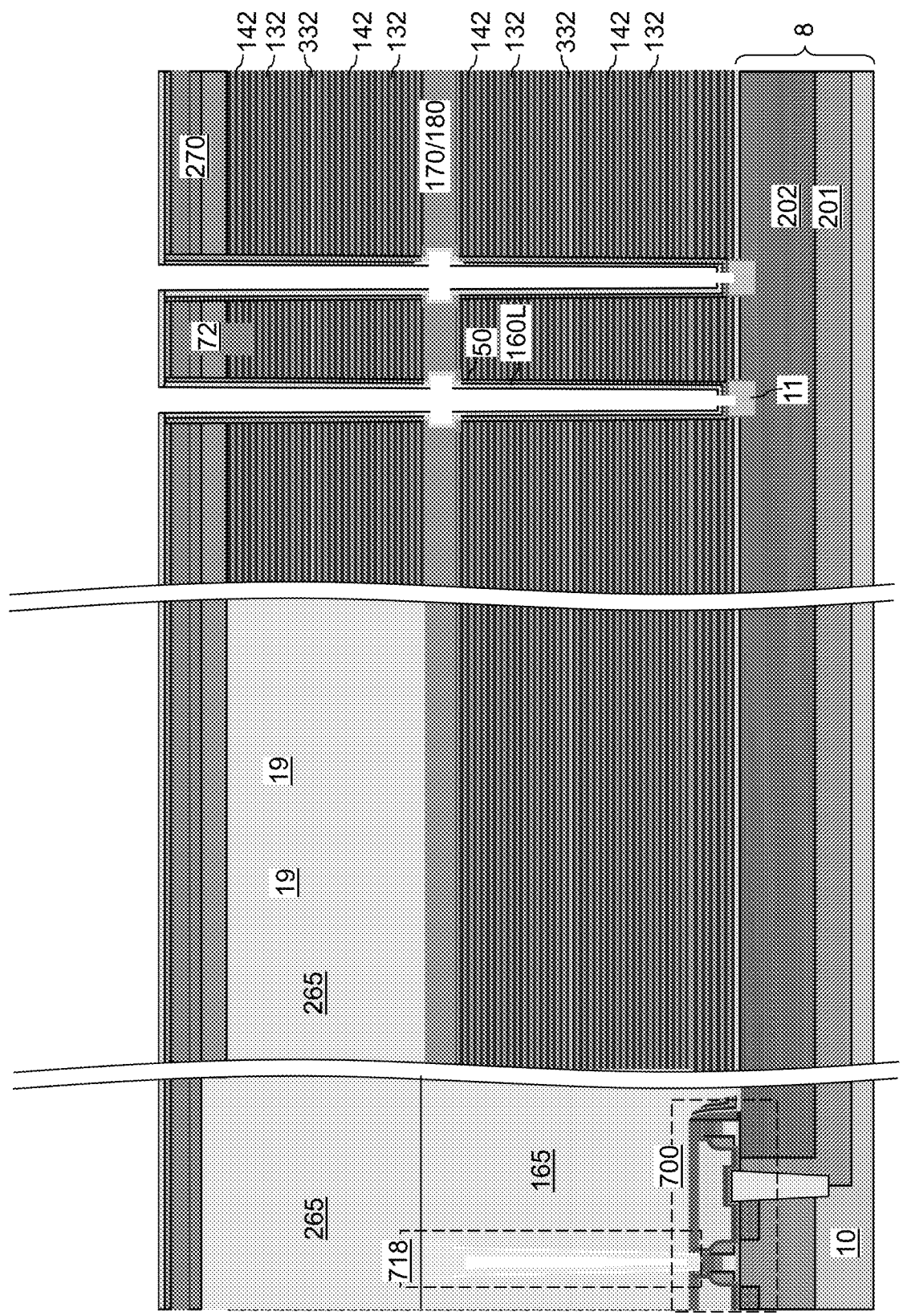
FIG. 10D is a vertical cross-sectional view of the first exemplary structure at the processing steps of FIGS. 10A-10C.
Figure 11D:
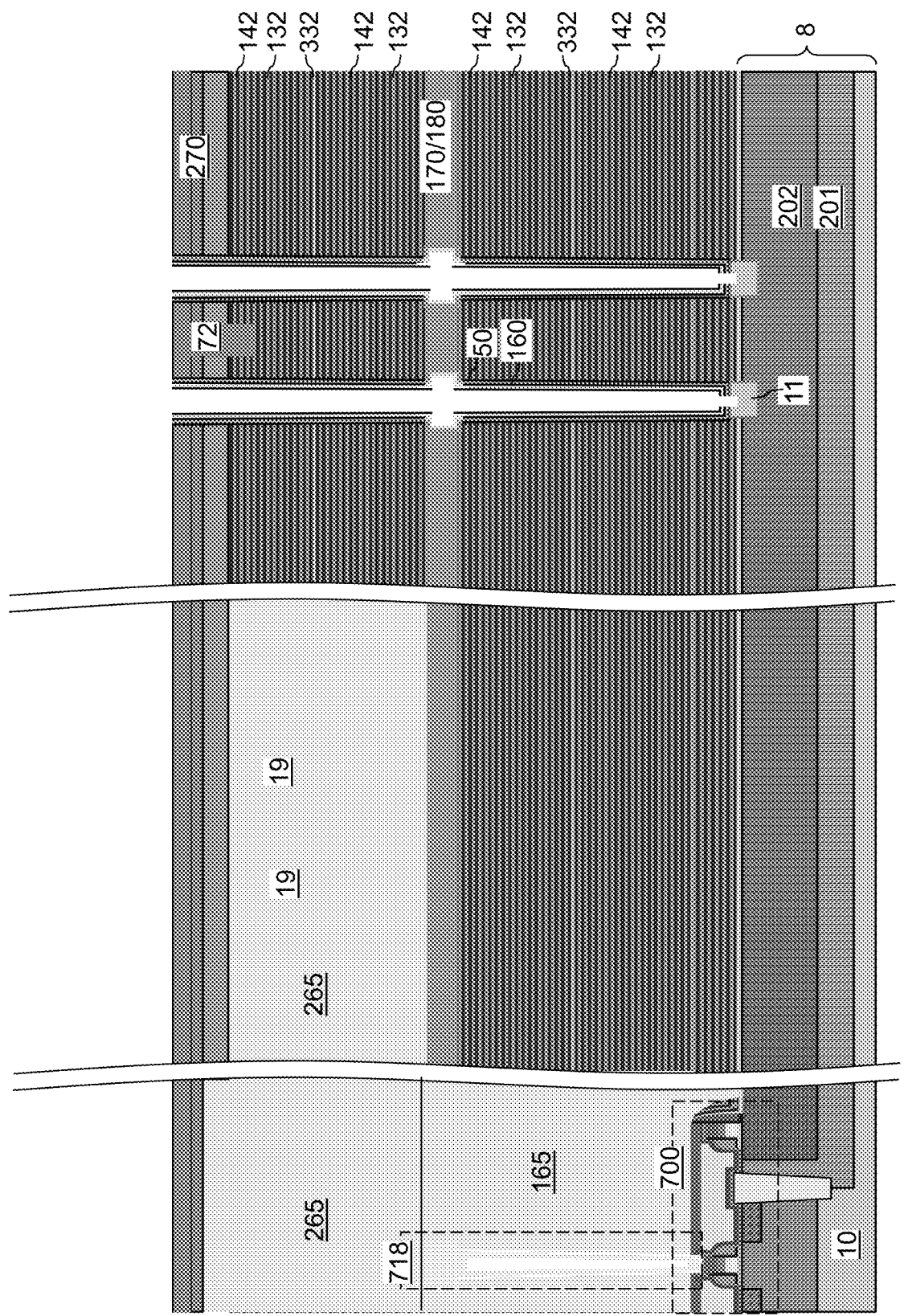
FIG. 11D is a vertical cross-sectional view of the alternative embodiment of the first exemplary structure at the processing steps of FIGS. 11A-11C.

Referring to FIGS. 8A and 8B, second-tier memory openings 249 may be formed through the second-tier structure (232, 242, 332, 342, 270, 265, 72). For example, a photoresist layer (not shown) may be applied over the second-tier insulating cap layer 270, and may be lithographically patterned to form openings therethrough. The pattern of the openings may be the same as the pattern of the first-tier memory openings 149, which is the same as the sacrificial first-tier memory opening fill portions 148. Thus, the lithographic mask used to pattern the first-tier memory openings 149 may be used to pattern the photoresist layer.

The pattern of openings in the photoresist layer may be transferred through the second-tier structure (232, 242, 332, 342, 270, 265, 72) by a second anisotropic etch process to form second-tier memory openings 249. The second-tier memory openings 249 are formed directly on a top surface of a respective one of the sacrificial first-tier memory opening fill portions 148.

The second anisotropic etch process include etch steps for etching the materials of the second-tier material layers (232, 242, 332, 342, 270). The second anisotropic etch process may use, for example, a series of reactive ion etch processes or a single reaction etch process (e.g., $CF_4/O_2/Ar$ etch). The sidewalls of the second-tier memory openings 249 may be substantially vertical, or may be tapered. A bottom periphery of each second-tier memory openings 249 may be laterally offset, and/or may be located entirely within, a periphery of a top surface of an underlying sacrificial first-tier memory opening fill portion 148. Each second-tier memory opening 149 can include a pair of sidewalls of the sacrificial material strips 342 that are laterally spaced apart along the second horizontal direction hd2. Each second-tier memory opening 149 can include a pair of sidewalls of an insulating material strip 332 that are laterally spaced apart along the first horizontal direction hd1. Remaining portions of each insulating material strip 332 include insulating material platelets located between a neighboring pair of memory openings 249 within a row of memory openings 249 that are arranged along the first horizontal direction hd1. The photoresist layer may be subsequently removed, for example, by ashing.

Referring to FIGS. 9A-9D, the sacrificial first-tier fill material of the sacrificial first-tier memory opening fill portions 148 may be removed using an etch process that etches the sacrificial first-tier fill material selective to the materials of the insulating layers (132, 232), the sacrificial material layers (142, 242), the insulating cap layers (170, 270), the inter-tier dielectric layer 180, and the semiconductor oxide plates 13. In an illustrative example, if the sacrificial first-tier memory opening fill portions 148 include amorphous carbon, the sacrificial first-tier memory opening fill portions 148 may be removed by an ashing process. If the sacrificial first-tier memory opening fill portions 148 include amorphous silicon, the sacrificial first-tier memory opening fill portions 148 may be removed by a wet etch process using hot trimethyl-2 hydroxyethyl ammonium hydroxide ("hot TMY") or tetramethyl ammonium hydroxide (TMAH). Subsequently, the semiconductor oxide plates 13 can be removed by an etch process, which may use an isotropic etch process or an anisotropic etch process. For example, a wet etch using dilute hydrofluoric acid may be used to remove the semiconductor oxide plates 13.

Each vertical stack of a volume of a first-tier memory opening 149 and a second-tier memory opening 249 constitutes a memory opening 49, which is also referred to as an inter-tier memory opening 49. A bottom portion of each memory opening 49 is filled within an epitaxial pedestal channel portion 11.

Generally, a first alternating stack of first insulating layers (such as first-tier insulating layers 132 or second-tier insulating layers 232) and first sacrificial material layers (such as first-tier sacrificial material layers 142 or second-tier sacrificial material layers 242) are formed over the substrate 8. A laterally alternating sequence of insulating material strips 332 and sacrificial material strips 342 is formed over the first alternating stack. A second alternating stack of second insulating layers (such as first-tier insulating layers 132 or second-tier insulating layers 232) and second sacrificial material layers (such as first-tier sacrificial material layers 142 or second-tier sacrificial material layers 242) are formed over the laterally alternating sequence. A memory opening 19 is formed at least through the second alternating stack, the laterally alternating sequence, and the first alternating stack.

In one embodiment, each inter-tier memory opening 49 can include a pair of sidewalls of the sacrificial material strips 342 that are laterally spaced apart along the second horizontal direction hd2 at each level that includes a laterally alternating sequence of insulating material strips 332 and sacrificial material strips 342. Further, each inter-tier memory opening 49 can include a pair of sidewalls of an insulating material strip 332 that are laterally spaced apart along the first horizontal direction hd1 at each level that includes a laterally alternating sequence of insulating material strips 332 and sacrificial material strips 342.

Referring to FIGS. 10A-10D, a stack of layers including a blocking dielectric layer 52, a charge storage layer 54, a tunneling dielectric layer 56, and a continuous sacrificial spacer material layer 160L may be sequentially deposited in each of the memory openings 49. The blocking dielectric layer 52 may include a single dielectric material layer or a stack of a plurality of dielectric material layers. In one embodiment, the blocking dielectric layer may include a dielectric metal oxide layer consisting essentially of a dielectric metal oxide. As used herein, a dielectric metal oxide refers to a dielectric material that includes at least one metallic element and at least oxygen. The dielectric metal oxide may consist essentially of the at least one metallic element and oxygen, or may consist essentially of the at least one metallic element, oxygen, and at least one non-metallic element such as nitrogen. In one embodiment, the blocking dielectric layer 52 may include a dielectric metal oxide having a dielectric constant greater than 7.9, i.e., having a dielectric constant greater than the dielectric constant of silicon nitride. The thickness of the dielectric metal oxide layer may be in a range from 1 nm to 20 nm, although lesser and greater thicknesses may also be used. The dielectric metal oxide layer may subsequently function as a dielectric material portion that blocks leakage of stored electrical charges to control gate electrodes. In one embodiment, the blocking dielectric layer 52 includes aluminum oxide. Alternatively or additionally, the blocking dielectric layer 52 may include a dielectric semiconductor compound such as silicon oxide, silicon oxynitride, silicon nitride, or a combination thereof.

Subsequently, the charge storage layer 54 may be formed. In one embodiment, the charge storage layer 54 may be a continuous layer or patterned discrete portions of a charge trapping material including a dielectric charge trapping material, which may be, for example, silicon nitride. Alternatively, the charge storage layer 54 may include a continuous layer or patterned discrete portions of a conductive material such as doped polysilicon or a metallic material that is patterned into multiple electrically isolated portions (e.g., floating gates), for example, by being formed within lateral recesses into sacrificial material layers (142, 242). In one embodiment, the charge storage layer 54 includes a silicon nitride layer. In one embodiment, the sacrificial material layers (142, 242) and the insulating layers (132, 232) may have vertically coincident sidewalls, and the charge storage layer 54 may be formed as a single continuous layer.

Alternatively, the sacrificial material layers (142, 242) may be laterally recessed with respect to the sidewalls of the insulating layers (132, 232), and a combination of a deposition process and an anisotropic etch process may be used to form the charge storage layer 54 as a plurality of memory material portions that are vertically spaced apart. The thickness of the charge storage layer 54 may be in a range from 2 nm to 20 nm, although lesser and greater thicknesses may also be used.

The tunneling dielectric layer 56 includes a dielectric material through which charge tunneling may be performed under suitable electrical bias conditions. The charge tunneling may be performed through hot-carrier injection or by Fowler-Nordheim tunneling induced charge transfer depending on the mode of operation of the monolithic three-dimensional NAND string memory device to be formed. The tunneling dielectric layer 56 may include silicon oxide, silicon nitride, silicon oxynitride, dielectric metal oxides (such as aluminum oxide and hafnium oxide), dielectric metal oxynitride, dielectric metal silicates, alloys thereof, and/or combinations thereof. In one embodiment, the tunneling dielectric layer 56 may include a stack of a first silicon oxide layer, a silicon oxynitride layer, and a second silicon oxide layer, which is commonly known as an ONO stack. In one embodiment, the tunneling dielectric layer 56 may include a silicon oxide layer that is substantially free of carbon or a silicon oxynitride layer that is substantially free of carbon. The thickness of the tunneling dielectric layer 56 may be in a range from 2 nm to 20 nm, although lesser and greater thicknesses may also be used.

The layer stack of the blocking dielectric layer 52, the charge storage layer 54, and the tunneling dielectric layer 56 constitutes a memory film 50. The continuous sacrificial spacer material layer 160L is deposited on the memory film 50. The continuous sacrificial spacer material layer 160L includes a material that can be removed selective to the materials of the memory film 50. For example, the continuous sacrificial spacer material layer 160L can include amorphous silicon, a silicon-germanium alloy, or amorphous carbon. The continuous sacrificial spacer material layer 160L may be formed by a conformal deposition method such as low pressure chemical vapor deposition (LPCVD). The thickness of the continuous sacrificial spacer material layer 160L may be in a range from 2 nm to 10 nm, although lesser and greater thicknesses may also be used. A memory cavity 49' is present within each volume of the memory openings 49 that is not filled with the deposited material layers (52, 54, 56, 160L).

In one embodiment, sacrificial contact via structures 718 may be optionally formed after formation of the first retro-stepped dielectric material portion 165 and prior to formation of the second-tier material layers (232, 242, 332, 342, 270). The sacrificial contact via structures 718 can be formed by forming a contact via cavity through the first retro-stepped dielectric material portion 165 on the peripheral semiconductor devices 700 (such as field effect transistors), and by filling the contact via cavity with a sacrificial material such as amorphous silicon.

Referring to FIGS. 11A-11D, an anisotropic etch that etches the materials of the continuous sacrificial spacer material layer 160L and the memory film 50 can be performed to remove horizontal portions of the continuous sacrificial spacer material layer 160L and the memory film 50. The continuous sacrificial spacer material layer 160L and the memory film 50 are removed from above the second-tier insulating cap layer 270 and at the bottom of each memory opening 49. A top surface of an epitaxial pedestal channel portion 11 is physically exposed at the bottom of each memory cavity 49'. Each remaining portion of the continuous sacrificial spacer material layer 160L is herein referred to as a sacrificial conformal spacer 160. A set of all material portions within a memory opening 49 is herein referred to as an in-process memory opening fill structure 158, which can include an epitaxial pedestal channel portion 11, a memory film 50, and a sacrificial conformal spacer 160.

Figure 12A:
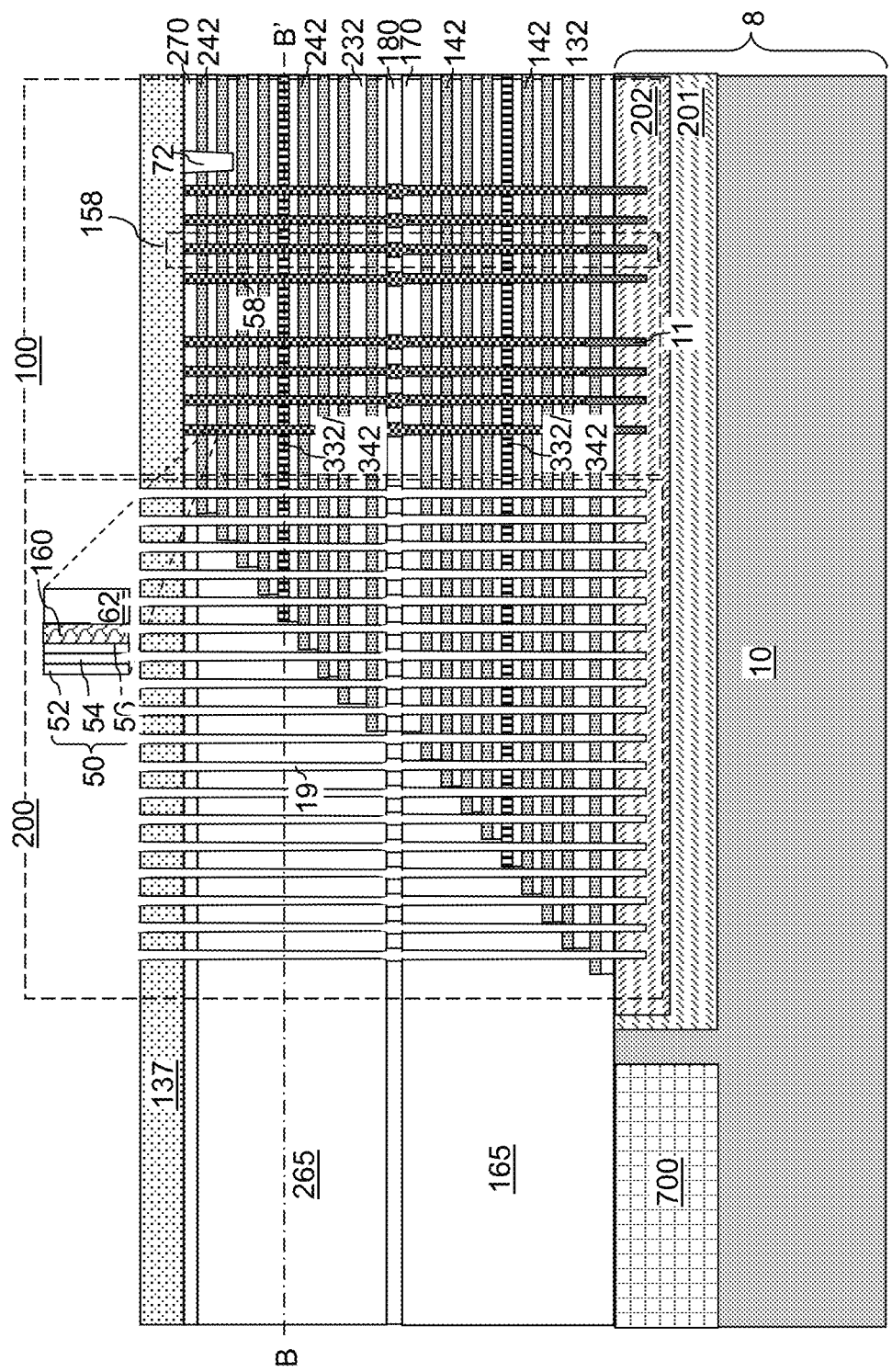
FIG. 12A is a vertical cross-sectional view of the first exemplary structure after covering the memory openings with a sacrificial cover material and formation of support openings according to the first embodiment of the present disclosure.
Figure 12B:
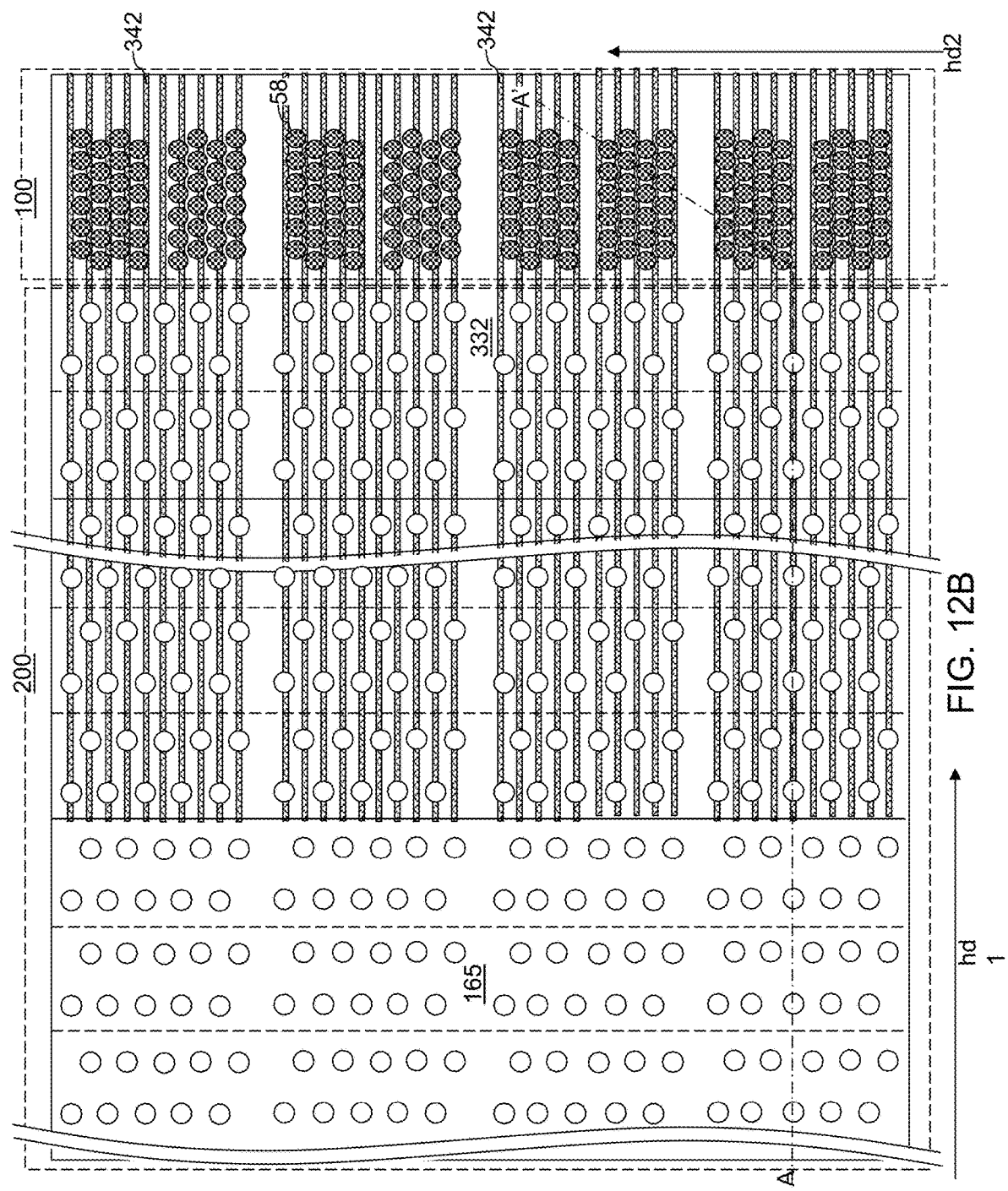
FIG. 12B is a horizontal cross-sectional view of the first exemplary structure along the horizontal plane B-B' of FIG. 12A. The hinged vertical plane A-A' corresponds to the plane of the vertical cross-sectional view of FIG. 12A.
Figure 12C:
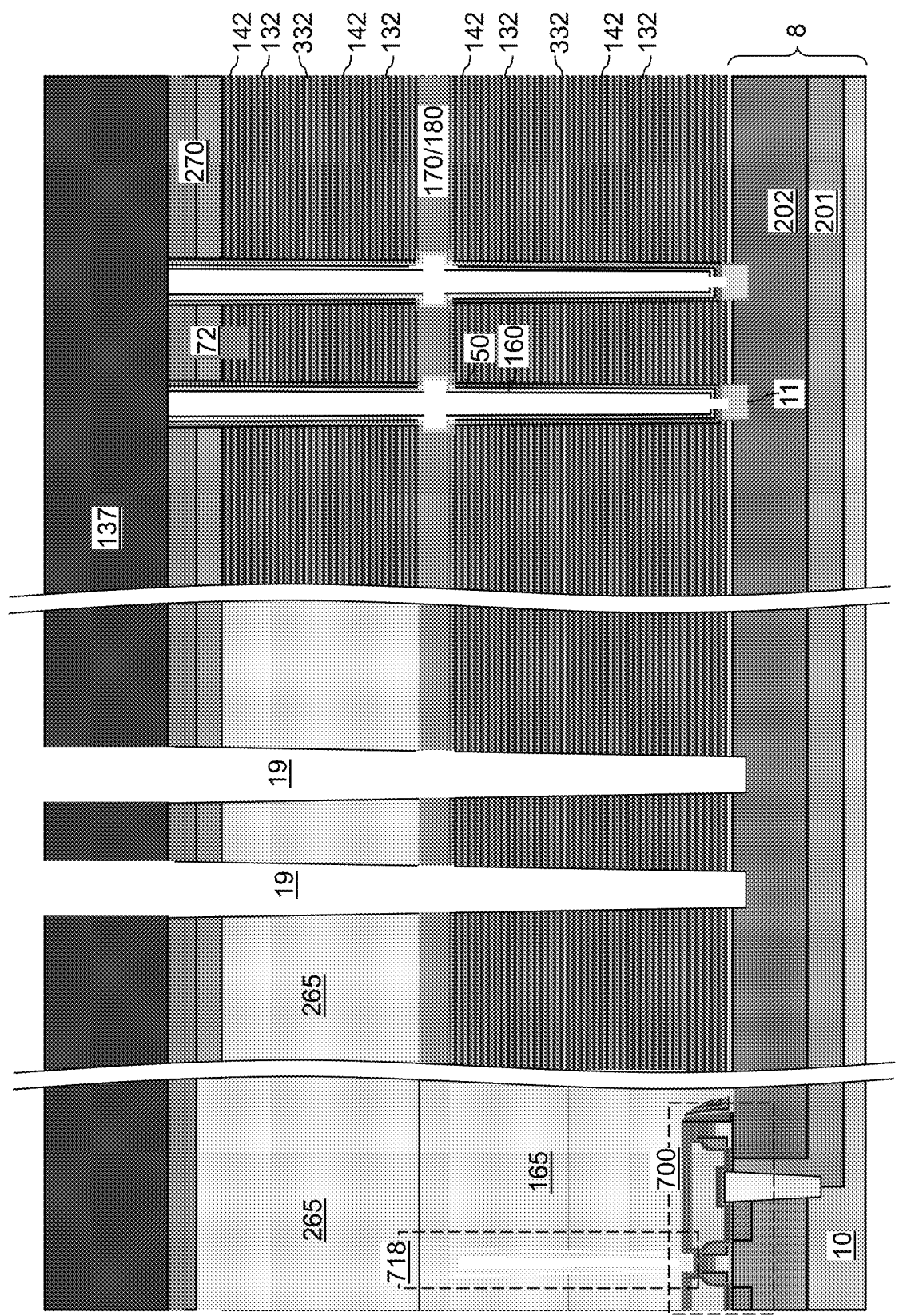
FIG. 12C is a vertical cross-sectional view of the alternative embodiment of the first exemplary structure at the processing steps of FIGS. 12A and 12B.
Figure 13A:
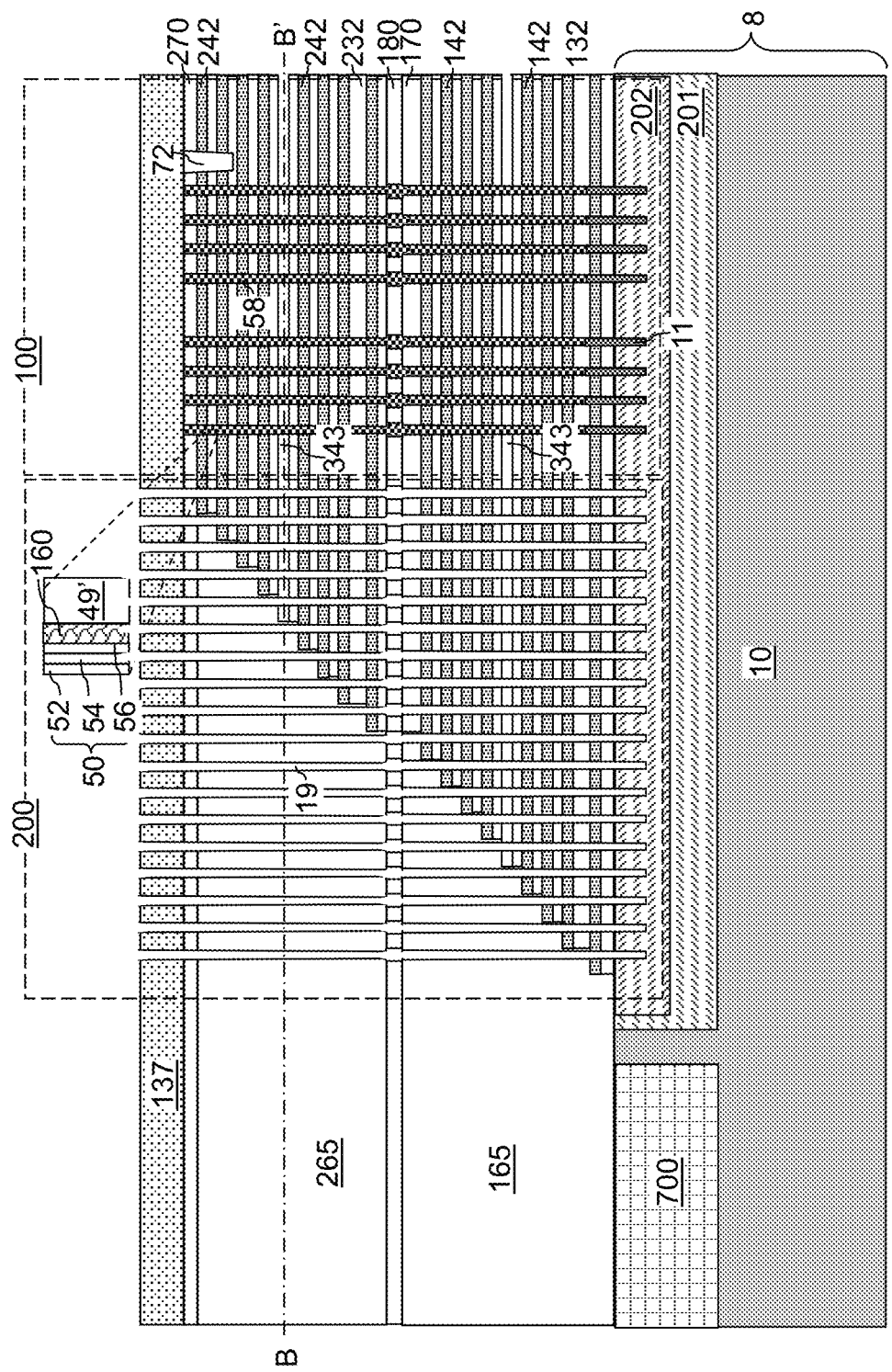
FIG. 13A is a vertical cross-sectional view of the first exemplary structure after formation of laterally-extending cavities by selective removal of sacrificial material strips according to the first embodiment of the present disclosure.
Figure 13B:
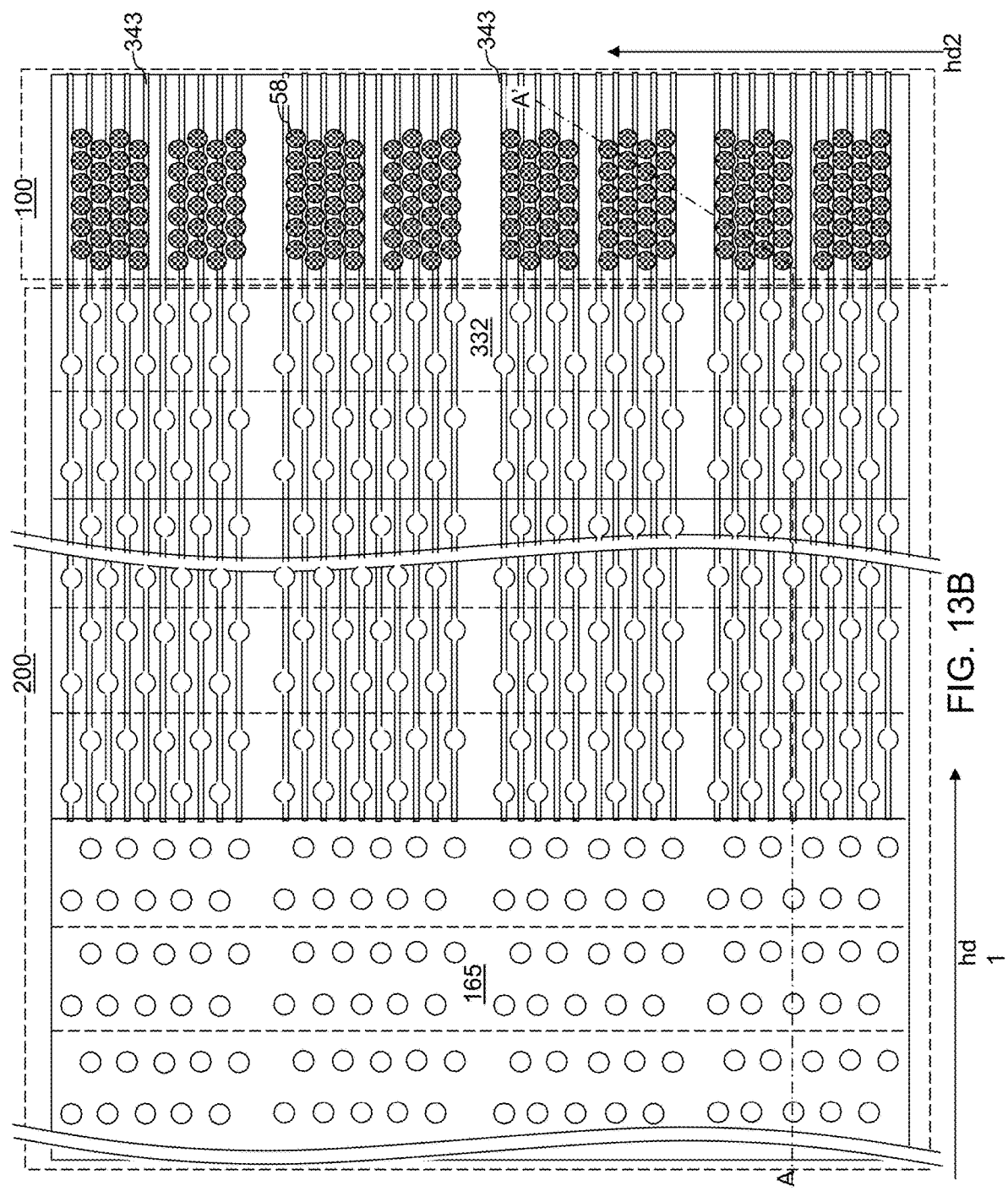
FIG. 13B is a horizontal cross-sectional view of the first exemplary structure along the horizontal plane B-B' of FIG. 13A. The hinged vertical plane A-A' corresponds to the plane of the vertical cross-sectional view of FIG. 13A.
Figure 13C:
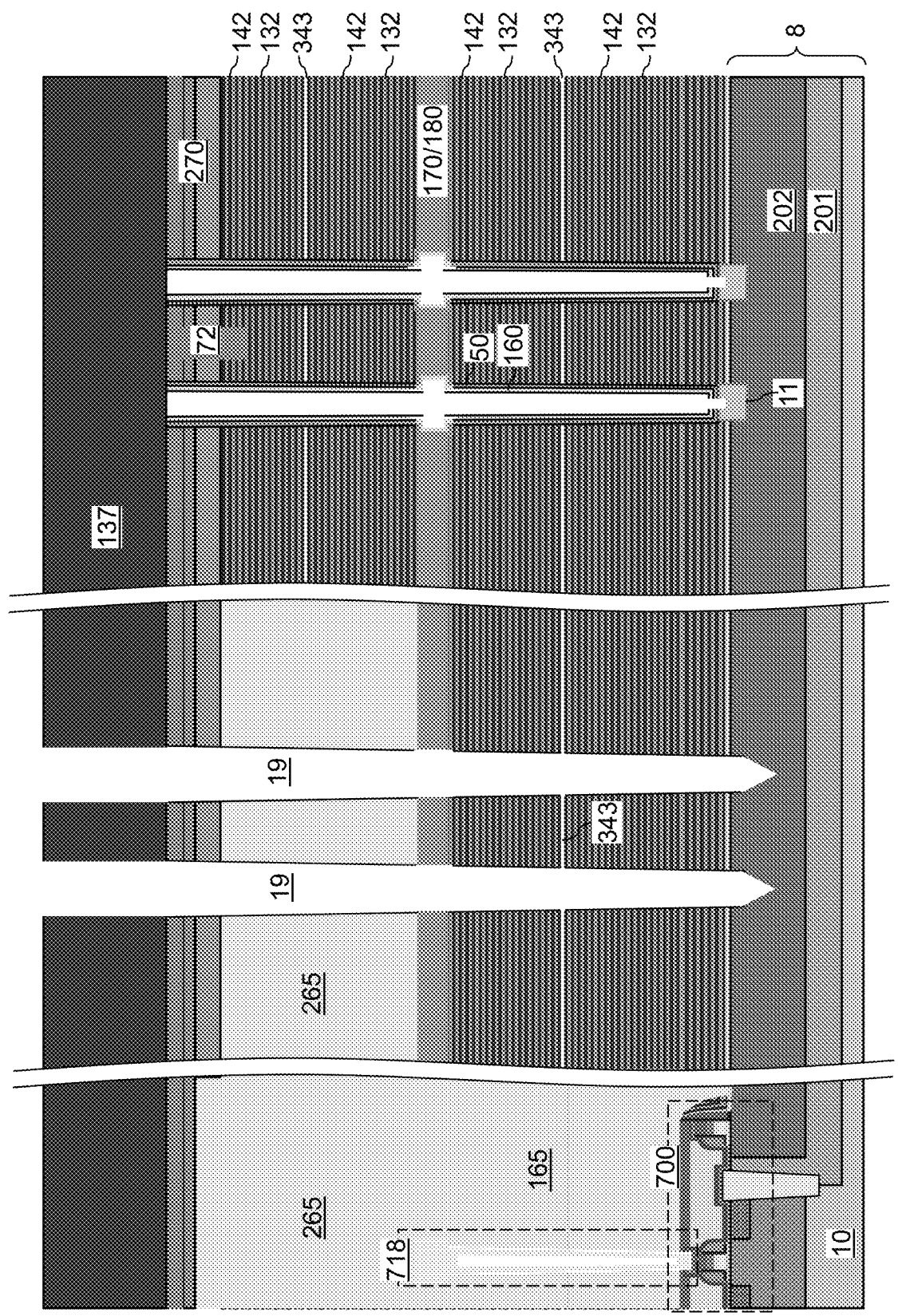
FIG. 13C is a vertical cross-sectional view of the alternative embodiment of the first exemplary structure at the processing steps of FIGS. 13A and 13B.
Figures 14A, 14B, 14C:
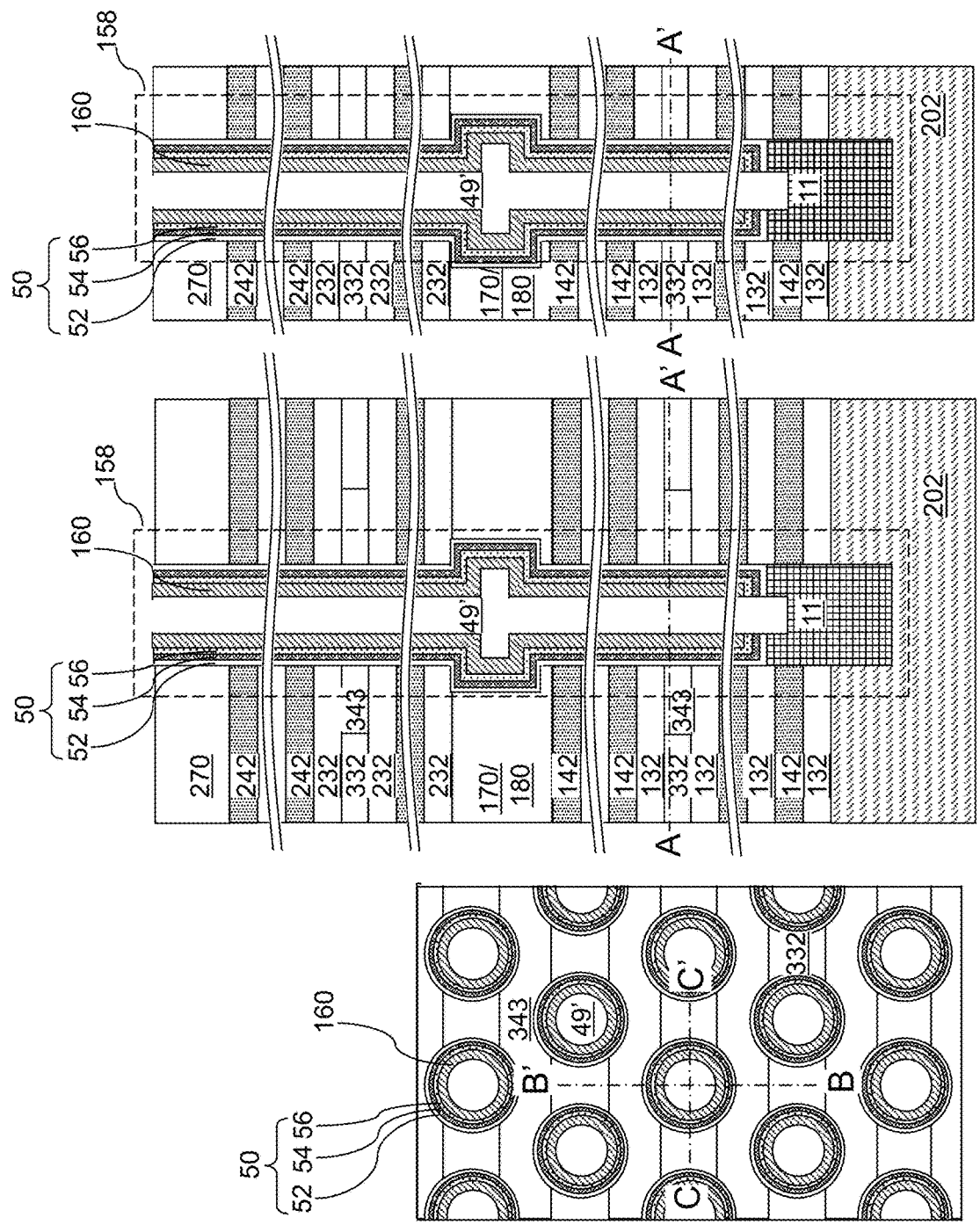
FIG. 14A is a horizontal cross-sectional view of a region of the first exemplary structure at the level of the laterally alternating sequence of insulating material strips and laterally-extending cavities at the processing steps of FIGS. 13A-13C according to the first embodiment of the present disclosure.
FIG. 14B is a vertical cross-sectional view along the vertical plane B-B' of FIG. 14A. The horizontal cross-sectional plane A-A' is the plane of the horizontal cross-sectional view of FIG. 14A.
FIG. 14C is a vertical cross-sectional view along the vertical plane C-C' of FIG. 14A. The horizontal cross-sectional plane A-A' is the plane of the horizontal cross-sectional view of FIG. 14A.

Referring to FIGS. 12A-12C, a sacrificial cover material layer 137 can be anisotropically deposited over the second-tier insulating cap layer 270. The sacrificial cover material layer 137 includes a sacrificial cover material, which is a material that can enhance an etch profile of underlying material portion in a subsequent anisotropic etch process by holding straight sidewall profiles during the subsequent anisotropic etch. In one embodiment, the sacrificial cover material layer 137 can include a material based on amorphous carbon. For example, the sacrificial cover material layer 137 can include Advanced Patterning Film™ (APF) provided by Applied Materials, Inc™. The memory openings 49 are covered with the sacrificial cover material. Each memory cavity 49' can be surrounded by a sacrificial conformal spacer 160 is present within a respective memory opening 49, and is covered by the sacrificial cover material layer 137.

A photoresist layer (not shown) can be applied over the sacrificial cover material layer 137, and can be lithographically patterned to form an array of openings in the staircase region 200. An anisotropic etch process is performed to transfer the pattern of the array of openings in the photoresist layer through the sacrificial cover material layer 137, the second-tier structure (232, 242, 332, 342, 270, 265, 72), the first-tier structure (132, 142, 332, 342, 170, 165), and optionally into the substrate 8. Support openings 19 are formed through the second-tier structure (232, 242, 332, 342, 270, 265, 72) and the first-tier structure (132, 142, 332, 342, 170, 165). In one embodiment, each of the sacrificial material strips 342 is at least partially cut through by at least one of the support openings 19. In one embodiment, each of the sacrificial material strips 342 includes at least one concave sidewall that is physically exposed to one of the support openings 19. The photoresist layer can be subsequently removed.

Generally, at least a subset of the support openings 19 can be formed through a first alternating stack of insulating layers (132 or 232) and sacrificial material layers (142 or 242), a laterally alternating sequence of insulating material strips 332 and sacrificial material strips 342, and at least one layer of a second alternating stack additional insulating layers (132 or 232) and additional sacrificial material layers (142 or 242) that overlie the laterally alternating sequence. In one embodiment, each support opening 19 may cut through a respective one of the sacrificial material strips 342.

Referring to FIGS. 13A-13C and 14A-14C, an isotropic etch process can be performed to etch the material of the sacrificial material trips 342 selective to the materials of the insulating layers (132, 232), sacrificial material layers (142, 242), the insulating cap layers (170, 270), and the first and second retro-stepped dielectric material portions (165, 265). In one embodiment, if the sacrificial material strips 342 include amorphous undoped silicon or a silicon-germanium alloy, a wet etch process using hot trimethyl-2 hydroxyethyl ammonium hydroxide ("hot TMY") or tetramethyl ammonium hydroxide (TMAH) can be performed to remove the sacrificial material strips 342 along the lengthwise direction of each sacrificial material strips 342, i.e., the first horizontal direction hd1. The voids formed by removal of the sacrificial material strips 342 are herein referred to as laterally-extending cavities 343. Removal of the sacrificial material strips 342 may be selective to the materials of the memory films 50. In this case, the laterally-extending cavities 343 can be laterally bounded by the memory films 50 of the in-process memory opening fill structures 158.

Referring to FIGS. 15A-15C, at least one isotropic etch process can be performed while the sacrificial cover material layer 137 is present over the second-tier insulating cap layer 270 to sequentially etch the portions of the blocking dielectric layers 52, the charge storage layers 54, the tunneling dielectric layers 56, and the sacrificial conformal spacers 160 that are adjacent to the laterally-extending cavities 343. The at least one isotropic etch process can be a sequence of isotropic etch processes. A one or more (e.g., a pair of) side apertures is formed on sidewalls of each memory opening 49 upon lateral expansion of the laterally-extending cavities 343 by etching each neighboring portion of the memory films 50 and the sacrificial conformal spacers 160. The laterally-extending cavities 343 are connected to each memory cavity 49' through the side apertures on the sidewalls of the memory openings 49. The memory cavities 49' combine with the laterally-extending cavities 343 to form a network of cavities (343, 49') after the at least one isotropic etch process.

Figures 16A, 16B, 16C:
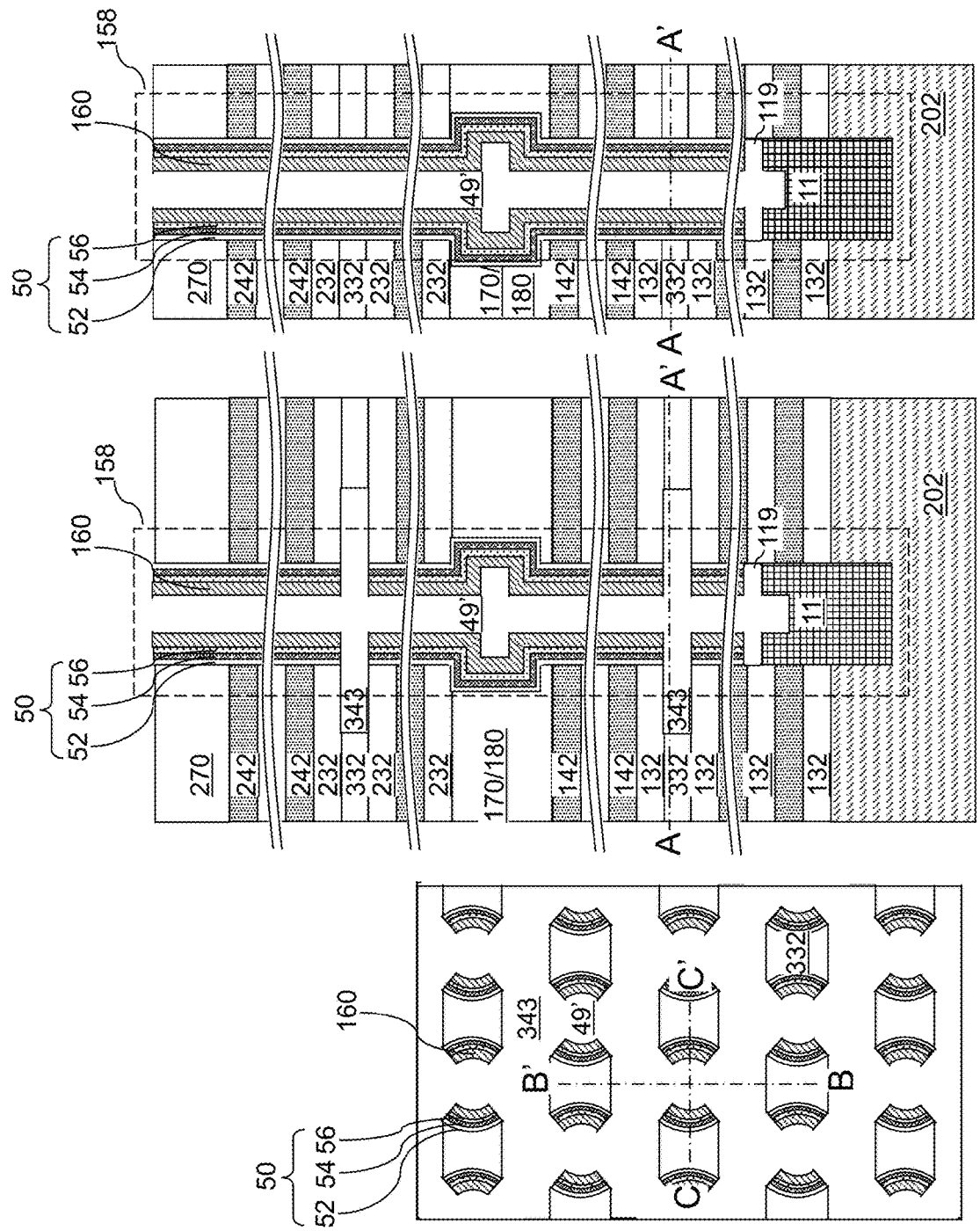
FIG. 16A is a horizontal cross-sectional view of a region of the first exemplary structure at the level of the laterally alternating sequence of insulating material strips and laterally extending cavities after removal of the sacrificial cover material and removal of a bottom portion of each memory film according to the first embodiment of the present disclosure.
FIG. 16B is a vertical cross-sectional view along the vertical plane B-B' of FIG. 16A. The horizontal cross-sectional plane A-A' is the plane of the horizontal cross-sectional view of FIG. 16A.
FIG. 16C is a vertical cross-sectional view along the vertical plane C-C' of FIG. 16A. The horizontal cross-sectional plane A-A' is the plane of the horizontal cross-sectional view of FIG. 16A.
Figure 17D:
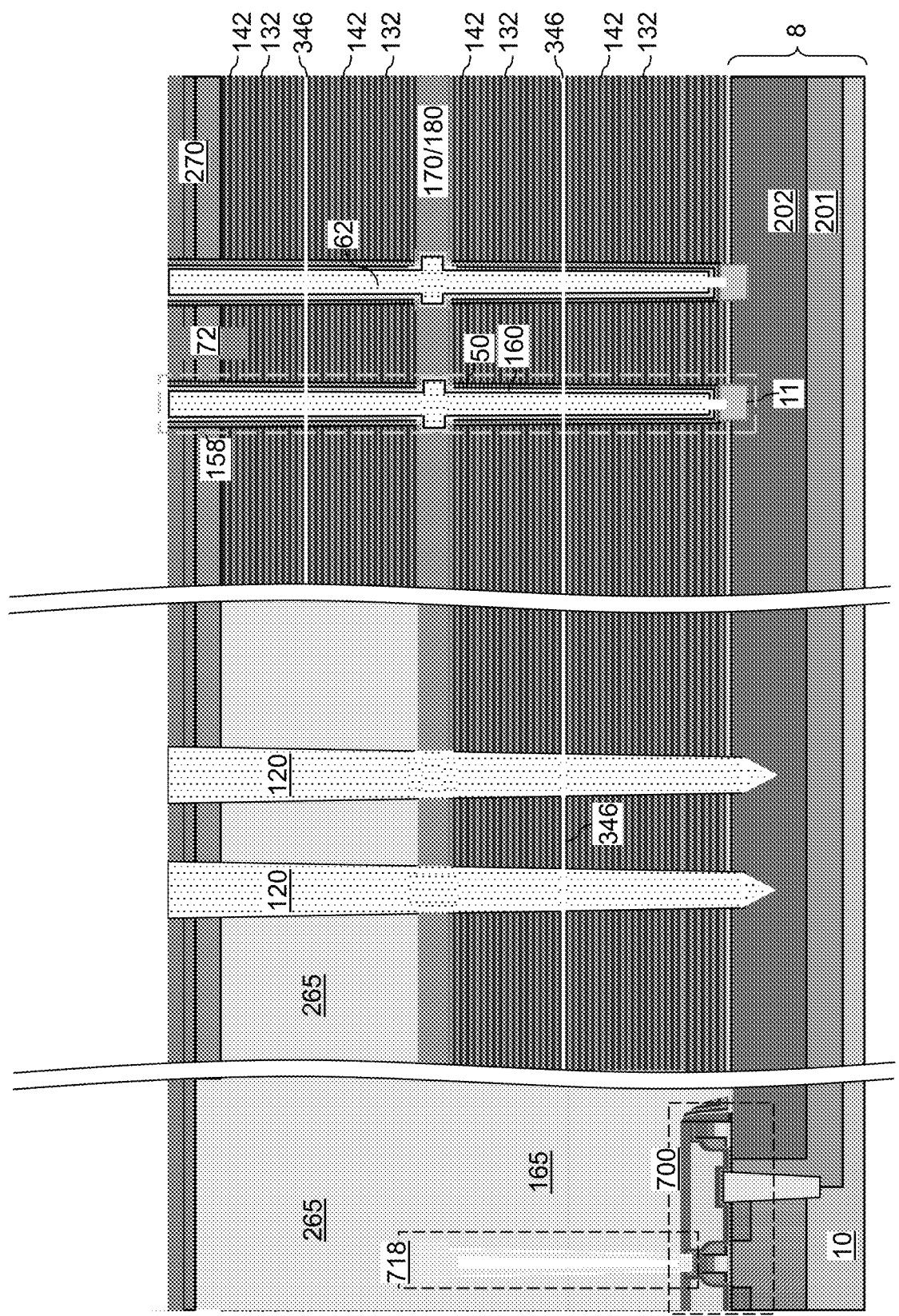
FIG. 17D is a vertical cross-sectional view of the alternative embodiment of the first exemplary structure at the processing steps of FIGS. 17A-17C.
Figures 18A, 18B, 18C:
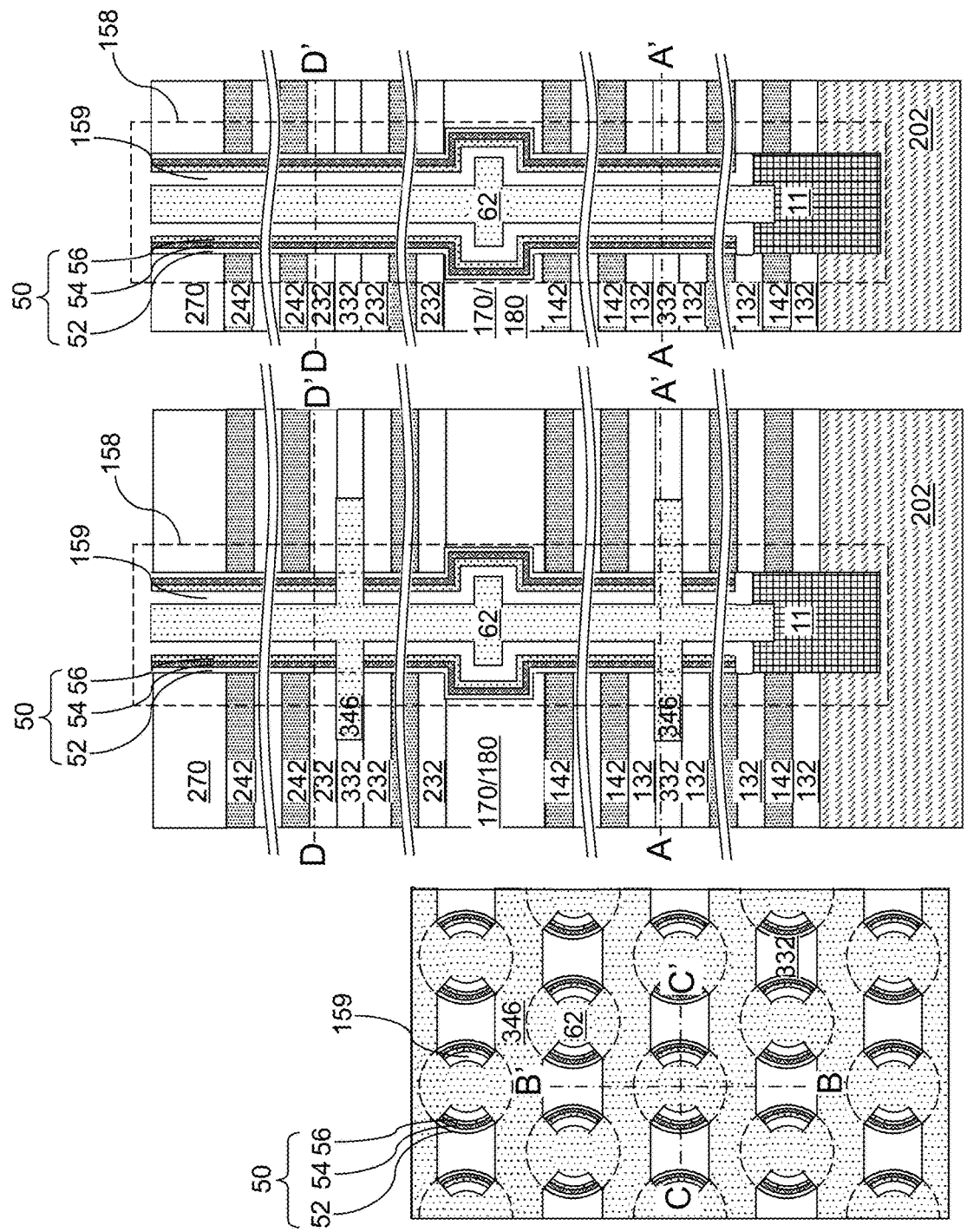
FIG. 18A is a horizontal cross-sectional view of a region of the first exemplary structure at the level of the laterally alternating sequence of insulating material strips and dielectric strips of the dielectric fill material after formation of channel cavities according to the first embodiment of the present disclosure.
FIG. 18B is a vertical cross-sectional view along the vertical plane B-B' of FIG. 18A. The horizontal cross-sectional plane A-A' is the plane of the horizontal cross-sectional view of FIG. 18A.
FIG. 18C is a vertical cross-sectional view along the vertical plane C-C' of FIG. 18A. The horizontal cross-sectional plane A-A' is the plane of the horizontal cross-sectional view of FIG. 18A.
Figure 18D:
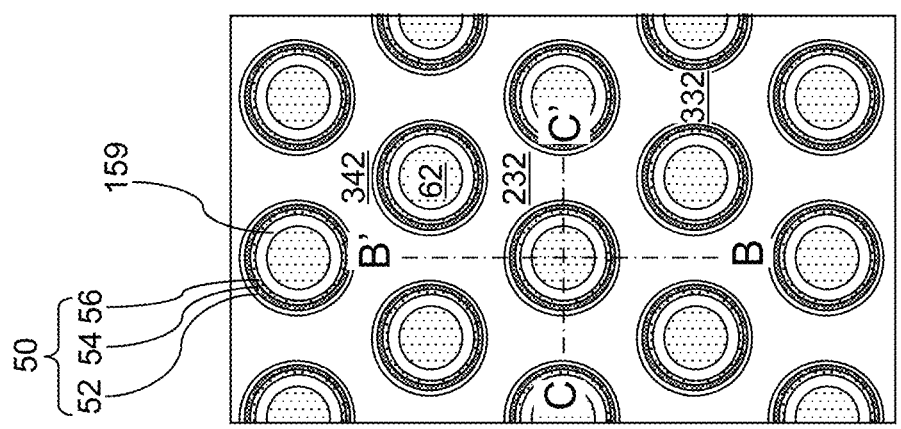
FIG. 18D is a vertical cross-sectional view of the horizontal plane D-D' of FIGS. 18B and 18C.
Figure 18E:
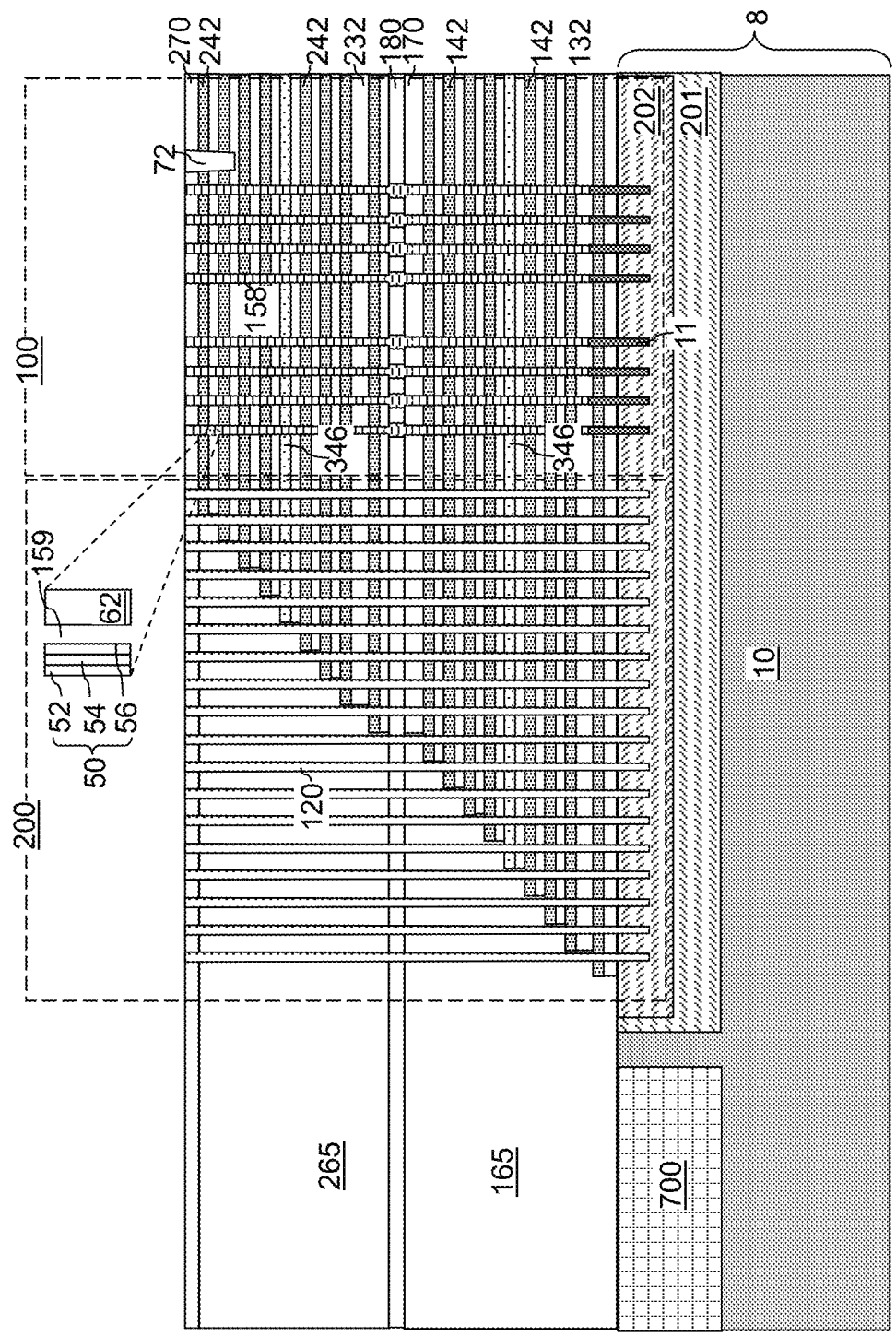
FIG. 18E is a vertical cross-sectional view of the first exemplary structure at the processing steps of FIGS. 18A-18D.
Figure 19D:
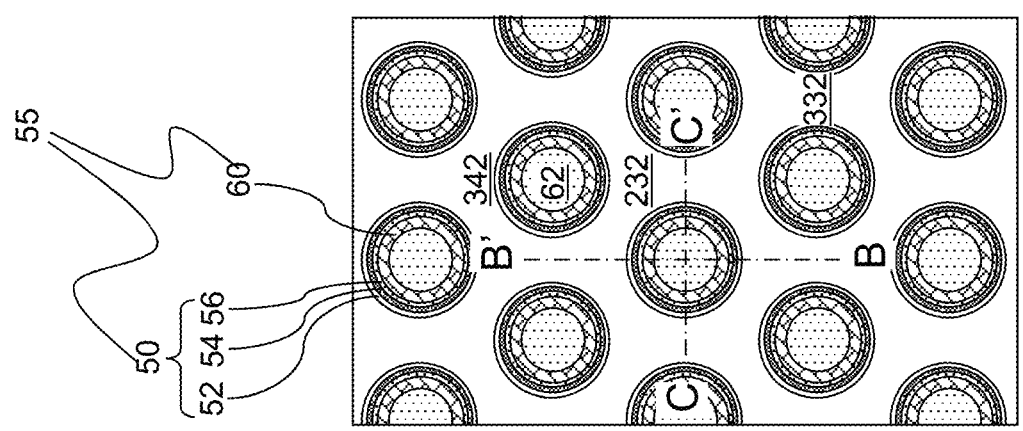
FIG. 19D is a vertical cross-sectional view of the horizontal plane D-D' of FIGS. 19B and 19C.
Figure 19E:
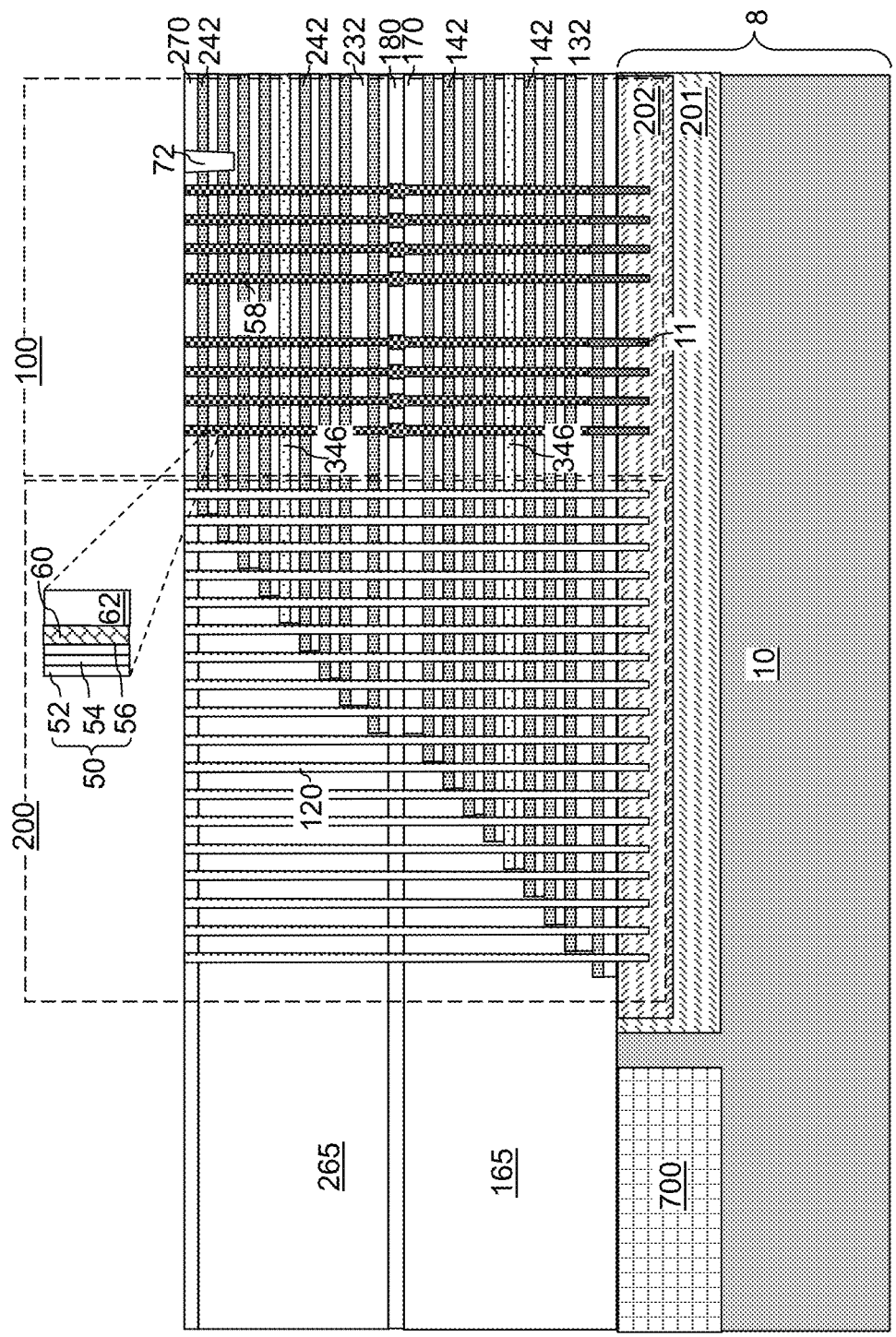
FIG. 19E is a vertical cross-sectional view of the first exemplary structure at the processing steps of FIGS. 19A-19D.

Referring to FIGS. 16A-16C, the sacrificial cover material layer 137 can be removed, for example, by ashing. An isotropic etch process that etches the materials of the memory films 50 can be performed to remove portions of the memory films 50 that contact the epitaxial pedestal channel portions 11. An annular cavity 119 can be formed above a peripheral portion of each epitaxial pedestal channel portion 11 after removing the bottom portion of each memory film 50 over the peripheral portion of each epitaxial pedestal channel portion 11. The entire topmost surface of each epitaxial pedestal channel portion 11 may be physically exposed after the isotropic etch process.

Referring to FIGS. 17A-17D, a dielectric material such as undoped silicate glass or a doped silicate glass can be conformally deposited in the network of cavities (343, 49') and in the support openings 19. In one embodiment, the dielectric material can include a doped silicate glass (such as borosilicate glass) that can be subsequently etched selective to undoped silicate glass. Excess portions of the dielectric material can be removed from above the horizontal plane including the top surface of the second-tier insulating cap layer 270. Each remaining portion of the dielectric material that fills a support opening 19 constitutes a support pillar structure 120. The remaining portions of the dielectric material that is deposited in the volumes of the laterally-extending cavities 343 constitute dielectric strips 346. The remaining portions of the dielectric material that is deposited in the memory cavities 49' (i.e., within a volume of a memory opening 49) constitutes dielectric cores 62. The support pillar structures 120, the dielectric strips 346, and the dielectric cores 62 are formed simultaneously. The support pillar structures 120, the dielectric strips 346, and the dielectric cores 62 are interconnected to form a single integral structure, i.e., a single continuous structure without any physically observable interfacial structures thereamongst. In one embodiment, each of the dielectric cores 62 comprises a dielectric pillar portion 62P vertically extending through the first-tier alternating stacks (132, 146) and the second-tier alternating stacks (232, 246), and comprises dielectric peg portions 62G laterally extending from the dielectric pillar portion 62P to respective side apertures to adjoin respective dielectric strips 346 at each level of the dielectric strips 346. As used herein, the term "peg" means an outward protrusion of any shape which is not limited to a cylindrical protrusion. In one embodiment, a peg may be a brace or a strut that supports vertical pillar shaped components in a lateral direction. In one embodiment, a pair of dielectric peg portions 62G laterally extend from the dielectric pillar portion 62P to respective side apertures to adjoin a respective pair of dielectric strips 346 at each level of the dielectric strips 346. However, one dielectric peg portion or more than two dielectric peg portions may be formed in alternative embodiments. In one embodiment, each of the dielectric strips 346 can encapsulate at least one laterally-extending void that extends along the first horizontal direction hd1. Each laterally-extending void may be laterally spaced from sidewalls of the memory openings 49.

Referring to FIGS. 18A-18E, an etch process is performed, which etches the material of the sacrificial conformal spacers 160 selective to the materials of the memory films 50, the dielectric cores 62, the second-tier insulating cap layer 270, and the support pillar structures 120. The etch process may be an isotropic etch process such as a wet etch process. In one embodiment, the sacrificial conformal spacers 160 can include undoped amorphous silicon or a silicon-germanium alloy, and the etch process can include a wet etch process using hot trimethyl-2 hydroxyethyl ammonium hydroxide ("hot TMY") or tetramethyl ammonium hydroxide (TMAH).

Channel cavities 159 are formed, which include the combined volumes of the sacrificial conformal spacers 160 and the annular cavities 119. Each channel cavity 159 can include a void that includes the volume of a removed sacrificial conformal spacer 160 and an underlying annular cavity 119. An annular top surface of an epitaxial pedestal channel portion 11 can be physically exposed at the bottom of each channel cavity 159. Each channel cavity 159 laterally surrounds a dielectric core 62. Each vertically-extending portion of a channel cavity 159 can have a uniform lateral width, which may be in a range from 10 nm to 120 nm, such as from 20 nm to 80 nm, although lesser and greater uniform lateral widths can also be used. The dielectric peg portions 62G of the dielectric cores 62 provide structural support to the dielectric cores 62 by fixing the position of each dielectric core 62 relative to the dielectric strips 346 and the insulating material strips 332 at each level at which the dielectric peg portions 62G during, and after, formation of the channel cavities 159.

Referring to FIGS. 19A-19E, a selective epitaxy process can be performed to grow a single crystalline semiconductor material having a doping of the first conductivity type in the channel cavities 159. For example, the first exemplary structure can be placed in a vacuum-tight selective epitaxy process chamber, and a combination of a semiconductor precursor gas (such as silane, disilane, dichlorosilane, trichlorosilane, silicon tetrachloride, germane, or a precursor gas for a compound semiconductor material), a dopant gas including atoms of electrical dopants of the first conductivity type (which can be, for example, diborane for p-type dopants or phosphine, arsine, or stibine for n-type dopants), and an etchant gas (such as hydrogen chloride) is flowed into the selective epitaxy process chamber while the first exemplary structure is maintained at an elevated temperature. The elevated temperature can be in a range from 500 degrees Celsius to 900 degrees Celsius. An epitaxial semiconductor channel 60 can grow upward from the physically exposed semiconductor surface of an epitaxial pedestal channel portion 11 within each memory opening 49 during the selective epitaxy process. The selective epitaxy process grows a single crystalline semiconductor material upward through the channel cavities 159 and around each of the dielectric peg portions 62G of the dielectric cores 62. The epitaxial semiconductor channel 60 can fill the entire volume of a channel cavity 159. The dielectric peg portions 62G of the dielectric cores 62 provide structural support to the dielectric cores 62 by fixing the position of each dielectric core 62 relative to the dielectric strips 346 and the insulating material strips 332 at each level at which the dielectric peg portions 62G during the selective epitaxy process.

Excess portions of the single crystalline semiconductor material that grows above the horizontal plane including the top surface of the second-tier insulating cap layer 270 can be removed by a planarization process, which can use chemical mechanical planarization. Each epitaxial semiconductor channel 60 can be epitaxially aligned to the single crystalline semiconductor material layer of the substrate 8 (such as the single crystalline semiconductor material of the first-conductivity-type doped well 202) through an intermediate single crystalline material of an intervening epitaxial pedestal channel portion 11.

A top portion of each dielectric core 62 can be vertically recessed selective to the second-tier insulating cap layer 270. In one embodiment, the second-tier insulating cap layer 270 can include undoped silicate glass, and the dielectric cores 62 can include a doped silicate glass such as borosilicate glass. In this case, a wet etch using dilute hydrofluoric acid can be performed to vertically recess the dielectric cores 62 selective to the second-tier insulating cap layer 270.

A doped semiconductor material having a doping of the second conductivity type can be deposited in the recessed volumes overlying the dielectric cores 62. Excess portions of the deposited doped semiconductor material can be removed from above the horizontal plane including the top surface of the second-tier insulating cap layer 270, for example, by a recess etch. Each remaining portion of the doped semiconductor material having a doping of the second conductivity type constitutes a drain region 63. The drain region 63 may include a polycrystalline doped semiconductor material or a single crystalline doped semiconductor material. The dopant concentration in the drain regions 63 can be in a range from $5.0 \times 10^{19}/cm^3$ to $2.0 \times 10^{21}/cm^3$, although lesser and greater dopant concentrations can also be used.

Each contiguous combination of a memory film 50 and an epitaxial semiconductor channel 60 constitutes a memory stack structure 55 including a vertical stack of memory elements therein. The vertical stack of memory elements can comprise portions of a charge storage layer located at each level of the sacrificial material layers (142, 242), which are subsequently replaced with electrically conductive layers. A set of all material portions that fills a memory opening after formation of the drain regions 63 constitutes a memory opening fill structure 58. Each memory opening fill structure 58 includes an epitaxial pedestal channel portion 11, a memory film 50, an epitaxial semiconductor channel 60, a dielectric core 62, and a drain region 63. Each dielectric core 62 includes a dielectric pillar portion 62P and at least one pair of dielectric peg portions 62G. Each dielectric core 62 includes a dielectric pillar portion 62P and as many pairs of dielectric peg portions 62G as the number of layers that contain a laterally alternating sequence of insulating material strips 332 and dielectric strips 346. In one embodiment, each dielectric core 62 includes a dielectric pillar portion 62P and a plurality of dielectric peg portions 62G.

Figure 20A:
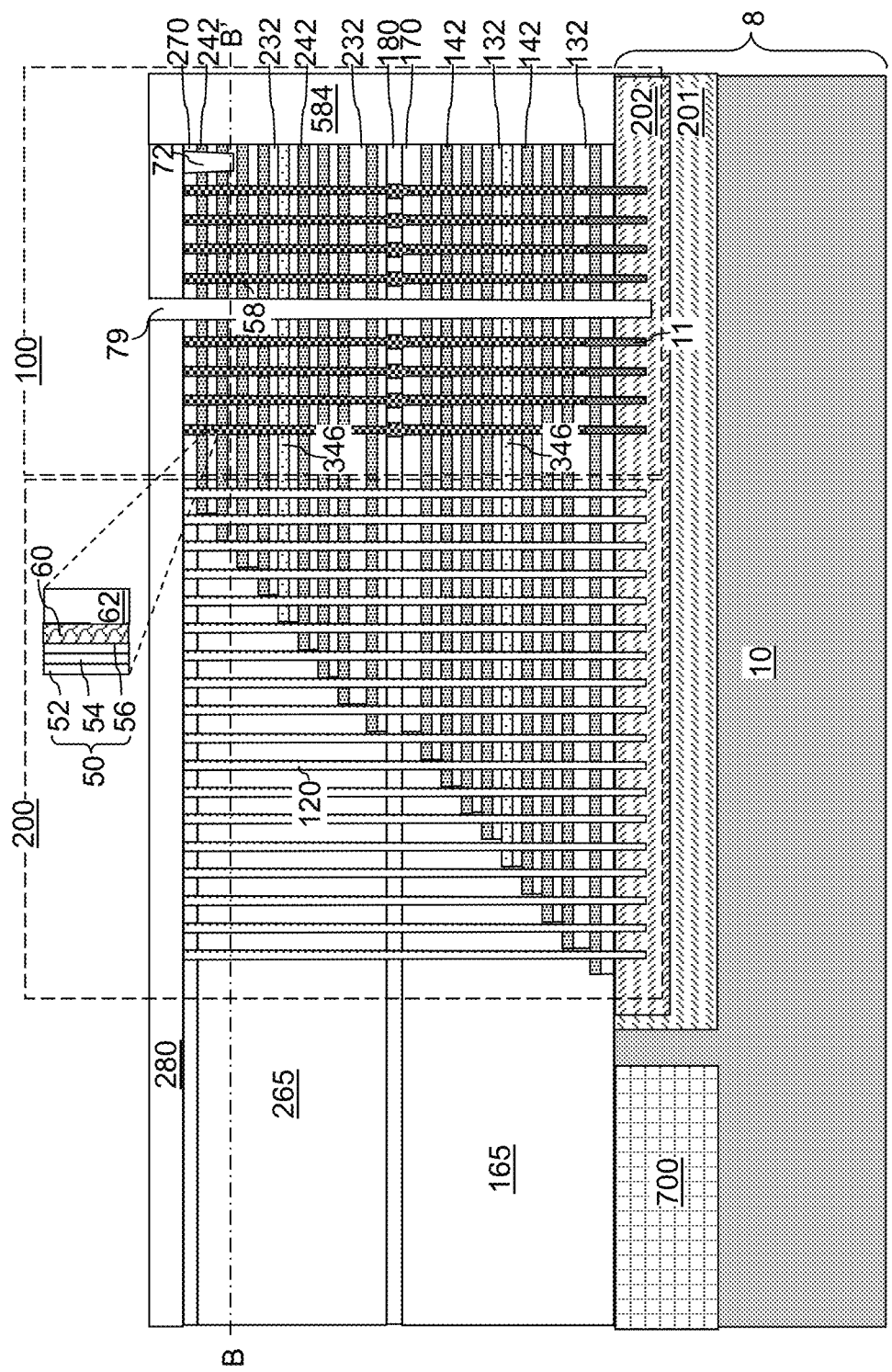
FIG. 20A is a vertical cross-sectional view of the first exemplary structure after formation of a first contact level dielectric layer and backside trenches according to the first embodiment of the present disclosure.
Figure 20B:
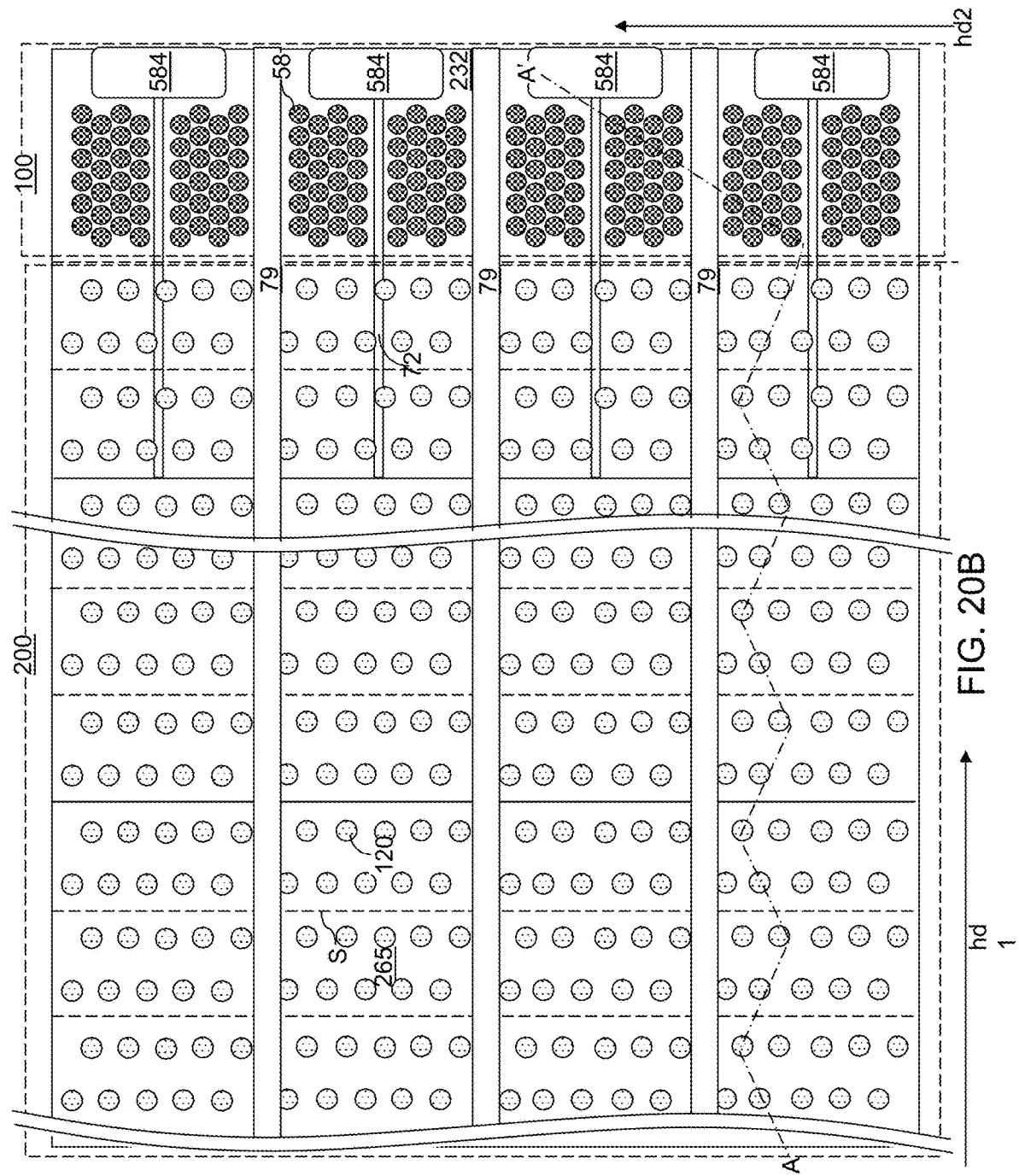
FIG. 20B is a horizontal cross-sectional view of the first exemplary structure along the horizontal plane B-B' of FIG. 20A. The hinged vertical plane A-A' corresponds to the plane of the vertical cross-sectional view of FIG. 20A.

Referring to FIGS. 20A and 20B, a first contact level dielectric layer 280 may be formed over the second-tier insulating cap layer 270. The first contact level dielectric layer 280 includes a dielectric material such as silicon oxide, and may be formed by a conformal or non-conformal deposition process. For example, the first contact level dielectric layer 280 may include undoped silicate glass and may have a thickness in a range from 100 nm to 600 nm, although lesser and greater thicknesses may also be used.

A photoresist layer (not shown) may be applied over the first contact level dielectric layer 280, and may be lithographically patterned to form elongated openings extending along the first horizontal direction hd1 within the areas of the memory array region 100 and the staircase region 200. An anisotropic etch may be performed to form backside trenches 79 having substantially vertical sidewalls that extend through the first contact level dielectric layer 280, the second-tier structure (232, 242, 332, 346, 270, 265, 72), and the first-tier structure (132, 142, 332, 346, 170, 165) may be formed underneath the openings in the photoresist layer. A top surface of the first-conductivity-type doped well 202 may be physically exposed at the bottom of each backside trench 79. In one embodiment, the backside trenches 79 may be formed between clusters of memory stack structures 55. The clusters of the memory stack structures 55 may be laterally spaced apart along the second horizontal direction hd2 by the backside trenches 79. The photoresist layer may be removed, for example, by ashing.

Figure 21:
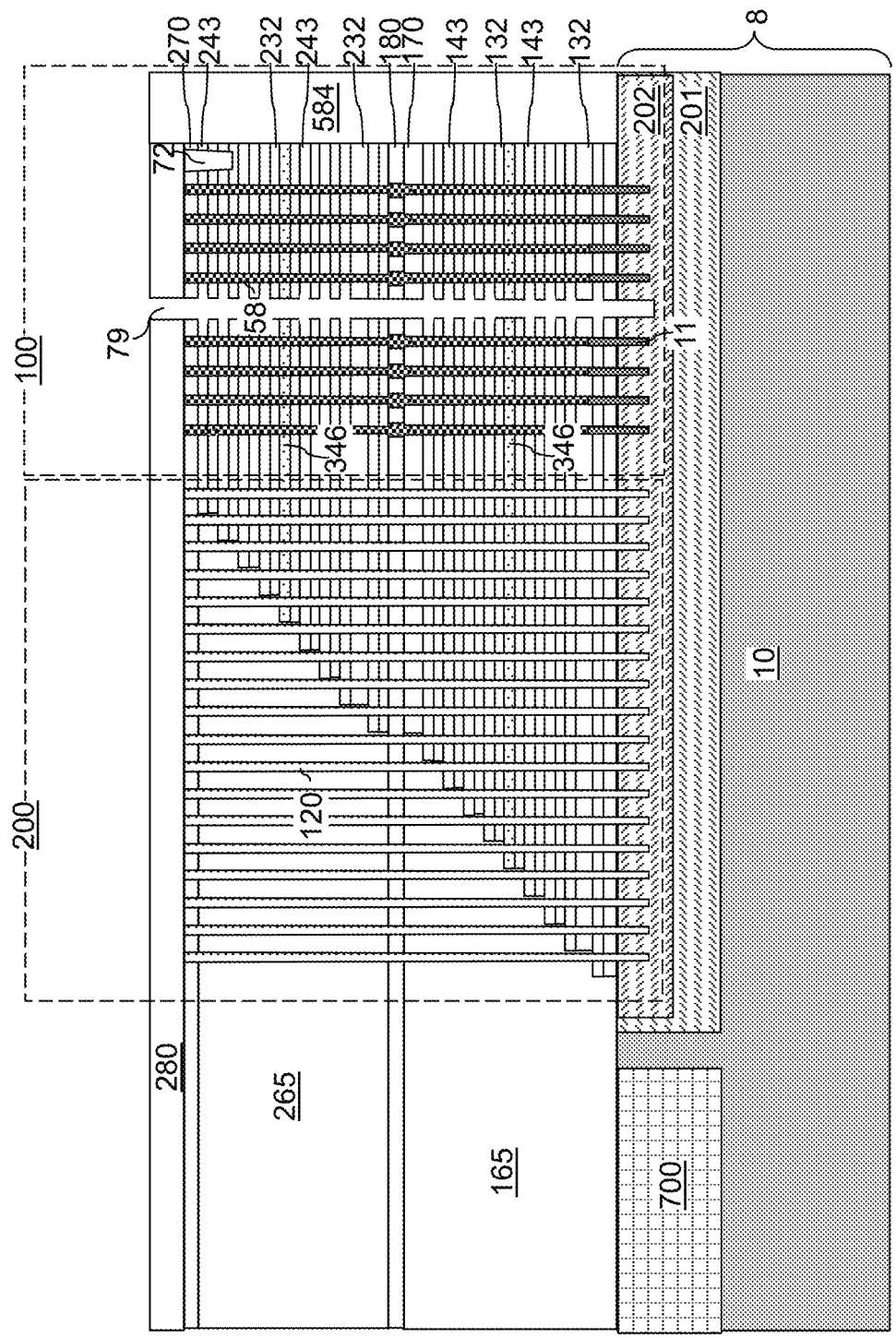
FIG. 21 is a vertical cross-sectional view of the first exemplary structure after formation of backside recesses according to the first embodiment of the present disclosure.

Referring to FIG. 21, the sacrificial material layers (142, 242) are may be removed selective to the insulating layers (132, 232), the insulating cap layers (170, 270), the first contact level dielectric layer 280, and the first-conductivity-type doped well 202. Specifically, an etchant that selectively etches the materials of the sacrificial material layers (142, 242) with respect to the materials of the insulating layers (132, 232), the insulating cap layers (170, 270), the retro-stepped dielectric material portions (165, 265), and the material of the outermost layer of the memory films 50 may be introduced into the backside trenches 79, for example, using an isotropic etch process. In one embodiment, the sacrificial material layers (142, 242) may include silicon nitride, the materials of the insulating layers (132, 232), the first and second-tier insulating cap layers (170, 270), the retro-stepped dielectric material portions (165, 265), and the outermost layer of the memory films 50 may include silicon oxide materials.

The isotropic etch process may be a wet etch process using a wet etch solution, or may be a gas phase (dry) etch process in which the etchant is introduced in a vapor phase into the backside trench 79. For example, if the sacrificial material layers (142, 242) include silicon nitride, the etch process may be a wet etch process in which the first exemplary structure is immersed within a wet etch tank including phosphoric acid, which etches silicon nitride selective to silicon oxide, silicon, and various other materials used in the art.

Backside recesses (143, 243) are formed in volumes from which the sacrificial material layers (142, 242) are removed. The backside recesses (143, 243) include first backside recesses 143 that are formed in volumes from which the first-tier sacrificial material layers 142 are removed and second backside recesses 243 that are formed in volumes from which the second-tier sacrificial material layers 242 are removed. Each of the backside recesses (143, 243) may be a laterally-extending cavity having a lateral dimension that is greater than the vertical extent of the cavity. In other words, the lateral dimension of each of the backside recesses (143, 243) may be greater than the height of the respective backside recess (143, 243). A plurality of backside recesses (143, 243) may be formed in the volumes from which the material of the sacrificial material layers (142, 242) is removed. Each of the backside recesses (143, 243) may extend substantially parallel to the top surface of the first-conductivity-type doped well 202. A backside recess (143, 243) may be vertically bounded by a top surface of an underlying insulating layer (132, 232) and a bottom surface of an overlying insulating layer (132, 232). In one embodiment, each of the backside recesses (143, 243) may have a uniform height throughout.

An oxidation process may be performed to oxidize physically exposed portions of the epitaxial pedestal channel portions 11. Tubular semiconductor oxide spacers (not shown) may be formed around each epitaxial pedestal channel portion 11. A backside blocking dielectric layer (not shown) may be optionally deposited in the backside recesses (143, 243) and the backside trenches 79 and over the first contact level dielectric layer 280. The backside blocking dielectric layer includes a dielectric material such as a dielectric metal oxide, silicon oxide, or a combination thereof. For example, the backside blocking dielectric layer may include aluminum oxide.

Figure 22A:
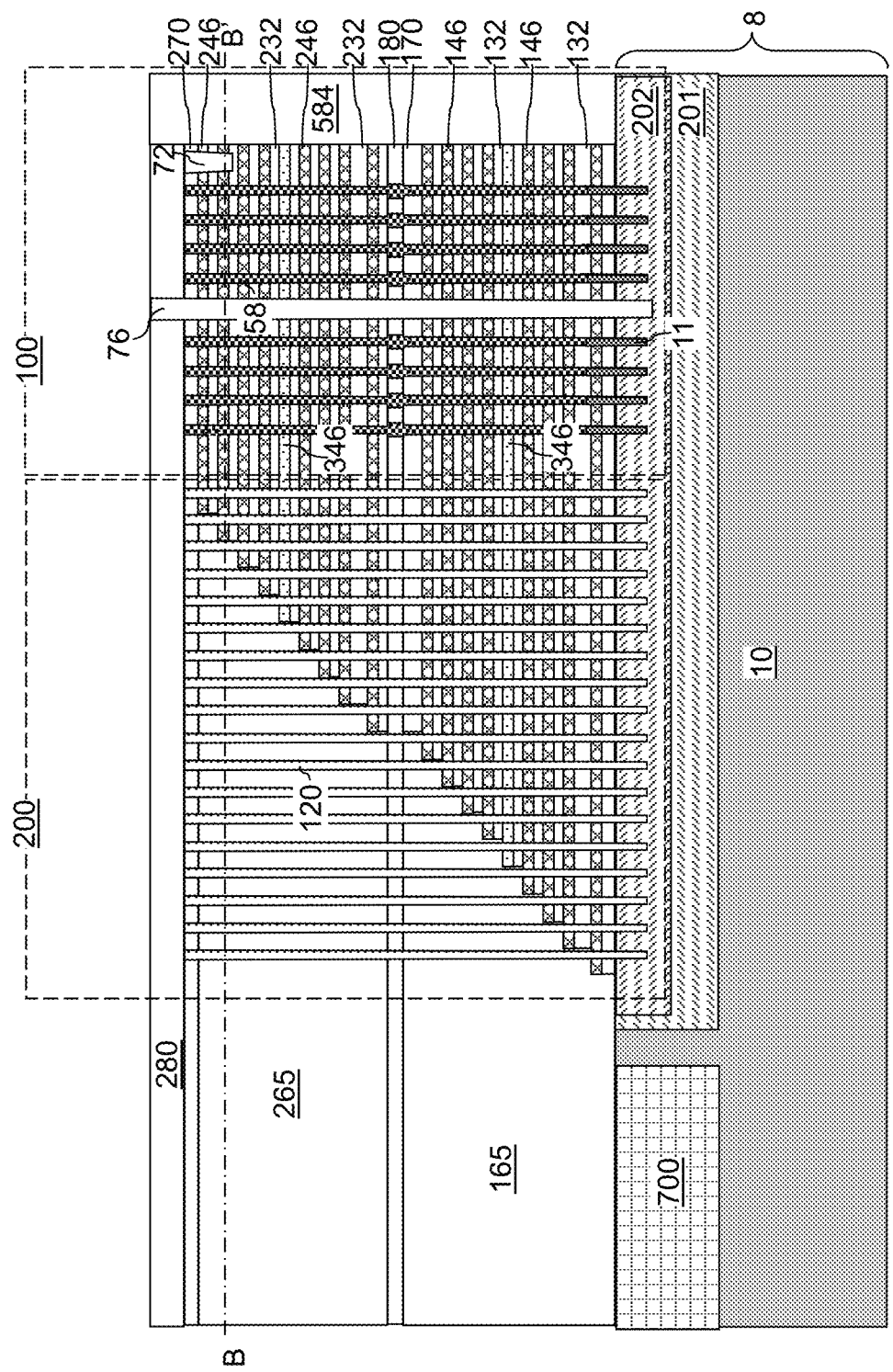
FIG. 22A is a vertical cross-sectional view of the first exemplary structure after formation of electrically conductive layers and backside trench fill structures according to the first embodiment of the present disclosure.
Figure 22B:
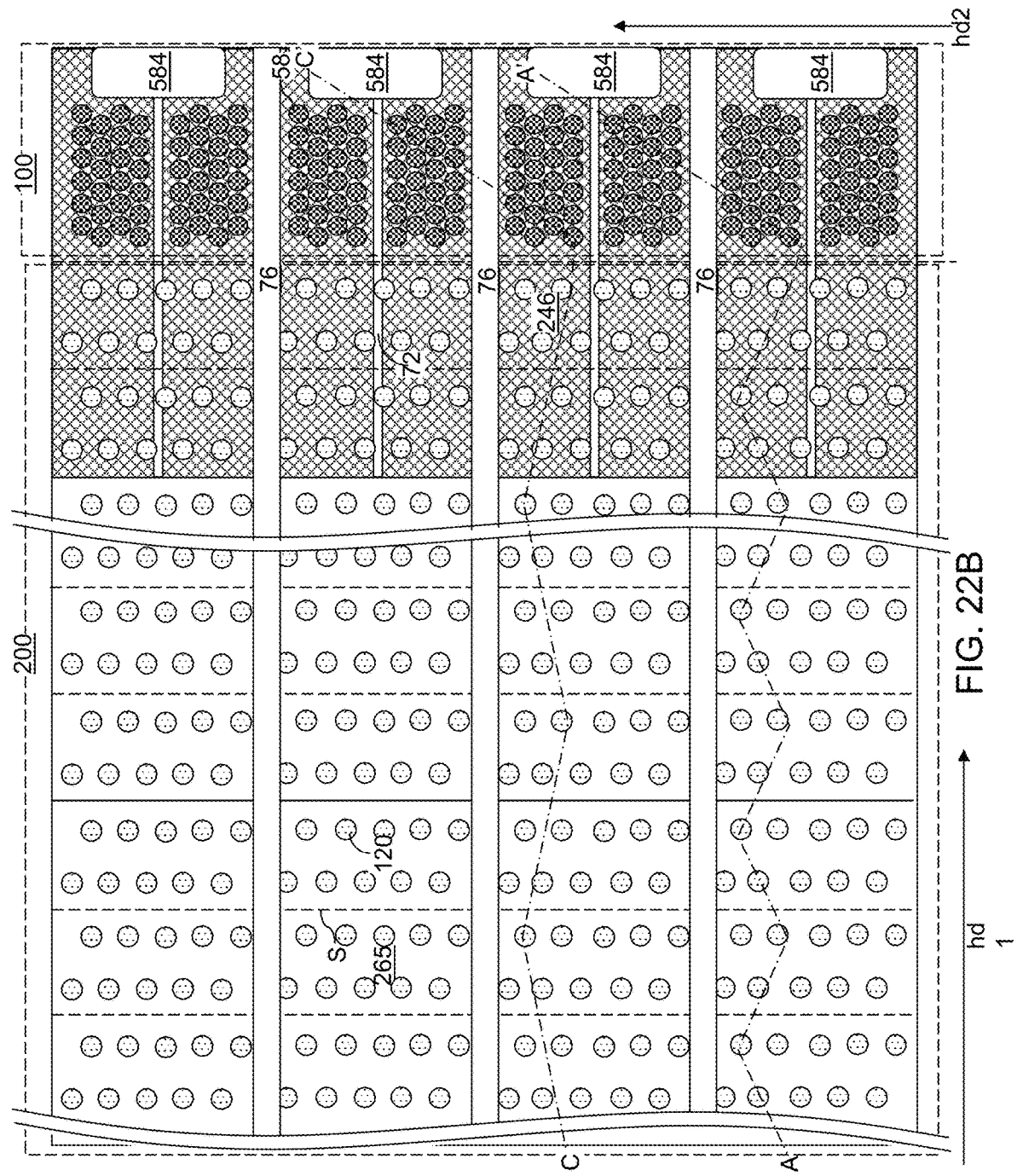
FIG. 22B is a horizontal cross-sectional view of the first exemplary structure along the horizontal plane B-B' of FIG. 22A. The hinged vertical plane A-A' corresponds to the plane of the vertical cross-sectional view of FIG. 22A.
Figure 22C:
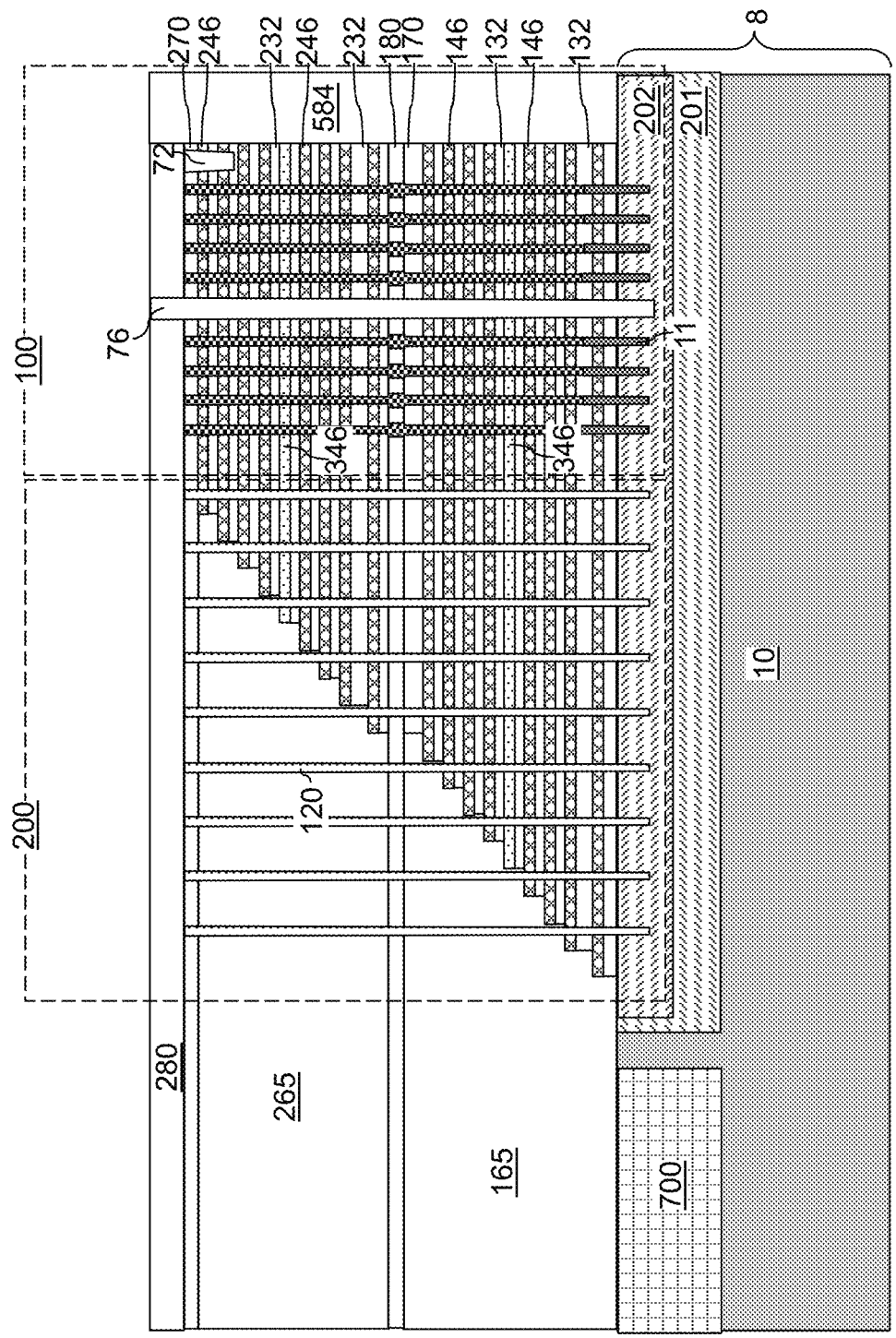
FIG. 22C is a horizontal cross-sectional view of the first exemplary structure along the horizontal plane B-B' of FIG. 22A. The hinged vertical plane A-A' corresponds to the plane of the vertical cross-sectional view of FIG. 22A.

Referring to FIGS. 22A-22C, at least one conductive material may be deposited in the plurality of backside recesses (243, 243), on the sidewalls of the backside trenches 79, and over the first contact level dielectric layer 280. The at least one conductive material may be deposited by a conformal deposition method, which may be, for example, chemical vapor deposition (CVD), atomic layer deposition (ALD), electroless plating, electroplating, or a combination thereof. The at least one conductive material may include an elemental metal, an intermetallic alloy of at least two elemental metals, a conductive nitride of at least one elemental metal, a conductive metal oxide, a conductive doped semiconductor material, a conductive metal-semiconductor alloy such as a metal silicide, alloys thereof, and combinations or stacks thereof.

In one embodiment, the at least one conductive material may include at least one metallic material, i.e., an electrically conductive material that includes at least one metallic element. Non-limiting exemplary metallic materials that may be deposited in the backside recesses (143, 243) include tungsten, tungsten nitride, titanium, titanium nitride, tantalum, tantalum nitride, cobalt, and ruthenium. For example, the at least one conductive material may include a conductive metallic nitride liner that includes a conductive metallic nitride material such as TiN, TaN, WN, or a combination thereof, and a conductive fill material such as W, Co, Ru, Mo, Cu, or combinations thereof. In one embodiment, the at least one conductive material for filling the backside recesses (143, 243) may be a combination of titanium nitride layer and a tungsten fill material.

Electrically conductive layers (146, 246) may be formed in the backside recesses (143, 243) by deposition of the at least one conductive material. A plurality of first-tier electrically conductive layers 146 may be formed in the plurality of first backside recesses 143, a plurality of second-tier electrically conductive layers 246 may be formed in the plurality of second backside recesses 243, and a continuous metallic material layer (not shown) may be formed on the sidewalls of each backside trench 79 and over the first contact level dielectric layer 280. Each of the first-tier electrically conductive layers 146 and the second-tier electrically conductive layers 246 may include a respective conductive metallic nitride liner and a respective conductive fill material. Thus, the first and second sacrificial material layers (142, 242) may be replaced with the electrically conductive layers (146, 246), respectively. Specifically, each first-tier sacrificial material layer 142 may be replaced with an optional portion of the backside blocking dielectric layer and a first-tier electrically conductive layer 146, and each second-tier sacrificial material layer 242 may be replaced with an optional portion of the backside blocking dielectric layer and a second-tier electrically conductive layer 246. A backside cavity is present in the portion of each backside trench 79 that is not filled with the continuous metallic material layer.

Residual conductive material may be removed from inside the backside trenches 79. Specifically, the deposited metallic material of the continuous metallic material layer may be etched back from the sidewalls of each backside trench 79 and from above the first contact level dielectric layer 280, for example, by an anisotropic or isotropic etch. Each remaining portion of the deposited metallic material in the first backside recesses constitutes a first-tier electrically conductive layer 146. Each remaining portion of the deposited metallic material in the second backside recesses constitutes a second-tier electrically conductive layer 246. Sidewalls of the first electrically conductive material layers 146 and the second-tier electrically conductive layers may be physically exposed to a respective backside trench 79. The backside trenches may have a pair of curved sidewalls having a non-periodic width variation along the first horizontal direction hd1 and a non-linear width variation along the vertical direction.

Each electrically conductive layer (146, 246) may be a conductive sheet including openings therein. A first subset of the openings through each electrically conductive layer (146, 246) may be filled with memory opening fill structures 58. A second subset of the openings through each electrically conductive layer (146, 246) may be filled with the support pillar structures 120. Each electrically conductive layer (146, 246) may have a lesser area than any underlying electrically conductive layer (146, 246) because of the first and second-tier stepped surfaces. Each electrically conductive layer (146, 246) may have a greater area than any overlying electrically conductive layer (146, 246) because of the first and second-tier stepped surfaces.

In some embodiments, drain-select-level isolation structures 72 may be provided at topmost levels of the second-tier electrically conductive layers 246. A subset of the second-tier electrically conductive layers 246 located at the levels of the drain-select-level isolation structures 72 constitutes drain select gate electrodes. A subset of the electrically conductive layer (146, 246) located underneath the drain select gate electrodes may function as combinations of a control gate and a word line located at the same level. The control gate electrodes within each electrically conductive layer (146, 246) are the control gate electrodes for a vertical memory device including the memory stack structure 55.

A backside trench fill structure 76 may be formed within each backside trench 79. Each backside trench fill structure 76 may consist of at least one dielectric fill material such as silicon oxide, silicon nitride, and/or a dielectric metal oxide material. Alternatively, the backside trench fill structure 76 may include a laterally-insulated source contact via structure that includes a conductive via structure contacting the first-conductivity-type doped well 202 and a dielectric spacer that laterally surrounds the conductive via structure.

Figure 23:
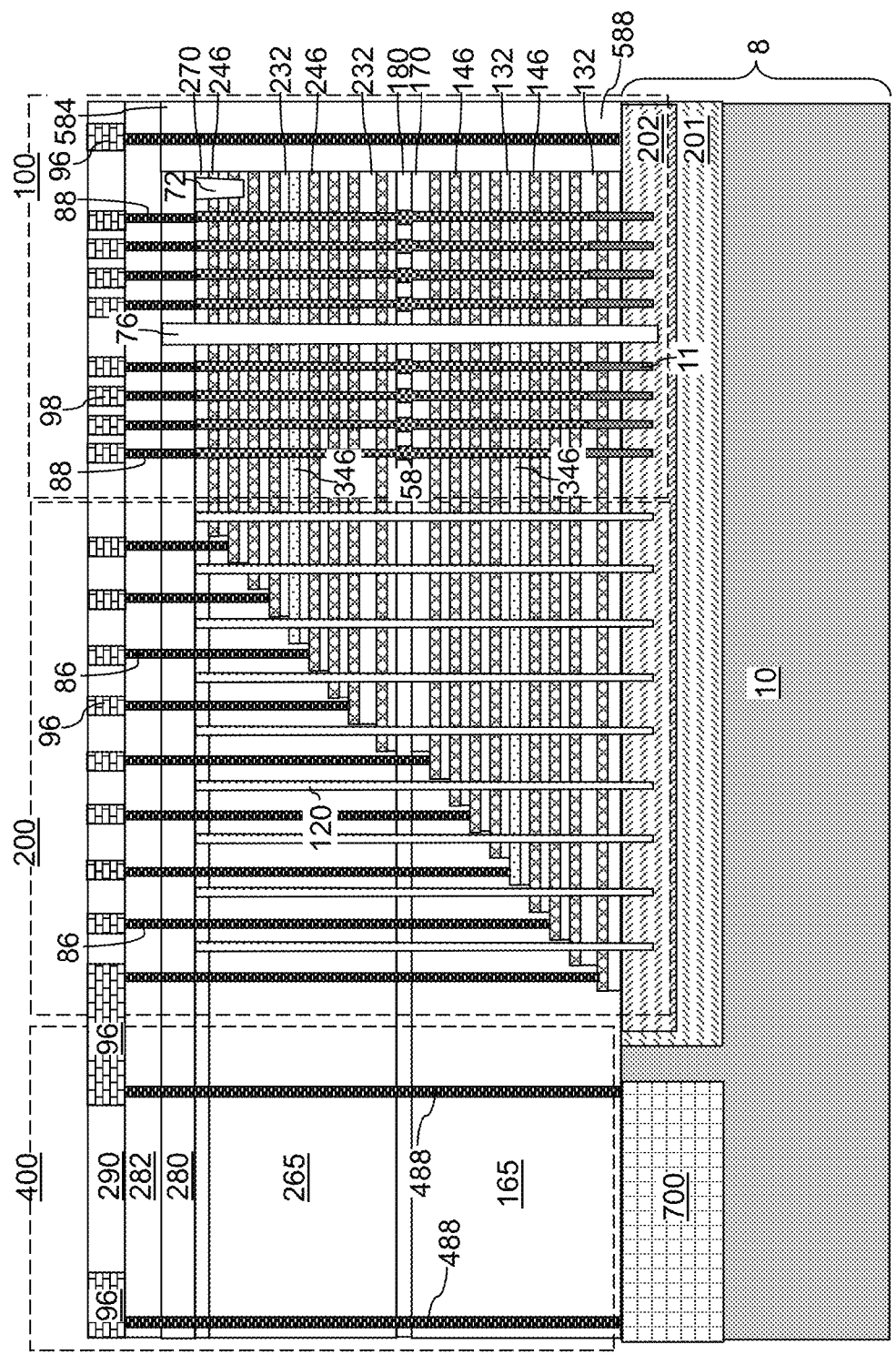
FIG. 23 is a vertical cross-sectional view of the first exemplary structure after formation of a second contact level dielectric layer, various contact via structures, through-memory-level via structures, and metal line structures according to the first embodiment of the present disclosure.

Referring to FIG. 23, a second contact level dielectric layer 282 may be formed over the first contact level dielectric layer 280. The second contact level dielectric layer 282 includes a dielectric material such as silicon oxide, and may have a thickness in a range from 100 nm to 600 nm, although lesser and greater thicknesses may also be used.

A photoresist layer (not shown) may be applied over the second contact level dielectric layer 282, and may be lithographically patterned to form various contact via openings. For example, openings for forming drain contact via structures 88 may be formed in the memory array region 100, and openings for forming staircase region contact via structures 86 may be formed in the staircase region 200. An anisotropic etch process is performed to transfer the pattern in the photoresist layer through the second and first contact level dielectric layers (282, 280) and underlying dielectric material portions. The drain regions 63 and the electrically conductive layers (146, 246) may be used as etch stop structures. Drain contact via cavities may be formed over each drain region 63, and staircase-region contact via cavities may be formed over each electrically conductive layer (146. 246) at the stepped surfaces underlying the first and second stepped dielectric material portions (165, 265). The photoresist layer may be subsequently removed, for example, by ashing.

Drain contact via structures 88 are formed in the drain contact via cavities and on a top surface of a respective one of the drain regions 63. Staircase-region contact via structures 86 are formed in the staircase-region contact via cavities and on a top surface of a respective one of the electrically conductive layers (146, 246). The staircase-region contact via structures 86 may include drain select level contact via structures that contact a subset of the second-tier electrically conductive layers 246 that function as drain select level gate electrodes. Further, the staircase-region contact via structures 86 may include word line contact via structures that contact electrically conductive layers (146, 246) that underlie the drain select level gate electrodes and function as word lines for the memory stack structures 55.

First through-memory-level via cavities may be formed through the second and first contact level dielectric layers (282, 280) and the second and first retro-stepped dielectric material portions (265, 165) and to a respective one of the peripheral semiconductor devices 700. Second through-memory-level via cavities may be formed through the interconnection region dielectric fill material portions 584 to a respective one of the additional peripheral semiconductor devices 700. At least one conductive material may be deposited in the first through-memory-level via cavities and in the second through-memory-level via cavities. Excess portions of the at least one conductive material may be removed from above the horizontal plane including the top surface of the second contact level dielectric layer 282. Each remaining portion of the at least one conductive material in a first through-memory-level via cavity constitutes a first through-memory-level via structure 488. Each remaining portion of the at least one conductive material in a second through-memory-level via cavity constitutes a second through-memory-level via structure 588.

At least one additional dielectric layer may be formed over the contact level dielectric layers (280, 282), and additional metal interconnect structures (herein referred to as upper-level metal interconnect structures) may be formed in the at least one additional dielectric layer. For example, the at least one additional dielectric layer may include a line-level dielectric layer 290 that is formed over the contact level dielectric layers (280, 282). The upper-level metal interconnect structures may include bit lines 98 contacting a respective one of the drain contact via structures 88, and interconnection line structures 96 contacting, and/or electrically connected to, at least one of the staircase-region contact via structures 86 and/or the first through-memory-level via structures 488 and/or the second through-memory-level via structures 588.

In one embodiment, the three-dimensional memory device comprises a monolithic three-dimensional NAND memory device, the electrically conductive strips (146, 246) comprise, or are electrically connected to, a respective word line of the monolithic three-dimensional NAND memory device, the substrate 8 comprises a silicon substrate, the monolithic three-dimensional NAND memory device comprises an array of monolithic three-dimensional NAND strings over the silicon substrate, and at least one memory cell in a first device level of the array of monolithic three-dimensional NAND strings is located over another memory cell in a second device level of the array of monolithic three-dimensional NAND strings. The silicon substrate may contain an integrated circuit comprising a driver circuit for the memory device located thereon, the electrically conductive strips (146, 246) comprise a plurality of control gate electrodes having a strip shape extending substantially parallel to the top surface of the substrate 8, the plurality of control gate electrodes comprise at least a first control gate electrode located in the first device level and a second control gate electrode located in the second device level. The array of monolithic three-dimensional NAND strings comprises a plurality of epitaxial semiconductor channels 60 that extends substantially perpendicular to a top surface of the substrate 8. The array of monolithic three-dimensional NAND strings comprises a plurality of charge storage elements (comprising portions of the memory films 50). Each charge storage element can be located adjacent to a respective one of the plurality of epitaxial semiconductor channels 60.

Referring collectively to FIGS. 1A-23 and according to various embodiments of the present disclosure, a three-dimensional memory device is provided, which comprises: a first alternating stack of first insulating layers (such as first-tier insulating layers 132 or second-tier insulating layers 232 that underlie a laterally alternating sequence of insulating material strips 332 and dielectric strips 346) and first electrically conductive layers (such as first-tier electrically conductive layers 146 or second-tier electrically conductive layers 246 that underlie the laterally alternating sequence of insulating material strips 332 and dielectric strips 346) located over a substrate 8; a second alternating stack of second insulating layers (such as first-tier insulating layers 132 or second-tier insulating layers 232 that overlie laterally alternating sequence of insulating material strips 332 and dielectric strips 346) and second electrically conductive layers (such as first-tier electrically conductive layers 146 or second-tier electrically conductive layers 246 that overlie the laterally alternating sequence of insulating material strips 332 and dielectric strips 346) located over, and spaced from, the first alternating stack; memory openings 49 vertically extending through the first alternating stack and the second alternating stack, wherein each of the memory openings 49 comprises a pair of side apertures located between the first alternating stack and the second alternating stack; and memory opening fill structures 58 located in a respective one of the memory openings 49 and comprising a memory film 50, a semiconductor channel 60, and a dielectric core 62 comprising a dielectric fill material, wherein the dielectric core 62 comprises a dielectric pillar portion 62P and dielectric peg portions 62G laterally extending from the dielectric pillar portion 62P through holes in the semiconductor channel 60 and adjoined to respective side apertures.

In one embodiment, the dielectric peg portions 62G are connected to dielectric strips 346 of the dielectric fill material located outside the memory openings 49 and between the first alternating stack and the second alternating stack. The dielectric strips 146 of the dielectric fill material comprise a plurality of dielectric strips 146 laterally extending along a first horizontal direction hd1 and spaced apart along a second horizontal direction hd2 that is perpendicular to the first horizontal direction hd2.

In one embodiment, the three-dimensional memory device comprises support pillar structures 120 vertically extending through the first alternating stack and at least a subset of layers within the second alternating stack, comprising the dielectric fill material, and adjoined to a respective one of the plurality of dielectric strips 346.

In one embodiment, the first alternating stack comprises first stepped surfaces in which the first electrically conductive layers have a lateral extent that decreases with a vertical distance from the substrate 8; the second alternating stack comprises second stepped surfaces in which the second electrically conductive layers have a lateral extent that decreases with the vertical distance from the substrate 8; and a retro-stepped dielectric material portion (such as a first retro-stepped dielectric material portion 165 and a second retro-stepped dielectric material portion 265) overlying the first stepped surfaces and the second stepped surfaces, wherein the support pillar structures 120 vertically extend through the retro-stepped dielectric material portion.

In one embodiment, each of the plurality of dielectric strips 346 has two sets of straight sidewall segments (that laterally extend along the first horizontal direction hd1), wherein each set of straight sidewall segments includes a plurality of straight sidewall segments located within a respective vertical plane that extend along the first horizontal direction hd1. A subset of sidewall segments can laterally extend between a neighboring pair of memory openings 49 within a row of memory openings 49.

A subset of remaining portions of the insulating material strips 332 can include insulating material platelets located between a neighboring pair of memory openings 49 that are laterally spaced apart along the first horizontal direction hd1 and located between a neighboring pair of dielectric strips 346. Each insulating material platelet can include a pair of concave sidewalls that are coincident with sidewalls of a pair of memory openings 49. In one embodiment, the three-dimensional memory device comprises a two-dimensional array of insulating material platelets, wherein a row of insulating material platelets is located between each neighboring pair of dielectric strips.

In one embodiment, the three-dimensional memory device comprises drain regions 63 contacting an upper end of a respective one of the semiconductor channels 60 and contacting a top surface of a respective one of the dielectric pillar portions 62P.

In one embodiment, a single crystalline semiconductor material layer (e.g., a substrate semiconductor layer 10) is located in or over the substrate 8, wherein the semiconductor channel 60 comprises an epitaxial semiconductor channel that is epitaxially aligned to the single crystalline semiconductor material layer. The three-dimensional memory device comprises epitaxial pedestal channel portions 11 contacting, and epitaxially aligned to, the single crystalline semiconductor material layer and a respective one of the epitaxial semiconductor channels 60. In one embodiment, each of the epitaxial pedestal channel portions 11 comprises an annular top surface that contacts an annular bottom surface of a respective one of the epitaxial semiconductor channels 60. A periphery of the annular bottom surface of the respective one of the epitaxial semiconductor channels 60 contacts one of the first insulating layers.

In one embodiment, each of the epitaxial pedestal channel portions 11 contacts a bottom surface of a respective one of the dielectric pillar portions 62P and a bottom portion of a cylindrical sidewall of the dielectric pillar portions 62P.

In one embodiment, the epitaxial semiconductor channels 60 comprise a material selected from single crystalline silicon, a single crystalline silicon-germanium alloy, or a single crystalline III-V compound semiconductor material; and the dielectric fill material is selected from undoped silicate glass, a doped silicate glass, or organosilicate glass.

In one embodiment, each of the semiconductor channels 60 has an annular horizontal cross-sectional shape at levels of the first alternating stack and at levels of the second alternating stack, and has a horizontal cross-sectional shape of a pair of block arcs at a level of the dielectric peg portions 62G. As used herein, a block arc refers to a shape that is derived from the shape of an annulus by limiting the range of the azimuthal angle of the shape to less than 360 degrees around the geometrical center of the annulus.

In one embodiment, each of the side apertures in the memory openings 49 has a rectangular shape having a height that is the same as a vertical separation distance between the first alternating stack and the second alternating stack, which is the same as the height of insulating material strips 332.

In one embodiment, the three-dimensional memory device comprises at least one additional alternating stack of additional insulating layers (such as a third alternating stack of second-tier insulating layers 232 and second-tier electrically conductive layers 246) and additional electrically conductive layers (such as a fourth alternating stack of additional second-tier insulating layers 232 and additional second-tier electrically conductive layers 246) located over the second alternating stack (which can be a second alternating stack of first-tier insulating layers 132 and first-tier electrically conductive layers 146 overlying the level of a set of insulating material strips 332 and dielectric strips 346 in a first-tier structure), wherein each of the dielectric cores 62 comprises additional dielectric peg portions 62G laterally extending from a respective dielectric pillar portion 62P above the at least one additional alternating stack.

Figure 24:
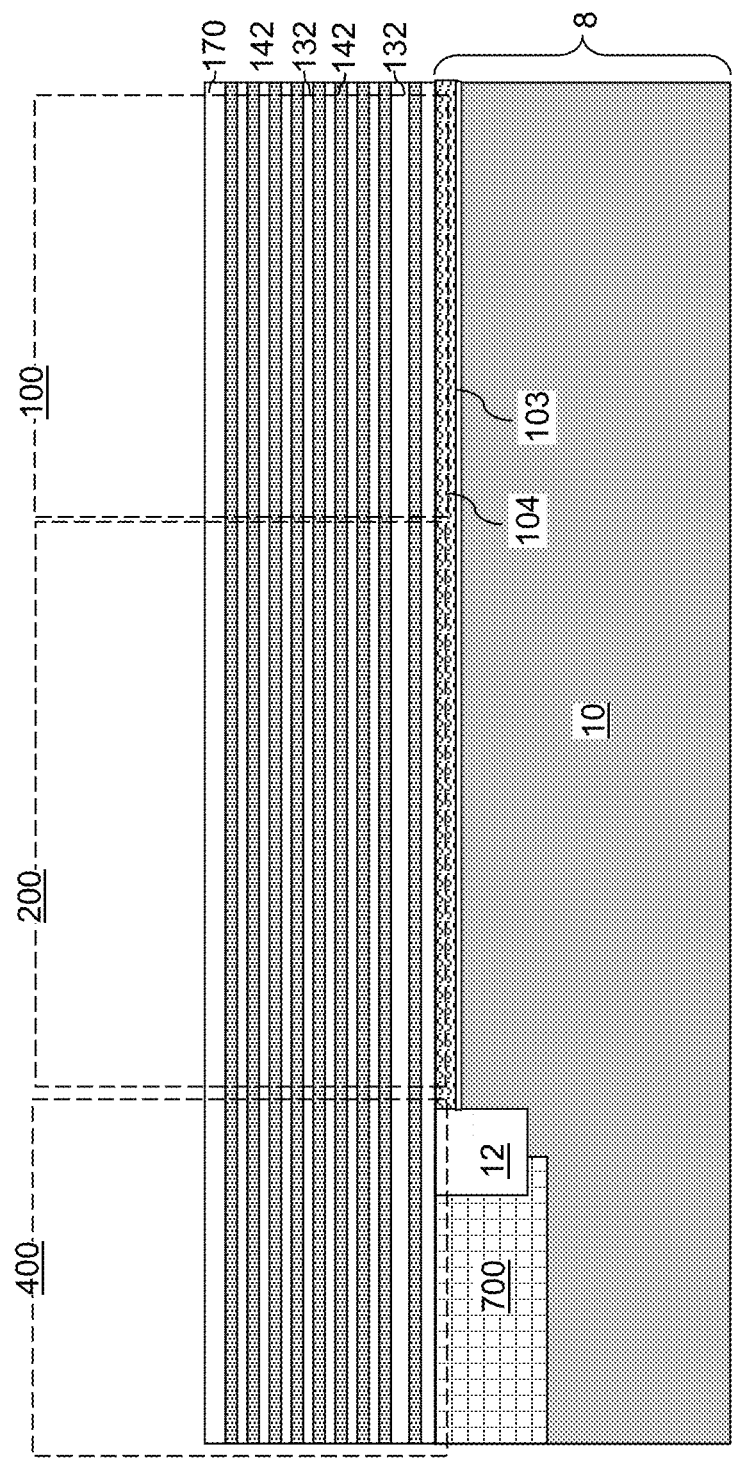
FIG. 24 is a vertical cross-sectional view of a second exemplary structure after formation of semiconductor devices, a source-level sacrificial layer, and a first-tier alternating stack of first insulating layers and first sacrificial material layers according to a second embodiment of the present disclosure.

Referring to FIG. 24, a second exemplary structure according to a second embodiment of the present disclosure includes a substrate 8. The substrate 8 includes a substrate semiconductor layer 10, which can be a single crystalline semiconductor material layer such as a single crystalline silicon layer. The substrate semiconductor layer 10 may have a doping of a first conductivity type. The atomic concentration of dopants of the first conductivity type in the substrate semiconductor layer 10 may be in a range from $1.0 \times 10^{14}/cm^3$ to $1.0 \times 10^{17}/cm^3$, although lesser and greater dopant concentrations can also be used. Peripheral semiconductor devices 700 may be formed on a recessed surface of the substrate semiconductor layer 10 in a peripheral device region 400. Shallow trench isolation structures 12 may be provide to provide electrical isolation between the peripheral semiconductor devices 700 and devices to be subsequently formed in the memory array region 100 and the staircase region 200.

A sacrificial etch stop liner 103 and a source-level sacrificial layer 104 can be formed in the memory array region 100 and in the staircase region 200. The sacrificial etch stop liner 103 includes a material that may function as an etch stop material during removal of the source-level sacrificial layer 104. For example, the sacrificial etch stop liner 103 may include silicon oxide, silicon nitride, and/or a dielectric metal oxide. In one embodiment, the sacrificial etch stop liner 103 may include a silicon oxide layer having a thickness in a range from 2 nm to 30 nm, although lesser and greater thicknesses may also be used.

The source-level sacrificial layer 104 includes a sacrificial material that may be removed selective to the sacrificial etch stop liner 103 and first-tier insulating layers 132 to be subsequently formed. In one embodiment, the source-level sacrificial layer 104 can include amorphous carbon. Alternatively, the source-level sacrificial layer 104 may include a semiconductor material such as undoped amorphous silicon or a silicon-germanium alloy with an atomic concentration of germanium greater than 20%. The thickness of the source-level sacrificial layer 104 may be in a range from 30 nm to 400 nm, such as from 60 nm to 200 nm, although lesser and greater thicknesses may also be used.

An alternating stack of first-tier insulating layers 132 and first-tier sacrificial material layers 142 can be formed over the source-level sacrificial layer 104. The first-tier insulating layers 132 and the first-tier sacrificial material layers 142 can have the same composition and the same thickness as in the first embodiment. The processing steps of FIG. 1 can be performed to form the alternating stack of first-tier insulating layers 132 and first-tier sacrificial material layers 142, which is herein referred to as a first-tier alternating stack (132, 142). The number of repetitions of a pair of a first-tier insulating layer 132 and a first-tier sacrificial material layer 142 in the first-tier alternating stack (132, 142) may be in a range from 16 to 1,024, and typically from 32 to 256, although a greater number of repetitions may also be used.

A first-tier insulating cap layer 170 is subsequently formed over the first-tier alternating stack (132, 142). In one embodiment, the first-tier insulating cap layer 170 includes the same dielectric material as the first-tier insulating layers 132. The thickness of the first-tier insulating cap layer 170 may be in a range from 20 nm to 300 nm, although lesser and greater thicknesses may also be used.

Figure 25:
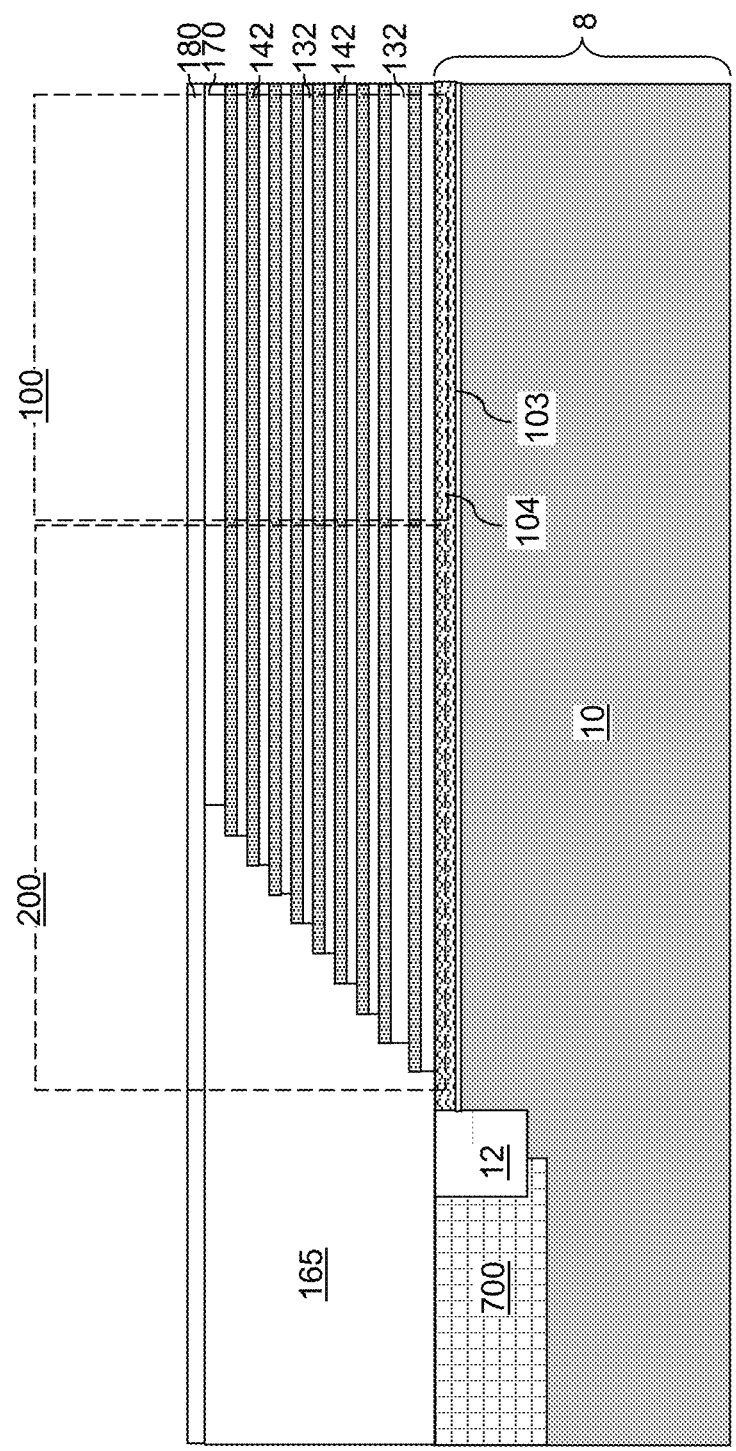
FIG. 25 is a vertical cross-sectional view of the second exemplary structure after formation of a first-tier staircase region, a first retro-stepped dielectric material portion, and an inter-tier dielectric layer according to the second embodiment of the present disclosure.

Referring to FIG. 25, the first-tier insulating cap layer 170 and the first-tier alternating stack (132, 142) may be patterned to form first stepped surfaces in the staircase region 200. The staircase region 200 may include a respective first stepped area in which the first stepped surfaces are formed, and a second stepped area in which additional stepped surfaces are to be subsequently formed in a second-tier structure (to be subsequently formed over a first-tier structure) and/or additional tier structures. The first stepped surfaces may be formed, for example, by forming a mask layer (not shown) with an opening therein, etching a cavity within the levels of the first-tier insulating cap layer 170, and iteratively expanding the etched area and vertically recessing the cavity by etching each pair of a first-tier insulating layer 132 and a first-tier sacrificial material layer 142 located directly underneath the bottom surface of the etched cavity within the etched area. In one embodiment, top surfaces of the first-tier sacrificial material layers 142 may be physically exposed at the first stepped surfaces. The cavity overlying the first stepped surfaces is herein referred to as a first stepped cavity.

A dielectric fill material (such as undoped silicate glass or doped silicate glass) may be deposited to fill the first stepped cavity. Excess portions of the dielectric fill material may be removed from above the horizontal plane including the top surface of the first-tier insulating cap layer 170. A remaining portion of the dielectric fill material that fills the region overlying the first stepped surfaces constitute a first retro-stepped dielectric material portion 165. As used herein, a "retro-stepped" element refers to an element that has stepped surfaces and a horizontal cross-sectional area that increases monotonically as a function of a vertical distance from a top surface of a substrate on which the element is present. The first-tier alternating stack (132, 142) and the first retro-stepped dielectric material portion 165 collectively constitute a first-tier structure, which is an in-process structure that is subsequently modified.

An inter-tier dielectric layer 180 may be optionally deposited over the first-tier structure (132, 142, 170, 165). The inter-tier dielectric layer 180 includes a dielectric material such as silicon oxide. In one embodiment, the inter-tier dielectric layer 180 may include a doped silicate glass having a greater etch rate than the material of the first-tier insulating layers 132 (which may include an undoped silicate glass). For example, the inter-tier dielectric layer 180 may include phosphosilicate glass. The thickness of the inter-tier dielectric layer 180 may be in a range from 30 nm to 300 nm, although lesser and greater thicknesses may also be used.

Figure 26A:
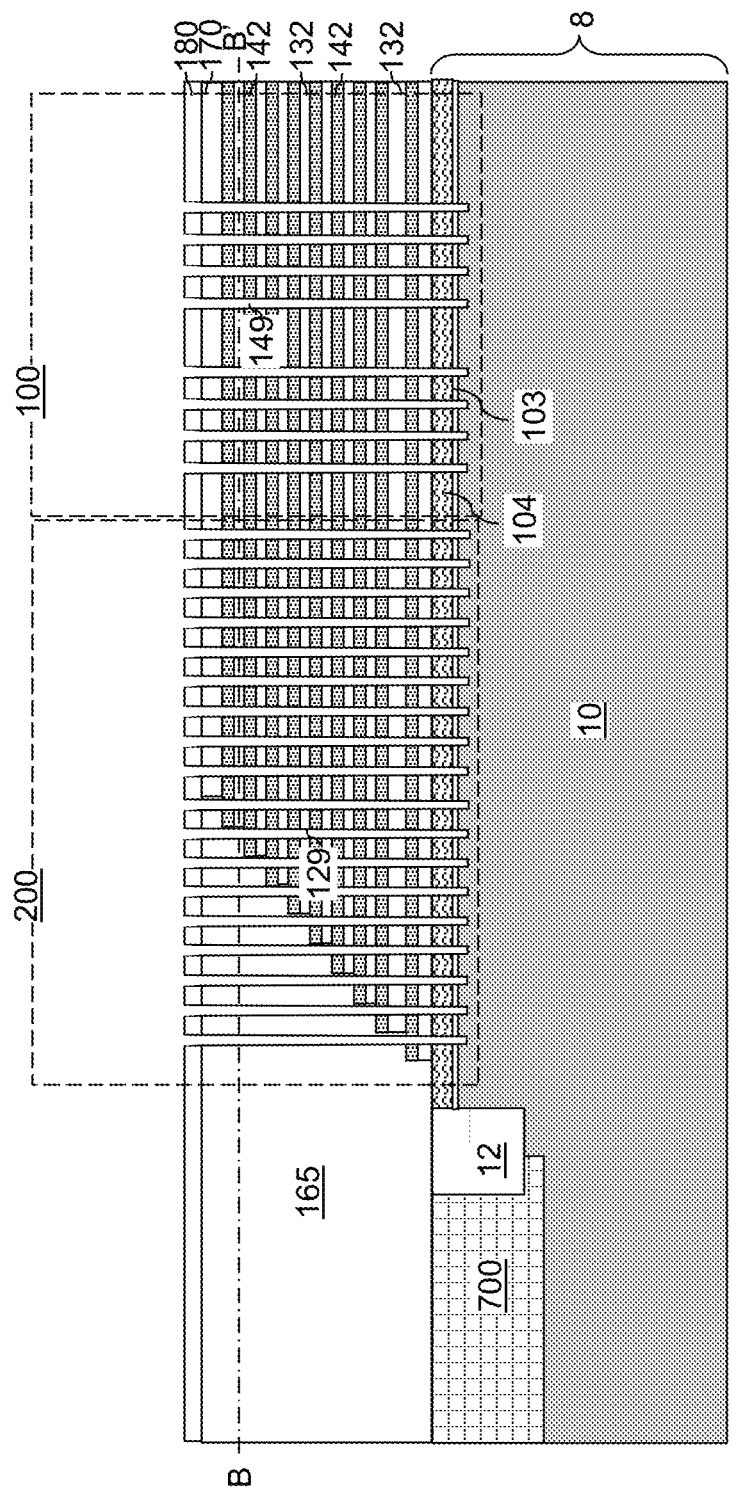
FIG. 26A is a vertical cross-sectional view of the second exemplary structure after formation of first-tier memory openings and first-tier support openings according to the second embodiment of the present disclosure.
Figure 26B:
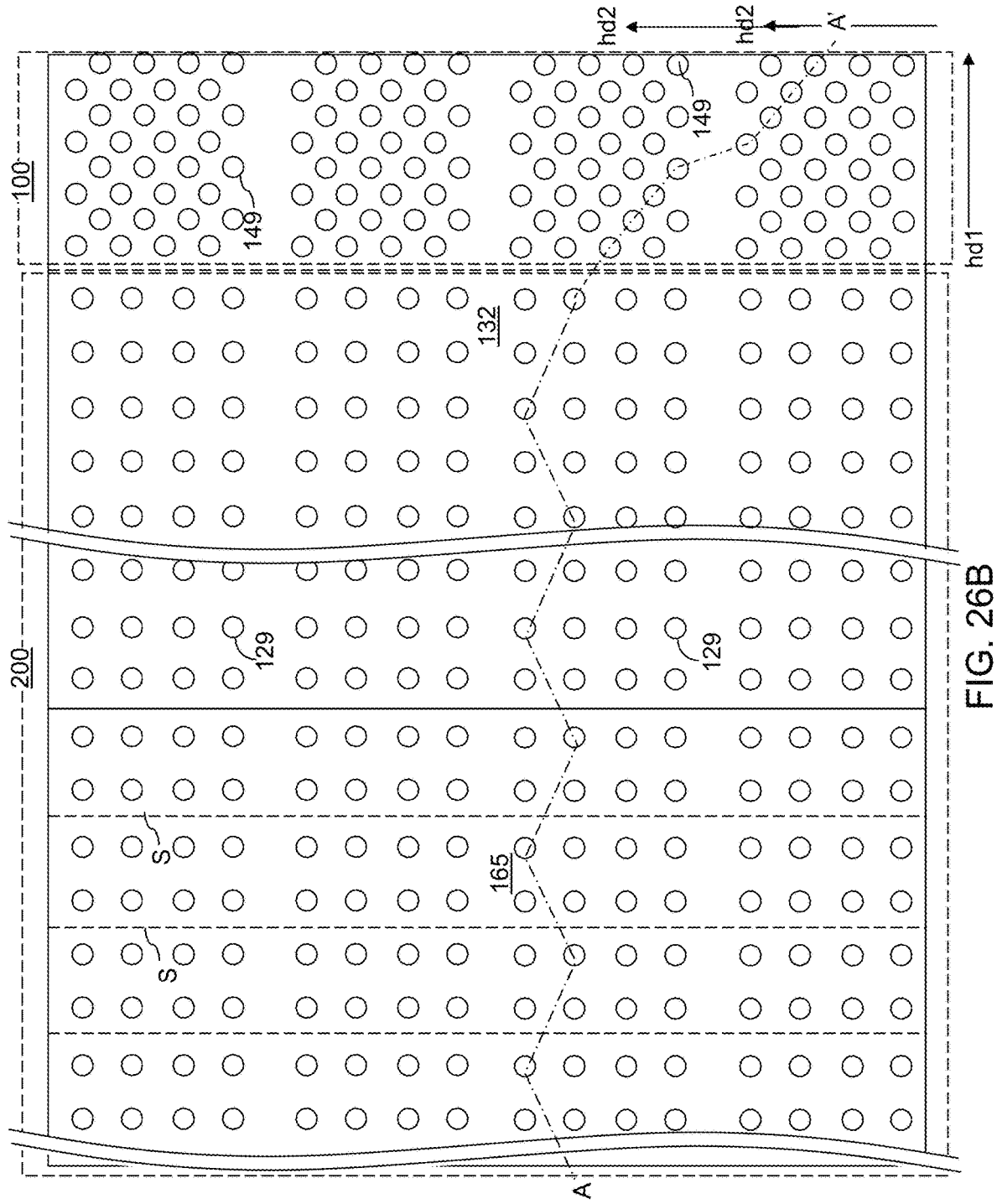
FIG. 26B is a top-down view of the second exemplary structure of FIG. 26A. The hinged vertical plane A-A' corresponds to the plane of the vertical cross-sectional view of FIG. 26A.

Referring to FIGS. 26A and 26B, various first-tier openings (149, 129) may be formed through the inter-tier dielectric layer 180, the first-tier structure (132, 142, 170, 165), the source-level sacrificial layer 104, and into the substrate semiconductor layer 10. A photoresist layer (not shown) may be applied over the inter-tier dielectric layer 180, and may be lithographically patterned to form various openings therethrough. The pattern of openings in the photoresist layer may be transferred through the inter-tier dielectric layer 180 and the first-tier structure (132, 142, 170, 165) and into the source-level sacrificial layer 104 by a first anisotropic etch process to form the various first-tier openings (149, 129) concurrently, i.e., during the first isotropic etch process. The various first-tier openings (149, 129) may include first-tier memory openings 149 and first-tier support openings 129. Locations of steps S in the first alternating stack (132, 142) are illustrated as dotted lines in FIG. 26B.

The first-tier memory openings 149 are openings that are formed in the memory array region 100 through each layer within the first alternating stack (132, 142) and are subsequently used to form memory stack structures therein. The first-tier memory openings 149 may be formed in clusters of first-tier memory openings 149 that are laterally spaced apart along the second horizontal direction hd2. Each cluster of first-tier memory openings 149 may be formed as a two-dimensional array of first-tier memory openings 149.

The first-tier support openings 129 are openings that are formed in the staircase region 200, and are subsequently used to form support pillar structures. A subset of the first-tier support openings 129 that is formed through the first retro-stepped dielectric material portion 165 may be formed through a respective horizontal surface of the first stepped surfaces.

In one embodiment, the first anisotropic etch process may include an initial step in which the materials of the first-tier alternating stack (132, 142) are etched concurrently with the material of the first retro-stepped dielectric material portion 165. The chemistry of the initial etch step may alternate to optimize etching of the first and second materials in the first-tier alternating stack (132, 142) while providing a comparable average etch rate to the material of the first retro-stepped dielectric material portion 165. The first anisotropic etch process may use, for example, a series of reactive ion etch processes or a single reaction etch process (e.g., $CF_4/O_2/Ar$ etch). The sidewalls of the various first-tier openings (149, 129) may be substantially vertical, or may be tapered.

Optionally, the portions of the first-tier memory openings 149 and the first-tier support openings 129 at the level of the inter-tier dielectric layer 180 may be laterally expanded by an isotropic etch. In this case, the inter-tier dielectric layer 180 may comprise a dielectric material (such as borosilicate glass) having a greater etch rate than the first-tier insulating layers 132 (that may include undoped silicate glass) in dilute hydrofluoric acid. An isotropic etch (such as a wet etch using HF) may be used to expand the lateral dimensions of the first-tier memory openings 149 at the level of the inter-tier dielectric layer 180. The portions of the first-tier memory openings 149 located at the level of the inter-tier dielectric layer 180 may be optionally widened to provide a larger landing pad for second-tier memory openings to be subsequently formed through a second-tier alternating stack (to be subsequently formed prior to formation of the second-tier memory openings).

Figure 27A:
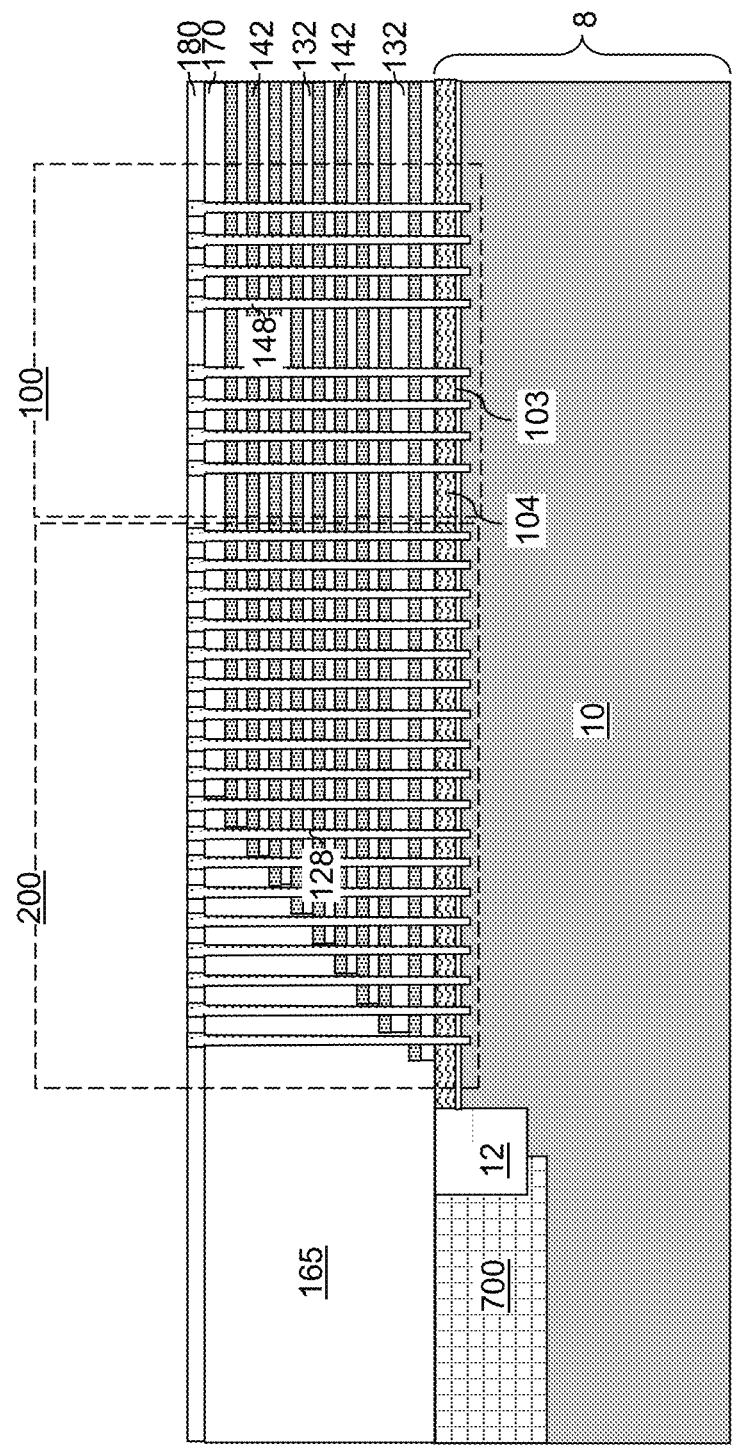
FIG. 27A is a vertical cross-sectional view of the second exemplary structure after formation of sacrificial first-tier memory opening fill portions and sacrificial first-tier support opening fill portions according to the second embodiment of the present disclosure.
Figure 27B:
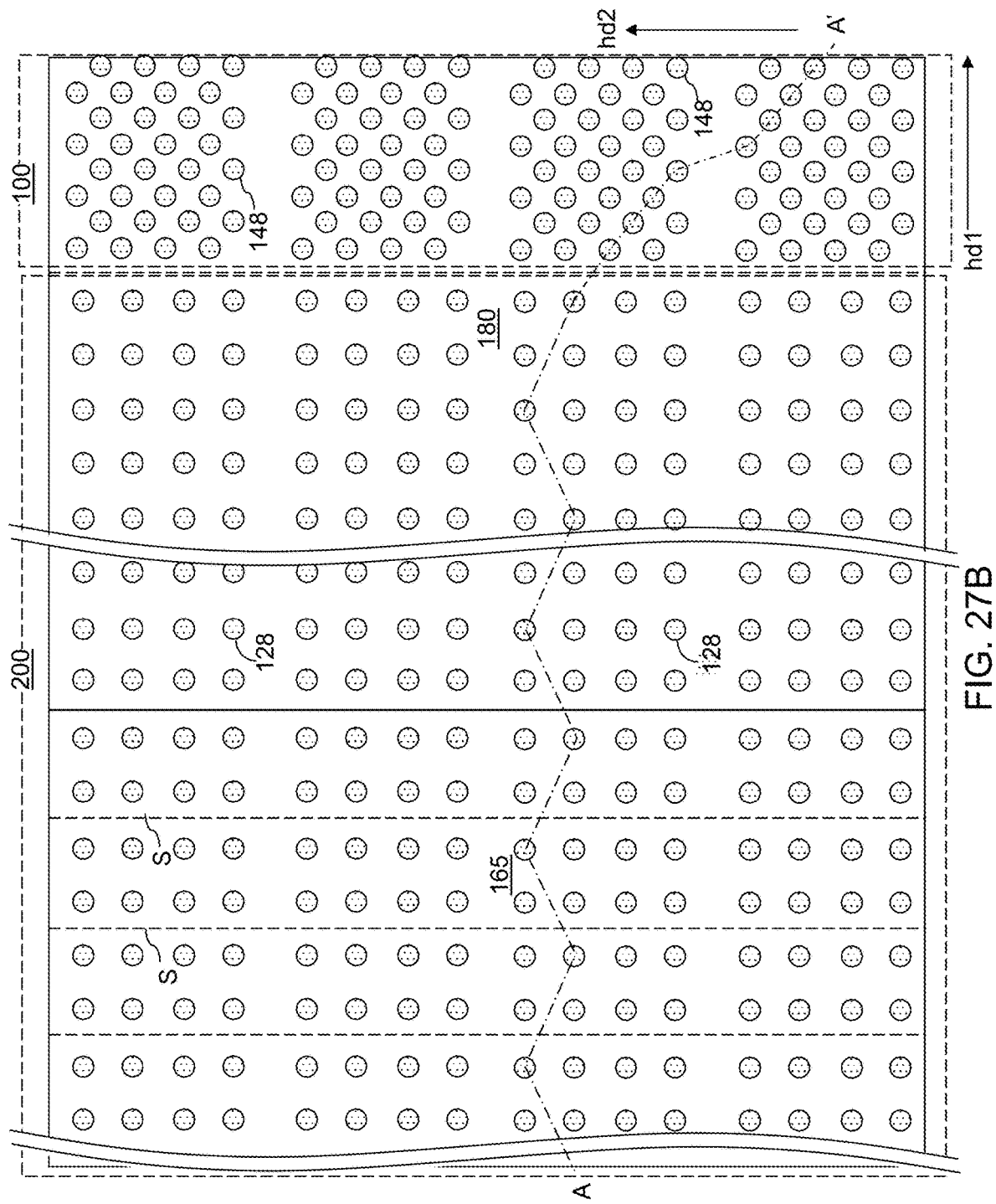
FIG. 27B is a top-down view of the second exemplary structure of FIG. 27A. The hinged vertical plane A-A' corresponds to the plane of the vertical cross-sectional view of FIG. 27A.

Referring to FIGS. 27A and 27B, sacrificial first-tier opening fill portions (148, 128) may be formed in the various first-tier openings (149, 129). For example, a sacrificial first-tier fill material is deposited concurrently deposited in each of the first-tier openings (149, 129). The sacrificial first-tier fill material includes a material that may be subsequently removed selective to the materials of the first-tier insulating layers 132 and the first-tier sacrificial material layers 142.

In one embodiment, the sacrificial first-tier fill material may include a semiconductor material such as silicon (e.g., a-Si or polysilicon), a silicon-germanium alloy, germanium, a III-V compound semiconductor material, or a combination thereof. Optionally, a thin etch stop liner (such as a silicon oxide layer or a silicon nitride layer having a thickness in a range from 1 nm to 3 nm) may be used prior to depositing the sacrificial first-tier fill material. The sacrificial first-tier fill material may be formed by a non-conformal deposition or a conformal deposition method.

In another embodiment, the sacrificial first-tier fill material may include a silicon oxide material having a higher etch rate than the materials of the first-tier insulating layers 132, the first-tier insulating cap layer 170, and the inter-tier dielectric layer 180. For example, the sacrificial first-tier fill material may include borosilicate glass or porous or non-porous organosilicate glass having an etch rate that is at least 100 times higher than the etch rate of densified TEOS oxide (i.e., a silicon oxide material formed by decomposition of tetraethylorthosilicate glass in a chemical vapor deposition process and subsequently densified in an anneal process) in a 100:1 dilute hydrofluoric acid. In this case, a thin etch stop liner (such as a silicon nitride layer having a thickness in a range from 1 nm to 3 nm) may be used prior to depositing the sacrificial first-tier fill material. The sacrificial first-tier fill material may be formed by a non-conformal deposition or a conformal deposition method.

In yet another embodiment, the sacrificial first-tier fill material may include amorphous silicon or a carbon-containing material (such as amorphous carbon or diamond-like carbon) that may be subsequently removed by ashing, or a silicon-based polymer that may be subsequently removed selective to the materials of the first alternating stack (132, 142).

Portions of the deposited sacrificial material may be removed from above the topmost layer of the first-tier alternating stack (132, 142), such as from above the inter-tier dielectric layer 180. For example, the sacrificial first-tier fill material may be recessed to a top surface of the inter-tier dielectric layer 180 using a planarization process. The planarization process may include a recess etch, chemical mechanical planarization (CMP), or a combination thereof. The top surface of the inter-tier dielectric layer 180 may be used as an etch stop layer or a planarization stop layer.

Remaining portions of the sacrificial first-tier fill material comprise sacrificial first-tier opening fill portions (148, 128). Specifically, each remaining portion of the sacrificial material in a first-tier memory opening 149 constitutes a sacrificial first-tier memory opening fill portion 148. Each remaining portion of the sacrificial material in a first-tier support opening 129 constitutes a sacrificial first-tier support opening fill portion 128. The various sacrificial first-tier opening fill portions (148, 128) are concurrently formed, i.e., during a same set of processes including the deposition process that deposits the sacrificial first-tier fill material and the planarization process that removes the first-tier deposition process from above the first alternating stack (132, 142) (such as from above the top surface of the inter-tier dielectric layer 180). The top surfaces of the sacrificial first-tier opening fill portions (148, 128) may be coplanar with the top surface of the inter-tier dielectric layer 180. Each of the sacrificial first-tier opening fill portions (148, 128) may, or may not, include cavities therein.

Figure 28A:
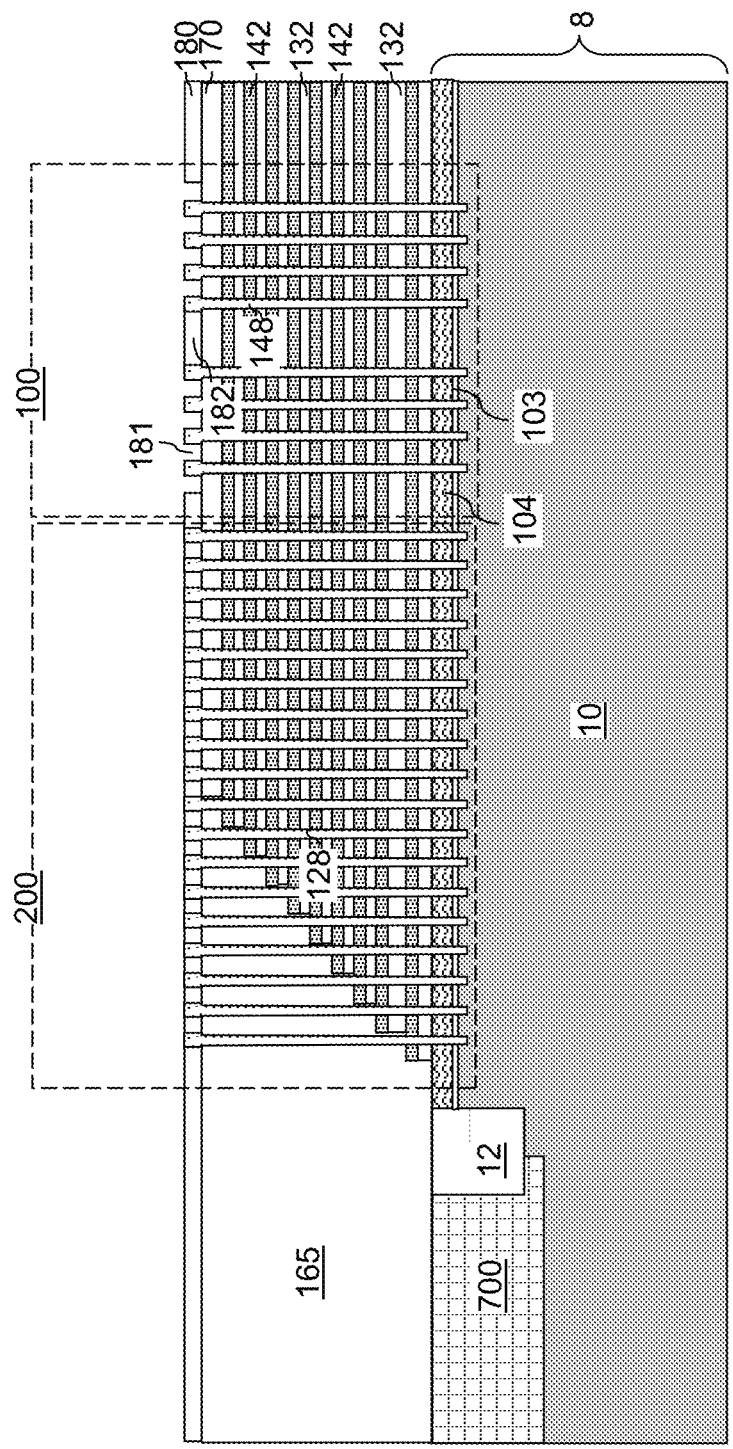
FIG. 28A is a vertical cross-sectional view of the second exemplary structure after formation of a one-dimensional array of line trenches according to the second embodiment of the present disclosure.
Figure 28B:
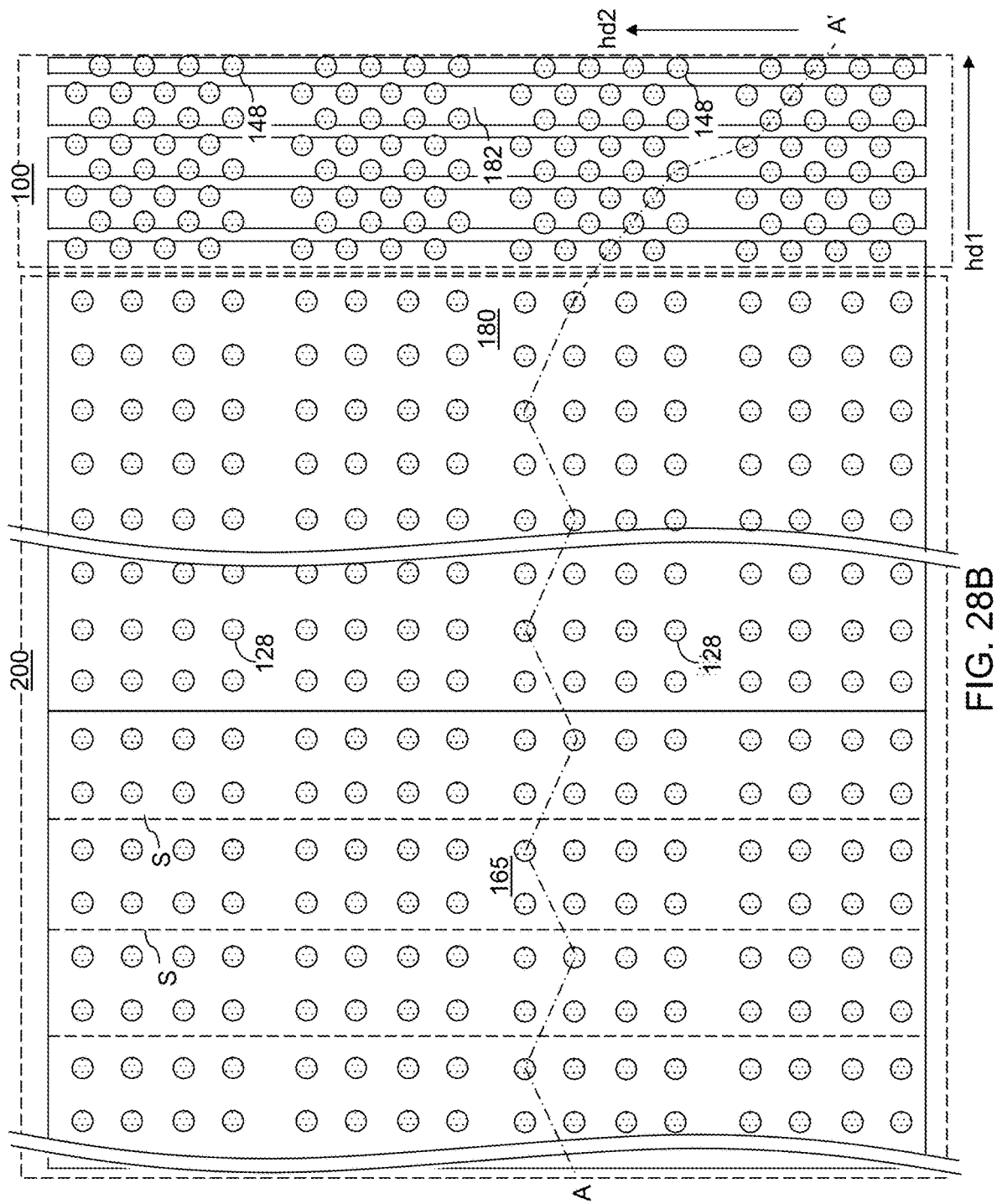
FIG. 28B is a top-down view of the second exemplary structure of FIG. 28A. The hinged vertical plane A-A' corresponds to the plane of the vertical cross-sectional view of FIG. 28A.

Referring to FIGS. 28A and 28B, a photoresist layer (not shown) can be applied over the inter-tier dielectric layer 180, and lithographically patterned to form a pattern of line-shaped openings that laterally extend along the second horizontal direction hd2. The locations and the widths of the line-shaped openings in the photoresist layer are selected such that each sacrificial first-tier memory opening fill portion 148 includes a peripheral region that underlies a respective one of the line-shaped openings in the photoresist layer. In one embodiment, each overlap area between the top surfaces of the sacrificial first-tier memory opening fill portion 148 and the areas of the line-shaped openings in the photoresist layer can have a shape of a circular segment. As used herein, a "circular segment" is a region of a circle which is "cut off" from the rest of the circle by a secant or a chord.

An anisotropic etch process is performed to etch the material of the inter-tier dielectric layer 180 selective to the material of the sacrificial first-tier memory opening fill portion 148. For example, the inter-tier dielectric layer 180 can include silicon oxide, and the sacrificial first-tier memory opening fill portion 148 can include amorphous silicon. In this case, the anisotropic etch process can use an etch chemistry that etches silicon oxide selective to silicon. Line trenches 181 are formed through the inter-tier dielectric layer 180. Each of the line trenches 181 can include a laterally alternating sequence of planar sidewall segments and convex sidewall segments. Each of the convex sidewall segments can be a portion of a cylindrical sidewall of a sacrificial first-tier memory opening fill portion 148.

The line trenches 181 may be formed as a one-dimensional array of line trenches 181 having a uniform center-to-center pitch along the first horizontal direction. In one embodiment, the sacrificial first-tier memory opening fill portion 148 can be formed in columns that laterally extend along the second horizontal direction hd2. In one embodiment, the uniform center-to-center pitch within the one-dimensional array of line trenches 181 may be twice the column-to-column distance of the columns of sacrificial first-tier memory opening fill portion 148. In one embodiment, only one side of each sacrificial first-tier memory opening fill portion 148 can be physically exposed to a respective one of the line trenches 181. Each patterned portion of the inter-tier dielectric layer 180 between a neighboring pair of line trenches 181 is herein referred to as an insulating material strip 182. A laterally alternating sequence of insulating material strips 182 and line trenches 181 is formed within the area of the memory array region 100.

Figure 29A:
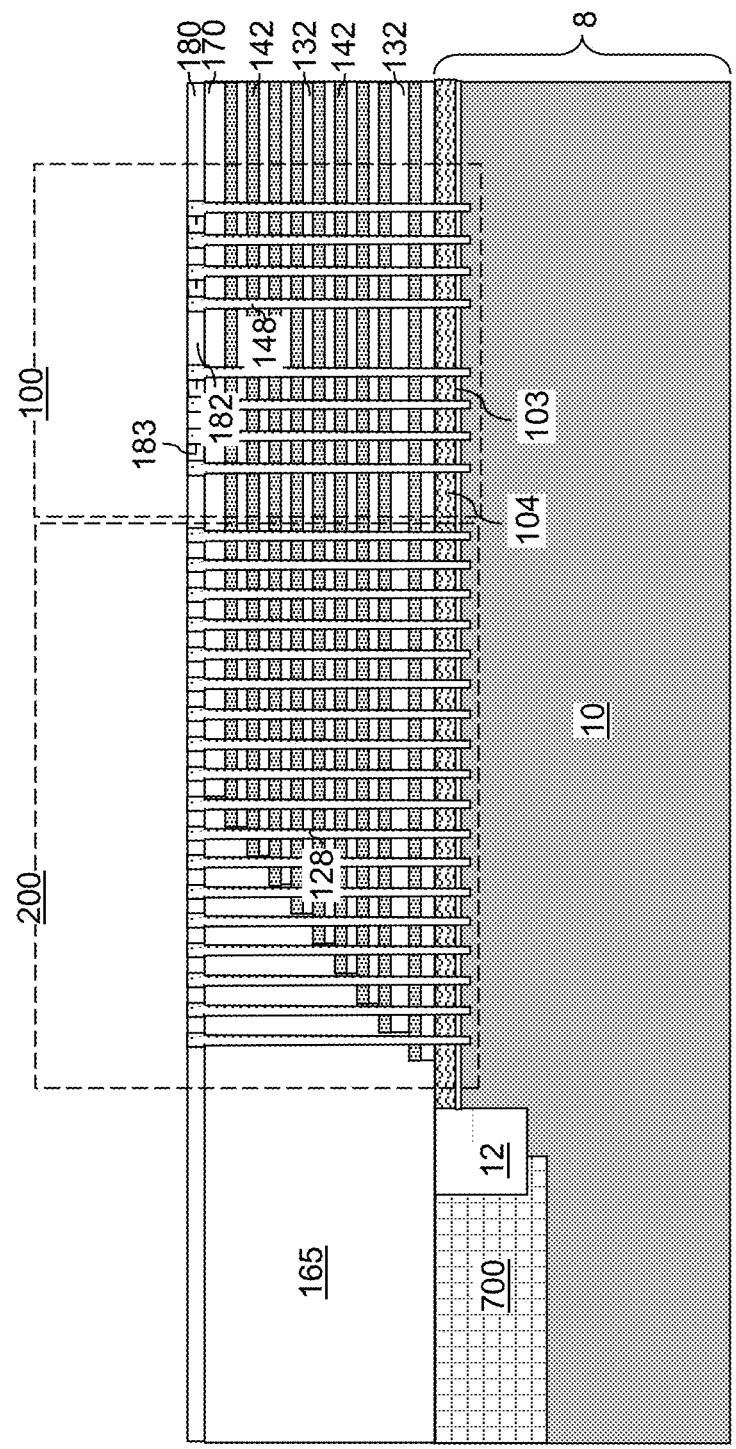
FIG. 29A is a vertical cross-sectional view of the second exemplary structure after formation of sacrificial material strips according to the second embodiment of the present disclosure.
Figure 29B:
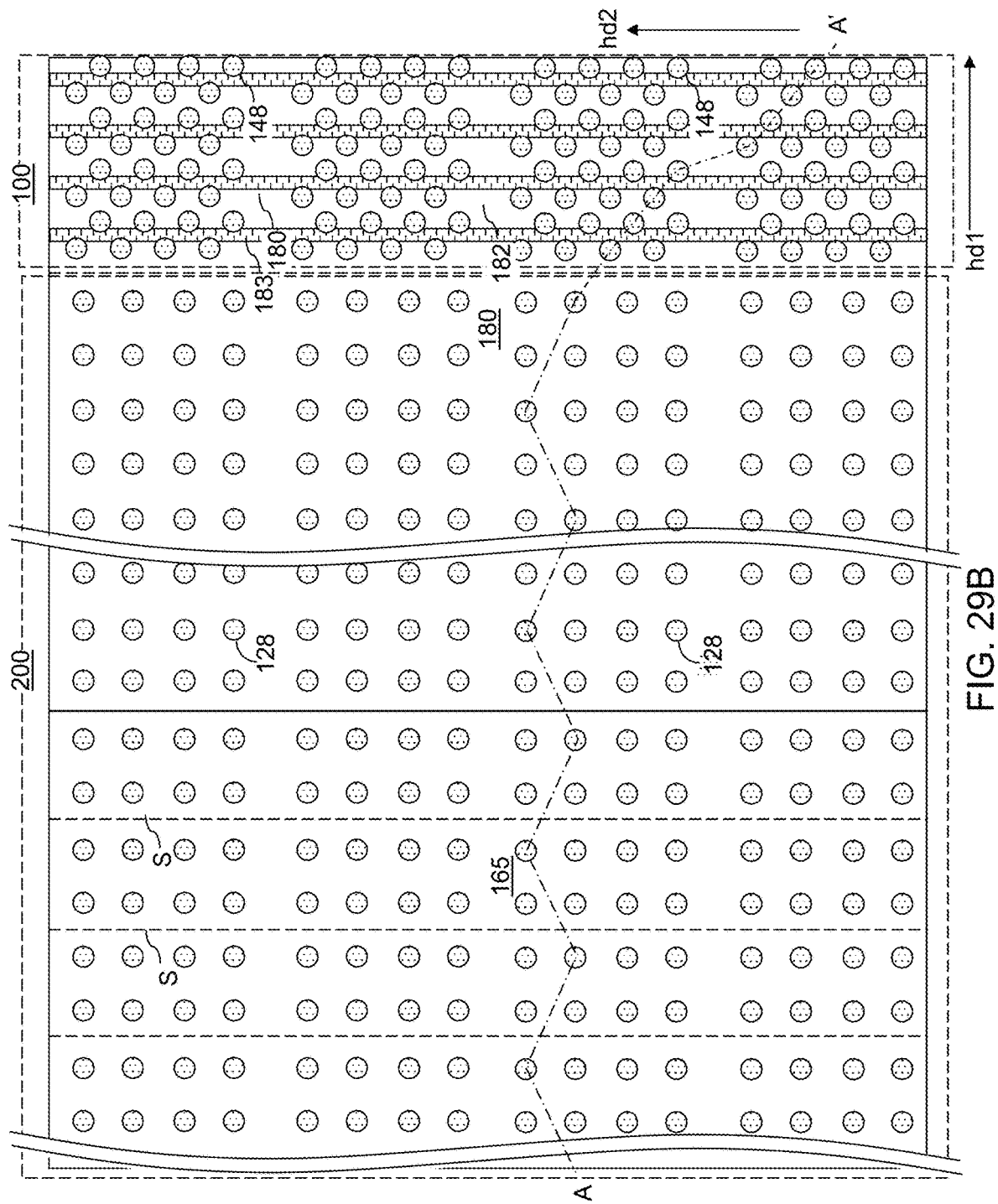
FIG. 29B is a top-down view of the second exemplary structure of FIG. 28A. The hinged vertical plane A-A' corresponds to the plane of the vertical cross-sectional view of FIG. 28A.

Referring to FIGS. 29A and 29B, a sacrificial material is deposited in the line trenches 181 and over the inter-tier dielectric layer 180. The sacrificial material includes a material that is different from the materials of the first-tier insulating layers 132, the first-tier sacrificial material layers 142, the first-tier insulating cap layer 170, and the inter-tier dielectric layer 180. In one embodiment, the sacrificial material can include amorphous carbon, organosilicate glass, amorphous undoped silicon or a silicon-germanium alloy. Excess portions of the sacrificial material can be removed from above the horizontal plane including the top surface of the inter-tier dielectric layer 180. Each remaining portion of the sacrificial material in a respective one of the line trenches 181 constitutes a sacrificial material strip 183. A laterally alternating sequence of insulating material strips 182 and sacrificial material strips 183 is formed above the first-tier insulating cap layer 170, i.e., at the level of the inter-tier dielectric layer 180. The remaining portion of the inter-tier dielectric layer 180 can be located in the staircase region 200, and the laterally alternating sequence of insulating material strips 182 and sacrificial material strips 183 can be located within the memory array region 100.

Figure 30:
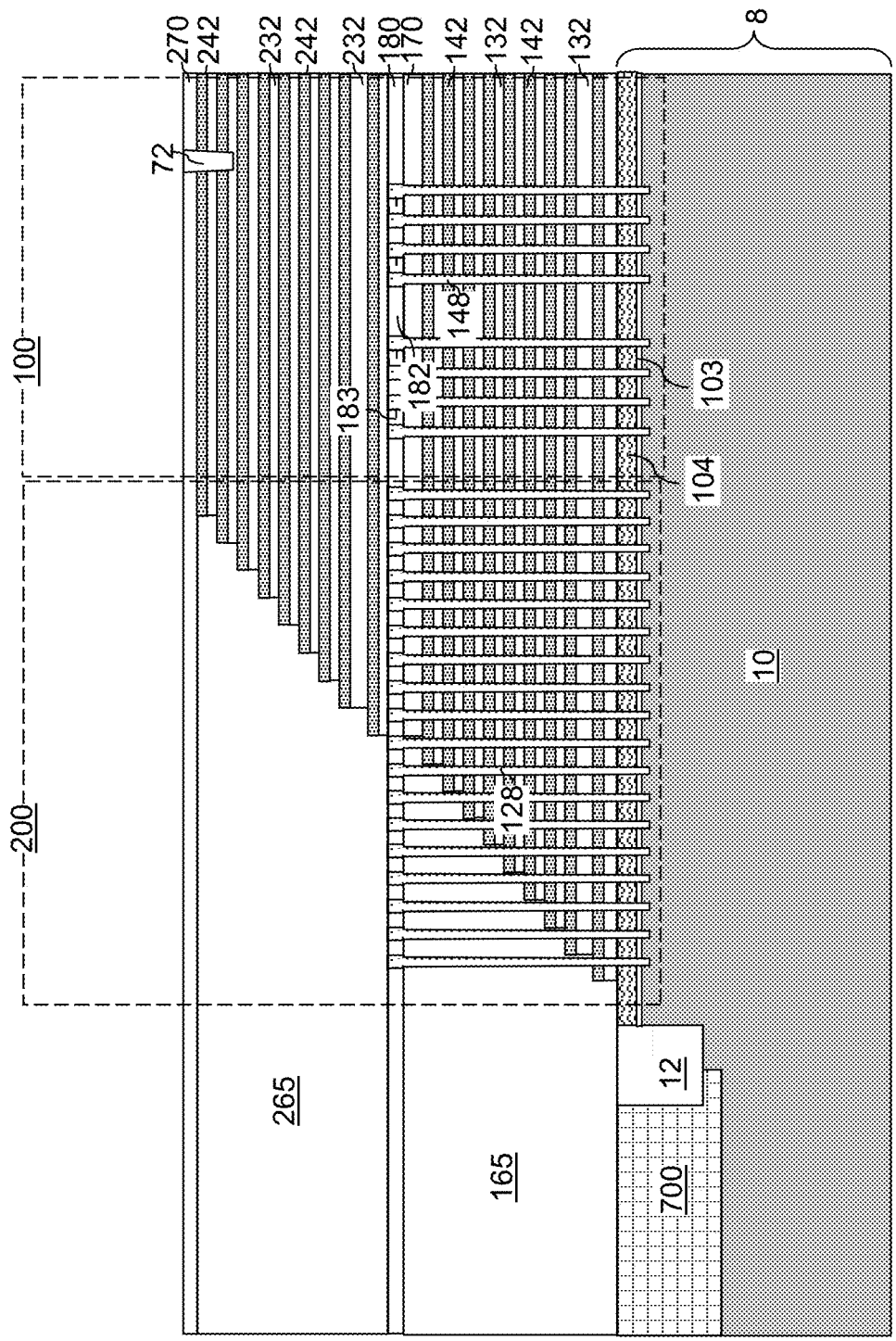
FIG. 30 is a vertical cross-sectional view of the second exemplary structure after formation of a second-tier alternating stack of second insulating layers and second sacrificial material layers, second stepped surfaces, and a second retro-stepped dielectric material portion according to the second embodiment of the present disclosure.

Referring to FIG. 30, a second-tier structure may be formed over the first-tier structure (132, 142, 170, 148, 128). The second-tier structure may include an additional alternating stack of insulating layers and spacer material layers, which may be sacrificial material layers. For example, a second alternating stack (232, 242) of material layers may be subsequently formed on the top surface of the first alternating stack (132, 142). The second alternating stack (232, 242) includes an alternating plurality of third material layers and fourth material layers. Each third material layer may include a third material, and each fourth material layer may include a fourth material that is different from the third material. In one embodiment, the third material may be the same as the first material of the first-tier insulating layer 132, and the fourth material may be the same as the second material of the first-tier sacrificial material layers 142.

In one embodiment, the third material layers may be second insulating layers 232 and the fourth material layers may be second spacer material layers that provide vertical spacing between each vertically neighboring pair of the second insulating layers 232. In one embodiment, the third material layers and the fourth material layers may be second insulating layers 232 and second-tier sacrificial material layers 242, respectively. The third material of the second insulating layers 232 may be at least one insulating material. The fourth material of the second-tier sacrificial material layers 242 may be a sacrificial material that may be removed selective to the third material of the second insulating layers 232. The second-tier sacrificial material layers 242 may comprise an insulating material, a semiconductor material, or a conductive material. The fourth material of the second-tier sacrificial material layers 242 may be subsequently replaced with electrically conductive electrodes which may function, for example, as control gate electrodes of a vertical NAND device.

In one embodiment, each second insulating layer 232 may include a second insulating material, and each second-tier sacrificial material layer 242 may include a second sacrificial material. In this case, the second alternating stack (232, 242) may include an alternating plurality of second insulating layers 232 and second-tier sacrificial material layers 242. The third material of the second insulating layers 232 may be deposited, for example, by chemical vapor deposition (CVD). The fourth material of the second-tier sacrificial material layers 242 may be formed, for example, CVD or atomic layer deposition (ALD).

The third material of the second insulating layers 232 may be at least one insulating material. Insulating materials that may be used for the second insulating layers 232 may be any material that may be used for the first-tier insulating layers 132. The fourth material of the second-tier sacrificial material layers 242 is a sacrificial material that may be removed selective to the third material of the second insulating layers 232. Sacrificial materials that may be used for the second-tier sacrificial material layers 242 may be any material that may be used for the first-tier sacrificial material layers 142. In one embodiment, the second insulating material may be the same as the first insulating material, and the second sacrificial material may be the same as the first sacrificial material.

The thicknesses of the second insulating layers 232 and the second-tier sacrificial material layers 242 may be in a range from 20 nm to 50 nm, although lesser and greater thicknesses may be used for each second insulating layer 232 and for each second-tier sacrificial material layer 242. The number of repetitions of the pairs of a second insulating layer 232 and a second-tier sacrificial material layer 242 may be in a range from 2 to 1,024, and typically from 8 to 256, although a greater number of repetitions may also be used. In one embodiment, each second-tier sacrificial material layer 242 in the second alternating stack (232, 242) may have a uniform thickness that is substantially invariant within each respective second-tier sacrificial material layer 242.

Second stepped surfaces in the second stepped area may be formed in the staircase region 200 using a same set of processing steps as the processing steps used to form the first stepped surfaces in the first stepped area with suitable adjustment to the pattern of at least one masking layer. A second retro-stepped dielectric material portion 265 may be formed over the second stepped surfaces in the staircase region 200.

A second-tier insulating cap layer 270 may be subsequently formed over the second alternating stack (232, 242). The second-tier insulating cap layer 270 includes a dielectric material that is different from the material of the second-tier sacrificial material layers 242. In one embodiment, the second-tier insulating cap layer 270 may include silicon oxide. In one embodiment, the first and second-tier sacrificial material layers (142, 242) may comprise silicon nitride.

Optionally, drain-select-level isolation structures 72 may be formed through a subset of layers in an upper portion of the second-tier alternating stack (232, 242). The second-tier sacrificial material layers 242 that are cut by the drain-select-level isolation structures 72 correspond to the levels in which drain-select-level electrically conductive layers are subsequently formed. The drain-select-level isolation structures 72 include a dielectric material such as silicon oxide. The drain-select-level isolation structures 72 may laterally extend along a first horizontal direction hd1, and may be laterally spaced apart along a second horizontal direction hd2 that is perpendicular to the first horizontal direction hd1. The combination of the second alternating stack (232, 242), the second retro-stepped dielectric material portion 265, the second-tier insulating cap layer 270, and the optional drainselect-level isolation structures 72 collectively constitute a second-tier structure (232, 242, 265, 270, 72).

Figure 31A:
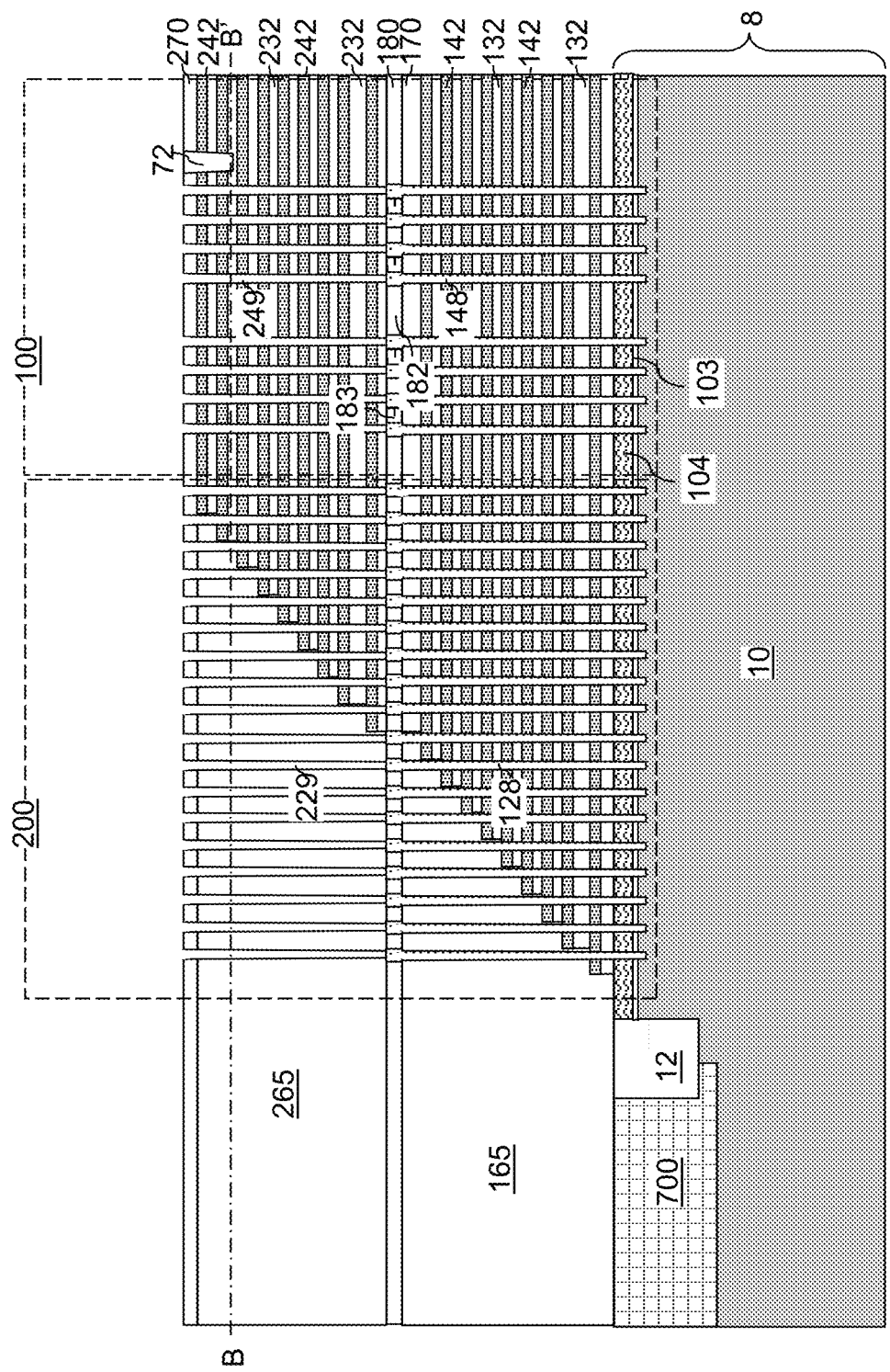
FIG. 31A is a vertical cross-sectional view of the second exemplary structure after formation of second-tier memory openings and second-tier support openings according to the second embodiment of the present disclosure.
Figure 31B:
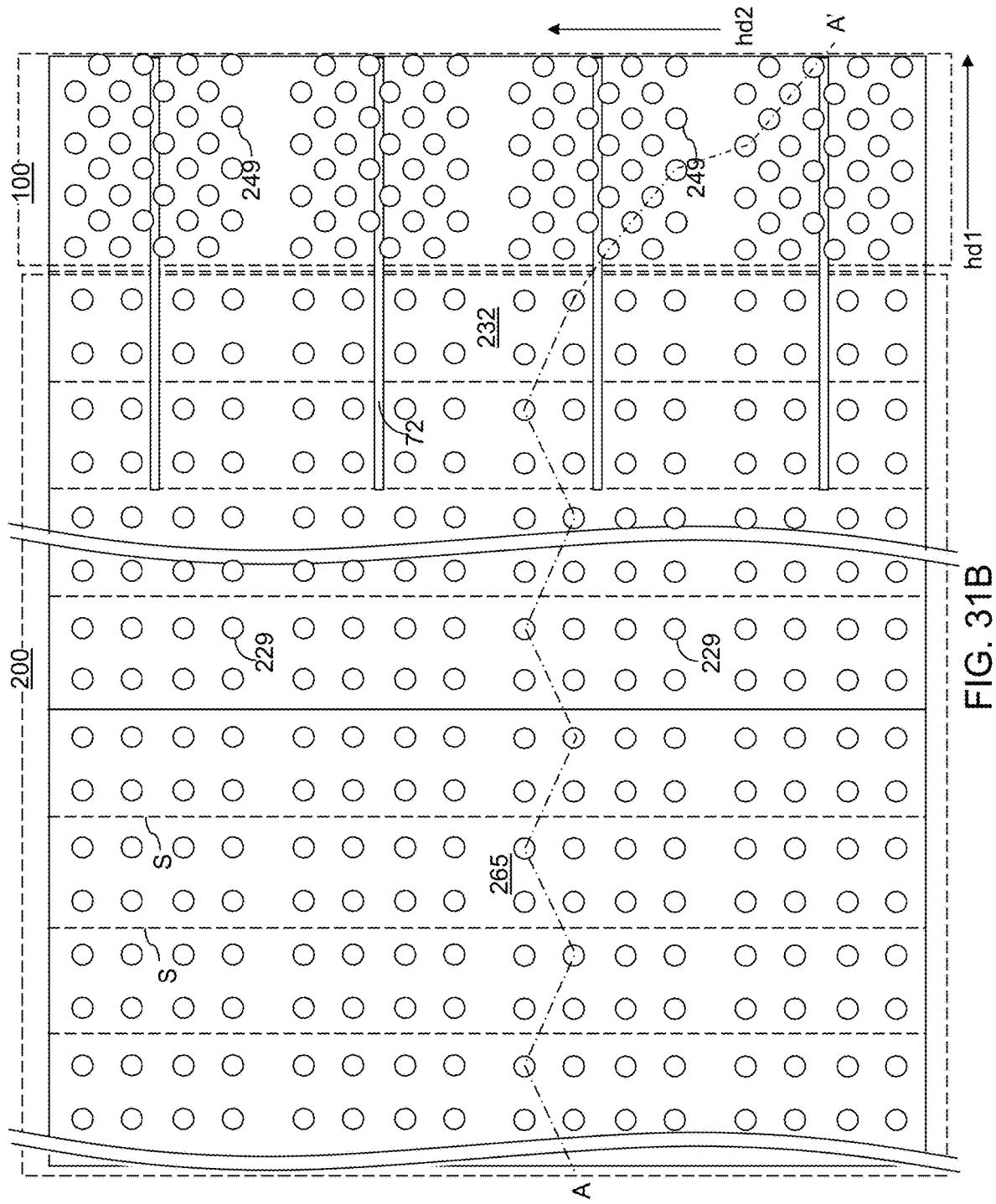
FIG. 31B is a horizontal cross-sectional view of the second exemplary structure along the horizontal plane B-B' of FIG. 7A. The hinged vertical plane A-A' corresponds to the plane of the vertical cross-sectional view of FIG. 7A.

Referring to FIGS. 31A and 31B, various second-tier openings (249, 229) may be formed through the second-tier structure (232, 242, 265, 270, 72). A photoresist layer (not shown) may be applied over the second-tier insulating cap layer 270, and may be lithographically patterned to form various openings therethrough. The pattern of the openings may be the same as the pattern of the various first-tier openings (149, 129), which is the same as the sacrificial first-tier opening fill portions (148, 128). Thus, the lithographic mask used to pattern the first-tier openings (149, 129) may be used to pattern the photoresist layer.

The pattern of openings in the photoresist layer may be transferred through the second-tier structure (232, 242, 265, 270, 72) by a second anisotropic etch process to form various second-tier openings (249, 229) concurrently, i.e., during the second anisotropic etch process. The various second-tier openings (249, 229) may include second-tier memory openings 249 and second-tier support openings 229.

The second-tier memory openings 249 are formed directly on a top surface of a respective one of the sacrificial first-tier memory opening fill portions 148. The second-tier support openings 229 are formed directly on a top surface of a respective one of the sacrificial first-tier support opening fill portions 128. Further, each second-tier support openings 229 may be formed through a horizontal surface within the second stepped surfaces, which include the interfacial surfaces between the second alternating stack (232, 242) and the second retro-stepped dielectric material portion 265. Locations of steps Sin the first-tier alternating stack (132, 142) and the second-tier alternating stack (232, 242) are illustrated as dotted lines in FIG. 31B.

The second anisotropic etch process may include an etch step in which the materials of the second-tier alternating stack (232, 242) are etched concurrently with the material of the second retro-stepped dielectric material portion 265. The chemistry of the etch step may alternate to optimize etching of the materials in the second-tier alternating stack (232, 242) while providing a comparable average etch rate to the material of the second retro-stepped dielectric material portion 265. The second anisotropic etch process may use, for example, a series of reactive ion etch processes or a single reaction etch process (e.g., $CF_4/O_2/Ar$ etch). The sidewalls of the various second-tier openings (249, 229) may be substantially vertical, or may be tapered. A bottom periphery of each second-tier opening (249, 229) may be laterally offset, and/or may be located entirely within, a periphery of a top surface of an underlying sacrificial first-tier opening fill portion (148, 128). The photoresist layer may be subsequently removed, for example, by ashing.

Figure 32:
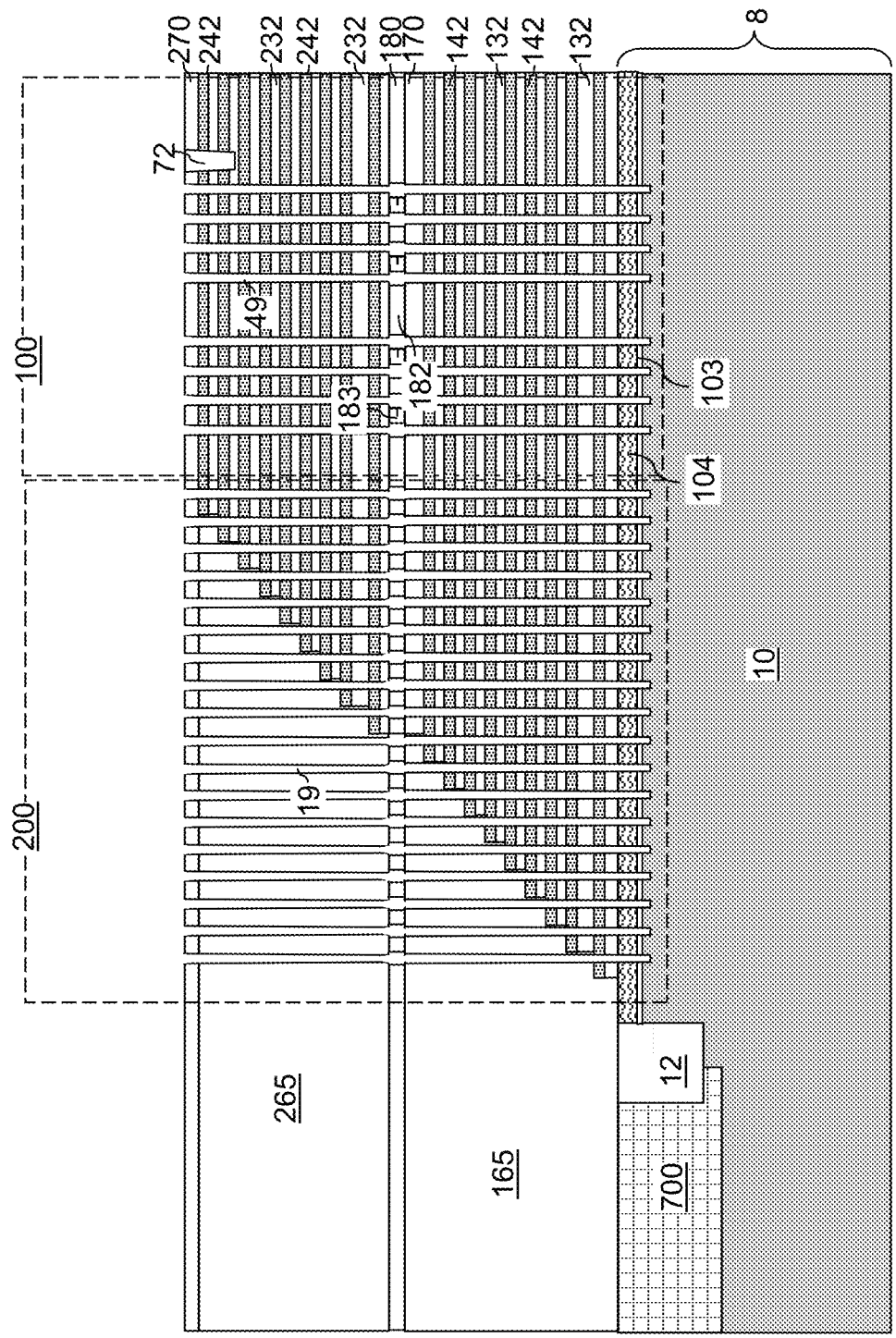
FIG. 32 is a vertical cross-sectional view of the second exemplary structure after formation of inter-tier memory openings and inter-tier support openings according to the second embodiment of the present disclosure.

Referring to FIG. 32, the sacrificial first-tier fill material of the sacrificial first-tier opening fill portions (148, 128) may be removed using an etch process that etches the sacrificial first-tier fill material selective to the materials of the first and second insulating layers (132, 232), the first and second-tier sacrificial material layers (142, 242), the first and second-tier insulating cap layers (170, 270), and the inter-tier dielectric layer 180. A memory opening 49, which is also referred to as an inter-tier memory opening 49, is formed in each combination of a second-tier memory openings 249 and a volume from which a sacrificial first-tier memory opening fill portion 148 is removed. A support opening 19, which is also referred to as an inter-tier support opening 19, is formed in each combination of a second-tier support openings 229 and a volume from which a sacrificial first-tier support opening fill portion 128 is removed. Each of the memory openings 49 cuts through a lengthwise edge of a respective one of the sacrificial material strips 183.

FIGS. 33A-33D provide sequential cross-sectional views of a memory opening 49 during formation of a memory opening fill structure. The same structural change occurs in each of the memory openings 49 and the support openings 19.

Referring to FIG. 33A, a memory opening 49 in the first exemplary device structure of FIG. 8 is illustrated. The memory opening 49 extends through the first-tier structure and the second-tier structure.

Referring to FIG. 33B, a stack of layers including a blocking dielectric layer 52, a charge storage layer 54, a tunneling dielectric layer 56, and a continuous sacrificial spacer material layer 260L may be sequentially deposited in the memory openings 49. The blocking dielectric layer 52 may include a single dielectric material layer or a stack of a plurality of dielectric material layers. In one embodiment, the blocking dielectric layer may include a dielectric metal oxide layer consisting essentially of a dielectric metal oxide. As used herein, a dielectric metal oxide refers to a dielectric material that includes at least one metallic element and at least oxygen. The dielectric metal oxide may consist essentially of the at least one metallic element and oxygen, or may consist essentially of the at least one metallic element, oxygen, and at least one non-metallic element such as nitrogen. In one embodiment, the blocking dielectric layer 52 may include a dielectric metal oxide having a dielectric constant greater than 7.9, i.e., having a dielectric constant greater than the dielectric constant of silicon nitride. The thickness of the dielectric metal oxide layer may be in a range from 1 nm to 20 nm, although lesser and greater thicknesses may also be used. The dielectric metal oxide layer may subsequently function as a dielectric material portion that blocks leakage of stored electrical charges to control gate electrodes. In one embodiment, the blocking dielectric layer 52 includes aluminum oxide. Alternatively or additionally, the blocking dielectric layer 52 may include a dielectric semiconductor compound such as silicon oxide, silicon oxynitride, silicon nitride, or a combination thereof.

Subsequently, the charge storage layer 54 may be formed. In one embodiment, the charge storage layer 54 may be a continuous layer or patterned discrete portions of a charge trapping material including a dielectric charge trapping material, which may be, for example, silicon nitride. Alternatively, the charge storage layer 54 may include a continuous layer or patterned discrete portions of a conductive material such as doped polysilicon or a metallic material that is patterned into multiple electrically isolated portions (e.g., floating gates), for example, by being formed within lateral recesses into sacrificial material layers (142, 242). In one embodiment, the charge storage layer 54 includes a silicon nitride layer. In one embodiment, the sacrificial material layers (142, 242) and the insulating layers (132, 232) may have vertically coincident sidewalls, and the charge storage layer 54 may be formed as a single continuous layer. Alternatively, the sacrificial material layers (142, 242) may be laterally recessed with respect to the sidewalls of the insulating layers (132, 232), and a combination of a deposition process and an anisotropic etch process may be used to form the charge storage layer 54 as a plurality of memory material portions that are vertically spaced apart. The thickness of the charge storage layer 54 may be in a range from 2 nm to 20 nm, although lesser and greater thicknesses may also be used.

The tunneling dielectric layer 56 includes a dielectric material through which charge tunneling may be performed under suitable electrical bias conditions. The charge tunneling may be performed through hot-carrier injection or by Fowler-Nordheim tunneling induced charge transfer depending on the mode of operation of the monolithic three-dimensional NAND string memory device to be formed. The tunneling dielectric layer 56 may include silicon oxide, silicon nitride, silicon oxynitride, dielectric metal oxides (such as aluminum oxide and hafnium oxide), dielectric metal oxynitride, dielectric metal silicates, alloys thereof, and/or combinations thereof. In one embodiment, the tunneling dielectric layer 56 may include a stack of a first silicon oxide layer, a silicon oxynitride layer, and a second silicon oxide layer, which is commonly known as an ONO stack. In one embodiment, the tunneling dielectric layer 56 may include a silicon oxide layer that is substantially free of carbon or a silicon oxynitride layer that is substantially free of carbon. The thickness of the tunneling dielectric layer 56 may be in a range from 2 nm to 20 nm, although lesser and greater thicknesses may also be used. The stack of the blocking dielectric layer 52, the charge storage layer 54, and the tunneling dielectric layer 56 constitutes a memory film 50 that stores memory bits.

The continuous sacrificial spacer material layer 260L is deposited on the memory film 50. The continuous sacrificial spacer material layer 260L includes a material that can be removed selective to the materials of the memory film 50. For example, the continuous sacrificial spacer material layer 260L can include amorphous silicon, a silicon-germanium alloy, or amorphous carbon. The continuous sacrificial spacer material layer 260L may be formed by a conformal deposition method such as low pressure chemical vapor deposition (LPCVD). The thickness of the continuous sacrificial spacer material layer 260L may be in a range from 2 nm to 10 nm, although lesser and greater thicknesses may also be used. A memory cavity 49' is present within each volume of the memory openings 49 that is not filled with the deposited material layers (52, 54, 56, 260L).

Referring to FIG. 33C, in case the memory cavity 49' in each memory opening is not completely filled by the continuous sacrificial spacer material layer 260L, a dielectric core layer may be deposited in the memory cavity 49' to fill any remaining portion of the memory cavity 49' within each memory opening. The dielectric core layer includes a dielectric material such as silicon oxide or organosilicate glass. The dielectric core layer may be deposited by a conformal deposition method such as low pressure chemical vapor deposition (LPCVD), or by a self-planarizing deposition process such as spin coating. The horizontal portion of the dielectric core layer overlying the second-tier insulating cap layer 270 may be removed, for example, by a recess etch. Optionally, the recess etch may continue until top surfaces of the remaining portions of the dielectric core layer are recessed to a height between the top surface of the second-tier insulating cap layer 270 and the bottom surface of the second-tier insulating cap layer 270. Each remaining portion of the dielectric core layer constitutes a dielectric core 62.

Referring to FIG. 33D, a sacrificial fill material may be deposited in cavities overlying the dielectric cores 62. The sacrificial fill material includes a material that is different from the materials of the continuous sacrificial spacer material layer 260L and the second-tier insulating cap layer 270. For example, the sacrificial fill material can include a doped silicate glass such as borosilicate glass. Portions of the sacrificial fill material, the continuous sacrificial spacer material layer 260L, the tunneling dielectric layer 56, the charge storage layer 54, and the blocking dielectric layer 52 that overlie the horizontal plane including the top surface of the second-tier insulating cap layer 270 may be removed by a planarization process such as a chemical mechanical planarization (CMP) process.

In case the dielectric cores 62 have top surfaces below the horizontal plane including the top surface of the second-tier insulating cap layer 270 and if a sacrificial fill material is used, each remaining portion of the sacrificial fill material constitutes a drain-level sacrificial pillar 91. Each remaining portion of the continuous sacrificial spacer material layer 260L constitutes a sacrificial conformal spacer 260. A tunneling dielectric layer 56 is surrounded by a charge storage layer 54, and laterally surrounds a sacrificial conformal spacer 260. Each adjoining set of a blocking dielectric layer 52, a charge storage layer 54, and a tunneling dielectric layer 56 collectively constitute a memory film 50, which may store electrical charges with a macroscopic retention time. In some embodiments, a blocking dielectric layer 52 may not be present in the memory film 50 at this step, and a blocking dielectric layer may be subsequently formed after formation of backside recesses. As used herein, a macroscopic retention time refers to a retention time suitable for operation of a memory device as a permanent memory device such as a retention time in excess of 24 hours.

Each combination of a memory film 50, a sacrificial conformal spacer 260, a dielectric core 62, and a drain region 63 within a memory opening 49 constitutes an in-process memory opening fill structure 258. The source-level sacrificial layer 104, the first-tier structure (132, 142, 170, 165), the second-tier structure (232, 242, 270, 265, 72), the inter-tier dielectric layer 180, and the in-process memory opening fill structures 258 collectively constitute a memory-level assembly.

Figure 34:
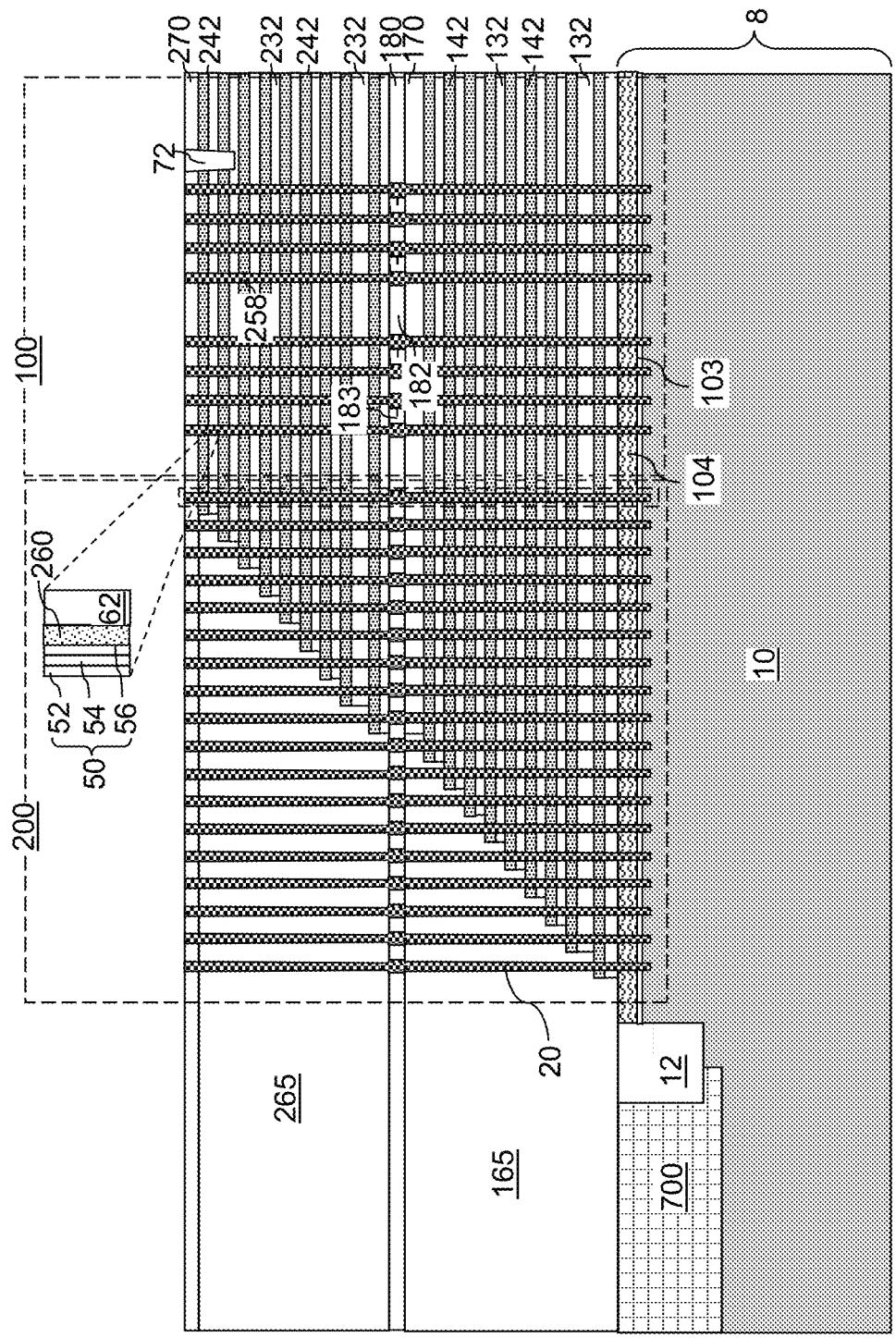
FIG. 34 is a vertical cross-sectional view of the second exemplary structure after formation of memory opening fill structures and support pillar structures according to the second embodiment of the present disclosure.
Figure 35A:
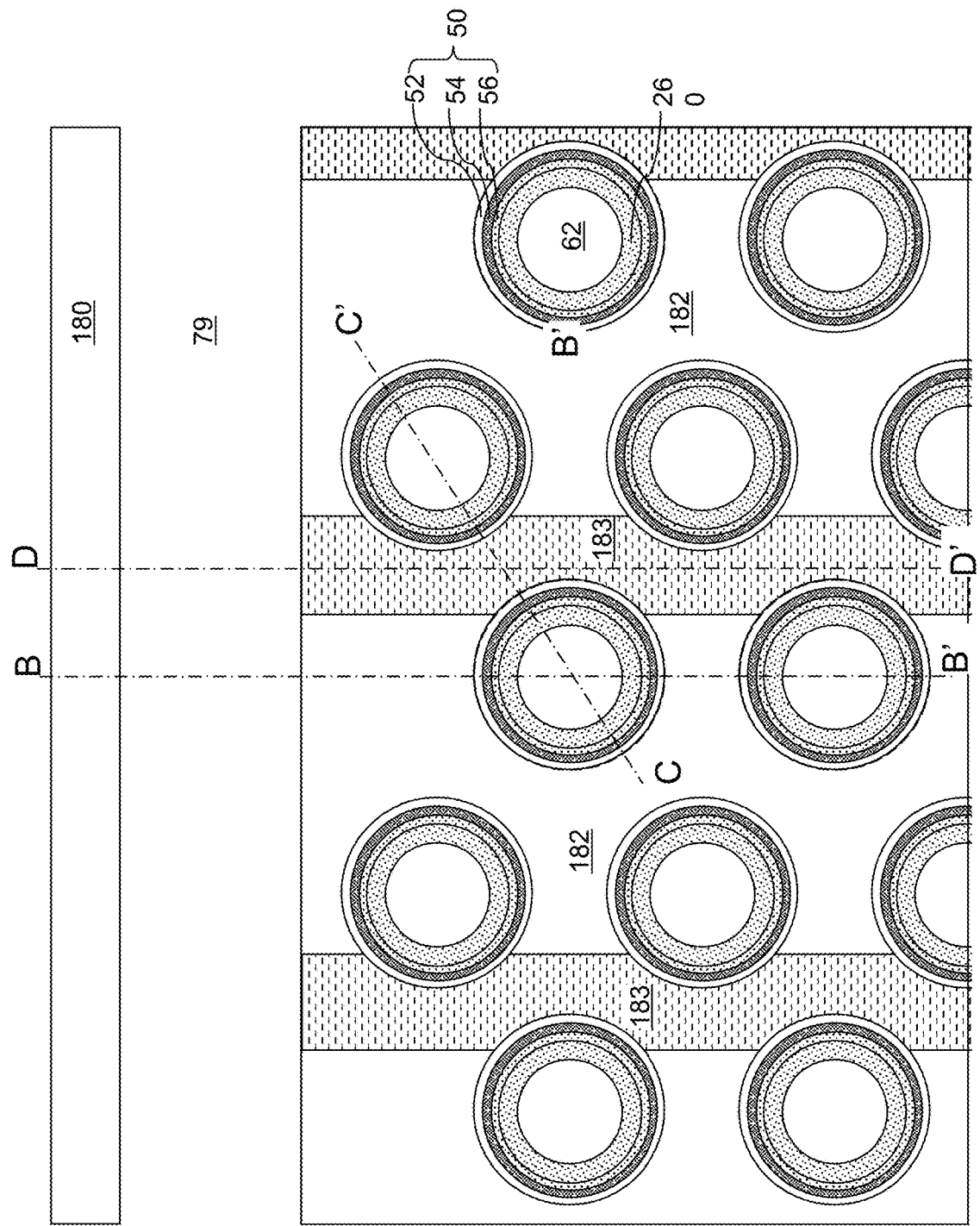
FIG. 35A is a horizontal cross-sectional view of a region of the second exemplary structure that includes a backside trench and in-process memory opening fill structures along a horizontal plane including insulating material strips after formation of backside trenches according to the second embodiment of the present disclosure.
Figure 35B:
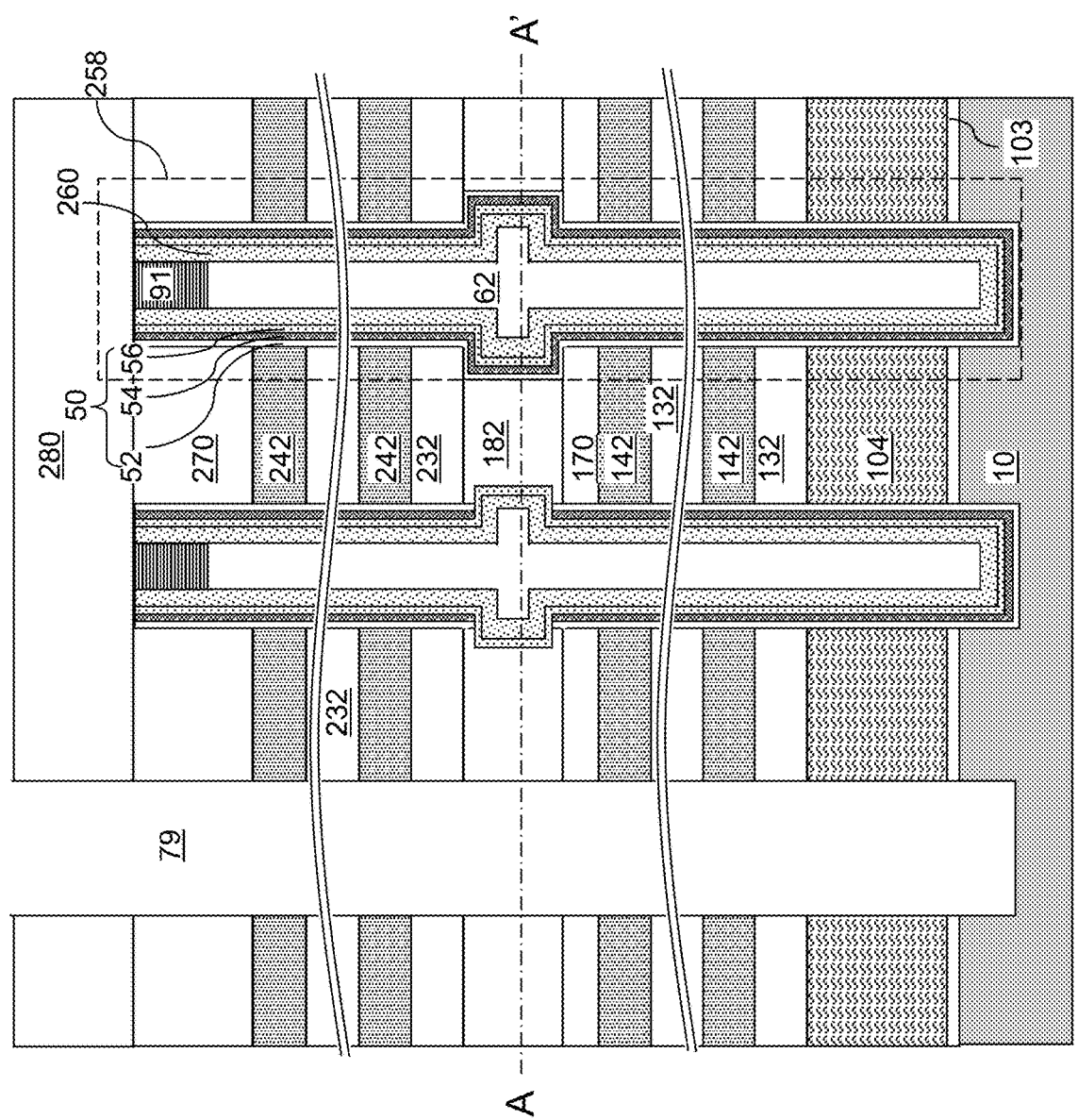
FIG. 35B is a vertical cross-sectional view of a region of the second exemplary structure along the vertical plane B-B' of FIG. 35A. The horizontal plane A-A' is the plane of the horizontal cross-sectional view of FIG. 35A.
Figure 35C:
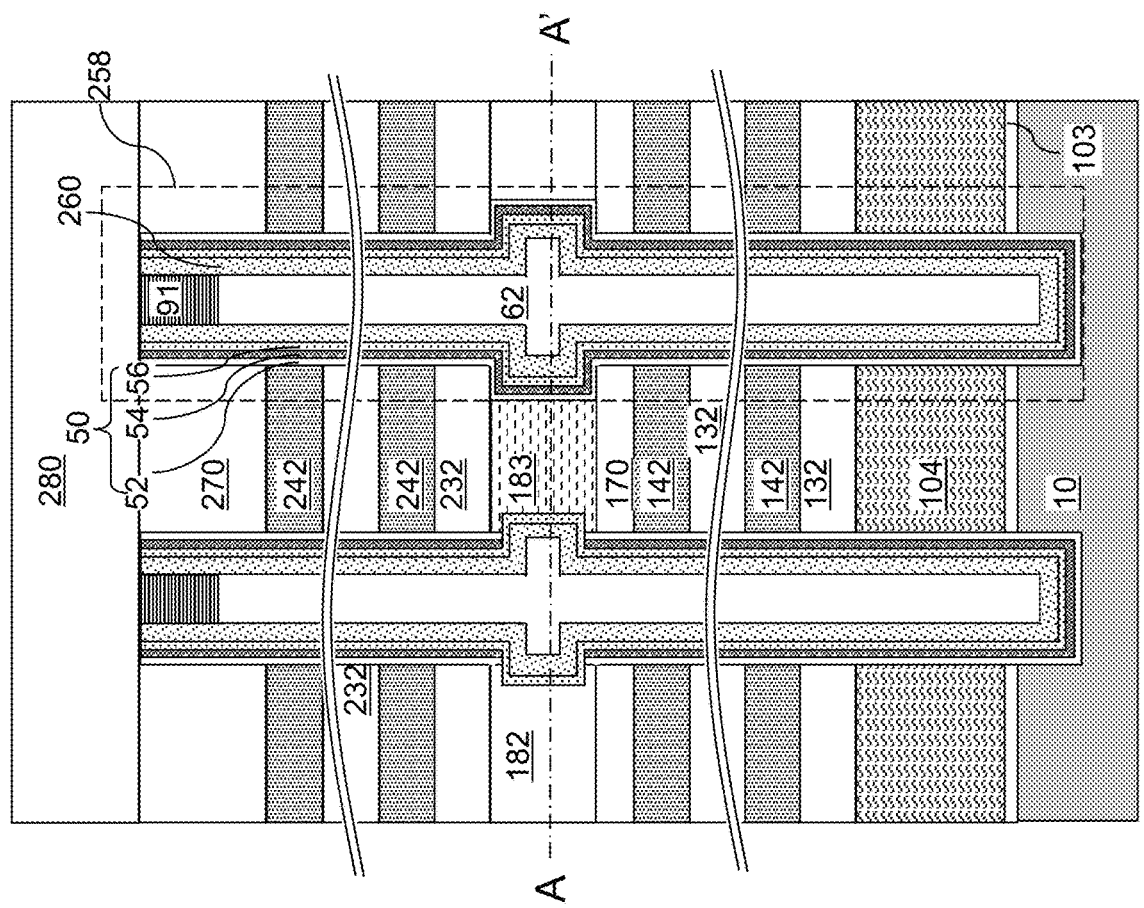
FIG. 35C is a vertical cross-sectional view of a region of the second exemplary structure along the vertical plane C-C' of FIG. 35A. The horizontal plane A-A' is the plane of the horizontal cross-sectional view of FIG. 35A.
Figure 35D:
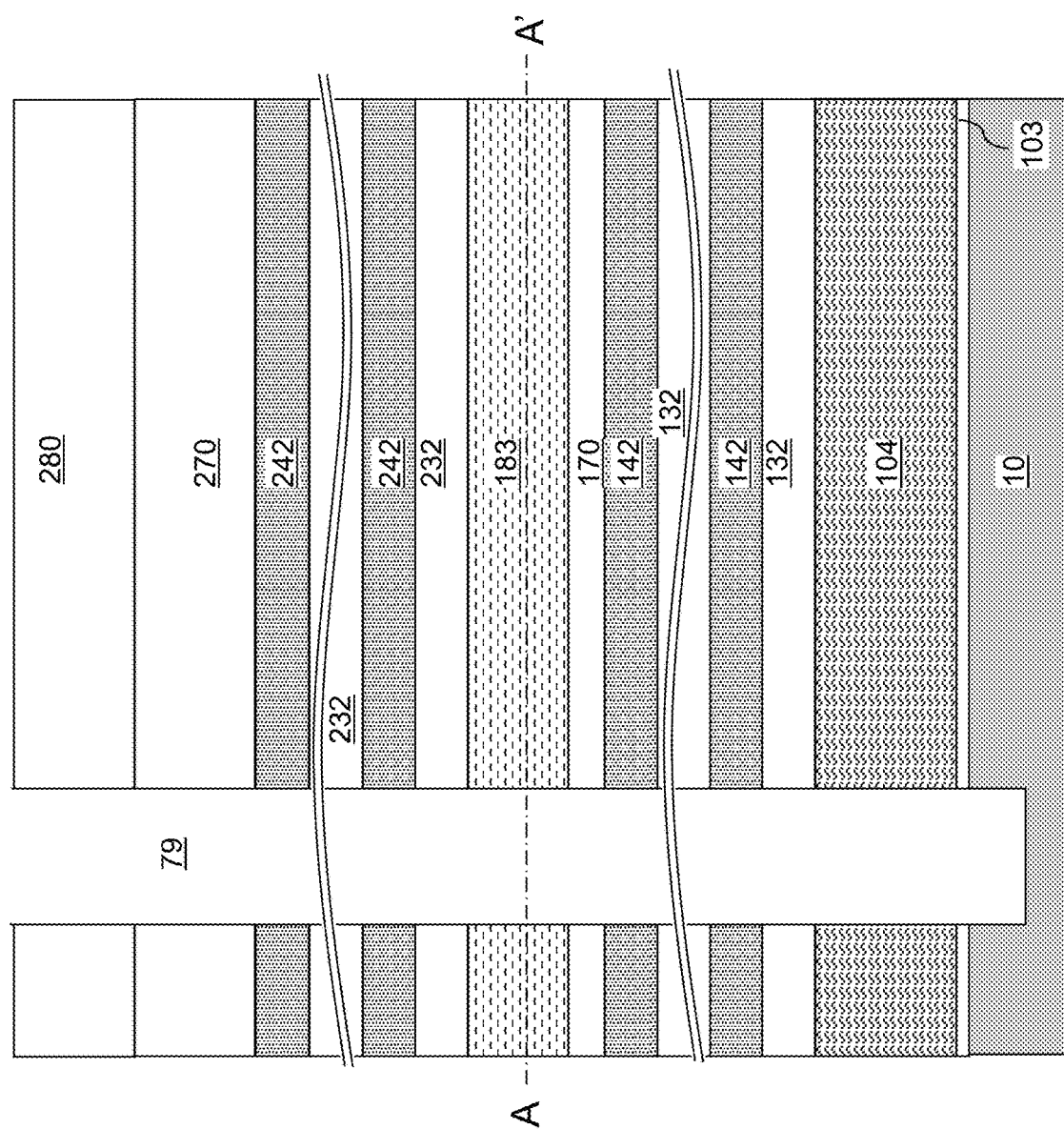
FIG. 35D is a vertical cross-sectional view of a region of the second exemplary structure along the vertical plane D-D' of FIG. 35A. The horizontal plane A-A' is the plane of the horizontal cross-sectional view of FIG. 35A.
Figure 35E:
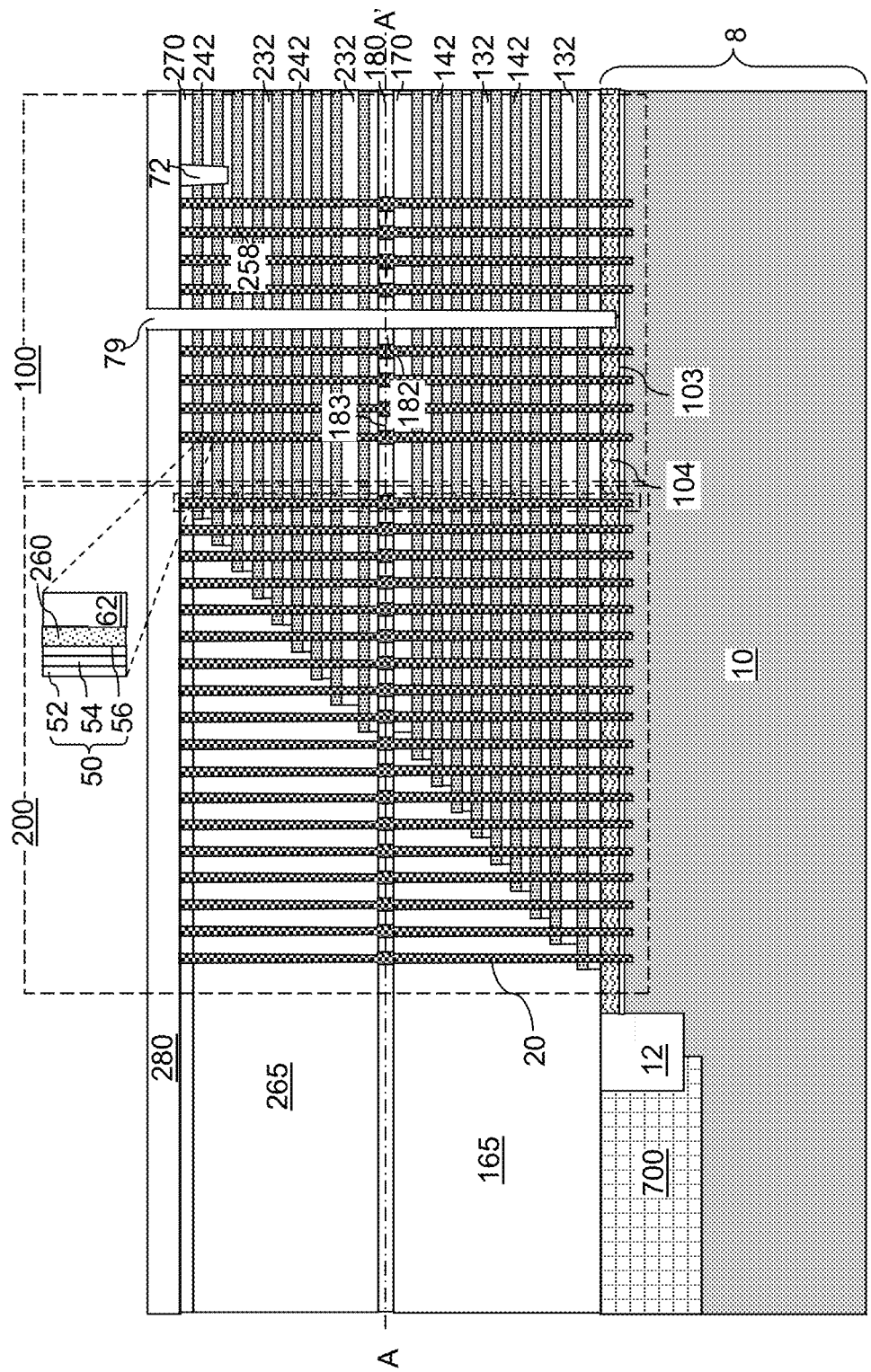
FIG. 35E is a vertical cross-sectional view of the second exemplary structure of FIGS. 35A-35D. The horizontal plane A-A' is the plane of the horizontal cross-sectional view of FIG. 35A.
Figure 36A:
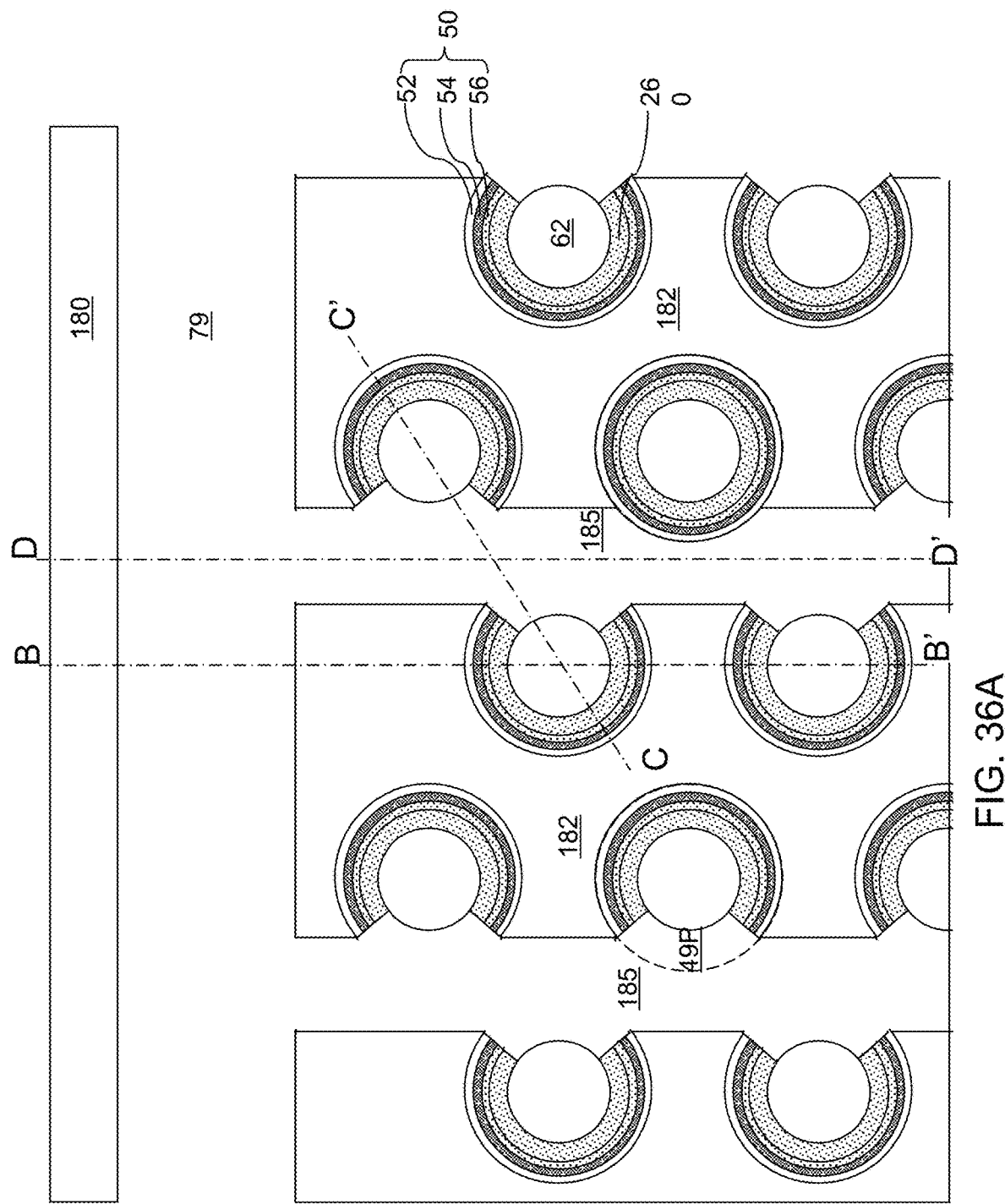
FIG. 36A is a horizontal cross-sectional view of a region of the second exemplary structure that includes a backside trench and in-process memory opening fill structures along a horizontal plane including insulating material strips after formation of laterally-extending cavities and removal of portions of the memory films and sacrificial conformal spacers that are proximal to the laterally-extending cavities according to the second embodiment of the present disclosure.
Figure 36B:
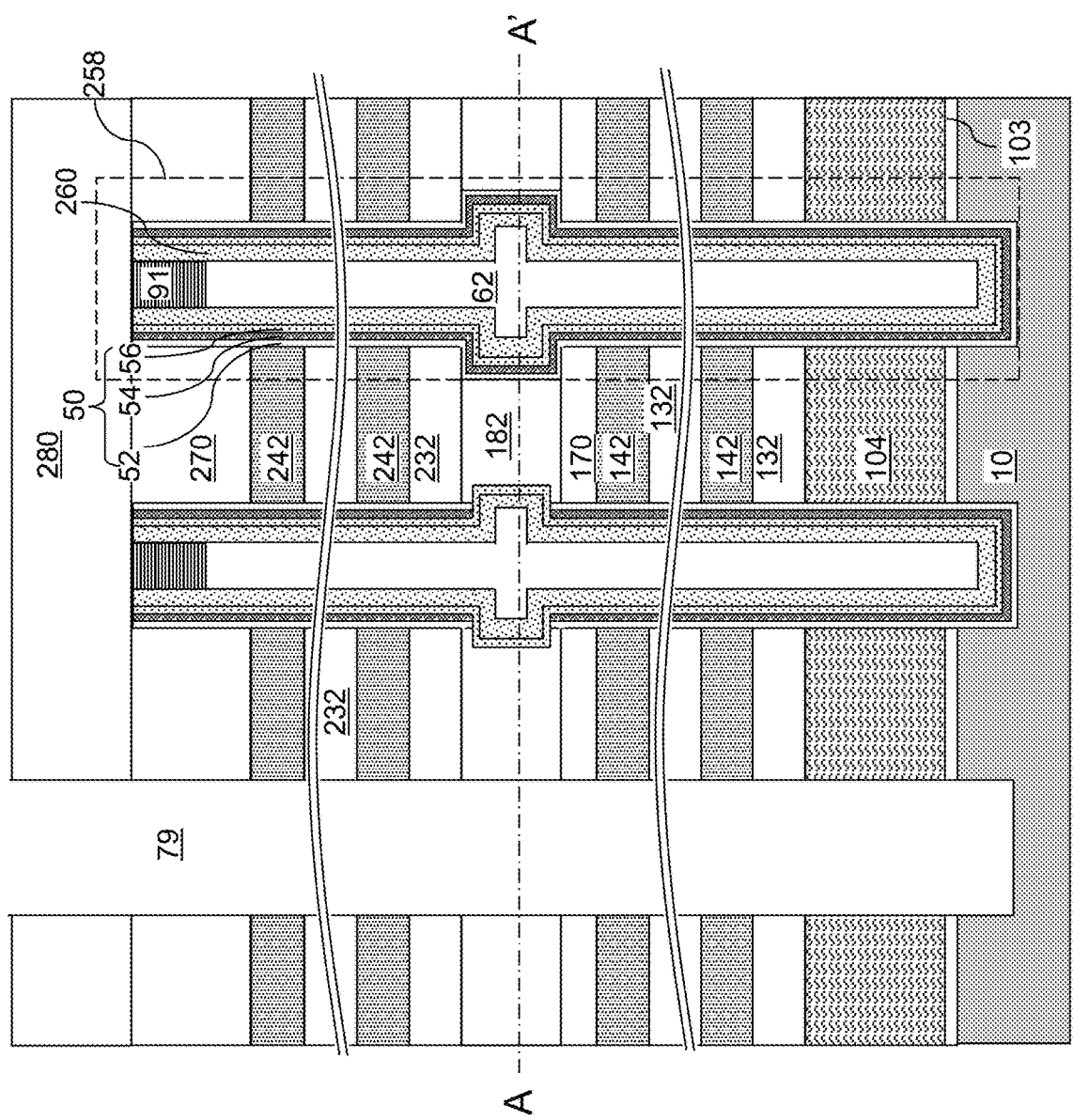
FIG. 36B is a vertical cross-sectional view of a region of the second exemplary structure along the vertical plane B-B' of FIG. 36A. The horizontal plane A-A' is the plane of the horizontal cross-sectional view of FIG. 36A.
Figure 36C:
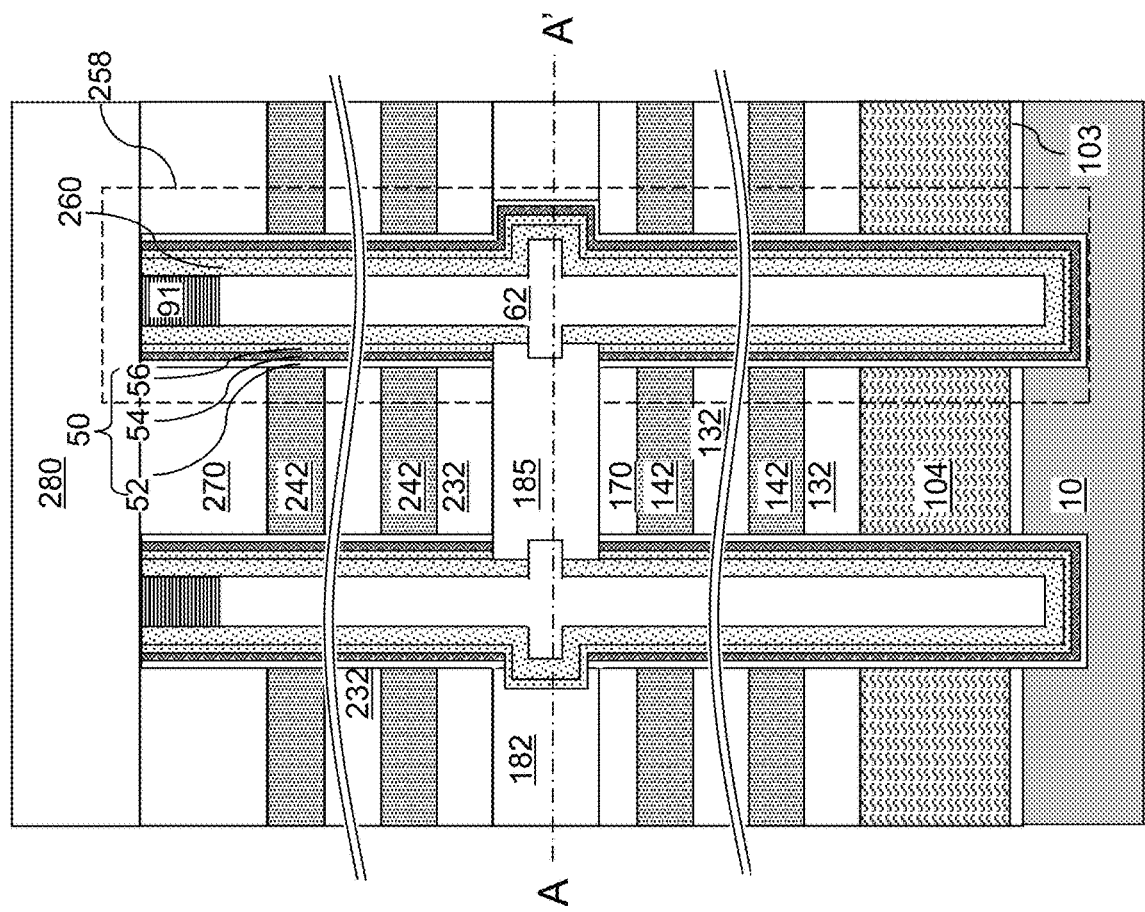
FIG. 36C is a vertical cross-sectional view of a region of the second exemplary structure along the vertical plane C-C' of FIG. 36A. The horizontal plane A-A' is the plane of the horizontal cross-sectional view of FIG. 36A.
Figure 36D:
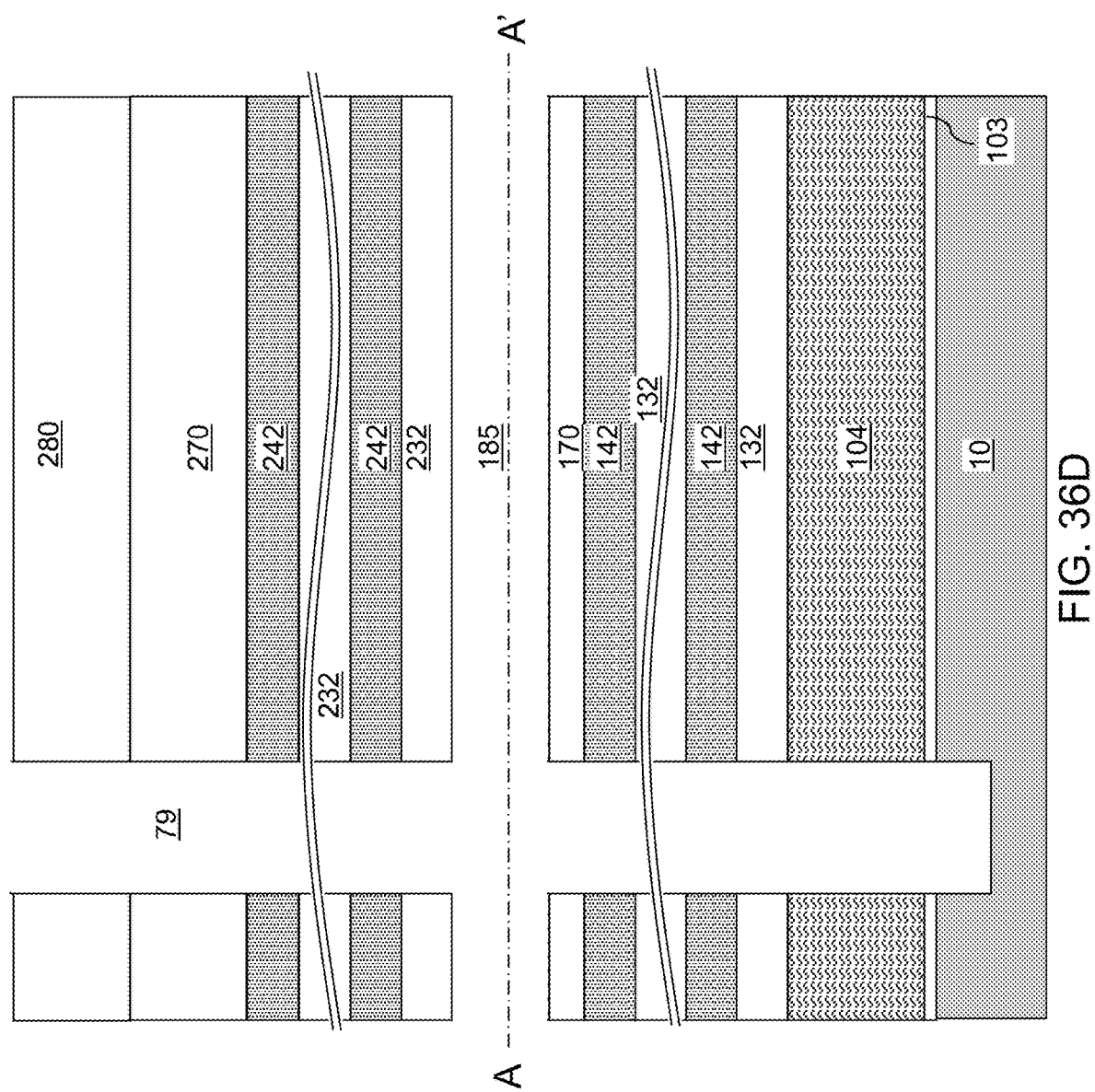
FIG. 36D is a vertical cross-sectional view of a region of the second exemplary structure along the vertical plane D-D' of FIG. 36A. The horizontal plane A-A' is the plane of the horizontal cross-sectional view of FIG. 36A.
Figure 36E:
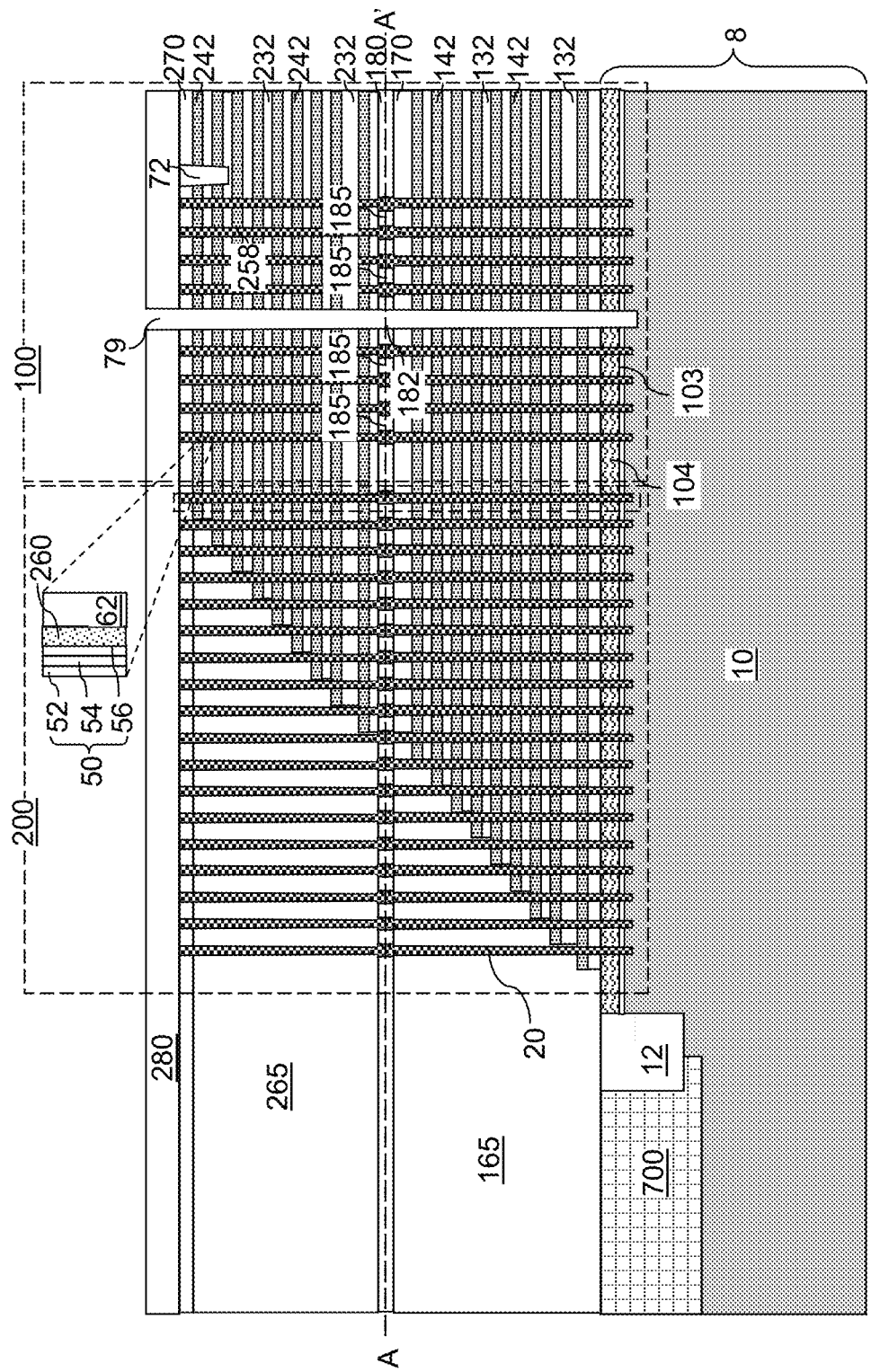
FIG. 36E is a vertical cross-sectional view of the second exemplary structure of FIGS. 36A-36D. The horizontal plane A-A' is the plane of the horizontal cross-sectional view of FIG. 36A.
Figure 37A:
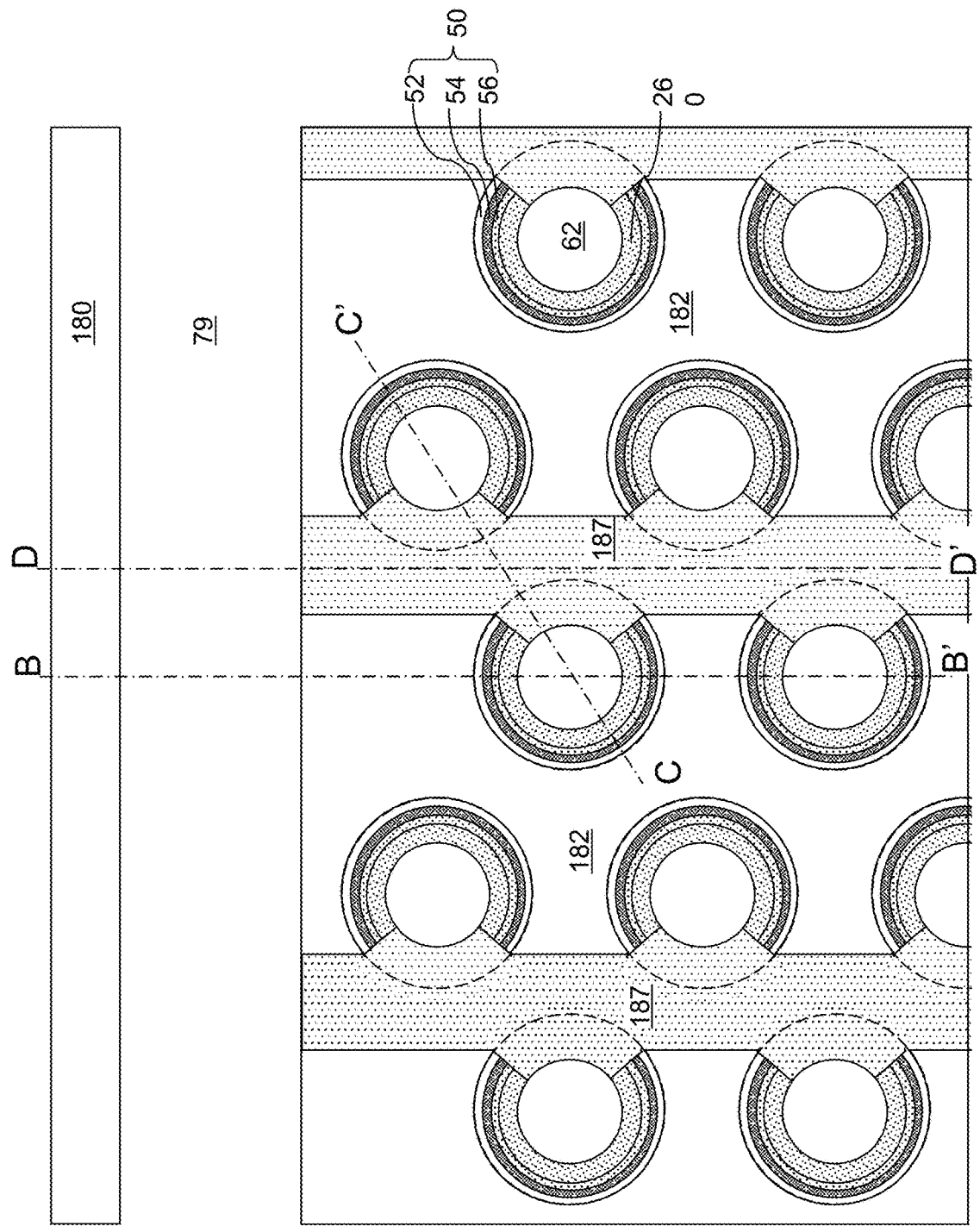
FIG. 37A is a horizontal cross-sectional view of a region of the second exemplary structure that includes a backside trench and in-process memory opening fill structures along a horizontal plane including insulating material strips after formation of dielectric strips in the laterally-extending cavities and in pocket cavities according to the second embodiment of the present disclosure.
Figure 37B:
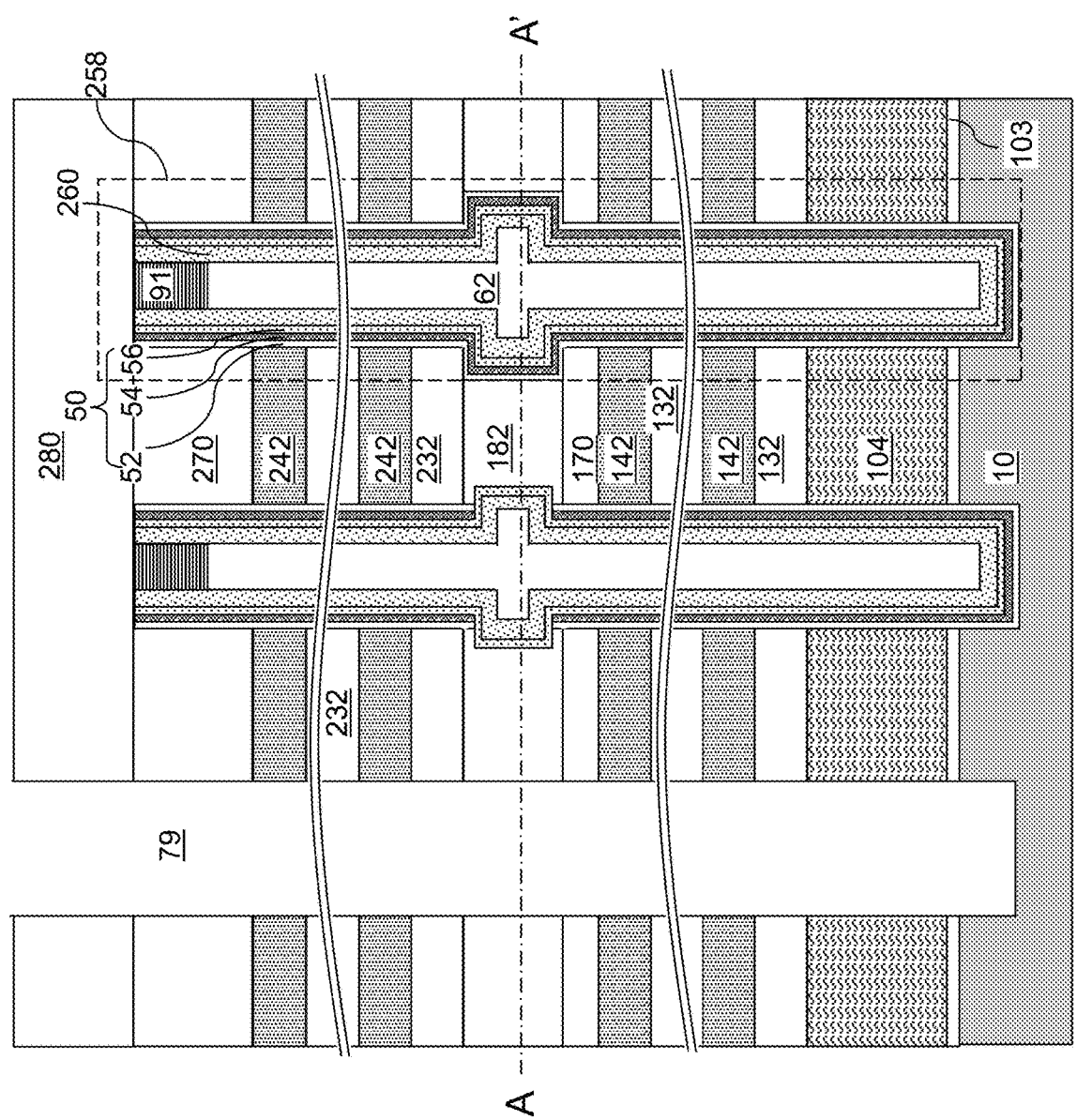
FIG. 37B is a vertical cross-sectional view of a region of the second exemplary structure along the vertical plane B-B' of FIG. 37A. The horizontal plane A-A' is the plane of the horizontal cross-sectional view of FIG. 37A.
Figure 37C:
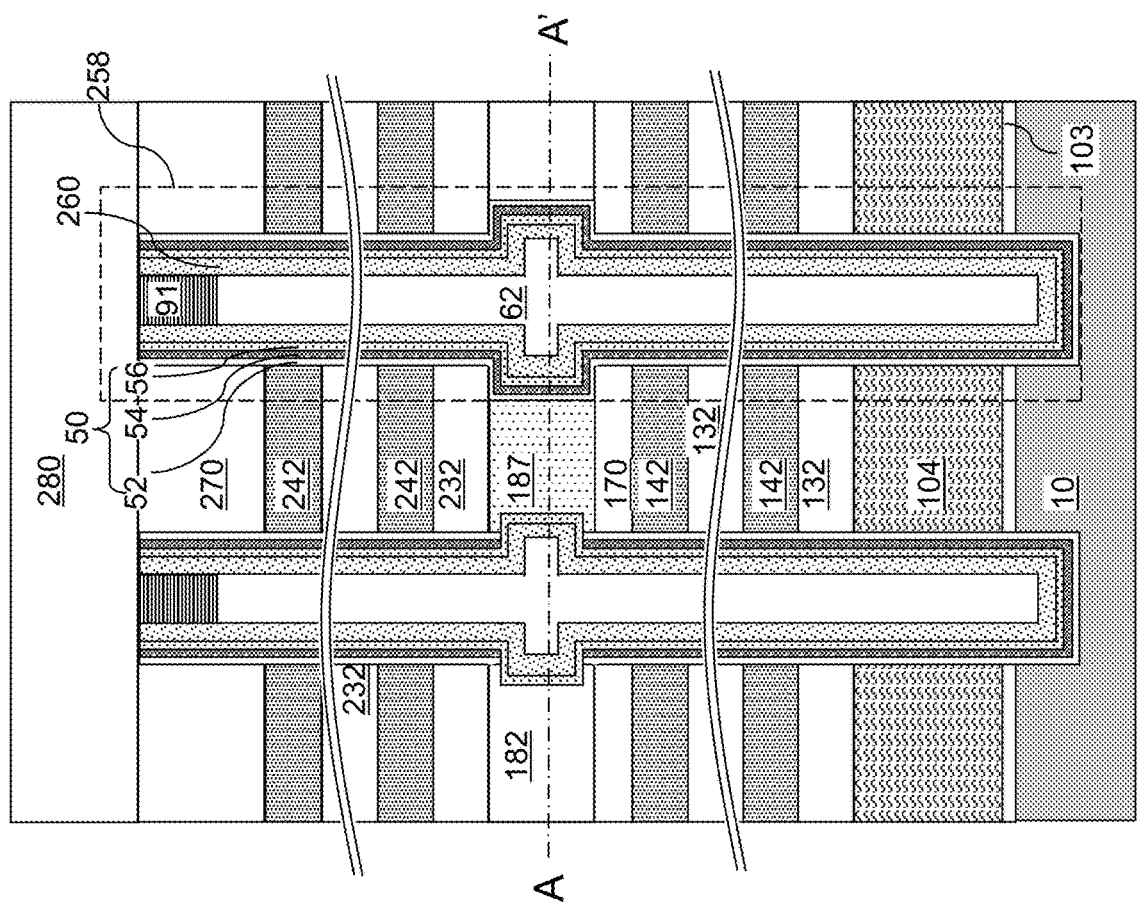
FIG. 37C is a vertical cross-sectional view of a region of the second exemplary structure along the vertical plane C-C' of FIG. 37A. The horizontal plane A-A' is the plane of the horizontal cross-sectional view of FIG. 37A.
Figure 37D:
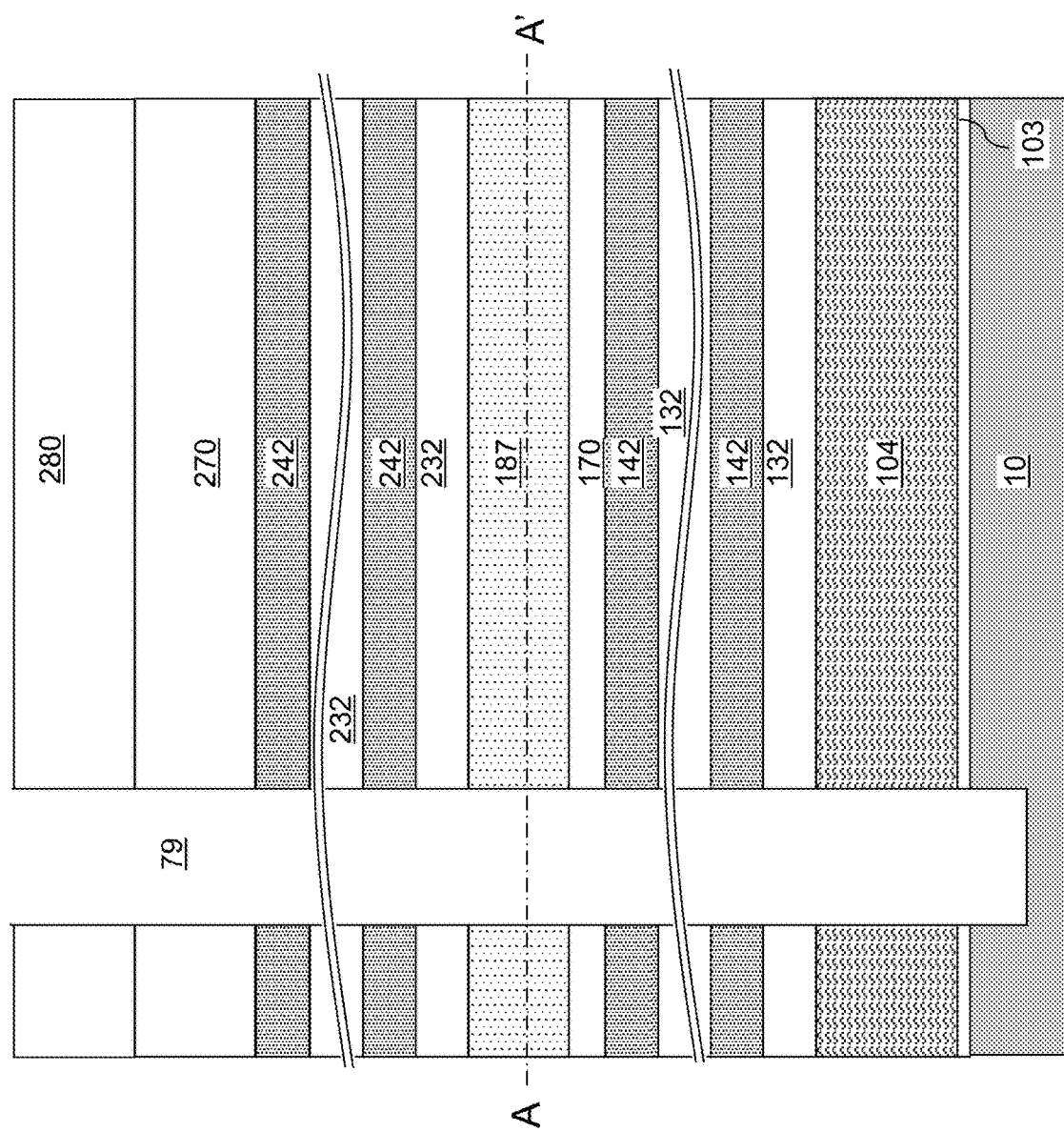
FIG. 37D is a vertical cross-sectional view of a region of the second exemplary structure along the vertical plane D-D' of FIG. 37A. The horizontal plane A-A' is the plane of the horizontal cross-sectional view of FIG. 37A.
Figure 37E:
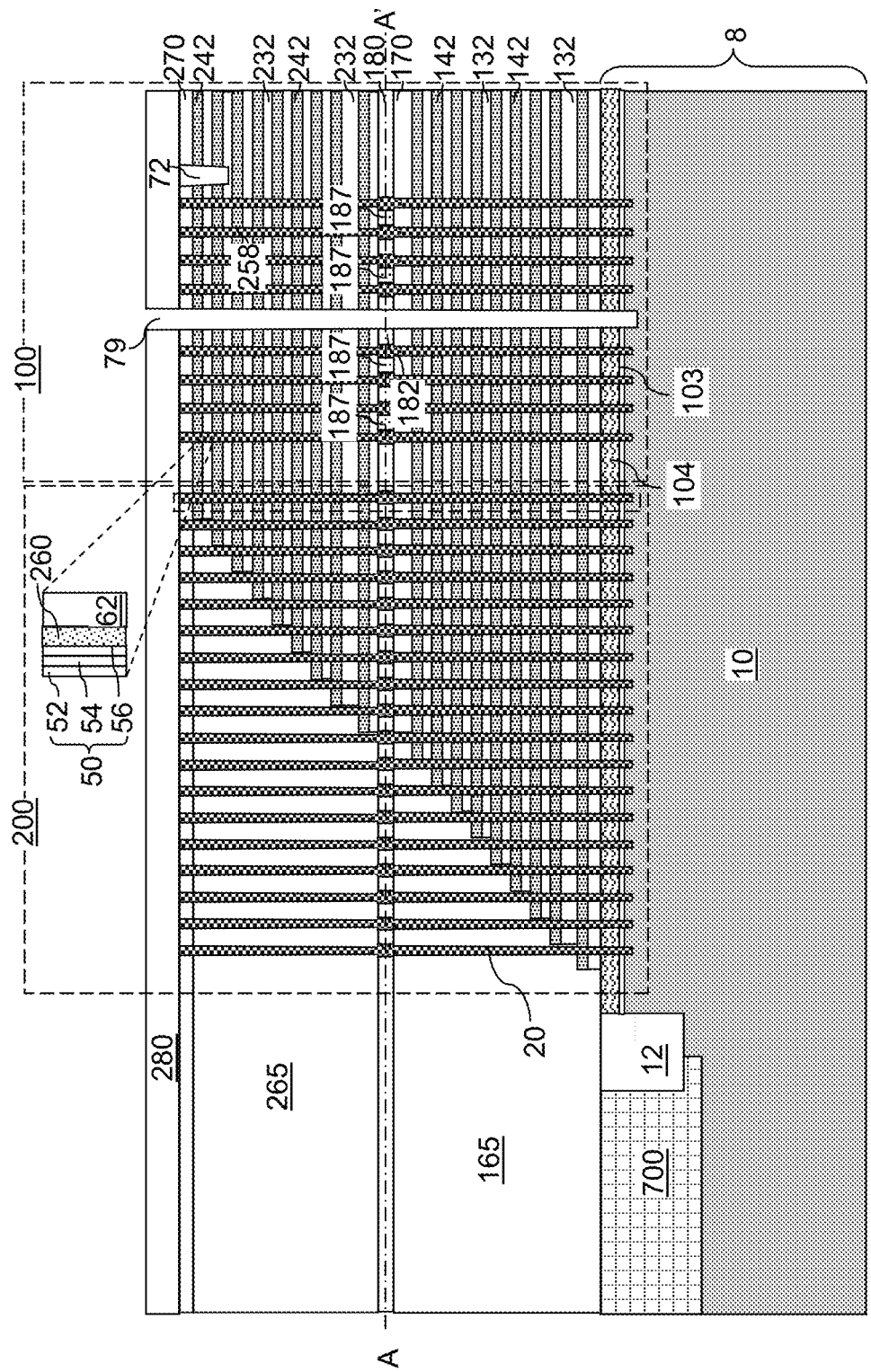
FIG. 37E is a vertical cross-sectional view of the second exemplary structure of FIGS. 37A-37D. The horizontal plane A-A' is the plane of the horizontal cross-sectional view of FIG. 37A.

Referring to FIG. 34, the first exemplary structure is illustrated after formation of the in-process memory opening fill structures 258. Support pillar structures 20 are formed in the support openings 19 concurrently with formation of the in-process memory opening fill structures 258. Each support pillar structure 20 may have a same set of components as an in-process memory opening fill structure 258.

Referring to FIGS. 35A-35E, a first contact level dielectric layer 280 may be formed over the second-tier structure (232, 242, 270, 265, 72). The first contact level dielectric layer 280 includes a dielectric material such as silicon oxide, and may be formed by a conformal or non-conformal deposition process. For example, the first contact level dielectric layer 280 may include undoped silicate glass and may have a thickness in a range from 100 nm to 600 nm, although lesser and greater thicknesses may also be used.

A photoresist layer may be applied over the first contact level dielectric layer 280 and may be lithographically patterned to form elongated openings that extend along the first horizontal direction hd1 between clusters of in-process memory opening fill structures 258. Backside trenches 79 may be formed by transferring the pattern in the photoresist layer (not shown) through the first contact level dielectric layer 280, the second-tier structure (232, 242, 270, 265, 72), the laterally alternating sequence of the insulating material strips 182 and the sacrificial material strips 183 and the inter-tier dielectric layer 180, and the first-tier structure (132, 142, 170, 165), and into the source-level sacrificial layer 104. Portions of the first contact level dielectric layer 280, the second-tier structure (232, 242, 270, 265, 72), the first-tier structure (132, 142, 170, 165), the laterally alternating sequence of the insulating material strips 182 and the sacrificial material strips 183 and the inter-tier dielectric layer 180, and the source-level sacrificial layer 104 that underlie the openings in the photoresist layer may be removed to form the backside trenches 79. In one embodiment, the backside trenches 79 may be formed between clusters of in-process memory opening fill structures 258. The clusters of the in-process memory opening fill structures 258 may be laterally spaced apart along the second horizontal direction hd2 by the backside trenches 79.

Referring to FIGS. 36A-36E, a first isotropic etch process can be performed in which a first isotropic etchant is provided into the backside trenches 79. The first isotropic etchant etches the material of the sacrificial material trips 183 selective to the materials of the insulating material strips 182 and the inter-tier dielectric layer 180, the insulating layers (132, 232), sacrificial material layers (142, 242), the insulating cap layers (170, 270), and the first and second retro-stepped dielectric material portions (165, 265). In one embodiment, if the sacrificial material strips 183 include amorphous carbon, the sacrificial material strips 183 can be removed by ashing. In one embodiment, if the sacrificial material strips 183 include organosilicate glass or borosilicate glass, a wet etch using hydrofluoric acid may be used. In one embodiment, if the sacrificial material strips 183 include amorphous undoped silicon or a silicon-germanium alloy, a wet etch process using hot trimethyl-2 hydroxyethyl ammonium hydroxide ("hot TMY") or tetramethyl ammonium hydroxide (TMAH) can be performed to remove the sacrificial material strips 183 along the lengthwise direction of each sacrificial material strips 183, i.e., the second horizontal direction hd2. The voids formed by removal of the sacrificial material strips 183 are herein referred to as laterally-extending cavities 185. Removal of the sacrificial material strips 183 may be selective to the materials of the memory films 50. Laterally-extending cavities 185 are formed in volumes from which the sacrificial material strips 183 are removed. In this case, the laterally-extending cavities 185 can be laterally bounded by the memory films 50 of the in-process memory opening fill structures 258.

Subsequently, at least one second isotropic etch process can be performed by providing at least one second isotropic etchant into the backside trenches 79 and into the laterally-extending cavities 185. The least one second isotropic etchant etches material portions of the portions of the blocking dielectric layers 52, the charge storage layers 54, the tunneling dielectric layers 56, and the sacrificial conformal spacers 260 that are adjacent to the laterally-extending cavities 185. The at least one second isotropic etch process can be a sequence of isotropic etch processes. A pocket cavity 49P is formed within each of the memory openings 49 in a volume adjoined to a respective one of the laterally-extending cavities 185. Each removed portion of the memory films 50 and the sacrificial conformal spacers 260 has a respective side aperture through which a pocket cavity 49P extends. Each pocket cavity 49P is adjoined to a respective one of the laterally-extending cavities 185. Each laterally-extending cavity 185 can be adjoined to at least one column of pocket cavities 49 that are arranged along the second horizontal direction hd2.

Referring to FIGS. 37A-37E, a dielectric material, such as undoped silicate glass or a doped silicate glass, can be conformally deposited in the pocket cavities 49P, the laterally-extending cavities 185, at peripheral regions of the backside trenches 79, and over the first contact level dielectric layer 280. In one embodiment, the dielectric material can include undoped silicate glass or a doped silicate glass (such as borosilicate glass). An isotropic etch-back process is performed to remove portions of the dielectric material from the peripheral regions of the backside trenches 79 and from above the first contact level dielectric layer 280.

Each remaining portion of the dielectric material in a pocket cavity 49P constitutes a dielectric peg portion. Each remaining portion of the dielectric material in a laterally-extending cavity 185 constitutes a dielectric rail portion. Each contiguous combination of a dielectric rail portion and a plurality of dielectric peg portions is herein referred to as a dielectric strip 187. The dielectric strips 187 are formed in the laterally-extending cavities 185 and in the pocket cavities 49, i.e., the volumes from which portions of the memory films 50 and the sacrificial conformal spacers 260 are removed. Thus, each of the dielectric strips 187 comprises a dielectric rail portion that fills a volume of one of the sacrificial material strips 183, and comprises dielectric peg portions that laterally protrude from the dielectric rail portion and are located within a column of memory openings 49. The dielectric strips 187 are formed directly on the dielectric cores 62. The laterally alternating sequence of the insulating material strips 182 and the dielectric strips 187 is herein referred to as an inter-tier insulating assembly (182, 187).

Figure 38A:
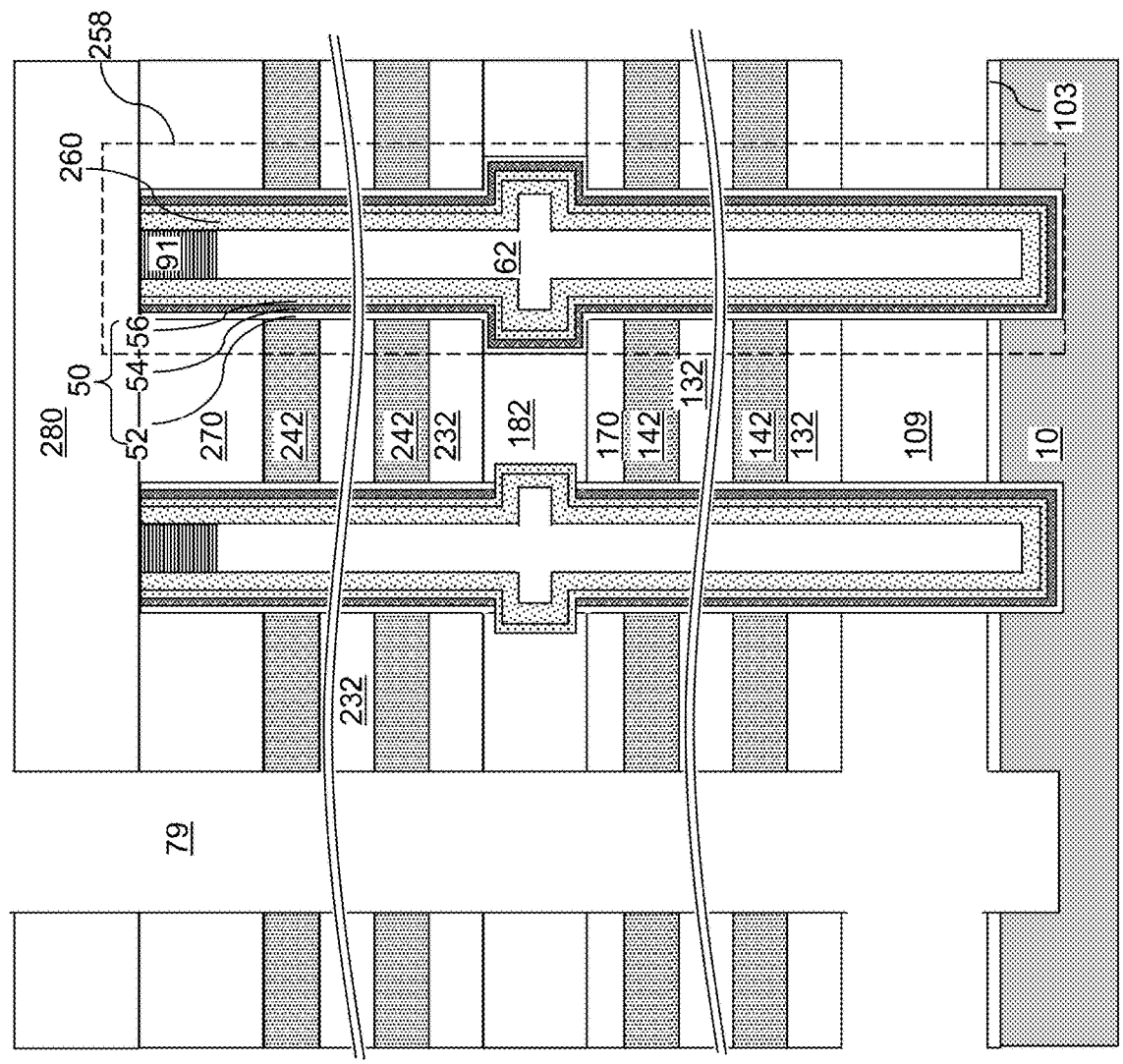
FIGS. 38A-38D illustrate sequential vertical cross-sectional views of memory opening fill structures and a backside trench during formation of source-level material layers according to the second embodiment of the present disclosure.

Referring to FIG. 38A, an etchant that etches the material of the source-level sacrificial layer 104 selective to the materials of the first alternating stack (132, 142), the second alternating stack (232, 242), the inter-tier dielectric layer 180 and the insulating material strips 182, the dielectric strips 187, the first and second-tier insulating cap layers (170, 270), the first contact level dielectric layer 280, and the sacrificial etch stop liner 103 may be introduced into the backside trenches in an isotropic etch process. For example, if the source-level sacrificial layer 104 includes undoped amorphous silicon or an undoped amorphous silicon-germanium alloy, and the sacrificial etch stop liner 103 include silicon oxide, a wet etch process using hot trimethyl-2 hydroxyethyl ammonium hydroxide ("hot TMY") or tetramethyl ammonium hydroxide (TMAH) may be used to remove the source-level sacrificial layer 104 selective to the sacrificial etch stop liner 103. Boron atoms in the lower source layer 112 and the upper source layer 118 prevents unintended etching of the lower source layer 112 and/or the upper source layer 118 in case surfaces of the lower source layer 112 and/or the upper source layer 118 are accidentally exposed to hot TMY or TMAH during the wet etch process. If the source-level sacrificial layer 104 includes organosilicate glass or borosilicate glass, a wet etch using dilute hydrofluoric acid may be used. A source cavity 109 is formed in the volume from which the source-level sacrificial layer 104 is removed. Each of the in-process memory opening fill structures 258 is physically exposed to the source cavity 109.

Figure 38B:
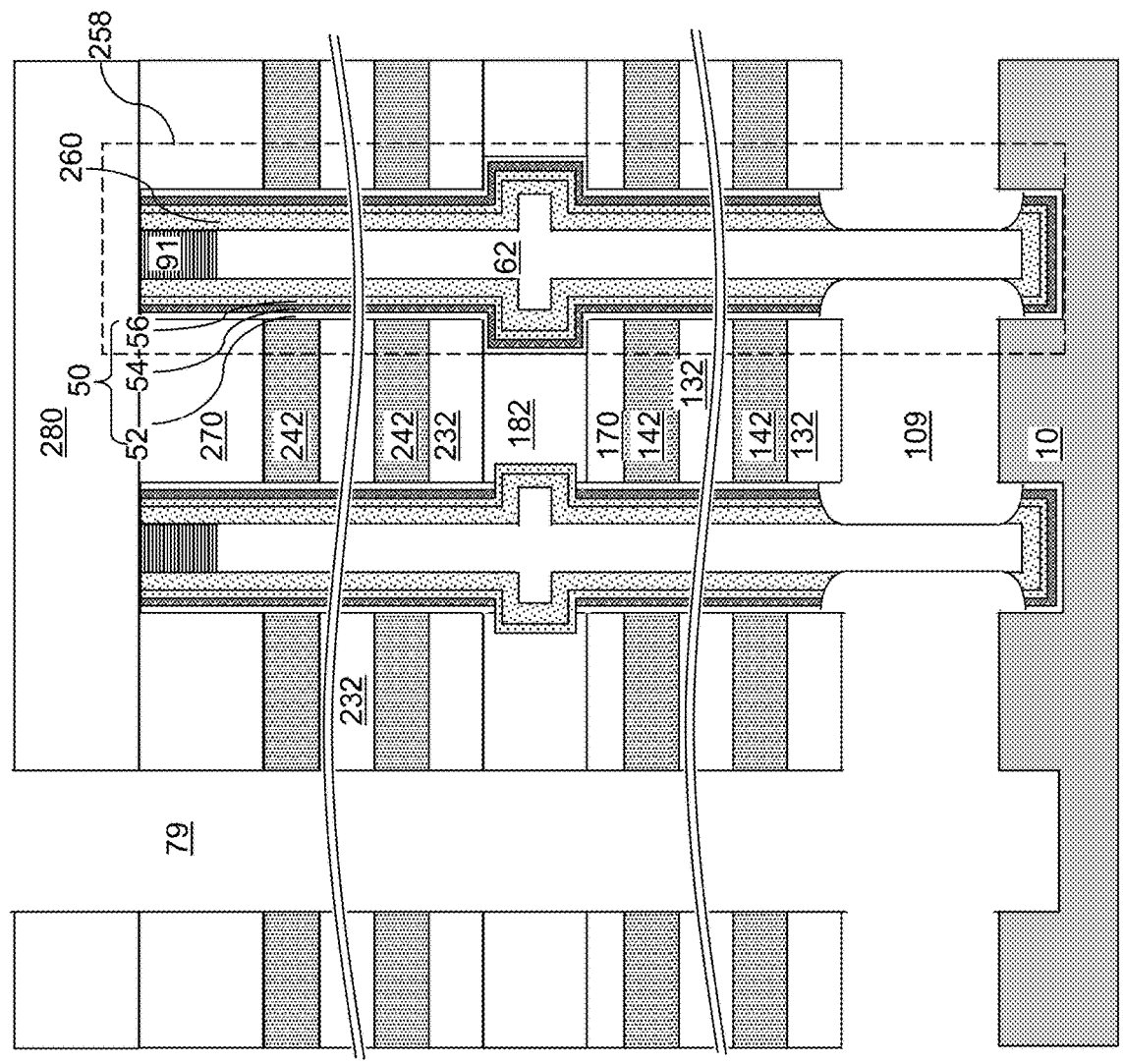
Figure 38C:
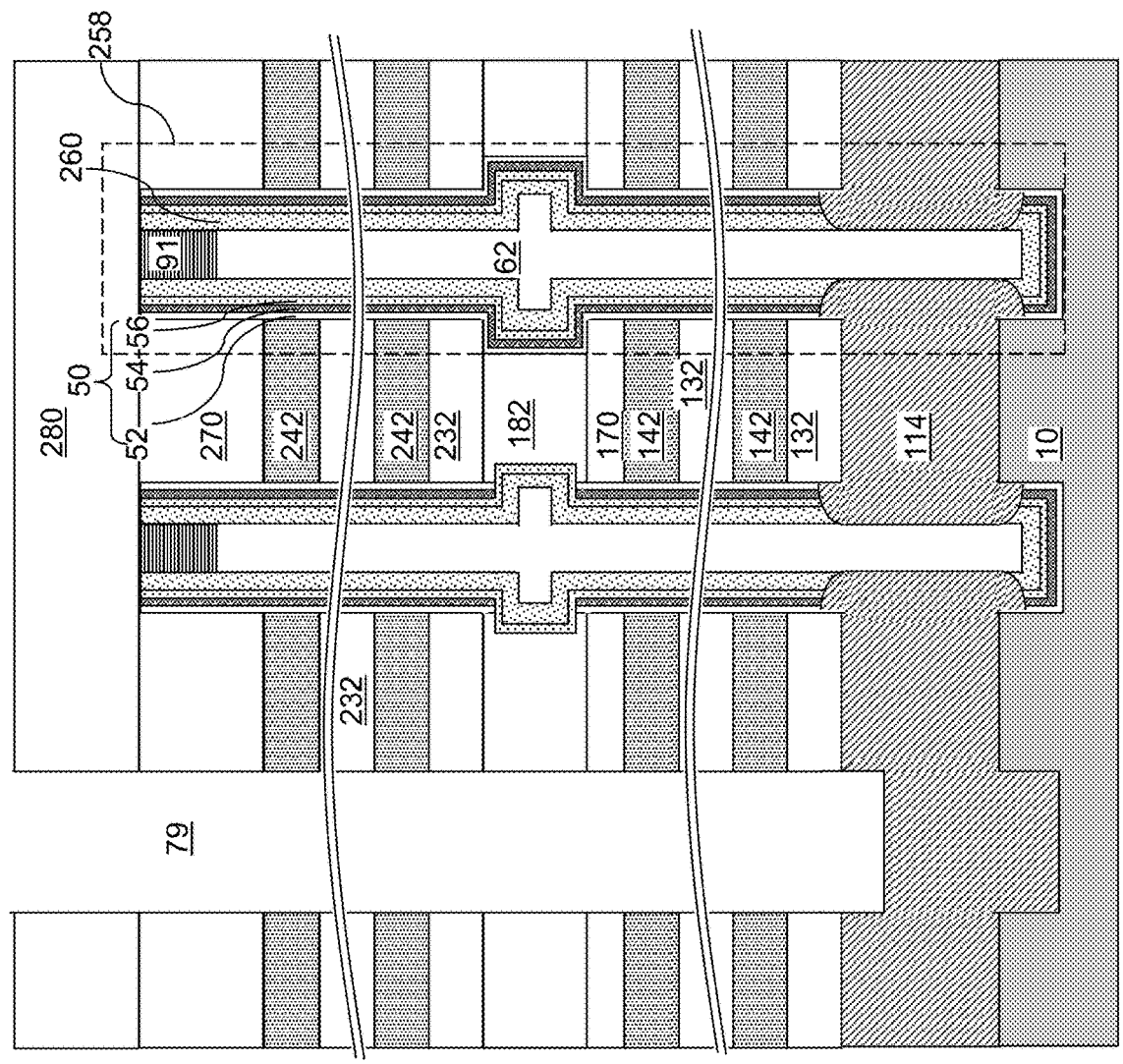

Referring to FIG. 38B, a sequence of isotropic etchants, such as wet etchants, may be applied to the physically exposed portions of the memory films 50 to sequentially etch the various component layers of the memory films 50 from outside to inside, and to physically expose cylindrical surfaces of the sacrificial conformal spacers 260 at the level of the source cavity 109. The sacrificial etch stop liner 103 may be collaterally etched during removal of the portions of the memory films 50 located at the level of the source cavity 109. The source cavity 109 may be expanded in volume by removal of the portions of the memory films 50 at the level of the source cavity 109 and the sacrificial etch stop liner 103. A top surface of the substrate semiconductor layer 10 can be physically exposed to the source cavity 109. The source cavity 109 is formed by isotropically etching the source-level sacrificial layer 104 and a bottom portion of each of the memory films 50 selective to the substrate semiconductor layer 10 and the sacrificial conformal spacers 260.

Figure 39A:
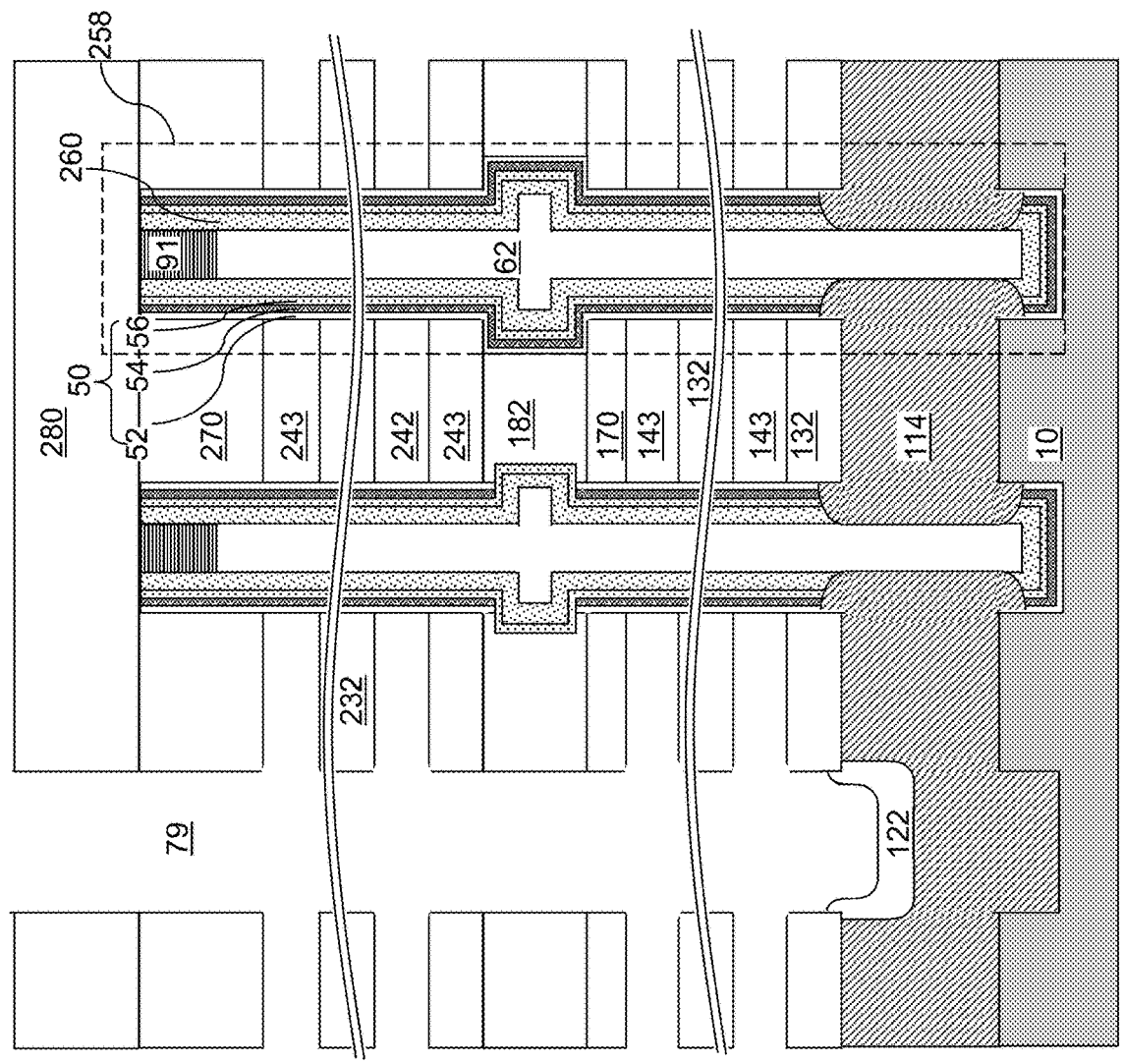
FIGS. 39A-39C illustrate sequential vertical cross-sectional views of memory opening fill structures and a backside trench during replacement of sacrificial material layers with electrically conductive layers according to the second embodiment of the present disclosure.
Figure 39B:
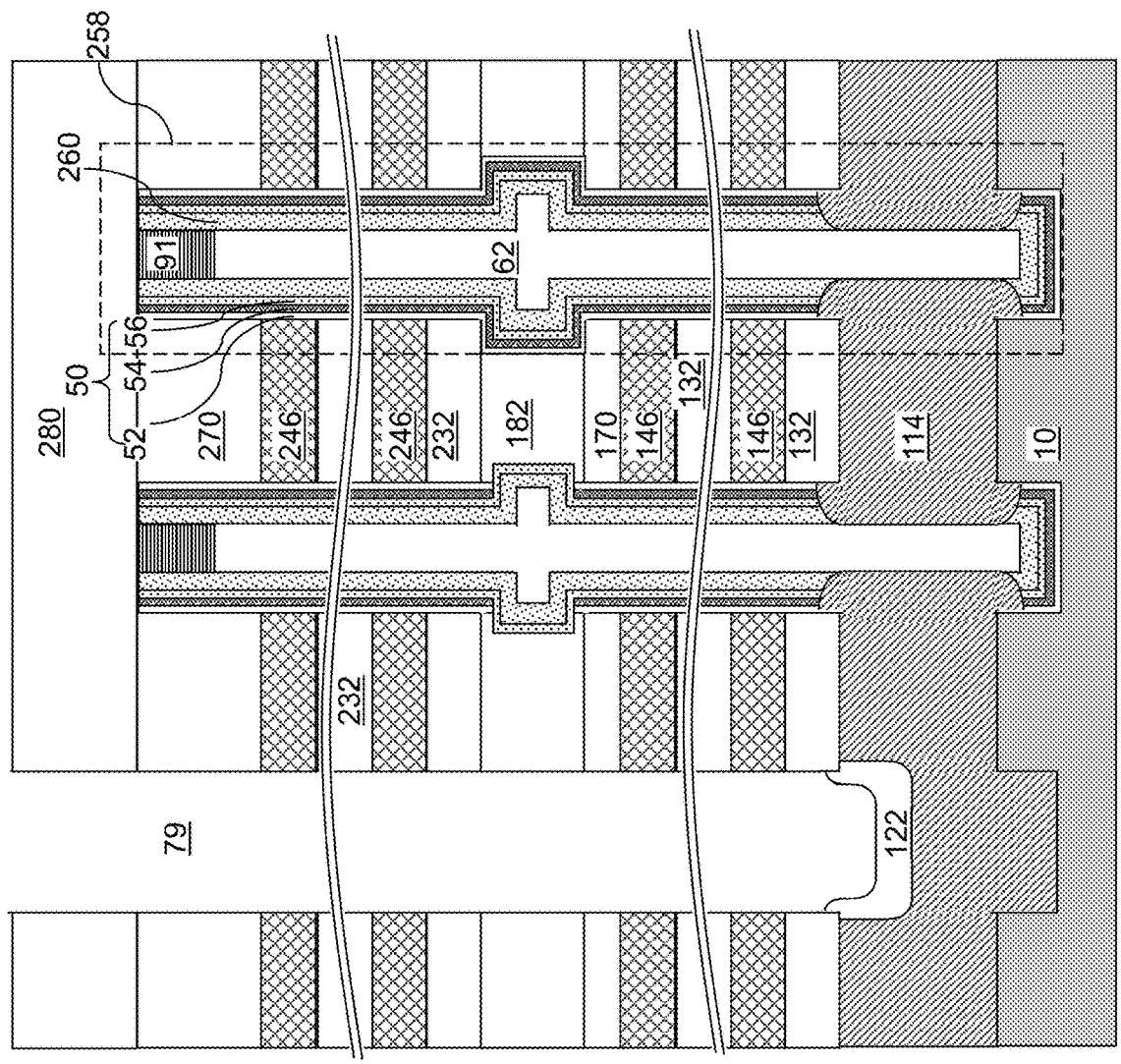
Figure 39C:
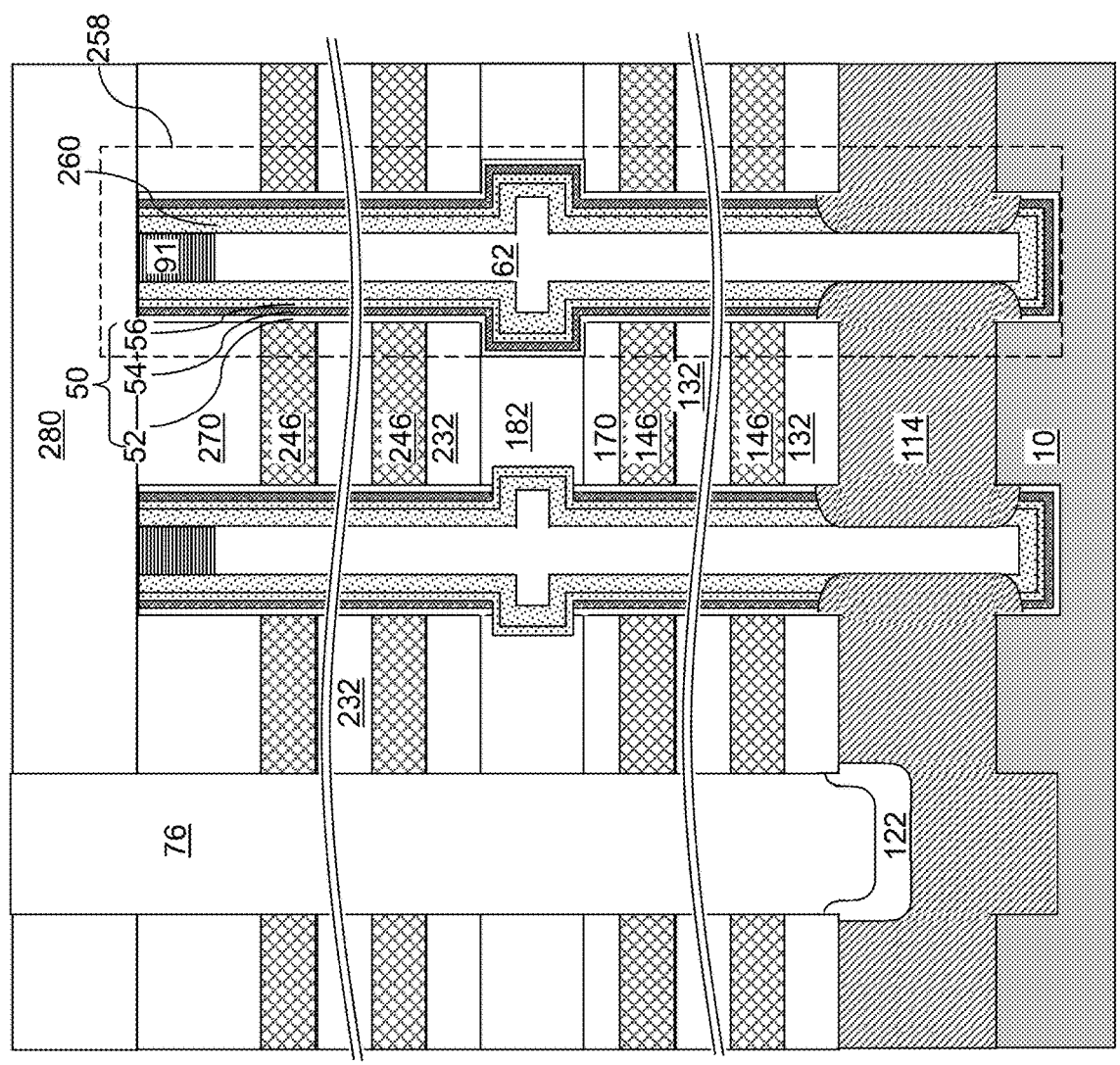

Referring to FIG. 39C, a semiconductor material having a doping of the second conductivity type may be deposited on the physically exposed semiconductor surfaces around the source cavity 109. The physically exposed semiconductor surfaces include bottom portions of outer sidewalls of the sacrificial conformal spacers 260 and a horizontal surface of the substrate semiconductor layer 10. In one embodiment, the doped semiconductor material of the second conductivity type may be deposited on the physically exposed semiconductor surfaces around the source cavity 109 by a selective epitaxy process. A semiconductor precursor gas, an etchant, and a dopant gas may be flowed concurrently into a process chamber including the exemplary structure during the selective epitaxy process. For example, the semiconductor precursor gas may include silane, disilane, or dichlorosilane, the etchant gas may include gaseous hydrogen chloride, and the dopant gas may include a hydride of a dopant atom such as phosphine, arsine, stibine, or diborane. In this case, the selective epitaxy process grows a doped single crystalline semiconductor material having a doping of the second conductivity type from physically exposed semiconductor surfaces around the source cavity 109. The deposited doped single crystalline semiconductor material forms a source contact layer 114, which may contact sidewalls of the sacrificial conformal spacers 260. The atomic concentration of the dopants of the second conductivity type in the deposited semiconductor material may be in a range from $1.0 \times 10^{20}/cm^3$ to $2.0 \times 10^{21}/cm^3$, such as from $2.0 \times 10^{20}/cm^3$ to $8.0 \times 10^{20}/cm^3$.

The source contact layer 114 as initially formed may consist essentially of semiconductor atoms and dopant atoms of the second conductivity type. Optionally, one or more etch back processes may be used in combination with a plurality of selective or non-selective deposition processes to provide a seamless and/or voidless source contact layer 114. In one embodiment, the doped semiconductor material may include single crystalline silicon. Thus, the source-level sacrificial layer 104 may be replaced with the source contact layer 114. Generally, the source-level sacrificial layer 104 is replaced with a source contact layer 114 including a doped single crystalline semiconductor material in epitaxial alignment with the single crystalline semiconductor material layer such as the substrate semiconductor layer 10.

Figure 38D:
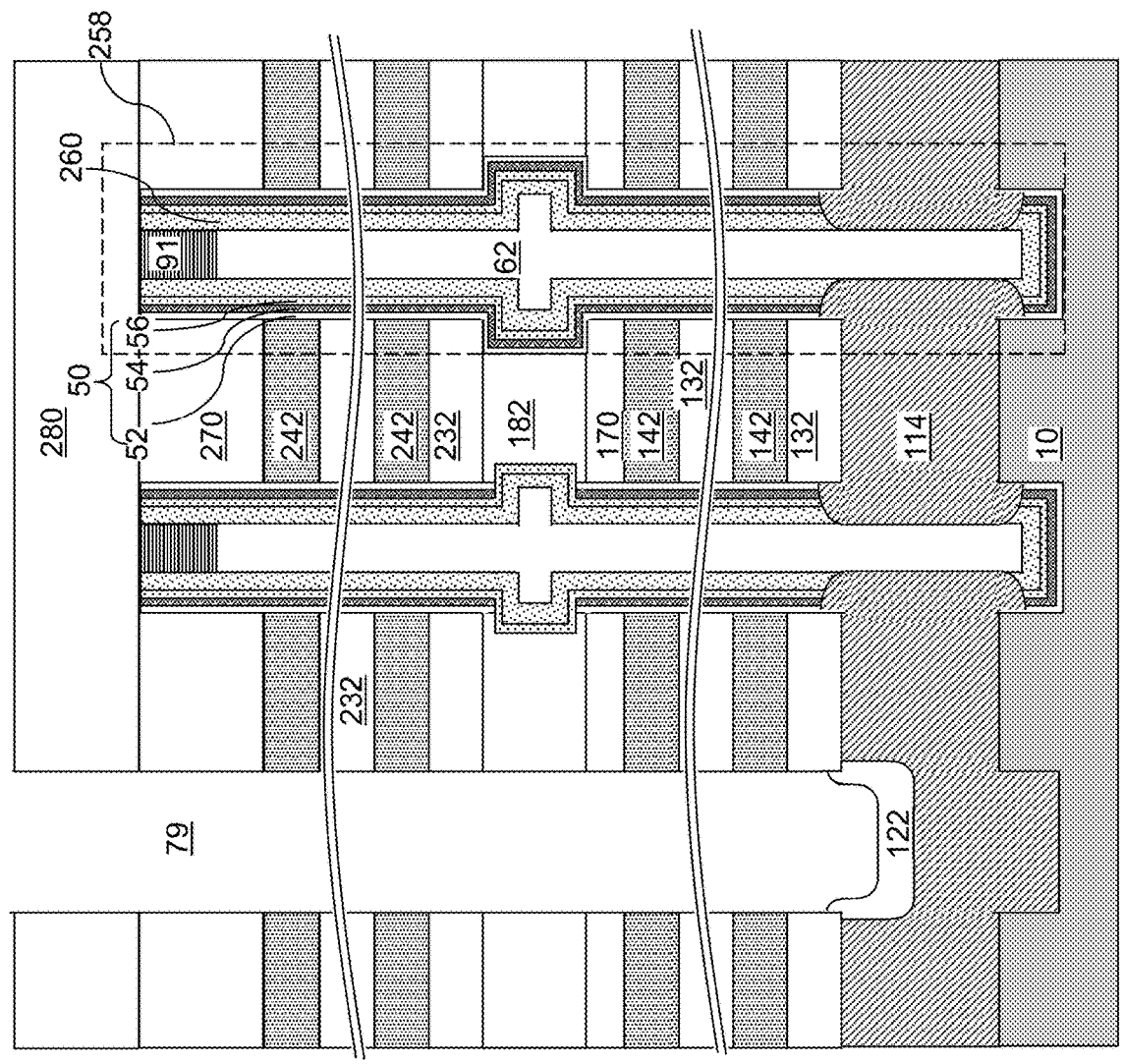

Referring to FIG. 38D, an oxidation process may be performed to convert physically exposed surface portions of the source contact layer 114 into dielectric semiconductor oxide plates 122.

Referring to FIG. 39A, the sacrificial material layers (142, 242) are may be removed selective to the insulating layers (132, 232), the inter-tier dielectric layer 180 and the laterally alternating sequence of insulating material strips 182 and the dielectric strips 187, the first and second-tier insulating cap layers (170, 270), the first contact level dielectric layer 280, and the source contact layer 114, and the dielectric semiconductor oxide plates 122. For example, an etchant that selectively etches the materials of the sacrificial material layers (142, 242) with respect to the materials of the insulating layers (132, 232), the inter-tier dielectric layer 180 and the laterally alternating sequence of insulating material strips 182 and the dielectric strips 187, the first and second-tier insulating cap layers (170, 270), the retro-stepped dielectric material portions (165, 265), and the material of the outermost layer of the memory films 50 may be introduced into the backside trenches 79, for example, using an isotropic etch process. For example, the sacrificial material layers (142, 242) may include silicon nitride, the materials of the insulating layers (132, 232), the inter-tier dielectric layer 180 and the laterally alternating sequence of insulating material strips 182 and the dielectric strips 187, the first and second-tier insulating cap layers (170, 270), the retro-stepped dielectric material portions (165, 265), and the outermost layer of the memory films 50 may include silicon oxide materials.

The isotropic etch process may be a wet etch process using a wet etch solution, or may be a gas phase (dry) etch process in which the etchant is introduced in a vapor phase into the backside trench 79. For example, if the sacrificial material layers (142, 242) include silicon nitride, the etch process may be a wet etch process in which the exemplary structure is immersed within a wet etch tank including phosphoric acid, which etches silicon nitride selective to silicon oxide, silicon, and various other materials used in the art.

Backside recesses (143, 243) are formed in volumes from which the sacrificial material layers (142, 242) are removed. The backside recesses (143, 243) include first backside recesses 143 that are formed in volumes from which the first-tier sacrificial material layers 142 are removed and second backside recesses 243 that are formed in volumes from which the second-tier sacrificial material layers 242 are removed. Each of the backside recesses (143, 243) may be a laterally extending cavity having a lateral dimension that is greater than the vertical extent of the laterally extending cavity. In other words, the lateral dimension of each of the backside recesses (143, 243) may be greater than the height of the respective backside recess (143, 243). A plurality of backside recesses (143, 243) may be formed in the volumes from which the material of the sacrificial material layers (142, 242) is removed. Each of the backside recesses (143, 243) may extend substantially parallel to the top surface of the substrate semiconductor layer 10. A backside recess (143, 243) may be vertically bounded by a top surface of an underlying insulating layer (132, 232) and a bottom surface of an overlying insulating layer (132, 232). In one embodiment, each of the backside recesses (143, 243) may have a uniform height throughout.

Referring to FIG. 39B, a backside blocking dielectric layer (not shown) may be optionally deposited in the backside recesses (143, 243) and the backside trenches 79 and over the first contact level dielectric layer 280. The backside blocking dielectric layer includes a dielectric material such as a dielectric metal oxide, silicon oxide, or a combination thereof. For example, the backside blocking dielectric layer may include aluminum oxide. The backside blocking dielectric layer may be formed by a conformal deposition process such as atomic layer deposition or chemical vapor deposition. The thickness of the backside blocking dielectric layer may be in a range from 1 nm to 20 nm, such as from 2 nm to 10 nm, although lesser and greater thicknesses may also be used.

At least one conductive material may be deposited in the plurality of backside recesses (143, 243), on the sidewalls of the backside trenches 79, and over the first contact level dielectric layer 280. The at least one conductive material may be deposited by a conformal deposition method, which may be, for example, chemical vapor deposition (CVD), atomic layer deposition (ALD), electroless plating, electroplating, or a combination thereof. The at least one conductive material may include an elemental metal, an intermetallic alloy of at least two elemental metals, a conductive nitride of at least one elemental metal, a conductive metal oxide, a conductive doped semiconductor material, a conductive metal-semiconductor alloy such as a metal silicide, alloys thereof, and combinations or stacks thereof.

In one embodiment, the at least one conductive material may include at least one metallic material, i.e., an electrically conductive material that includes at least one metallic element. Non-limiting exemplary metallic materials that may be deposited in the backside recesses (143, 243) include tungsten, tungsten nitride, titanium, titanium nitride, tantalum, tantalum nitride, cobalt, and ruthenium. For example, the at least one conductive material may include a conductive metallic nitride liner that includes a conductive metallic nitride material such as TiN, TaN, WN, or a combination thereof, and a conductive fill material such as W, Co, Ru, Mo, Cu, or combinations thereof. In one embodiment, the at least one conductive material for filling the backside recesses (143, 243) may be a combination of titanium nitride layer and a tungsten fill material.

Electrically conductive layers (146, 246) may be formed in the backside recesses (143, 243) by deposition of the at least one conductive material. A plurality of first electrically conductive layers 146 may be formed in the plurality of first backside recesses 143, a plurality of second electrically conductive layers 246 may be formed in the plurality of second backside recesses 243, and a continuous metallic material layer (not shown) may be formed on the sidewalls of each backside trench 79 and over the first contact level dielectric layer 280. Each of the first electrically conductive layers 146 and the second electrically conductive layers 246 may include a respective conductive metallic nitride liner and a respective conductive fill material. Thus, the first and second-tier sacrificial material layers (142, 242) may be replaced with the first and second electrically conductive layers (146, 246), respectively. Specifically, each first-tier sacrificial material layer 142 may be replaced with an optional portion of the backside blocking dielectric layer and a first electrically conductive layer 146, and each second-tier sacrificial material layer 242 may be replaced with an optional portion of the backside blocking dielectric layer and a second electrically conductive layer 246. A backside cavity is present in the portion of each backside trench 79 that is not filled with the continuous metallic material layer.

Residual conductive material may be removed from inside the backside trenches 79. Specifically, the deposited metallic material of the continuous metallic material layer may be etched back from the sidewalls of each backside trench 79 and from above the first contact level dielectric layer 280, for example, by an anisotropic or isotropic etch. Each remaining portion of the deposited metallic material in the first backside recesses constitutes a first electrically conductive layer 146. Each remaining portion of the deposited metallic material in the second backside recesses constitutes a second electrically conductive layer 246. Sidewalls of the first electrically conductive material layers 146 and the second electrically conductive layers may be physically exposed to a respective backside trench 79. The backside trenches may have a pair of curved sidewalls having a non-periodic width variation along the first horizontal direction hd1 and a non-linear width variation along the vertical direction.

Each electrically conductive layer (146, 246) may be a conductive sheet including openings therein. A first subset of the openings through each electrically conductive layer (146, 246) may be filled with in-process memory opening fill structures 258. A second subset of the openings through each electrically conductive layer (146, 246) may be filled with the support pillar structures 20. Each electrically conductive layer (146, 246) may have a lesser area than any underlying electrically conductive layer (146, 246) because of the first and second stepped surfaces. Each electrically conductive layer (146, 246) may have a greater area than any overlying electrically conductive layer (146, 246) because of the first and second stepped surfaces.

In some embodiment, drain-select-level isolation structures 72 may be provided at topmost levels of the second electrically conductive layers 246. A subset of the second electrically conductive layers 246 located at the levels of the drain-select-level isolation structures 72 constitutes drain select gate electrodes. A subset of the electrically conductive layer (146, 246) located underneath the drain select gate electrodes may function as combinations of a control gate and a word line located at the same level.

Each of the memory films 50 comprises a vertical stack of memory elements located at each level of the electrically conductive layers (146, 246). A subset of the electrically conductive layers (146, 246) may comprise word lines for the memory elements.

Figure 40A:
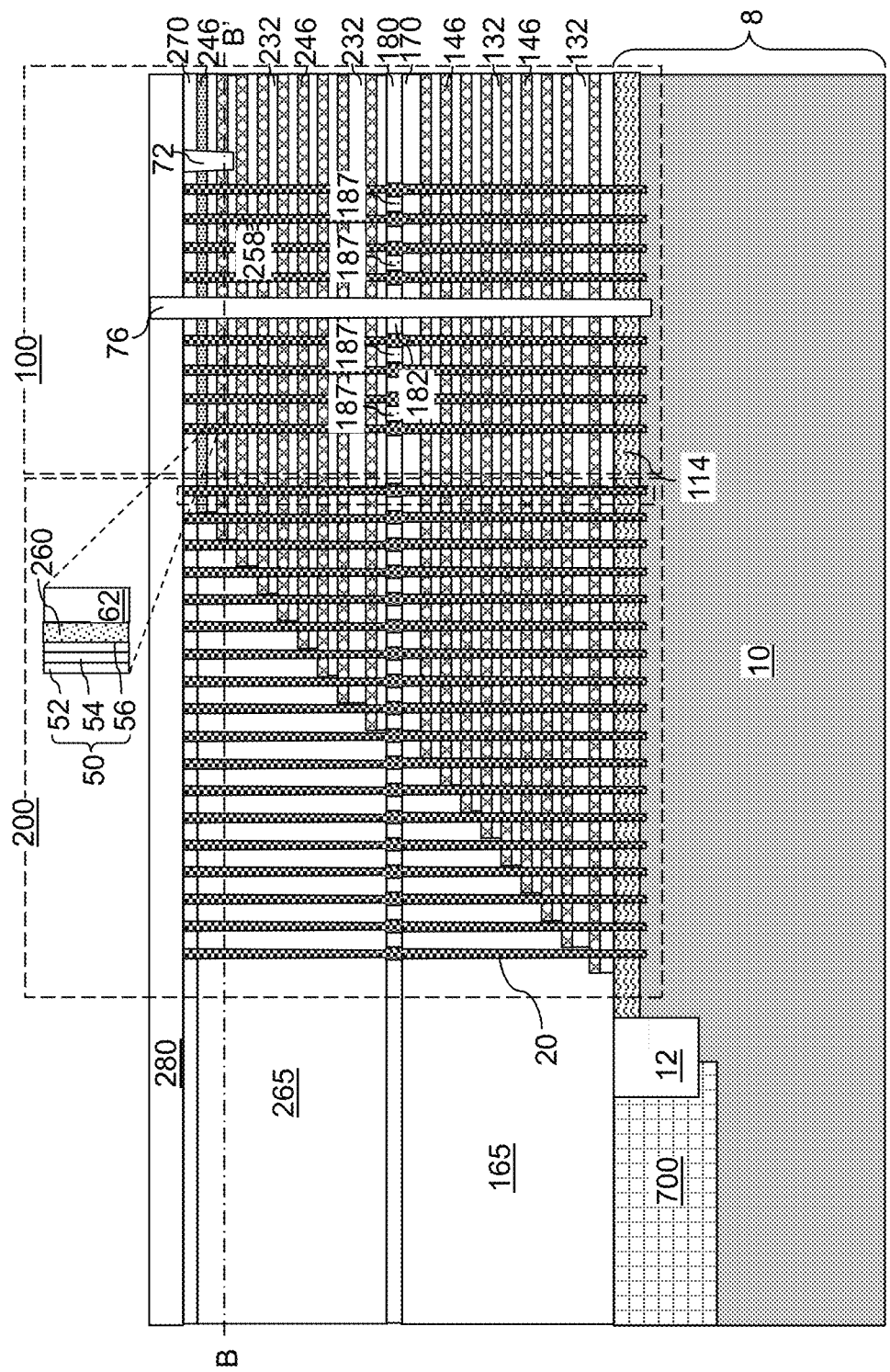
FIG. 40A is a vertical cross-sectional view of the second exemplary structure after formation of backside trench fill structures in the backside trenches according to the second embodiment of the present disclosure.
Figure 40B:
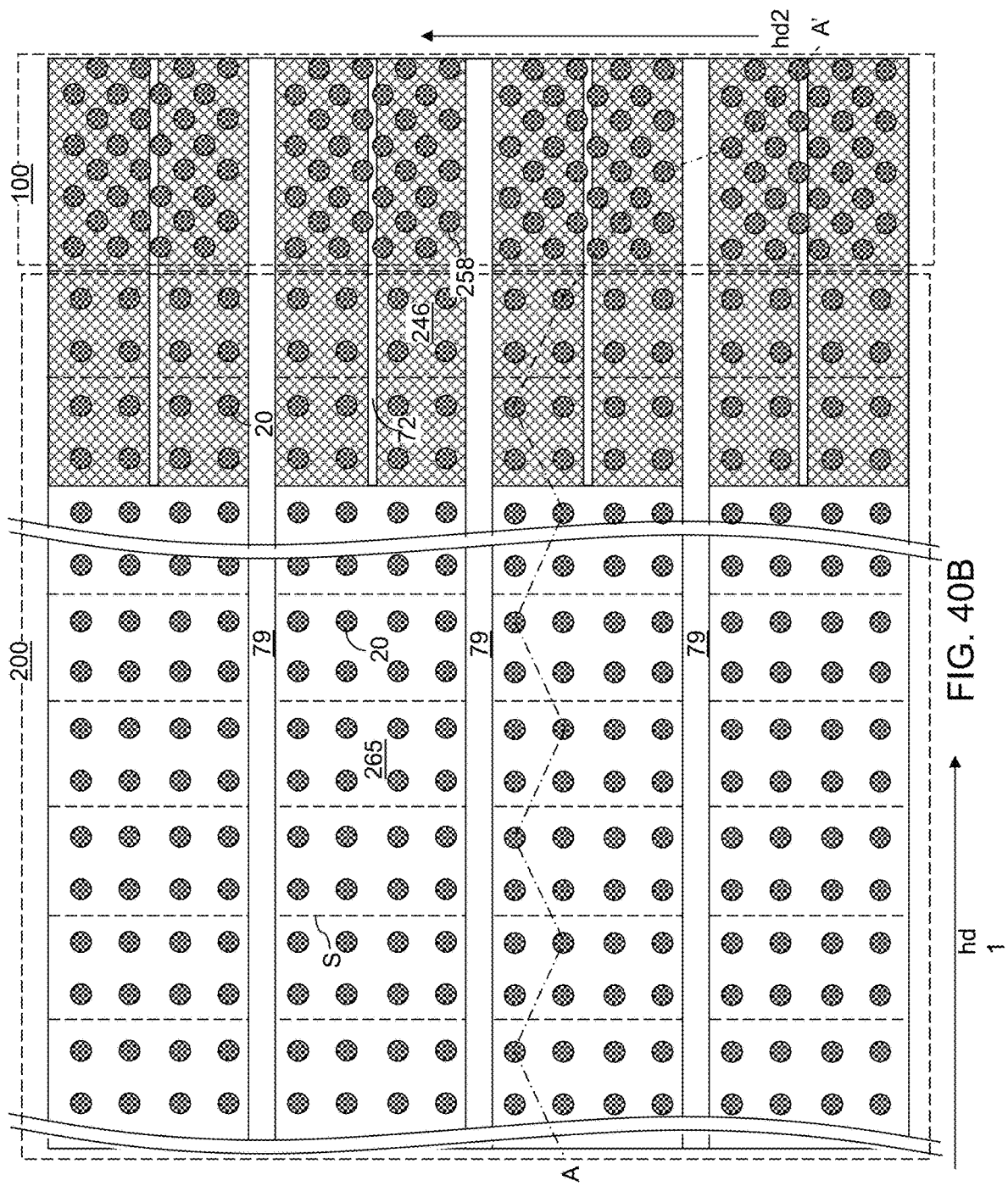
FIG. 40B is a horizontal cross-sectional view of the second exemplary structure along the horizontal plane B-B' of FIG. 40A. The hinged vertical plane A-A' corresponds to the plane of the vertical cross-sectional view of FIG. 40A.

Referring to FIGS. 39C, 40A, and 40B, a dielectric material layer may be conformally deposited in the backside trenches 79 and over the first contact level dielectric layer 280 by a conformal deposition process. The dielectric material layer may include, for example, silicon oxide. Each deposited portion of the dielectric material in the backside trenches 79 constitutes a backside trench fill structure 76, which may be a dielectric wall structure. Horizontal portions of the dielectric material above the top surface of the first contact level dielectric layer 280 may be removed, or may be incorporated into the first contact level dielectric layer 280.

Figure 41A:
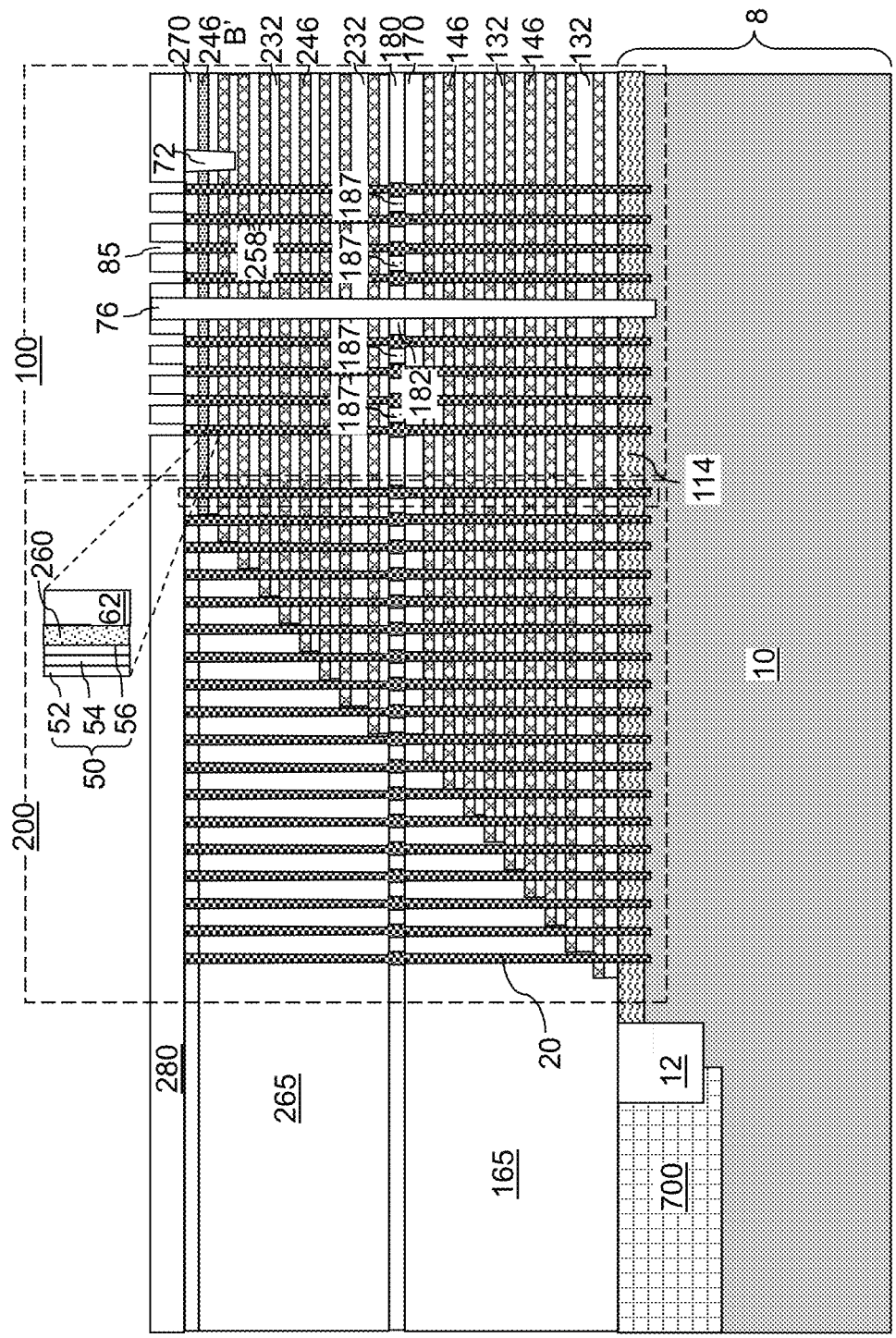
FIG. 41A is a vertical cross-sectional view of the second exemplary structure after formation of drain cavities according to the second embodiment of the present disclosure.
Figure 42:
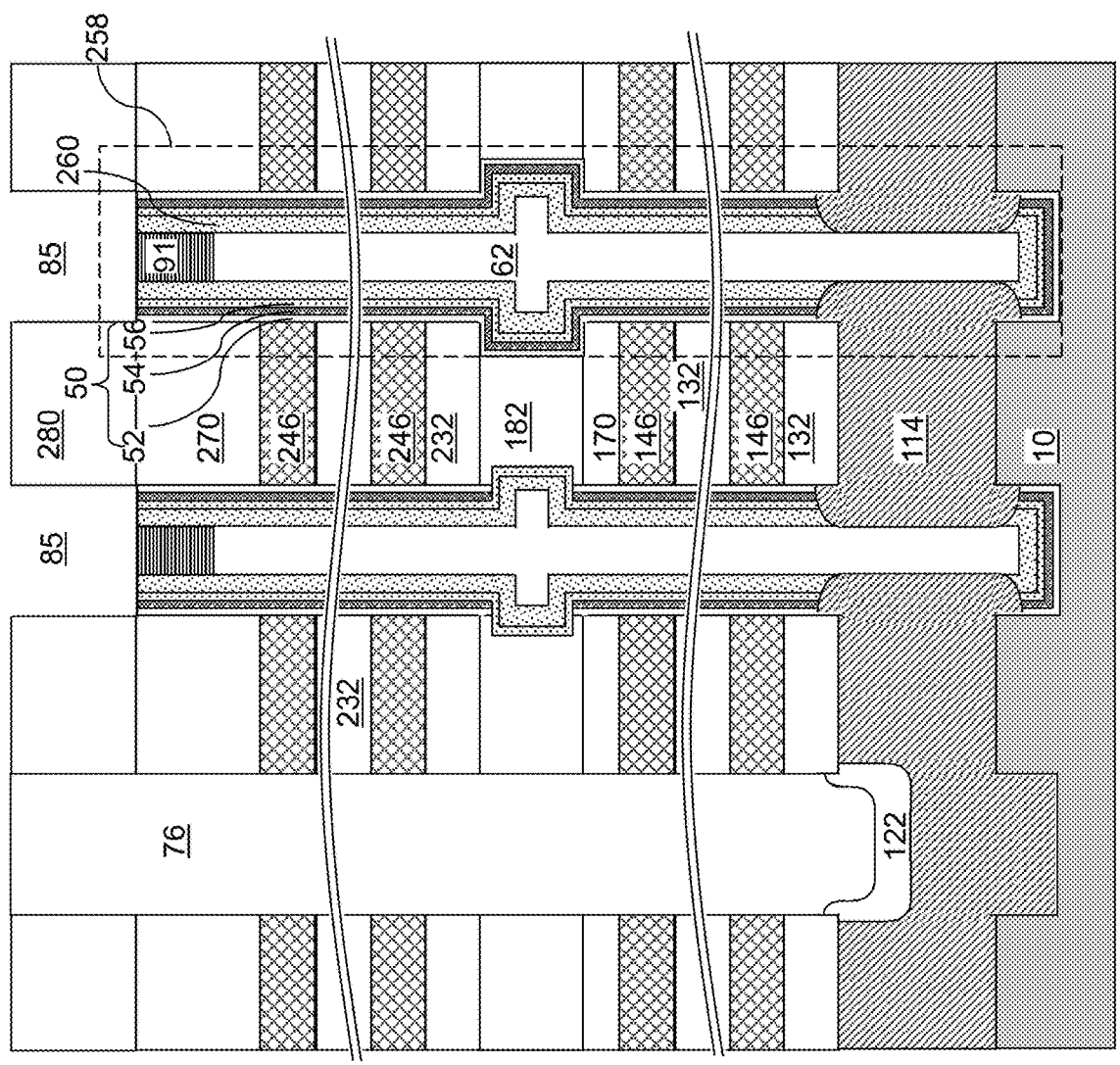
FIG. 42 is a vertical cross-sectional view of a region of the second exemplary structure at the processing steps of FIGS. 41A and 41B.

Referring to FIGS. 41A, 41B, and 42, drain cavities 85 can be formed over each of the in-process memory opening fill structures 258. For example, a photoresist layer (not shown) can be applied over the first contact level dielectric layer 280, and can be patterned with discrete openings that overlie the in-process memory opening fill structures 258. An anisotropic etch can be performed to transfer the pattern in the photoresist layer through the first contact level dielectric layer 280. The photoresist layer can be subsequently removed, for example, by ashing.

Figure 43A:
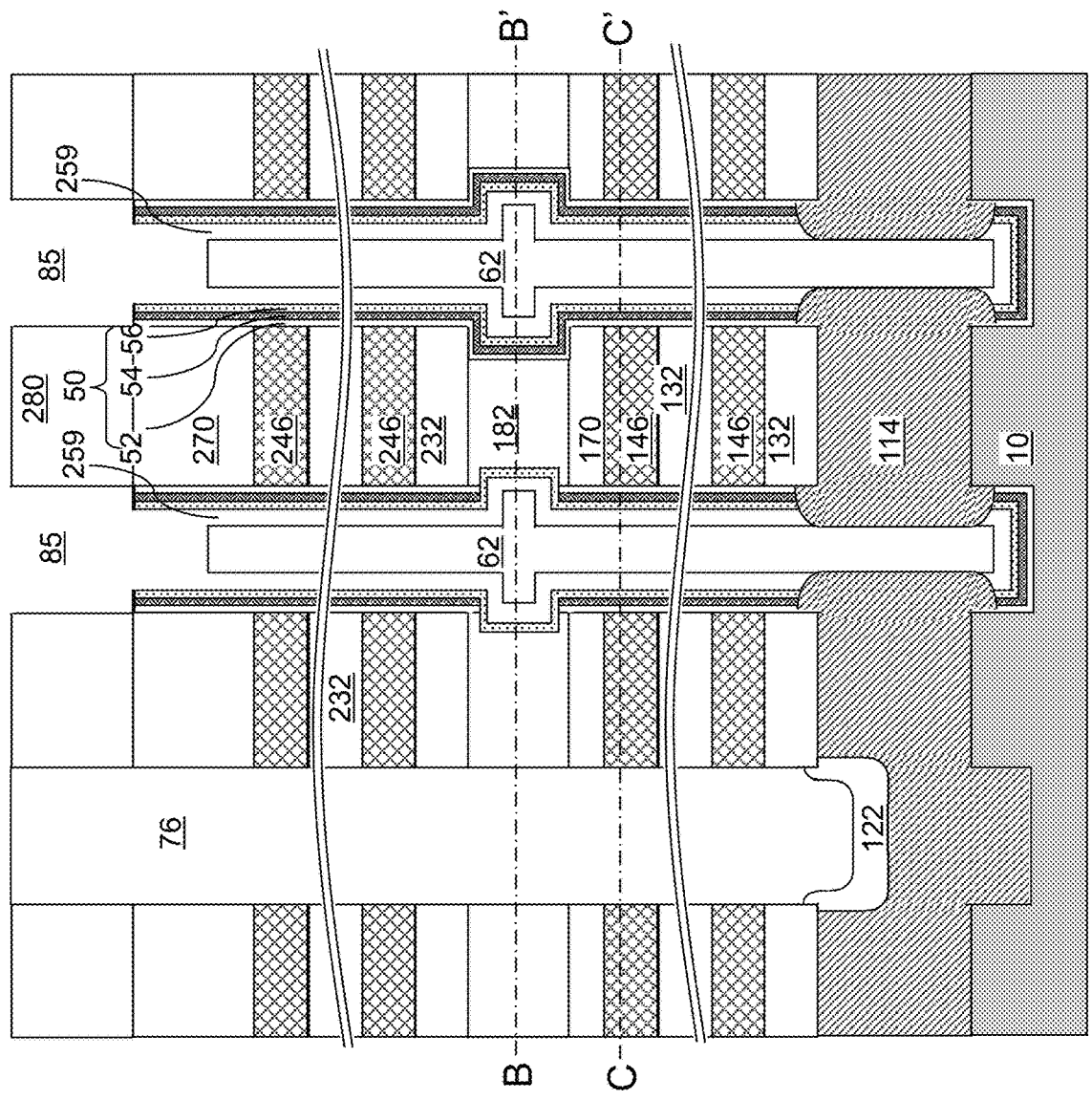
FIG. 43A is a vertical cross-sectional view of a region of the second exemplary structure after formation of channel cavities according to the second embodiment of the present disclosure.
Figure 43B:
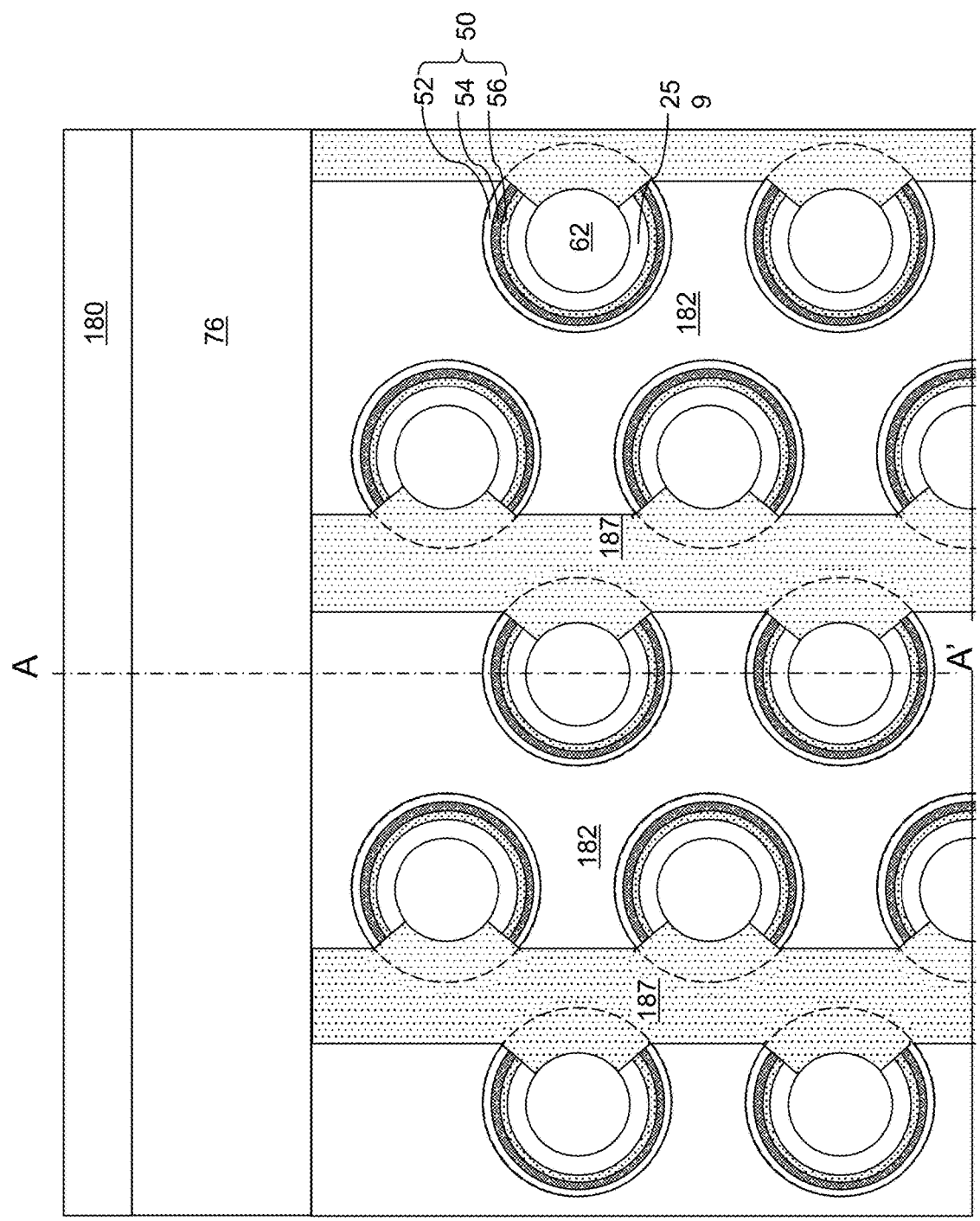
FIG. 43B is a horizontal cross-sectional view of a region of the second exemplary structure along the horizontal plane B-B' of FIG. 43A. The vertical plane A-A' is the plane of the vertical cross-sectional view of FIG. 43A.
Figure 43C:
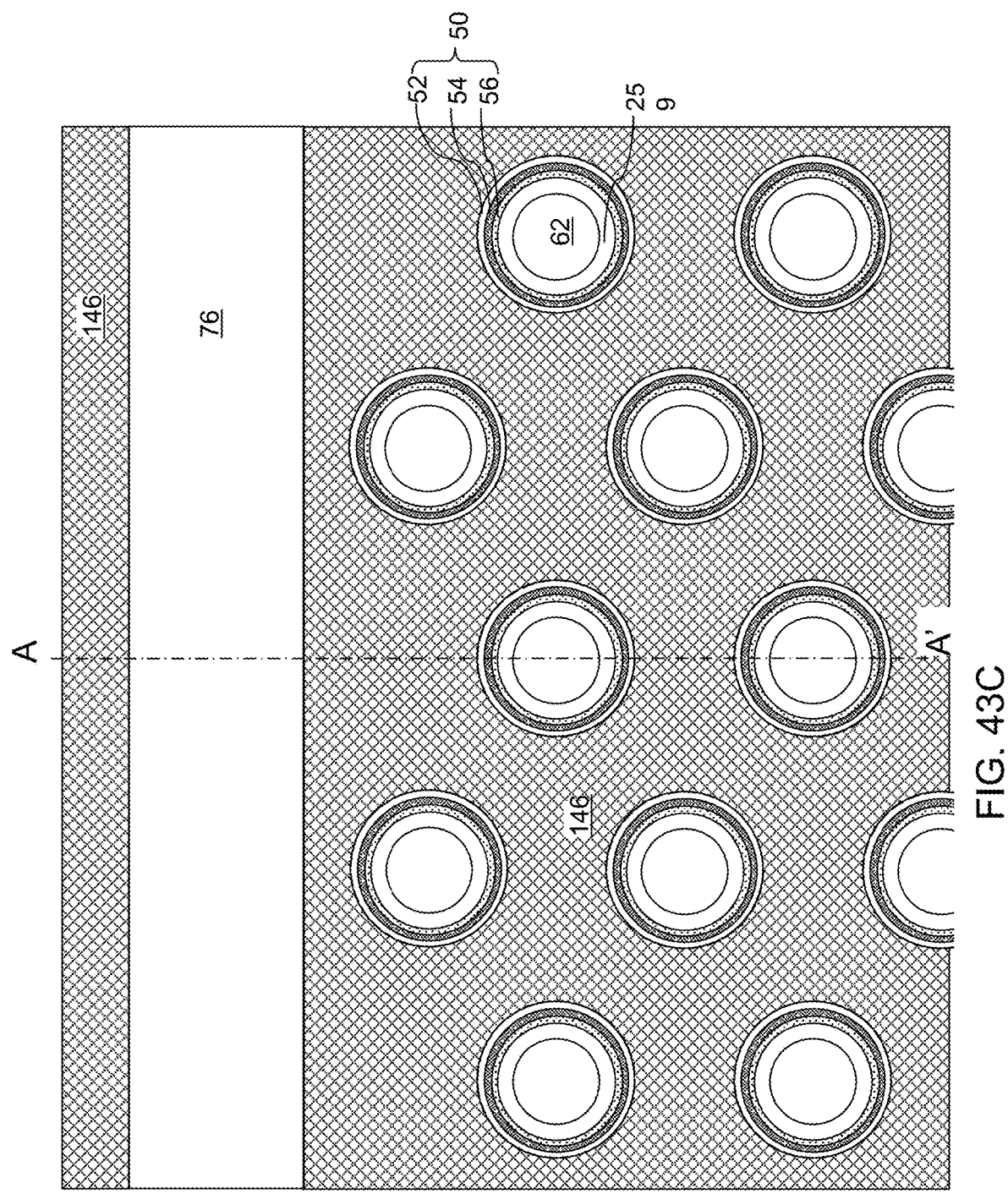
FIG. 43C is a horizontal cross-sectional view of a region of the second exemplary structure along the horizontal plane C-C' of FIG. 43A. The vertical plane A-A' is the plane of the vertical cross-sectional view of FIG. 43A.

Referring to FIGS. 43A-43C, an etch process is performed, which etches the material of the sacrificial conformal spacers 260 selective to the materials of the memory films 50, the dielectric cores 62, the first contact level dielectric layer 280, and the source contact layer 114. The etch process may be an isotropic etch process such as a wet etch process. In one embodiment, the sacrificial conformal spacers 260 can include undoped amorphous silicon or a silicon-germanium alloy, and the etch process can include a wet etch process using hot trimethyl-2 hydroxyethyl ammonium hydroxide ("hot TMY") or tetramethyl ammonium hydroxide (TMAH). The drain-level sacrificial pillars 91, if present, may be removed.

Channel cavities 259 are formed, which include the combined volumes of the sacrificial conformal spacers 260. Each channel cavity 259 can include a void that includes the volume of a removed sacrificial conformal spacer 260. An annular top surface of the single crystalline semiconductor material of the source contact layer 114 can be physically exposed at the bottom of each channel cavity 259. Each channel cavity 259 laterally surrounds a dielectric core 62. Each vertically-extending portion of a channel cavity 259 can have a uniform lateral width, which may be in a range from 10 nm to 120 nm, such as from 20 nm to 80 nm, although lesser and greater uniform lateral widths can also be used. The dielectric peg portions of the dielectric strips 187 provide structural support to the dielectric cores 62 by fixing the position of each dielectric core 62 relative to the dielectric strips 187 and the insulating material strips 182 at the level of the inter-tier dielectric layer 180 during, and after, formation of the channel cavities 159.

Figure 44:
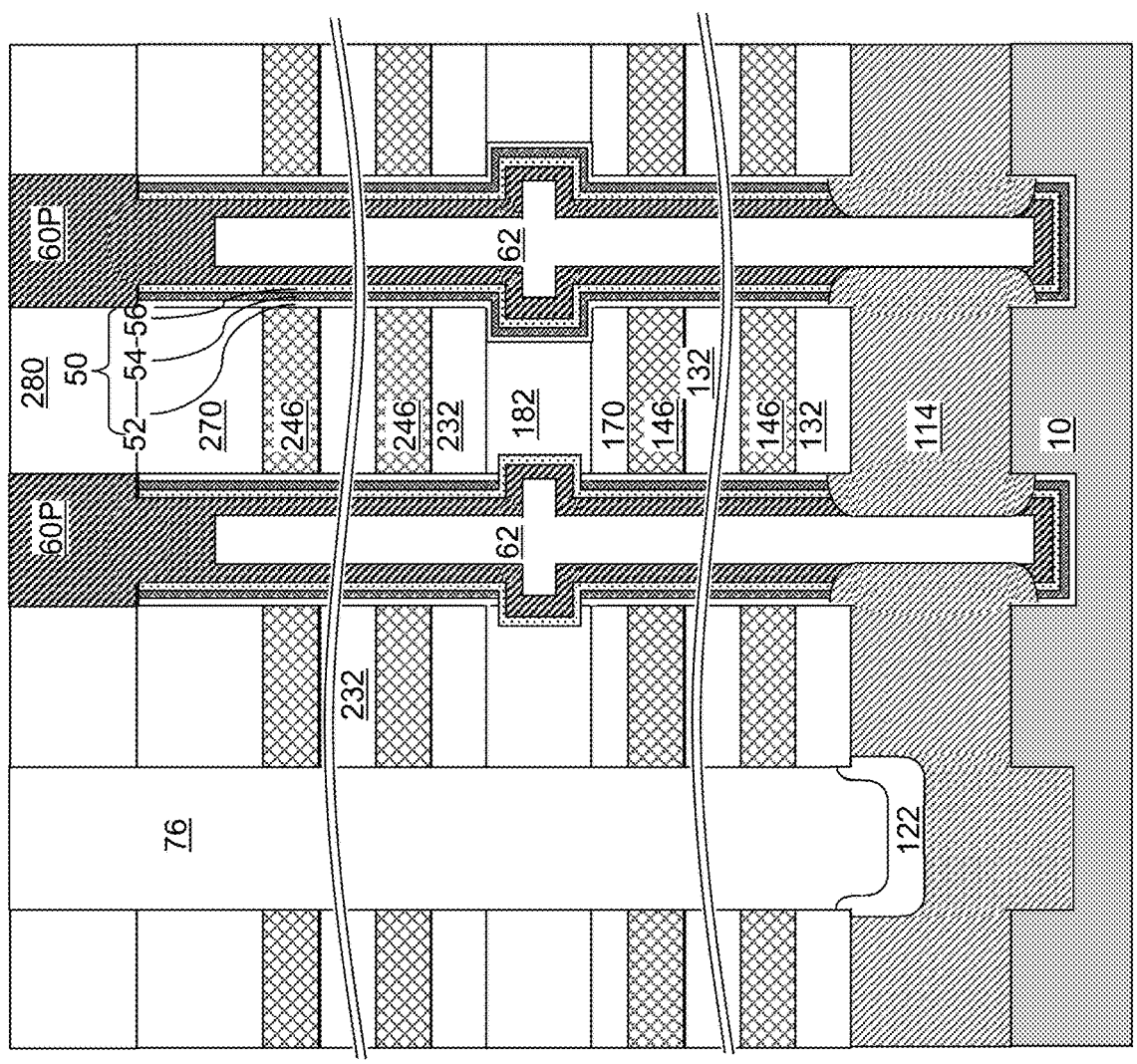
FIG. 44 is a vertical cross-sectional view of the second exemplary structure after formation of in-process epitaxial semiconductor channels according to the second embodiment of the present disclosure.
Figure 45A:
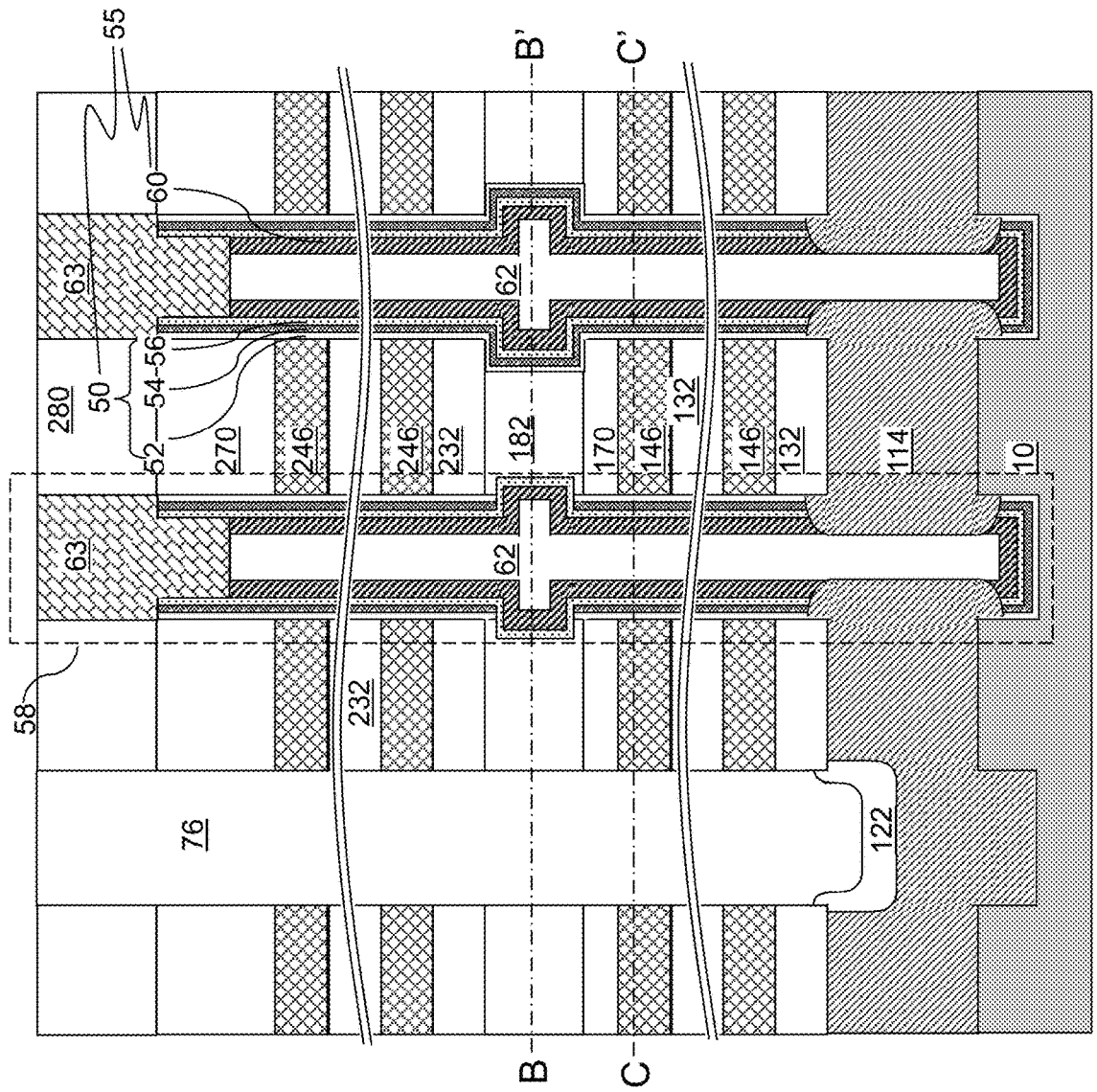
FIG. 45A is a vertical cross-sectional view of a region of the second exemplary structure after formation of epitaxial semiconductor channels and drain regions according to the second embodiment of the present disclosure.
Figure 45B:
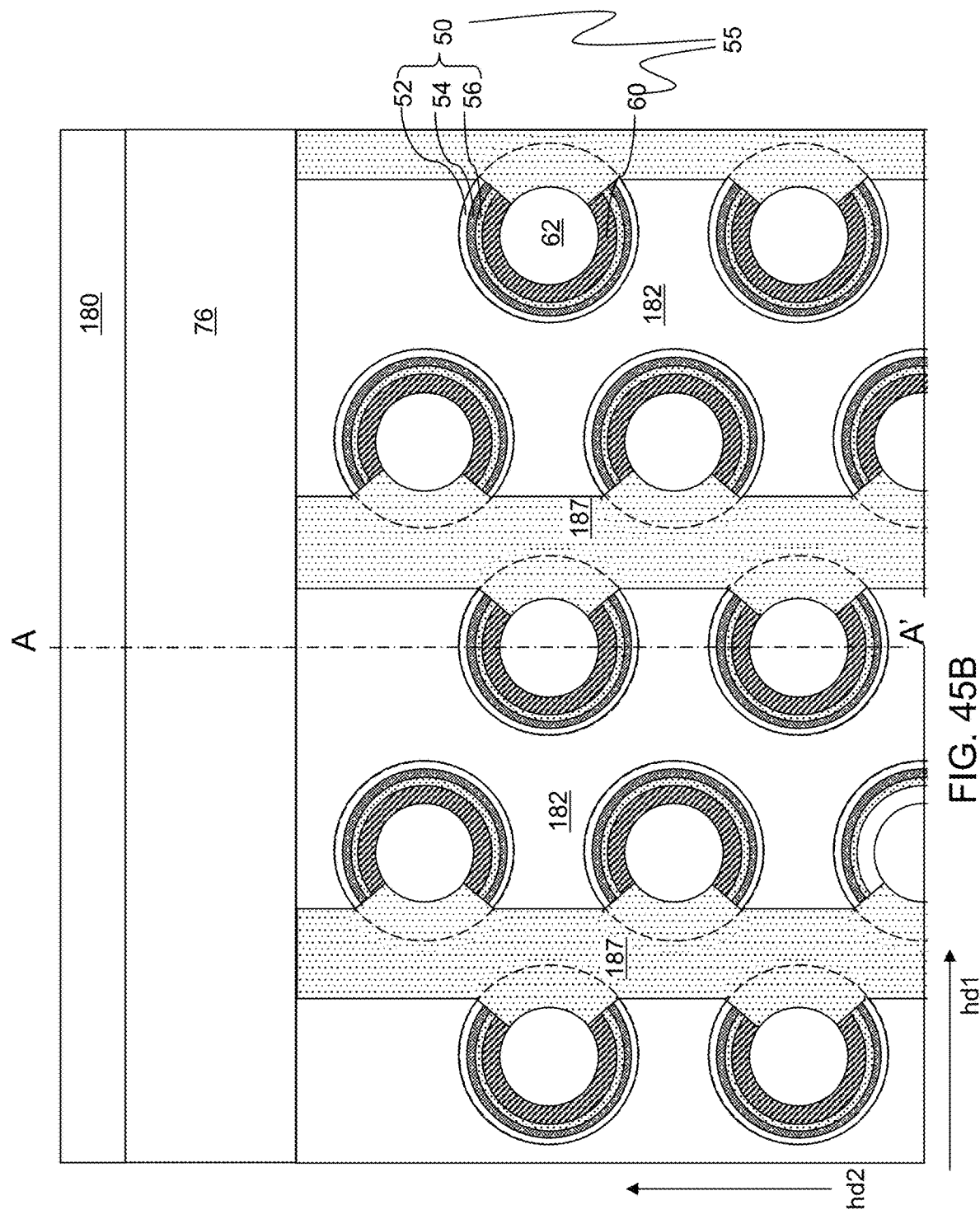
FIG. 45B is a horizontal cross-sectional view of a region of the second exemplary structure along the horizontal plane B-B' of FIG. 45A. The vertical plane A-A' is the plane of the vertical cross-sectional view of FIG. 45A.
Figure 45C:
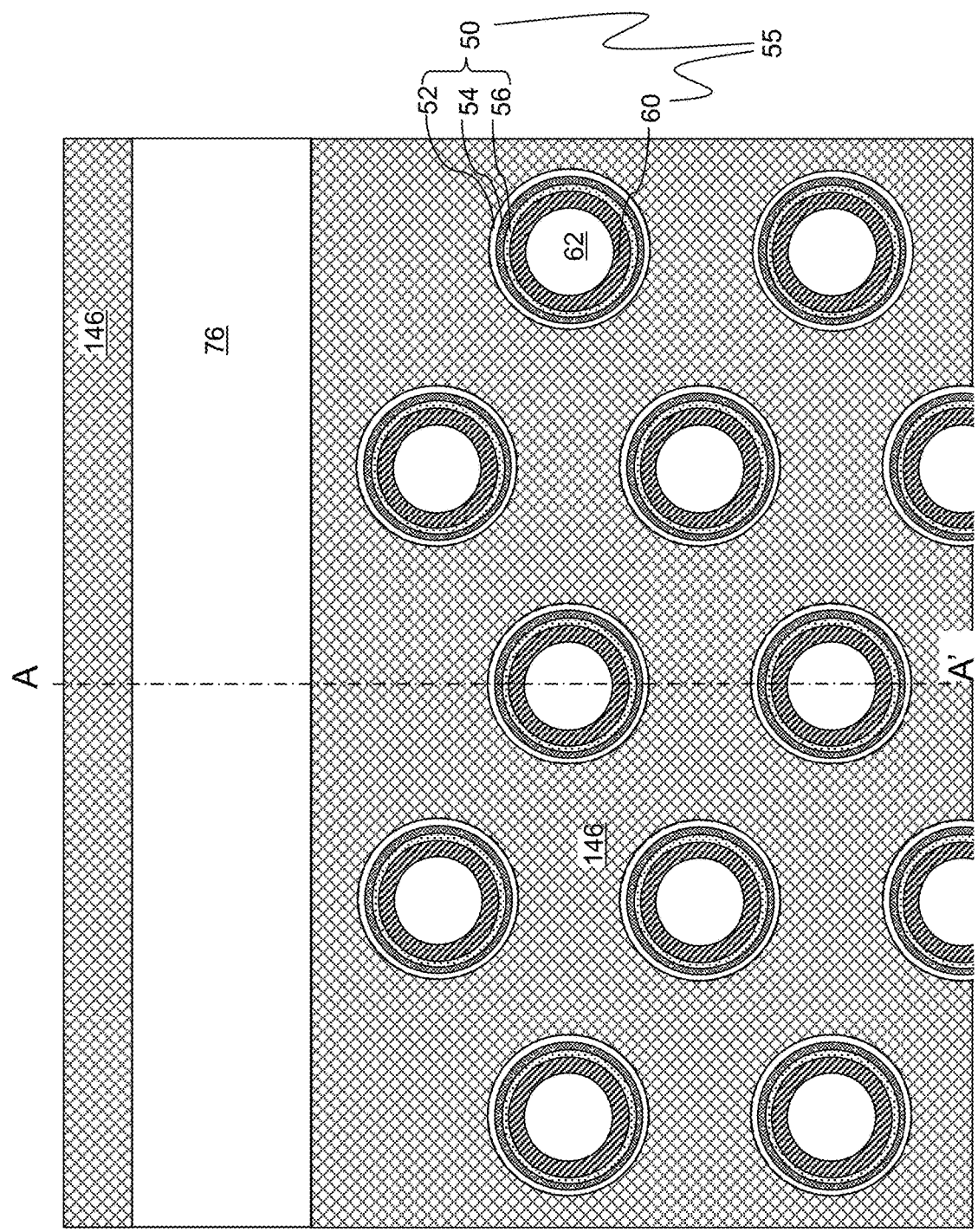
FIG. 45C is a horizontal cross-sectional view of a region of the second exemplary structure along the horizontal plane C-C' of FIG. 45A. The vertical plane A-A' is the plane of the vertical cross-sectional view of FIG. 45A.
Figure 46A:
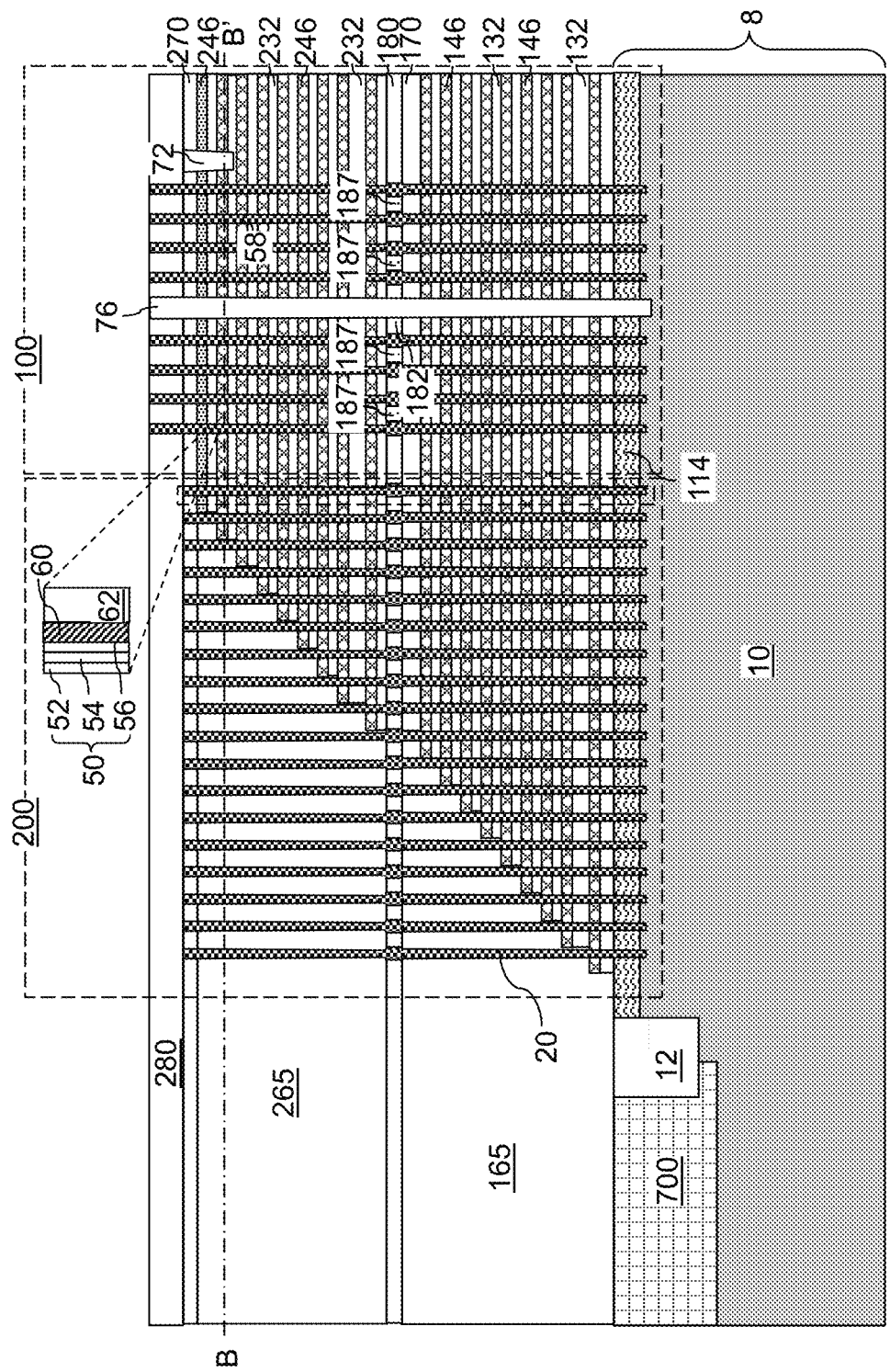
FIG. 46A is a vertical cross-sectional view of the second exemplary structure at the processing steps of FIGS. 45A-45C.
Figure 46B:
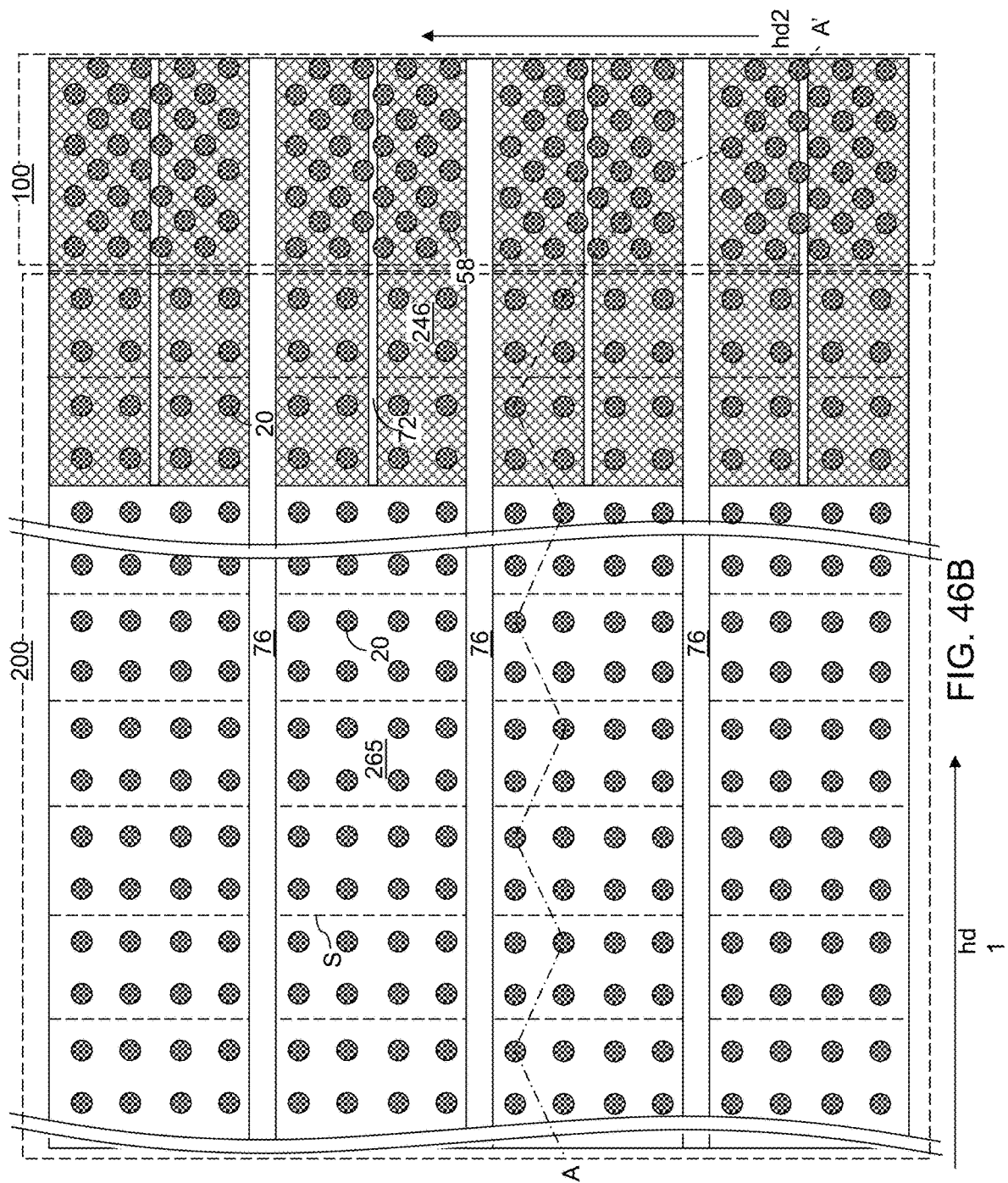
FIG. 46B is a horizontal cross-sectional view of the second exemplary structure along the horizontal plane B-B' of FIG. 46A. The hinged vertical plane A-A' corresponds to the plane of the vertical cross-sectional view of FIG. 46A.

Referring to FIG. 44, a selective epitaxy process can be performed to grow a single crystalline semiconductor material having a doping of the first conductivity type in the channel cavities 259. For example, the first exemplary structure can be placed in a vacuum-tight selective epitaxy process chamber, and a combination of a semiconductor precursor gas (such as silane, disilane, dichlorosilane, trichlorosilane, silicon tetrachloride, germane, or a precursor gas for a compound semiconductor material), a dopant gas including atoms of electrical dopants of the first conductivity type (which can be, for example, diborane for p-type dopants or phosphine, arsine, or stibine for n-type dopants), and an etchant gas (such as hydrogen chloride) is flowed into the selective epitaxy process chamber while the first exemplary structure is maintained at an elevated temperature. The elevated temperature can be in a range from 500 degrees Celsius to 900 degrees Celsius. An in-process epitaxial semiconductor channel 60P can grow upward from the physically exposed semiconductor surface of the source contact layer 114 during the selective epitaxy process. The selective epitaxy process grows a single crystalline semiconductor material upward through the channel cavities 259 and around each of the dielectric peg portions of the dielectric strips 187. The in-process epitaxial semiconductor channel 60P can fill the entire volume of a channel cavity 259. The dielectric peg portions of the dielectric strips 187 provide structural support to the dielectric cores 62 by fixing the position of each dielectric core 62 relative to the dielectric strips 187 and the insulating material strips 182 at the level of the inter-tier dielectric layer 180 during the selective epitaxy process.

Excess portions of the single crystalline semiconductor material that grows above the horizontal plane including the top surface of the first contact level dielectric layer 280 can be removed by a planarization process, which can use chemical mechanical planarization. Each in-process epitaxial semiconductor channel 60P can be epitaxially aligned to the single crystalline semiconductor material layer of the substrate 8 (such as the substrate semiconductor layer 10) through an intermediate single crystalline material of the source contact layer 114.

Referring to FIGS. 45A-45C, 46A, and 46B, dopants of the second conductivity type can be implanted into an upper portion of each in-process epitaxial semiconductor channel 60P. Each implanted upper portion of the in-process epitaxial semiconductor channels 60P is converted into a drain region having a doping of the second conductivity type. Each remaining underlying portion of the in-process epitaxial semiconductor channel 60P has a doping of the first conductivity type, and constitutes an epitaxial semiconductor channel 60. The drain regions 63 can include a single crystalline doped semiconductor material. The dopant concentration in the drain regions 63 can be in a range from $5.0 \times 10^{19}/cm^3$ to $2.0 \times 10^{21}/cm^3$, although lesser and greater dopant concentrations can also be used.

Each contiguous combination of a memory film 50 and an epitaxial semiconductor channel 60 constitutes a memory stack structure 55 including a vertical stack of memory elements therein. The vertical stack of memory elements can comprise portions of a charge storage layer located at each level of the electrically conductive layers (146, 246). A set of all material portions that fills a memory opening 49 after formation of the drain regions 63 constitutes a memory opening fill structure 58. Each memory opening fill structure 58 includes a memory film 50, an epitaxial semiconductor channel 60, a dielectric core 62, a drain region 63, and a dielectric peg portion of a dielectric strip 187. The epitaxial semiconductor channels 60 are formed directly on, and with epitaxial alignment with, the source contact layer 114.

Figure 47:
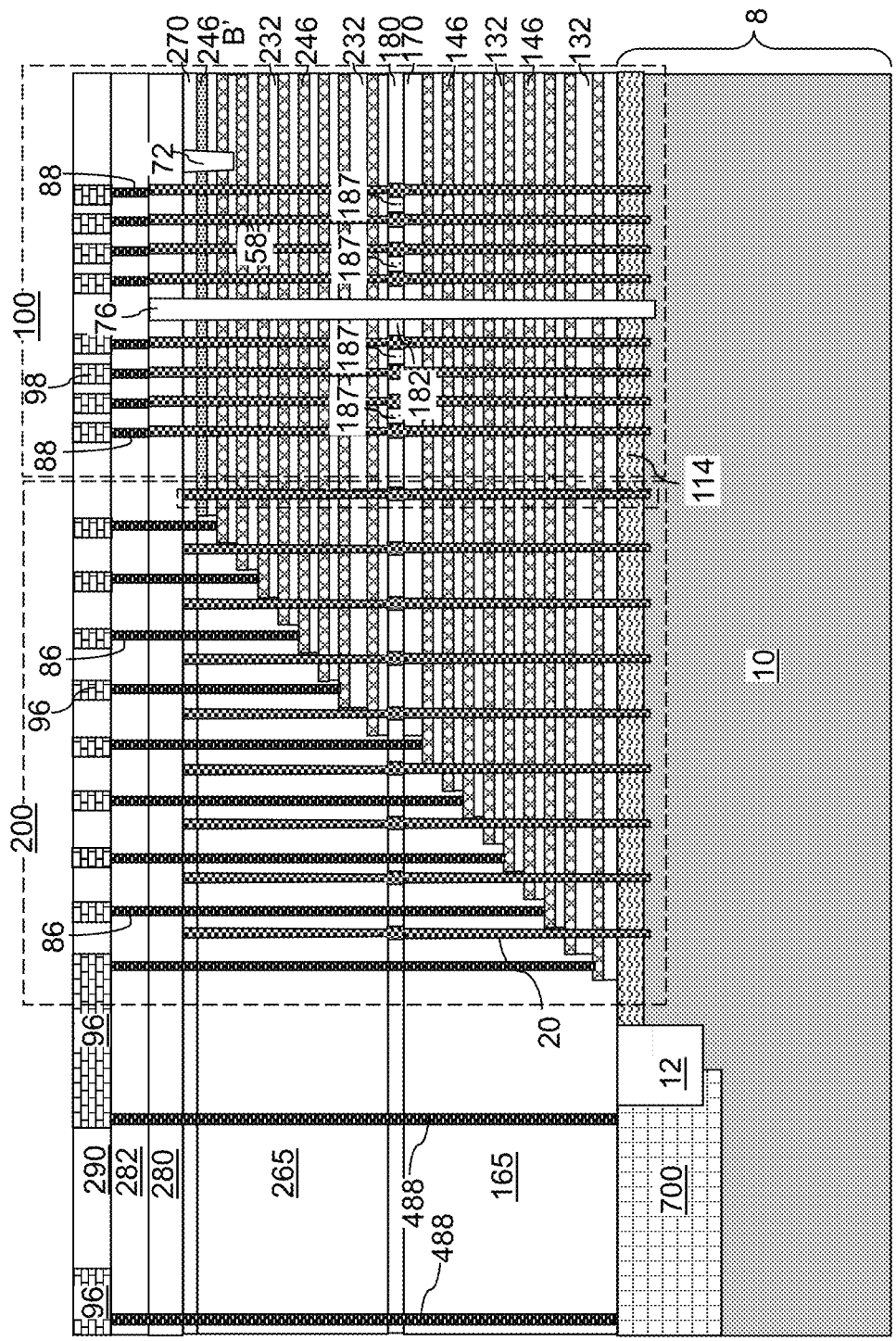
FIG. 47 is a vertical cross-sectional view of the second exemplary structure after formation of through-memory-level via structures, contact via structures, and metal line structures according to the second embodiment of the present disclosure.

Referring to FIG. 47, the processing steps of FIG. 23 can be performed to form first through-memory-level via structures 488, contact via structures (96, 88), and metal line structures (96, 98).

Referring to all drawings and according to various embodiments of the present disclosure, a three-dimensional memory device is provided, which comprises: a first-tier alternating stack of first-tier insulating layers 132 and first-tier electrically conductive layers 146 located over a substrate 8; an inter-tier insulating assembly (182, 187) located over the first-tier alternating stack (132, 146) and including a plurality of dielectric strips 187, wherein each of the plurality of dielectric strips 187 includes dielectric peg portions that laterally protrude from a dielectric rail portion; a second-tier alternating stack of second-tier insulating layers 232 and second-tier electrically conductive layers 246 located over the inter-tier insulating assembly (182, 187); memory openings 49 vertically extending through the first-tier alternating stack (132, 146), the inter-tier insulating assembly (182, 187), and the second-tier alternating stack (232, 246), wherein each of the memory openings 49 comprises a side aperture through which a respective one of the dielectric peg portions extend inward; and memory opening fill structures 58 located in a respective one of the memory openings 49 and comprising a memory film 50, a semiconductor channel 60, and a dielectric core 62 comprising a dielectric fill material and adjoined to the respective one of the dielectric peg portions.

In one embodiment, each of the semiconductor channels 60 has a respective annular horizontal cross-sectional shape at levels of the first-tier alternating stack (132, 146) and at levels of the second-tier alternating stack (232, 246), and has a respective shape of a block arc at a level of the inter-tier insulating assembly (182, 187), i.e., between a first horizontal plane including a bottom surface of the inter-tier insulating assembly (182, 187) and a second horizontal plane including a top surface of the inter-tier insulating assembly (182, 187).

In one embodiment, each of the memory films 50 has a respective annular horizontal cross-sectional shape at the levels of the first-tier alternating stack (132, 146) and at the levels of the second-tier alternating stack (232, 246), and has a respective shape of a block arc at the level of the inter-tier insulating assembly (182, 187).

In one embodiment, each interface between the dielectric cores 62 and the dielectric peg portions comprises a convex vertical surface of a respective one of the dielectric cores 62 and a concave vertical surface of a respective one of the dielectric peg portions.

In one embodiment, the inter-tier insulating assembly (182, 187) comprises insulating material strips 182 that are interlaced with the plurality of dielectric strips 187, wherein a laterally alternating sequence of insulating material strips 182 and dielectric strips 187 that alternate along a first horizontal direction hd1 is present between the first-tier alternating stack (132, 146) and the second-tier alternating stack (232, 246).

In one embodiment, each of the plurality of insulating material strips 182 contacts two columns of memory opening fill structures 58 that extend along a second horizontal direction hd2 that is perpendicular to the first horizontal direction hd1.

In one embodiment, the three-dimensional memory device comprises: a backside trench 79 vertically extending through the first-tier alternating stack (132, 146), the inter-tier insulating assembly (182, 187), and the second-tier alternating stack (232, 246), laterally extending along the first horizontal direction hd1, and having a uniform width along a second horizontal direction hd2 that is perpendicular to the first horizontal direction hd1; and a backside trench fill structure 76 located in the backside trench 79, wherein each strip within the laterally alternating sequence of insulating material strips 182 and dielectric strips 187 contacts a sidewall of the backside trench fill structure 76.

In one embodiment, each of the plurality of dielectric strips 187 has two sets of straight sidewall segments, wherein each set of straight sidewall segments includes a plurality of straight sidewall segments located within a respective vertical plane that is perpendicular to the first horizontal direction hd1.

In one embodiment, the three-dimensional memory device comprises a single crystalline semiconductor material layer located in or over the substrate 8, wherein the semiconductor channel 60 comprises an epitaxial semiconductor channel that is epitaxially aligned to the single crystalline semiconductor material layer. The device also comprises drain regions 63 comprising a doped epitaxial semiconductor material contacting an upper end of, and epitaxially aligned to, a respective one of the epitaxial semiconductor channels 60 and contacting a top surface of a respective one of the dielectric cores 62.

In one embodiment, the three-dimensional memory device comprises: a source contact layer 114 comprising a doped single crystalline semiconductor material and contacting, and epitaxially aligned to, the single crystalline semiconductor material layer and the epitaxial semiconductor channels 60. In one embodiment, the source contact layer 114 contacts and laterally surrounds each of the dielectric cores 62.

In one embodiment, each interface between the source contact layer 114 and the epitaxial semiconductor channels 60 comprises an annular convex tapered surface of the source contact layer 114 and an annular concave tapered surface of a respective one of the epitaxial semiconductor channels 60.

In one embodiment, the epitaxial semiconductor channels 60 comprise a material selected from single crystalline silicon, a single crystalline silicon-germanium alloy, or a single crystalline III-V compound semiconductor material; and the plurality of dielectric strips 187 comprises a material selected from undoped silicate glass, a doped silicate glass, or organosilicate glass.

In one embodiment, the second exemplary structure can further include the dielectric pegs 62G of the first exemplary structure in addition to the dielectric pegs of the dielectric strips 187 located in the inter-tier insulating assembly to provide additional support to the semiconductor channels 60 and the dielectric cores 62.

The dielectric pegs of the first and/or second exemplary structures provide support to the semiconductor channels 60 and the dielectric cores 62 to prevent them from collapsing during fabrication steps (e.g., during formation of the backside recesses 43).

The various epitaxial single crystalline semiconductor channels 60 (e.g., single crystal silicon channels) of some of embodiments of the present disclosure provide a higher charge carrier mobility relative to polycrystalline semiconductor channels. Further, the epitaxial semiconductor channels 60 of the embodiments of the present disclosure are formed in a tubular configuration, and thus, can be formed with a sufficiently small lateral thickness to provide complete depletion of charge carriers within the epitaxial semiconductor channels 60 when the epitaxial semiconductor channels 60 are turned off. Thus, the epitaxial semiconductor channels 60 of the embodiments of the present disclosure can provide high on-current and low leakage current for NAND strings, thereby enhancing performance of a three-dimensional memory device including the NAND strings. However, in alternative embodiments, the semiconductor channels 60 may be polycrystalline, such as polysilicon channels.

Figure 48A:
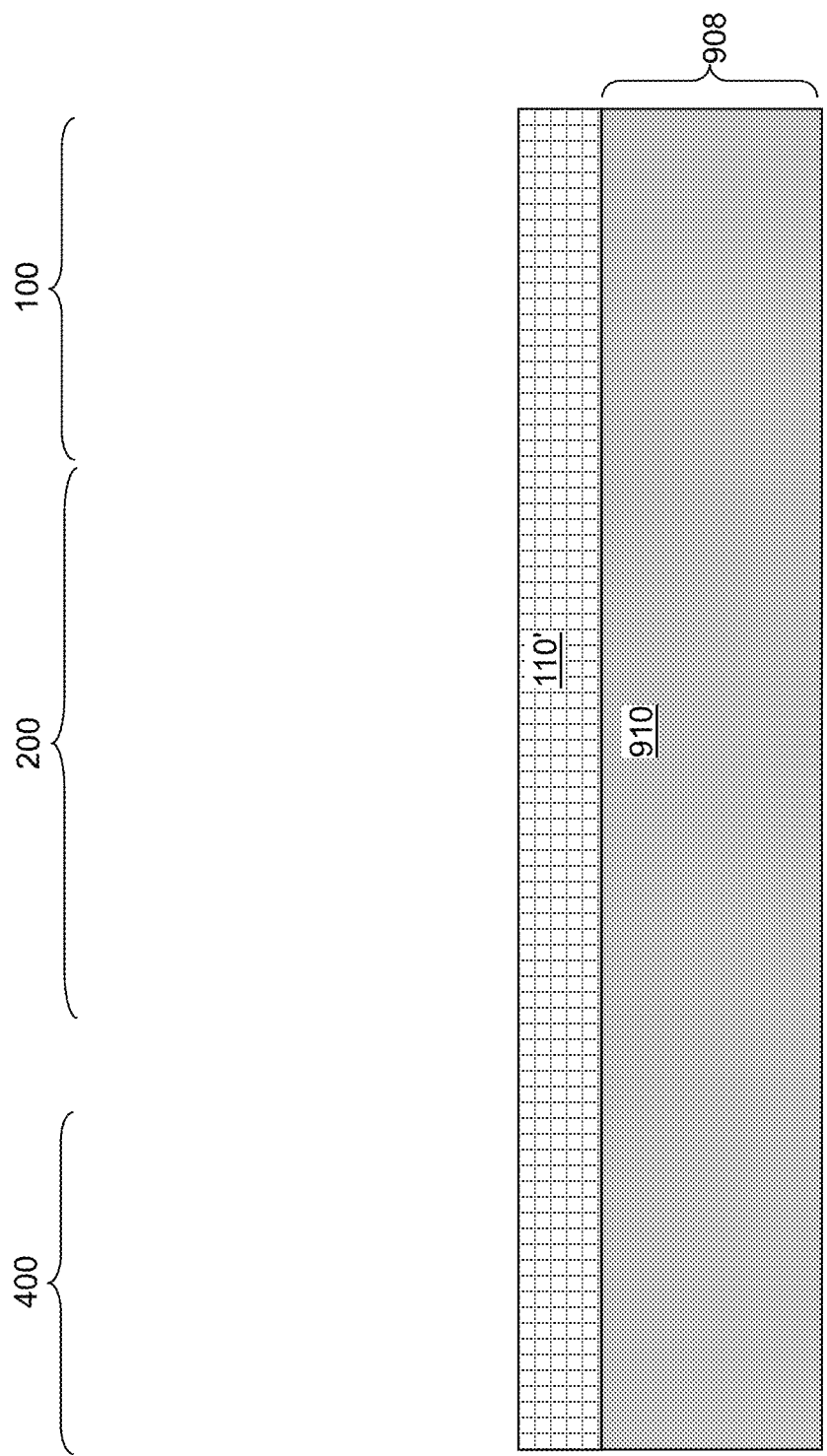
FIG. 48A is a vertical cross-sectional view of a third exemplary structure after formation of in-process source-level material layers on a substrate according to a third embodiment of the present disclosure.
Figure 48B:
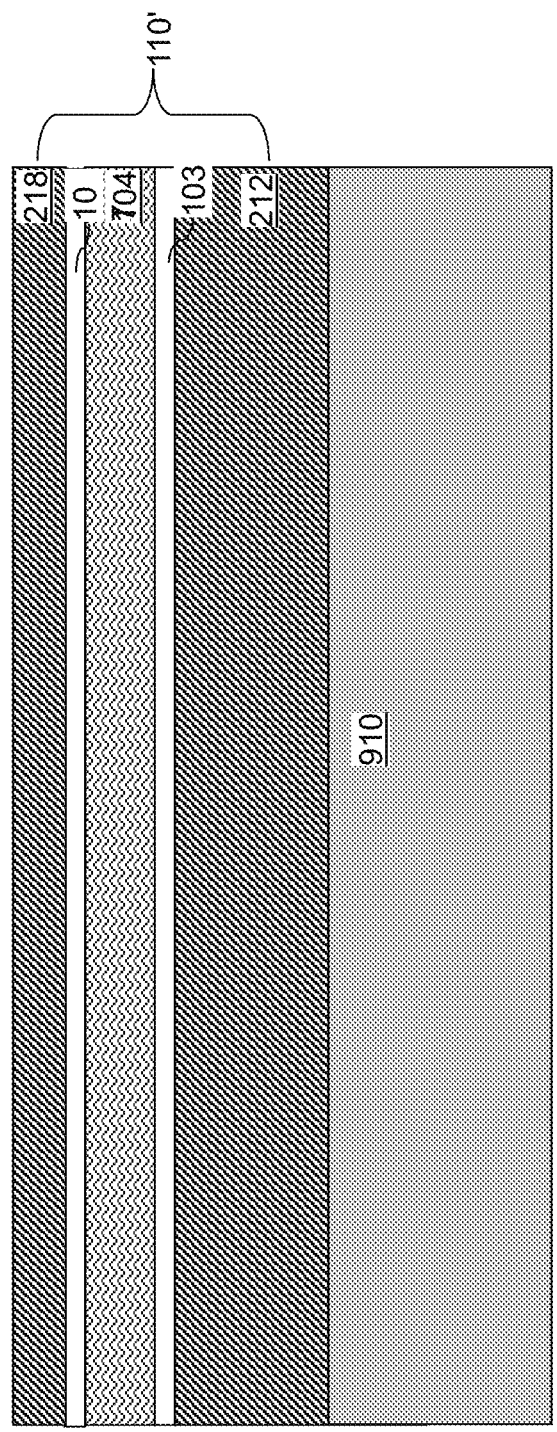
FIG. 48B is a magnified view of a region of the third exemplary structure of FIG. 48A.

Referring to FIGS. 48A and 48B, a third exemplary structure according to a third embodiment of the present disclosure is illustrated. The third exemplary structure includes a substrate 908 that includes a upper substrate portion 910. The substrate 908 may be a semiconductor substrate, such as a commercially available single crystalline silicon wafer. In this case, the upper substrate portion 910 may include the top part of the silicon wafer, a doped well, and/or an epitaxial silicon layer comprising a single crystalline semiconductor (e.g., silicon) material that is free of carbon or that contains carbon. As used herein, a structure is "free of carbon" if the atomic concentration of carbon within the structure is below trace level such as less than 0.1 million parts per million in atomic concentration.

A lower semiconductor layer 212 can be formed on the upper substrate portion 910. In one embodiment, the lower semiconductor layer 212 can be formed by ion implantation or diffusion of p-type dopant (e.g., boron) and optionally carbon into an upper part of the upper substrate portion 910. Alternatively, a single crystalline semiconductor (e.g., silicon) material layer that is in-situ doped with boron and optionally carbon can be deposited on a top surface of the upper substrate portion 910 to form the lower semiconductor layer 212. Preferably, the p-type dopants in the lower semiconductor layer 212 comprise boron atoms. In this case, the lower semiconductor layer 212 can include a carbon and boron-doped semiconductor material, which is herein referred to as a first boron-doped semiconductor material. In one embodiment, the first boron-doped semiconductor material comprises a doped single crystalline semiconductor material that is epitaxially aligned to the single crystalline semiconductor material of the substrate 908, i.e., the single crystalline semiconductor material of the upper substrate portion 910.

In one embodiment, the first boron-doped semiconductor material can include boron atoms at an atomic concentration in a range from $1.0 \times 10^{18}/cm^3$ to $2.0 \times 10^{21}/cm^3$. In one embodiment, the first boron-doped semiconductor material of the lower semiconductor layer 212 can comprise single crystalline silicon that is doped with boron atoms and with carbon atoms. In one embodiment, the first boron-doped semiconductor material can include carbon atoms at an atomic concentration in a range from $1.0 \times 10^{15}/cm^3$ to $1.0 \times 10^{19}/cm^3$. The thickness of the lower semiconductor layer 212 can be in a range from 50 nm to 400 nm, such as from 100 nm to 300 nm, although lesser and greater thicknesses can also be employed.

A lower etch stop dielectric layer 103 can be formed on the top surface of the lower semiconductor layer 212. The lower etch stop dielectric layer 103 includes a dielectric material that can function as an etch stop material during subsequently removal of a sacrificial material. For example, the lower etch stop dielectric layer 103 can include silicon oxide. The lower etch stop dielectric layer 103 may be formed by thermal oxidation or plasma oxidation of a surface portion of the lower semiconductor layer 212. The lower etch stop dielectric layer 103 can have a thickness in a range from 2 nm to 10 nm, although lesser and greater thicknesses can also be employed.

A sacrificial source-level material can be deposited over the lower etch stop dielectric liner 103 to form a sacrificial source-level material layer 104. The sacrificial source-level material layer 104 includes a material that can be removed selective to the lower etch stop dielectric liner 103. For example, the sacrificial source-level material layer 104 can include undoped amorphous silicon, undoped polysilicon, amorphous carbon, organosilicate glass, or a polymer material. In one embodiment, the sacrificial source-level material layer 104 includes undoped amorphous silicon or polysilicon. The sacrificial source-level material layer 104 can have a uniform thickness throughout, which can be in a range from 20 nm to 300 nm, such as from 50 nm to 150 nm, although lesser and greater thicknesses can also be employed.

An upper etch stop dielectric liner 107 can be formed on the sacrificial source-level material layer 104. The upper etch stop dielectric liner 107 includes a dielectric material that is selective to the etch process to be subsequently employed to remove the sacrificial source-level material layer 104. In one embodiment, the upper etch stop dielectric liner 107 can include silicon oxide. The thickness of the upper etch stop dielectric liner 107 cab be in a range from 2 nm to 10 nm, although lesser and greater thicknesses can also be employed.

An upper semiconductor layer 218 can be formed over the upper etch stop dielectric liner 107 by deposition of a polycrystalline or amorphous semiconductor material having a p-type doping and including carbon atoms. In one embodiment, the p-type dopants in the upper semiconductor layer 218 can comprise boron atoms. In this case, the upper semiconductor layer 218 can include a boron-doped semiconductor material, which is herein referred to as a second boron-doped semiconductor material.

In one embodiment, the second boron-doped semiconductor material can include boron atoms at an atomic concentration in a range from $1.0 \times 10^{18}/cm^3$ to $2.0 \times 10^{21}/cm^3$. In one embodiment, the second boron-doped semiconductor material of the upper semiconductor layer 218 can comprise polycrystalline or amorphous silicon that is doped with boron atoms and with carbon atoms. In one embodiment, the second boron-doped semiconductor material can include carbon atoms at an atomic concentration in a range from $1.0 \times 10^{15}/cm^3$ to $1.0 \times 10^{19}/cm^3$. The thickness of the upper semiconductor layer 218 can be in a range from 20 nm to 400 nm, such as from 50 nm to 200 nm, although lesser and greater thicknesses can also be employed.

The layer stack of the lower semiconductor layer 212, the lower etch stop dielectric liner 103, the sacrificial source-level material layer 104, the upper etch stop dielectric liner 107, and the upper semiconductor layer 218 is herein referred to as in-process source-level material layers 110', which is subsequently modified to provide source-level material layers. The exemplary structure includes a memory array region 100 in which an array of memory devices is to be subsequently formed, a staircase region 200 in which stepped surfaces of an alternating stack of insulating layers and electrically conductive layers are to be subsequently formed, and a peripheral region 400 from which layers within the alternating stack of insulating layers and electrically conductive layers are removed. Optionally, the in-process source-level material layers 110' may be lithographically patterned to form an opening in the peripheral region 400 and to form at least one optional opening within the memory array region 100. In this case, a dielectric material can be deposited in regions from which portions of the in-process source-level material layers 110' are removed to provide dielectric isolation structures (not illustrated).

Generally, the in-process source-level material layers 110' comprises a lower semiconductor layer 212, an optional lower etch stop dielectric liner 103, a sacrificial source-level material layer 104, an optional upper etch stop dielectric liner 107, and an upper semiconductor layer 218.

Figure 49:
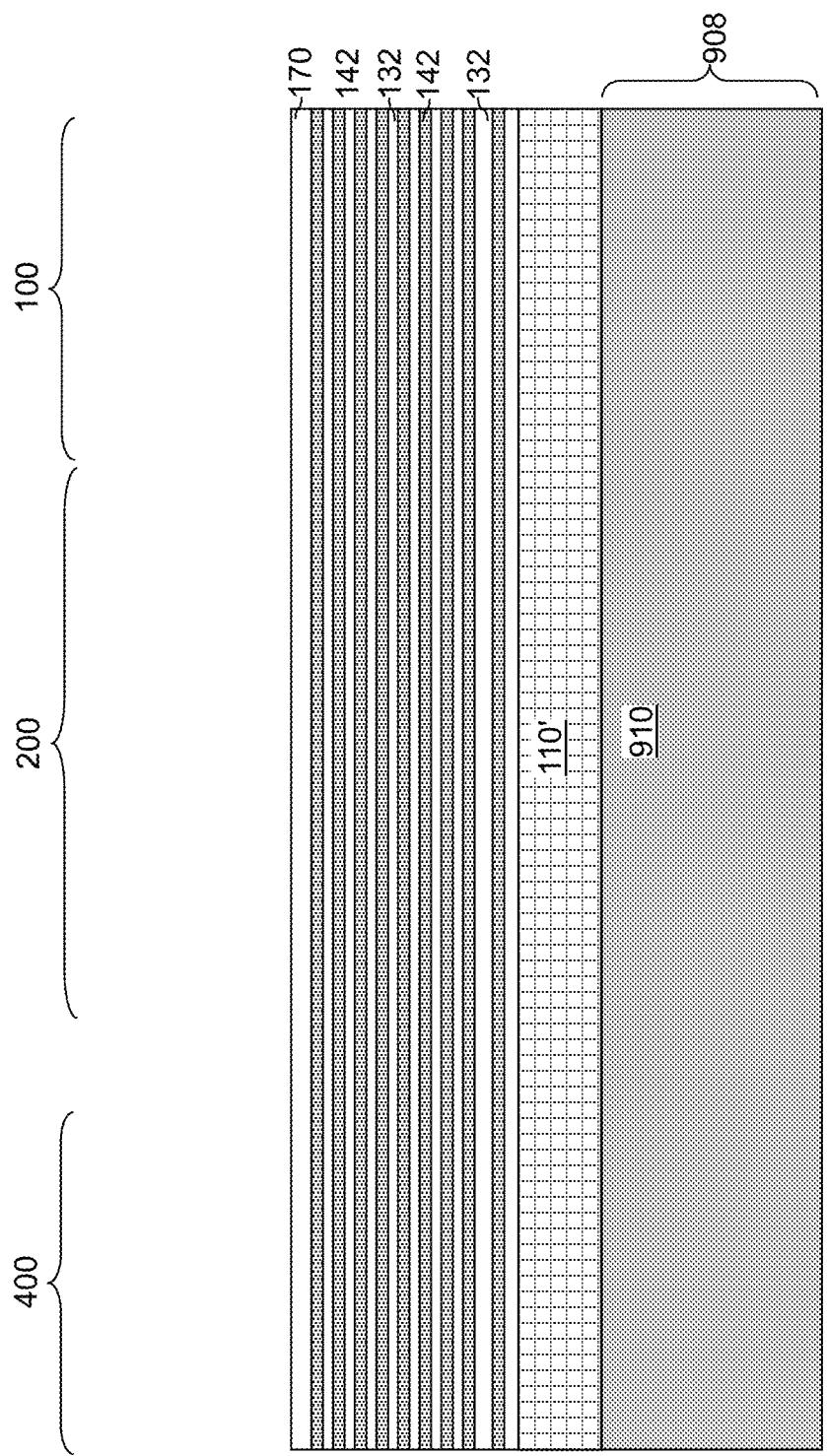
FIG. 49 is a vertical cross-sectional view of the third exemplary structure after formation of a first-tier alternating stack according to the third embodiment of the present disclosure.

Referring to FIG. 49, an alternating stack of first material layers and second material layers is subsequently formed. Each first material layer may include a first material, and each second material layer may include a second material that is different from the first material. In case at least another alternating stack of material layers is subsequently formed over the alternating stack of the first material layers and the second material layers, the alternating stack is herein referred to as a first-tier alternating stack. The level of the first-tier alternating stack is herein referred to as a first-tier level, and the level of the alternating stack to be subsequently formed immediately above the first-tier level is herein referred to as a second-tier level, etc.

The first-tier alternating stack may include first insulting layers 132 as the first material layers, and first spacer material layers as the second material layers. In one embodiment, the first spacer material layers may be sacrificial material layers that are subsequently replaced with electrically conductive layers. In another embodiment, the first spacer material layers may be electrically conductive layers that are not subsequently replaced with other layers. While the present disclosure is described using embodiments in which sacrificial material layers are replaced with electrically conductive layers, embodiments in which the spacer material layers are formed as electrically conductive layers (thereby obviating the need to perform replacement processes) are expressly contemplated herein.

In one embodiment, the first material layers and the second material layers may be first insulating layers 132 and first sacrificial material layers 142, respectively. In one embodiment, each first insulating layer 132 may include a first insulating material, and each first sacrificial material layer 142 may include a first sacrificial material. An alternating plurality of first insulating layers 132 and first sacrificial material layers 142 is formed over the in-process source-level material layers 110'. As used herein, a "sacrificial material" refers to a material that is removed during a subsequent processing step.

As used herein, an alternating stack of first elements and second elements refers to a structure in which instances of the first elements and instances of the second elements alternate. Each instance of the first elements that is not an end element of the alternating plurality is adjoined by two instances of the second elements on both sides, and each instance of the second elements that is not an end element of the alternating plurality is adjoined by two instances of the first elements on both ends. The first elements may have the same thickness throughout, or may have different thicknesses. The second elements may have the same thickness throughout, or may have different thicknesses. The alternating plurality of first material layers and second material layers may begin with an instance of the first material layers or with an instance of the second material layers, and may end with an instance of the first material layers or with an instance of the second material layers. In one embodiment, an instance of the first elements and an instance of the second elements may form a unit that is repeated with periodicity within the alternating plurality.

The first-tier alternating stack (132, 142) may include first insulating layers 132 composed of the first material, and first sacrificial material layers 142 composed of the second material, which is different from the first material. The first material of the first insulating layers 132 may be at least one insulating material. Insulating materials that may be used for the first insulating layers 132 include, but are not limited to silicon oxide (including doped or undoped silicate glass), silicon nitride, silicon oxynitride, organosilicate glass (OSG), spin-on dielectric materials, dielectric metal oxides that are commonly known as high dielectric constant (high-k) dielectric oxides (e.g., aluminum oxide, hafnium oxide, etc.) and silicates thereof, dielectric metal oxynitrides and silicates thereof, and organic insulating materials. In one embodiment, the first material of the first insulating layers 132 may be silicon oxide.

The second material of the first sacrificial material layers 142 is a sacrificial material that may be removed selective to the first material of the first insulating layers 132. As used herein, a removal of a first material is "selective to" a second material if the removal process removes the first material at a rate that is at least twice the rate of removal of the second material. The ratio of the rate of removal of the first material to the rate of removal of the second material is herein referred to as a "selectivity" of the removal process for the first material with respect to the second material.

The first sacrificial material layers 142 may comprise an insulating material, a semiconductor material, or a conductive material. The second material of the first sacrificial material layers 142 may be subsequently replaced with electrically conductive electrodes which may function, for example, as control gate electrodes of a vertical NAND device. In one embodiment, the first sacrificial material layers 142 may be material layers that comprise silicon nitride.

In one embodiment, the first insulating layers 132 may include silicon oxide, and sacrificial material layers may include silicon nitride sacrificial material layers. The first material of the first insulating layers 132 may be deposited, for example, by chemical vapor deposition (CVD). For example, if silicon oxide is used for the first insulating layers 132, tetraethylorthosilicate (TEOS) may be used as the precursor material for the CVD process. The second material of the first sacrificial material layers 142 may be formed, for example, CVD or atomic layer deposition (ALD).

The thicknesses of the first insulating layers 132 and the first sacrificial material layers 142 may be in a range from 20 nm to 50 nm, although lesser and greater thicknesses may be used for each first insulating layer 132 and for each first sacrificial material layer 142. The number of repetitions of the pairs of a first insulating layer 132 and a first sacrificial material layer 142 may be in a range from 2 to 1,024, and typically from 8 to 256, although a greater number of repetitions may also be used. In one embodiment, each first sacrificial material layer 142 in the first-tier alternating stack (132, 142) may have a uniform thickness that is substantially invariant within each respective first sacrificial material layer 142.

A first insulating cap layer 170 is subsequently formed over the first alternating stack (132, 142). The first insulating cap layer 170 includes a dielectric material, which may be any dielectric material that may be used for the first insulating layers 132. In one embodiment, the first insulating cap layer 170 includes the same dielectric material as the first insulating layers 132. The thickness of the first insulating cap layer 170 may be in a range from 20 nm to 300 nm, although lesser and greater thicknesses may also be used.

Figure 50:
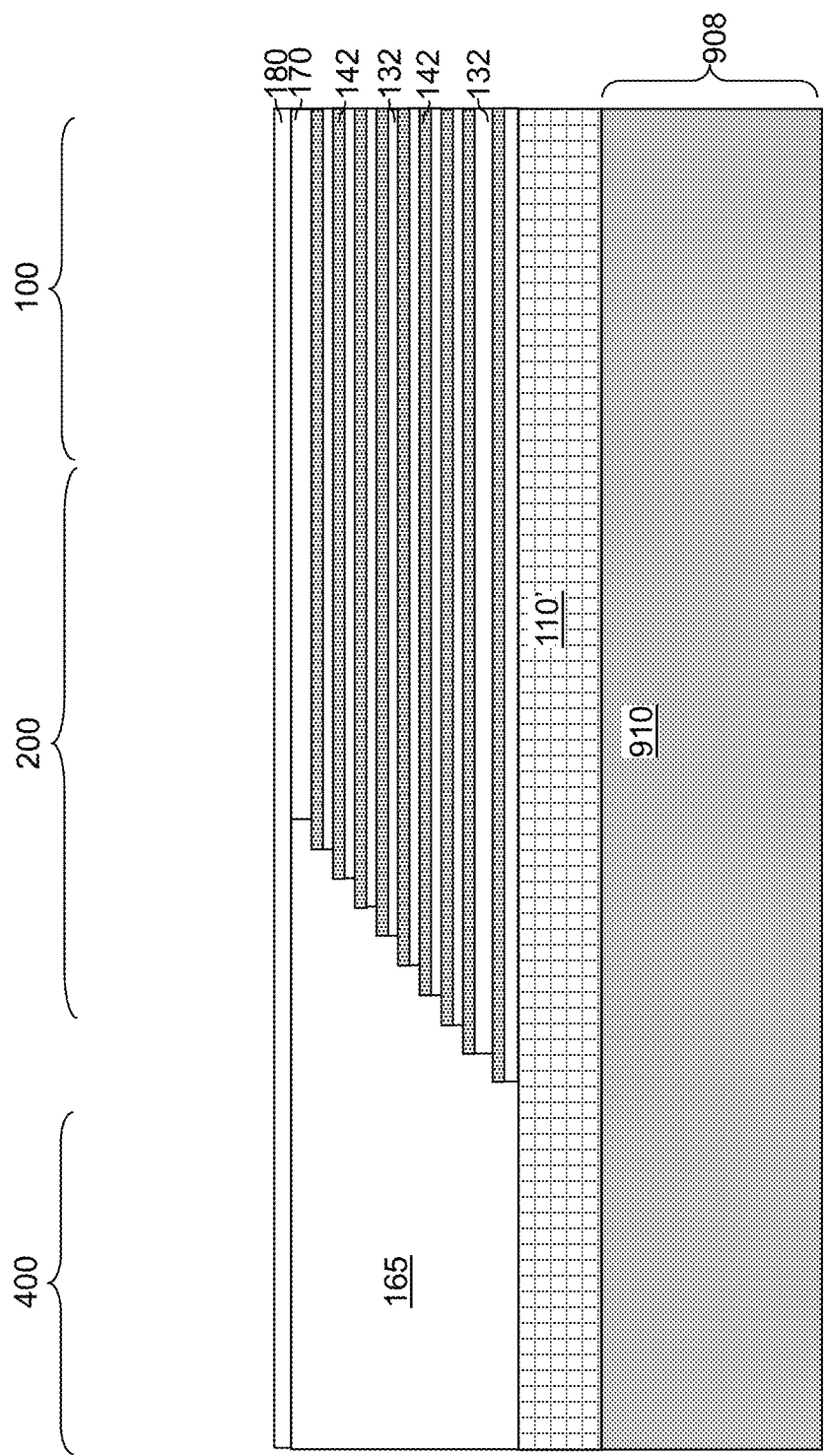
FIG. 50 is a vertical cross-sectional view of the third exemplary structure after formation of first stepped surfaces, a first retro-stepped dielectric material portion, and an inter-tier dielectric layer according to the third embodiment of the present disclosure.

Referring to FIG. 50, the first insulating cap layer 170 and the first-tier alternating stack (132, 142) may be patterned to form first stepped surfaces in the staircase region 200. The staircase region 200 may include a respective first stepped area in which the first stepped surfaces are formed, and a second stepped area in which additional stepped surfaces are to be subsequently formed in a second-tier structure (to be subsequently formed over a first-tier structure) and/or additional tier structures. The first stepped surfaces may be formed, for example, by forming a mask layer (not shown) with an opening therein, etching a cavity within the levels of the first insulating cap layer 170, and iteratively expanding the etched area and vertically recessing the cavity by etching each pair of a first insulating layer 132 and a first sacrificial material layer 142 located directly underneath the bottom surface of the etched cavity within the etched area. In one embodiment, top surfaces of the first sacrificial material layers 142 may be physically exposed at the first stepped surfaces. The cavity overlying the first stepped surfaces is herein referred to as a first stepped cavity.

A dielectric fill material (such as undoped silicate glass or doped silicate glass) may be deposited to fill the first stepped cavity. Excess portions of the dielectric fill material may be removed from above the horizontal plane including the top surface of the first insulating cap layer 170. A remaining portion of the dielectric fill material that fills the region overlying the first stepped surfaces constitute a first retro-stepped dielectric material portion 165. As used herein, a "retro-stepped" element refers to an element that has stepped surfaces and a horizontal cross-sectional area that increases monotonically as a function of a vertical distance from a top surface of a substrate on which the element is present. The first-tier alternating stack (132, 142) and the first retro-stepped dielectric material portion 165 collectively constitute a first-tier structure, which is an in-process structure that is subsequently modified.

An inter-tier dielectric layer 180 may be optionally deposited over the first-tier structure (132, 142, 170, 165). The inter-tier dielectric layer 180 includes a dielectric material such as silicon oxide. In one embodiment, the inter-tier dielectric layer 180 may include a doped silicate glass having a greater etch rate than the material of the first insulating layers 132 (which may include an undoped silicate glass). For example, the inter-tier dielectric layer 180 may include phosphosilicate glass. The thickness of the inter-tier dielectric layer 180 may be in a range from 30 nm to 300 nm, although lesser and greater thicknesses may also be used.

Figure 51A:
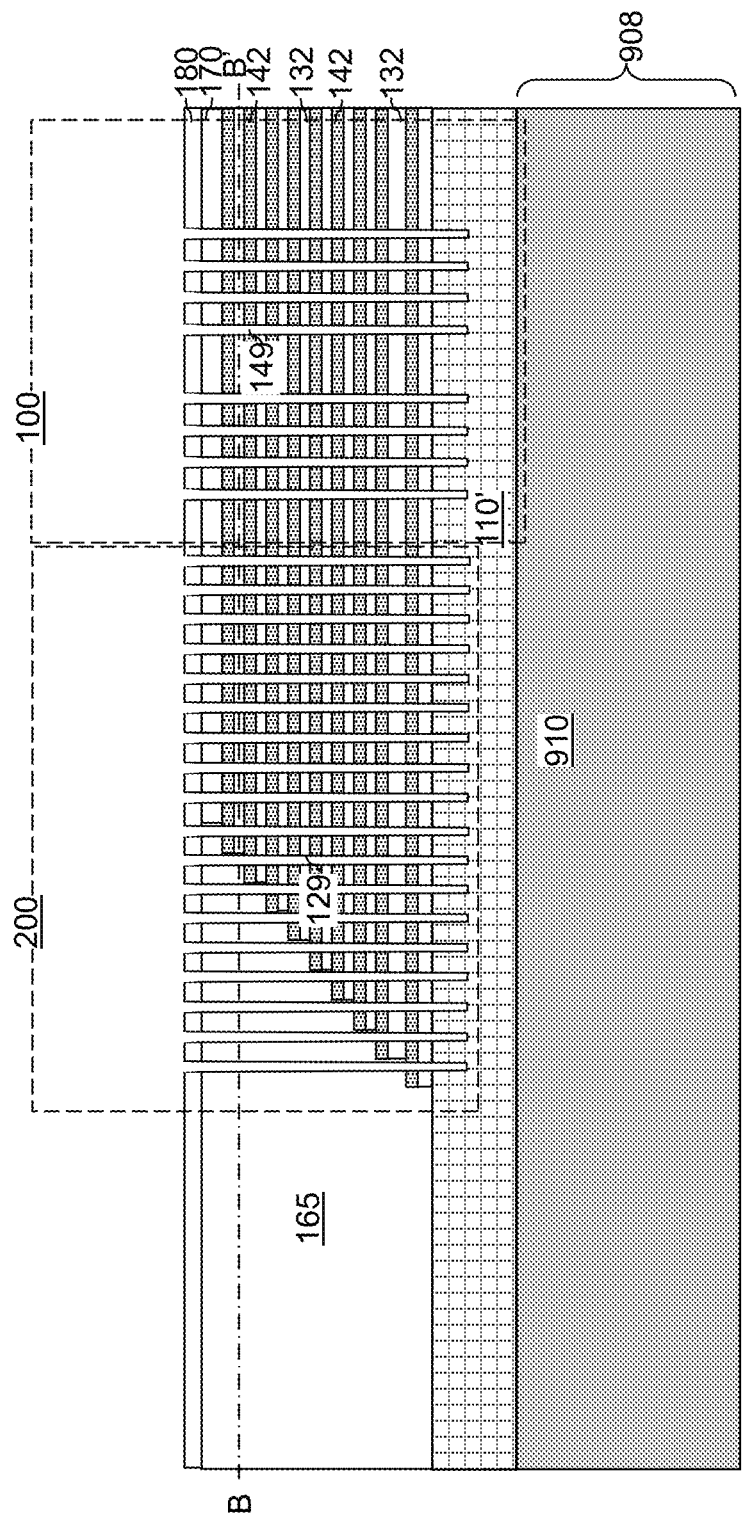
FIG. 51A is a vertical cross-sectional view of the third exemplary structure after formation of first-tier memory openings and first-tier support openings according to the third embodiment of the present disclosure.
Figure 51B:
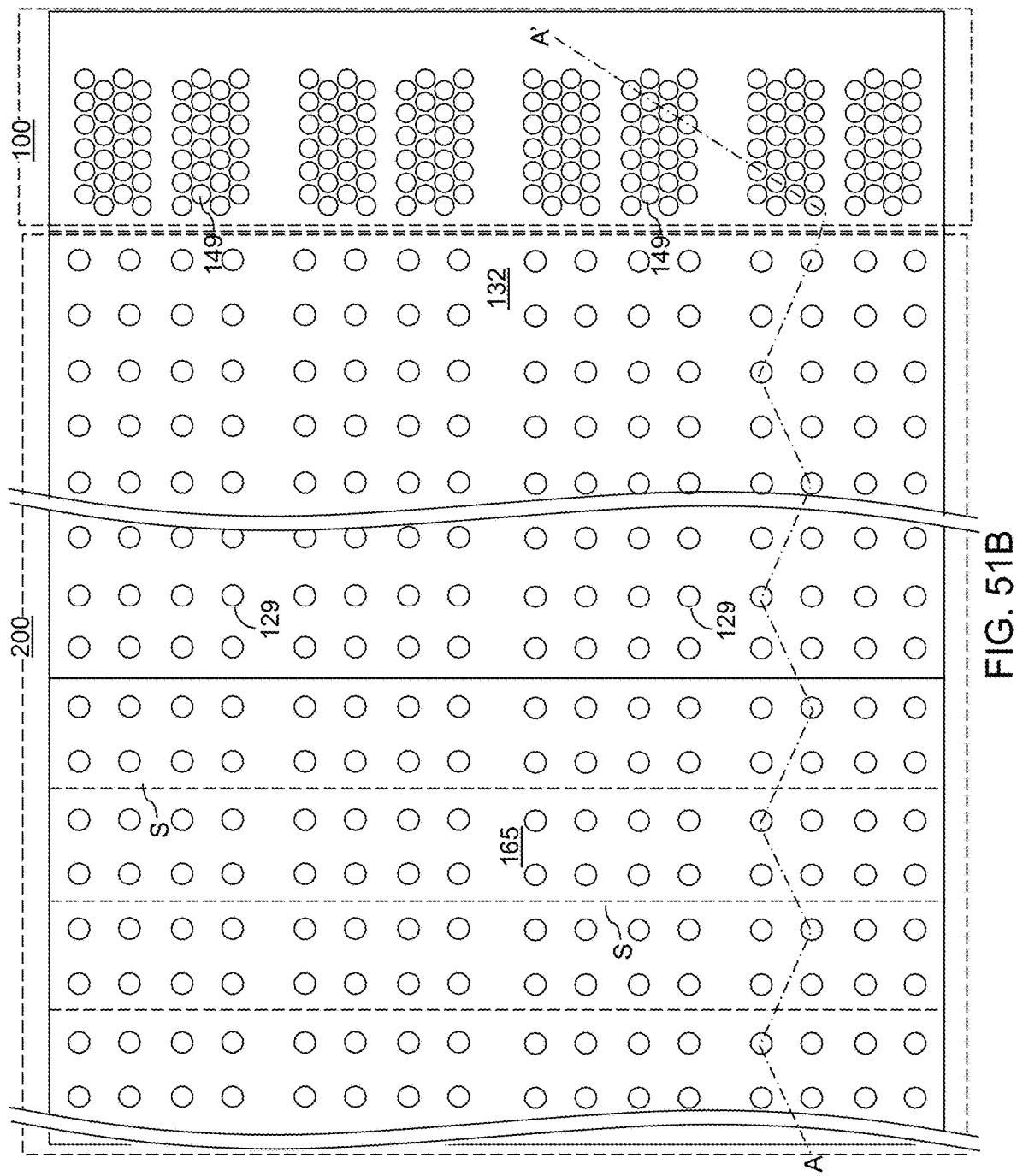
FIG. 51B is a horizontal cross-sectional view of the third exemplary structure of FIG. 51A. The hinged vertical plane A-A' corresponds to the plane of the vertical cross-sectional view of FIG. 51A.

Referring to FIGS. 51A and 51B, various first-tier openings (149, 129) may be formed through the inter-tier dielectric layer 180 and the first-tier structure (132, 142, 170, 165) and into the in-process source-level material layers 110'. The first-tier openings (149, 129) can vertically extend into an upper portion of the lower semiconductor layer 212 outside the areas of the sacrificial recess trench fill portions 104A. A photoresist layer (not shown) may be applied over the inter-tier dielectric layer 180, and may be lithographically patterned to form various openings therethrough. The pattern of openings in the photoresist layer may be transferred through the inter-tier dielectric layer 180 and the first-tier structure (132, 142, 170, 165) and into the in-process source-level material layers 110' by a first anisotropic etch process to form the various first-tier openings (149, 129)

concurrently, i.e., during the first isotropic etch process. The various first-tier openings (149, 129) may include first-tier memory openings 149 and first-tier support openings 129. Locations of steps S in the first alternating stack (132, 142) are illustrated as dotted lines in FIG. 51B.

The first-tier memory openings 149 are openings that are formed in the memory array region 100 through each layer within the first alternating stack (132, 142) and are subsequently used to form memory stack structures therein. The first-tier memory openings 149 may be formed in clusters of first-tier memory openings 149 that are laterally spaced apart along the second horizontal direction hd2. Each cluster of first-tier memory openings 149 may be formed as a two-dimensional array of first-tier memory openings 149.

The first-tier support openings 129 are openings that are formed in the staircase region 200, and are subsequently employed to form support pillar structures. A subset of the first-tier support openings 129 that is formed through the first retro-stepped dielectric material portion 165 may be formed through a respective horizontal surface of the first stepped surfaces.

In one embodiment, the first anisotropic etch process may include an initial step in which the materials of the first-tier alternating stack (132, 142) are etched concurrently with the material of the first retro-stepped dielectric material portion 165. The chemistry of the initial etch step may alternate to optimize etching of the first and second materials in the first-tier alternating stack (132, 142) while providing a comparable average etch rate to the material of the first retro-stepped dielectric material portion 165. The first anisotropic etch process may use, for example, a series of reactive ion etch processes or a single reaction etch process (e.g., $CF_4/O_2/Ar$ etch). The sidewalls of the various first-tier openings (149, 129) may be substantially vertical, or may be tapered.

In one embodiment, the terminal portion of the first anisotropic etch process may etch through the source-select-level conductive layer 218, the source-level insulating layer 117, the upper semiconductor layer 218, the upper etch stop dielectric liner 107, the sacrificial source-level material layer 104, and the lower etch stop dielectric liner 103, and at least partly into the lower semiconductor layer 212. The terminal portion of the first anisotropic etch process may include at least one etch chemistry for etching the various semiconductor materials of the in-process source-level material layers 110'. The photoresist layer may be subsequently removed, for example, by ashing.

Optionally, the portions of the first-tier memory openings 149 and the first-tier support openings 129 at the level of the inter-tier dielectric layer 180 may be laterally expanded by an isotropic etch. In this case, the inter-tier dielectric layer 180 may comprise a dielectric material (such as borosilicate glass) having a greater etch rate than the first insulating layers 132 (that may include undoped silicate glass) in dilute hydrofluoric acid. An isotropic etch (such as a wet etch using HF) may be used to expand the lateral dimensions of the first-tier memory openings 149 at the level of the inter-tier dielectric layer 180. The portions of the first-tier memory openings 149 located at the level of the inter-tier dielectric layer 180 may be optionally widened to provide a larger landing pad for second-tier memory openings to be subsequently formed through a second-tier alternating stack (to be subsequently formed prior to formation of the second-tier memory openings).

Figure 52:
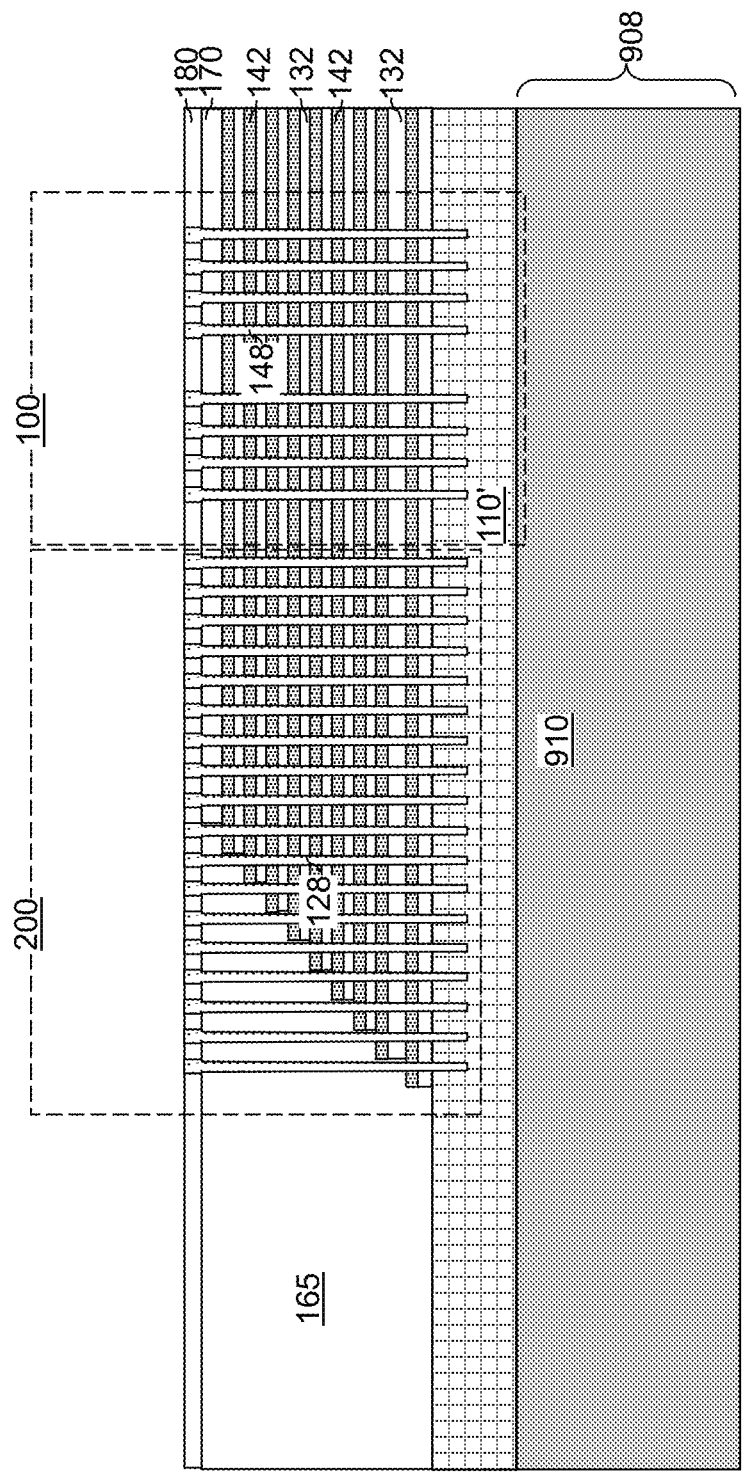
FIG. 52 is a vertical cross-sectional view of the third exemplary structure after formation of various sacrificial fill structures according to the third embodiment of the present disclosure.

Referring to FIG. 52, sacrificial first-tier opening fill portions (148, 128) may be formed in the various first-tier openings (149, 129). For example, a sacrificial first-tier fill material is deposited concurrently deposited in each of the first-tier openings (149, 129). The sacrificial first-tier fill material includes a material that may be subsequently removed selective to the materials of the first insulating layers 132 and the first sacrificial material layers 142.

In one embodiment, the sacrificial first-tier fill material may include a semiconductor material such as silicon (e.g., a-Si or polysilicon), a silicon-germanium alloy, germanium, a III-V compound semiconductor material, or a combination thereof. Optionally, a thin etch stop liner (such as a silicon oxide layer or a silicon nitride layer having a thickness in a range from 1 nm to 3 nm) may be used prior to depositing the sacrificial first-tier fill material. The sacrificial first-tier fill material may be formed by a non-conformal deposition or a conformal deposition method.

In another embodiment, the sacrificial first-tier fill material may include a silicon oxide material having a higher etch rate than the materials of the first insulating layers 132, the first insulating cap layer 170, and the inter-tier dielectric layer 180. For example, the sacrificial first-tier fill material may include borosilicate glass or porous or non-porous organosilicate glass having an etch rate that is at least 100 times higher than the etch rate of densified TEOS oxide (i.e., a silicon oxide material formed by decomposition of tetra-ethylorthosilicate glass in a chemical vapor deposition process and subsequently densified in an anneal process) in a 100:1 dilute hydrofluoric acid. In this case, a thin etch stop liner (such as a silicon nitride layer having a thickness in a range from 1 nm to 3 nm) may be used prior to depositing the sacrificial first-tier fill material. The sacrificial first-tier fill material may be formed by a non-conformal deposition or a conformal deposition method.

In yet another embodiment, the sacrificial first-tier fill material may include amorphous silicon or a carbon-containing material (such as amorphous carbon or diamond-like carbon) that may be subsequently removed by ashing, or a silicon-based polymer that may be subsequently removed selective to the materials of the first alternating stack (132, 142).

Portions of the deposited sacrificial material may be removed from above the topmost layer of the first-tier alternating stack (132, 142), such as from above the inter-tier dielectric layer 180. For example, the sacrificial first-tier fill material may be recessed to a top surface of the inter-tier dielectric layer 180 using a planarization process. The planarization process may include a recess etch, chemical mechanical planarization (CMP), or a combination thereof. The top surface of the inter-tier dielectric layer 180 may be used as an etch stop layer or a planarization stop layer.

Remaining portions of the sacrificial first-tier fill material comprise sacrificial first-tier opening fill portions (148, 128). Specifically, each remaining portion of the sacrificial material in a first-tier memory opening 149 constitutes a sacrificial first-tier memory opening fill portion 148. Each remaining portion of the sacrificial material in a first-tier support opening 129 constitutes a sacrificial first-tier support opening fill portion 128. The various sacrificial first-tier opening fill portions (148, 128) are concurrently formed, i.e., during a same set of processes including the deposition process that deposits the sacrificial first-tier fill material and the planarization process that removes the first-tier deposition process from above the first alternating stack (132, 142) (such as from above the top surface of the inter-tier dielectric layer 180). The top surfaces of the sacrificial first-tier opening fill portions (148, 128) may be coplanar with the top surface of the inter-tier dielectric layer 180. Each of the sacrificial first-tier opening fill portions (148, 128) may, or may not, include cavities therein.

Figure 53:
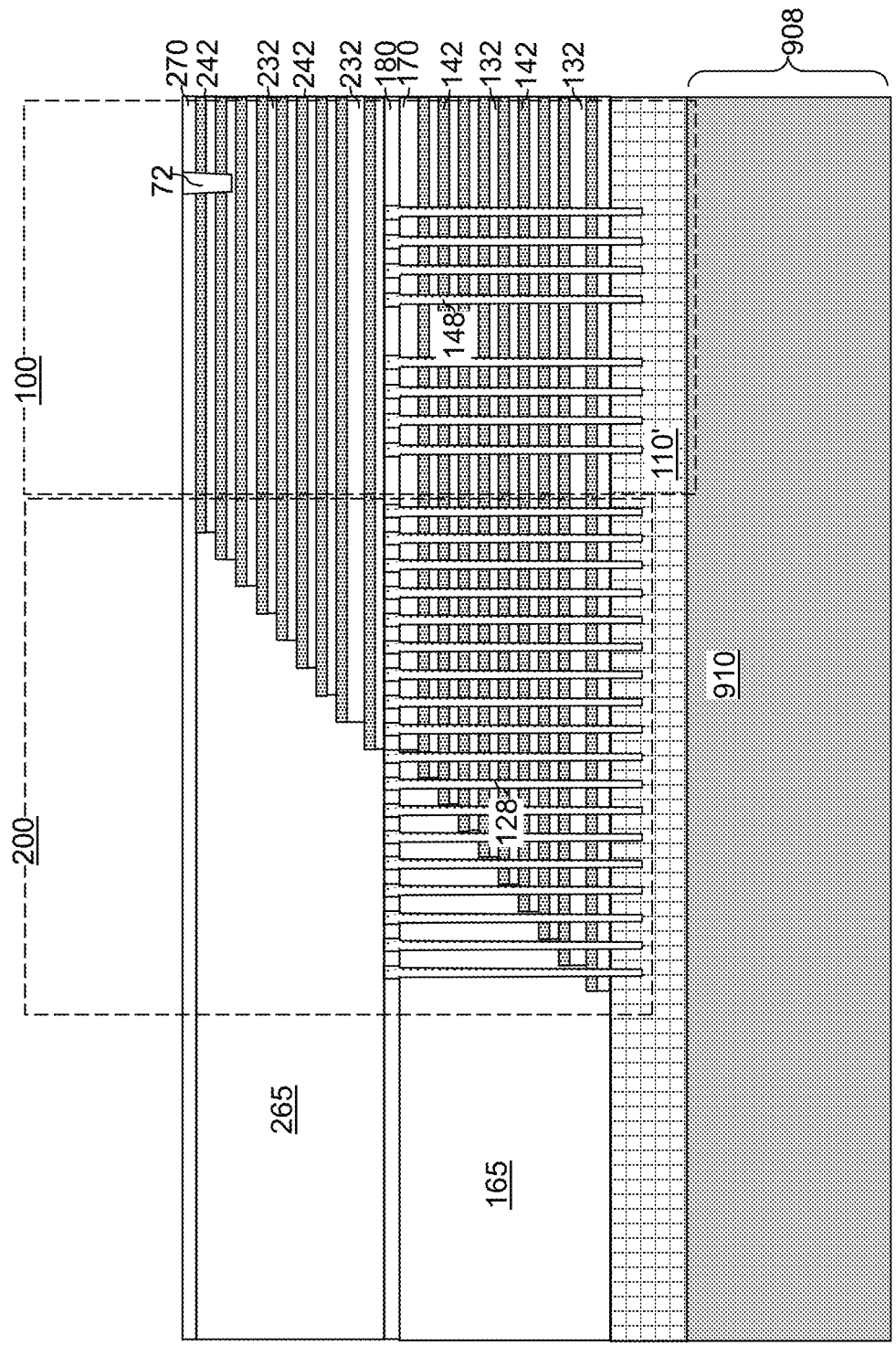
FIG. 53 is a vertical cross-sectional view of the third exemplary structure after formation of a second-tier alternating stack of second insulating layers and second spacer material layers, second stepped surfaces, and a second retro-stepped dielectric material portion according to the third embodiment of the present disclosure.

Referring to FIG. 53, a second-tier structure may be formed over the first-tier structure (132, 142, 170, 148). The second-tier structure may include an additional alternating stack of insulating layers and spacer material layers, which may be sacrificial material layers. For example, a second alternating stack (232, 242) of material layers may be subsequently formed on the top surface of the first alternating stack (132, 142). The second alternating stack (232, 242) includes an alternating plurality of third material layers and fourth material layers. Each third material layer may include a third material, and each fourth material layer may include a fourth material that is different from the third material. In one embodiment, the third material may be the same as the first material of the first insulating layer 132, and the fourth material may be the same as the second material of the first sacrificial material layers 142.

In one embodiment, the third material layers may be second insulating layers 232 and the fourth material layers may be second spacer material layers that provide vertical spacing between each vertically neighboring pair of the second insulating layers 232. In one embodiment, the third material layers and the fourth material layers may be second insulating layers 232 and second sacrificial material layers 242, respectively. The third material of the second insulating layers 232 may be at least one insulating material. The fourth material of the second sacrificial material layers 242 may be a sacrificial material that may be removed selective to the third material of the second insulating layers 232. The second sacrificial material layers 242 may comprise an insulating material, a semiconductor material, or a conductive material. The fourth material of the second sacrificial material layers 242 may be subsequently replaced with electrically conductive electrodes which may function, for example, as control gate electrodes of a vertical NAND device.

In one embodiment, each second insulating layer 232 may include a second insulating material, and each second sacrificial material layer 242 may include a second sacrificial material.

In this case, the second alternating stack (232, 242) may include an alternating plurality of second insulating layers 232 and second sacrificial material layers 242. The third material of the second insulating layers 232 may be deposited, for example, by chemical vapor deposition (CVD). The fourth material of the second sacrificial material layers 242 may be formed, for example, CVD or atomic layer deposition (ALD).

The third material of the second insulating layers 232 may be at least one insulating material. Insulating materials that may be used for the second insulating layers 232 may be any material that may be used for the first insulating layers 132. The fourth material of the second sacrificial material layers 242 is a sacrificial material that may be removed selective to the third material of the second insulating layers 232. Sacrificial materials that may be used for the second sacrificial material layers 242 may be any material that may be used for the first sacrificial material layers 142. In one embodiment, the second insulating material may be the same as the first insulating material, and the second sacrificial material may be the same as the first sacrificial material.

The thicknesses of the second insulating layers 232 and the second sacrificial material layers 242 may be in a range from 20 nm to 50 nm, although lesser and greater thicknesses may be used for each second insulating layer 232 and for each second sacrificial material layer 242. The number of repetitions of the pairs of a second insulating layer 232 and a second sacrificial material layer 242 may be in a range from 2 to 1,024, and typically from 8 to 256, although a greater number of repetitions may also be used. In one embodiment, each second sacrificial material layer 242 in the second alternating stack (232, 242) may have a uniform thickness that is substantially invariant within each respective second sacrificial material layer 242.

Second stepped surfaces in the second stepped area may be formed in the staircase region 200 using a same set of processing steps as the processing steps used to form the first stepped surfaces in the first stepped area with suitable adjustment to the pattern of at least one masking layer. A second retro-stepped dielectric material portion 265 may be formed over the second stepped surfaces in the staircase region 200.

A second insulating cap layer 270 may be subsequently formed over the second alternating stack (232, 242). The second insulating cap layer 270 includes a dielectric material that is different from the material of the second sacrificial material layers 242. In one embodiment, the second insulating cap layer 270 may include silicon oxide. In one embodiment, the first and second sacrificial material layers (142, 242) may comprise silicon nitride.

Generally speaking, at least one alternating stack of insulating layers (132, 232) and spacer material layers (such as sacrificial material layers (142, 242)) may be formed over the in-process source-level material layers 110', and at least one retro-stepped dielectric material portion (165, 265) may be formed over the staircase regions on the at least one alternating stack (132, 142, 232, 242).

Optionally, drain-select-level isolation structures 72 may be formed through a subset of layers in an upper portion of the second-tier alternating stack (232, 242). The second sacrificial material layers 242 that are cut by the drain-select-level isolation structures 72 correspond to the levels in which drain-select-level electrically conductive layers are subsequently formed. The drain-select-level isolation structures 72 include a dielectric material such as silicon oxide. The drain-select-level isolation structures 72 may laterally extend along a first horizontal direction hd1, and may be laterally spaced apart along a second horizontal direction hd2 that is perpendicular to the first horizontal direction hd1. The combination of the second alternating stack (232, 242), the second retro-stepped dielectric material portion 265, the second insulating cap layer 270, and the optional drain-select-level isolation structures 72 collectively constitute a second-tier structure (232, 242, 265, 270, 72).

Figure 54A:
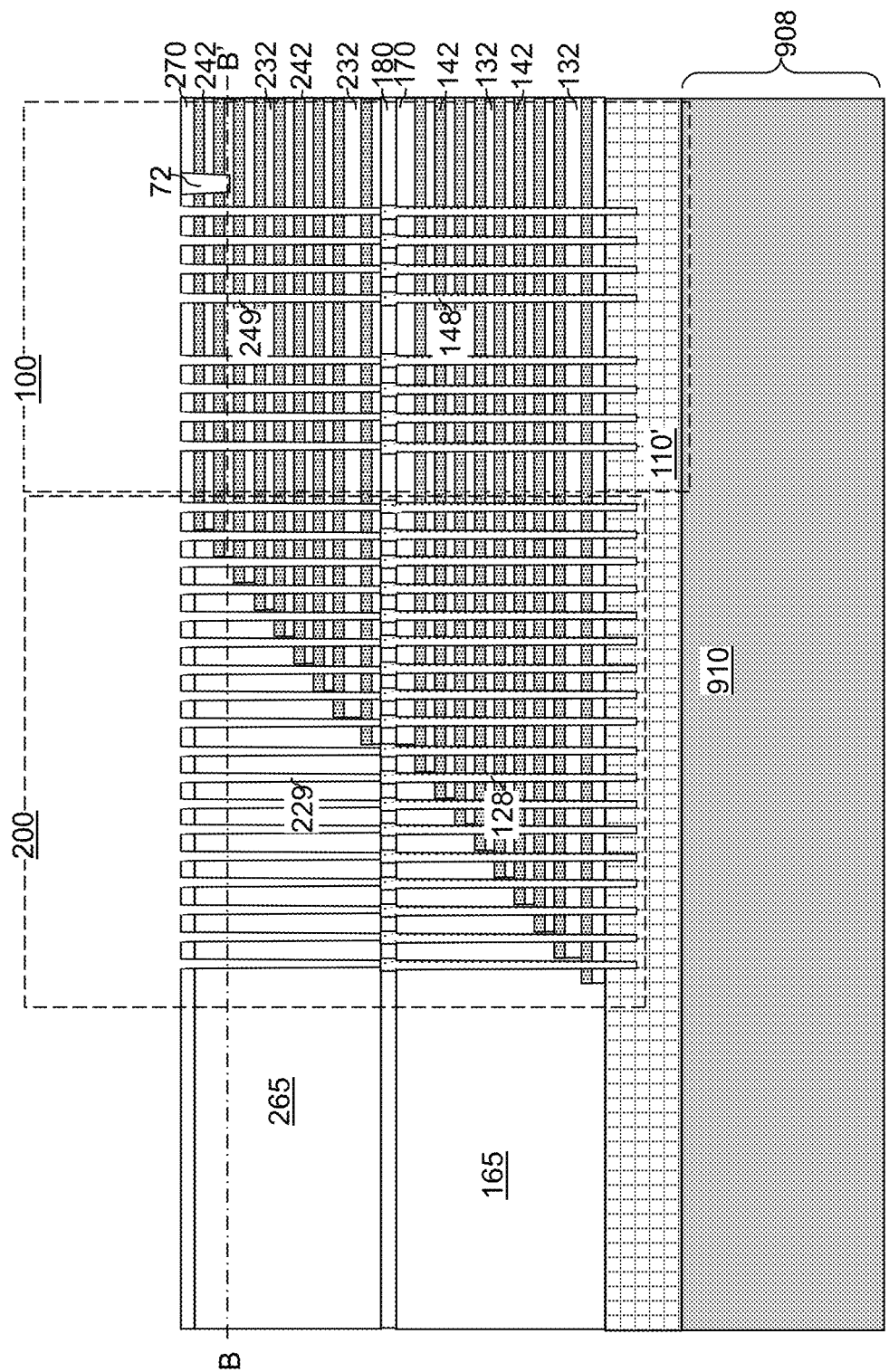
FIG. 54A is a vertical cross-sectional view of the third exemplary structure after formation of second-tier memory openings and second-tier support openings according to the third embodiment of the present disclosure.
Figure 54B:
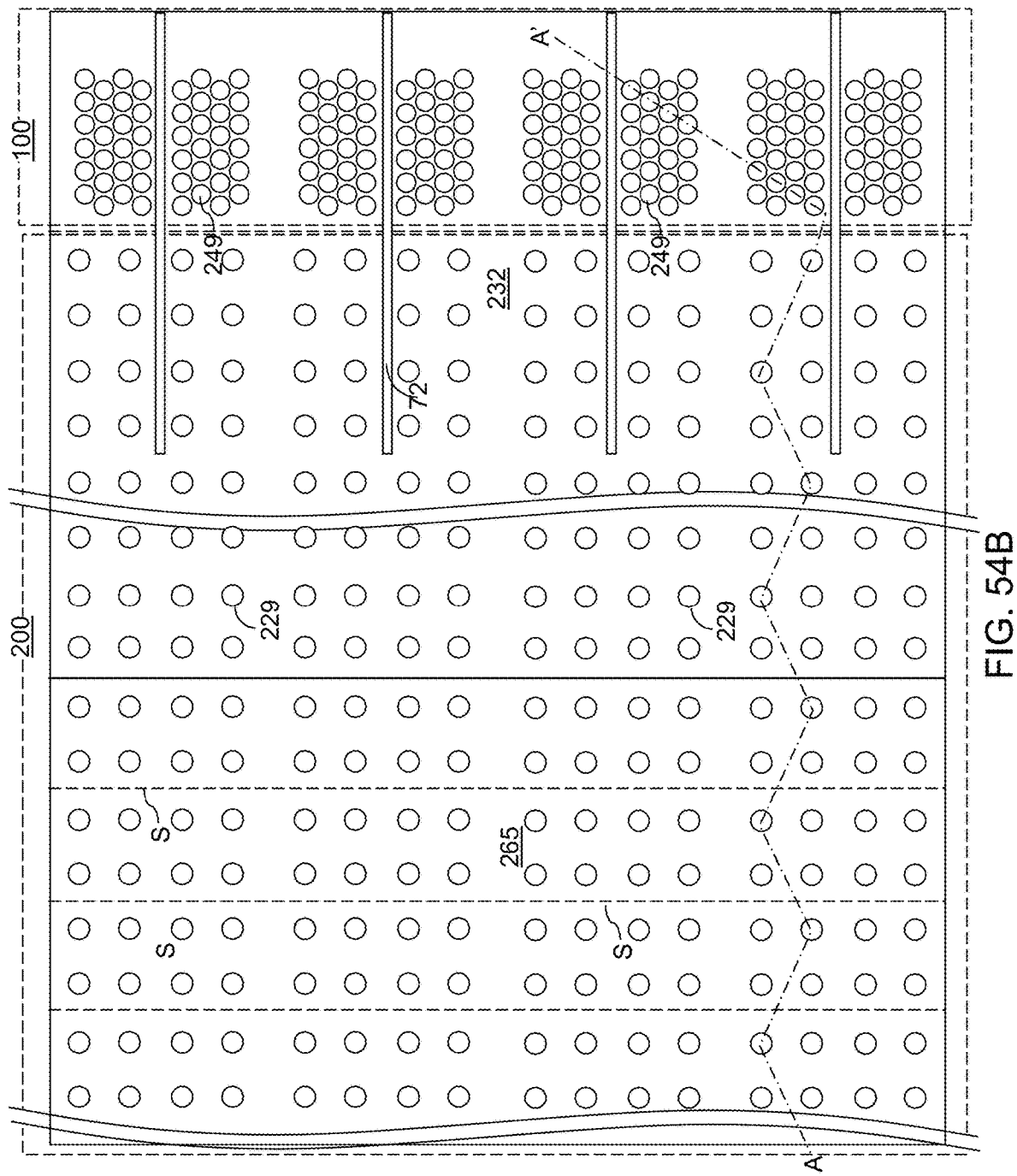
FIG. 54B is a horizontal cross-sectional view of the third exemplary structure along the horizontal plane B-B' of FIG. 54A. The hinged vertical plane A-A' corresponds to the plane of the vertical cross-sectional view of FIG. 54A.

Referring to FIGS. 54A and 54B, various second-tier openings (249, 229) may be formed through the second-tier structure (232, 242, 265, 270, 72). A photoresist layer (not shown) may be applied over the second insulating cap layer 270, and may be lithographically patterned to form various openings therethrough. The pattern of the openings may be the same as the pattern of the various first-tier openings (149, 129), which is the same as the sacrificial first-tier opening fill portions (148, 128). Thus, the lithographic mask used to pattern the first-tier openings (149, 129) may be used to pattern the photoresist layer.

The pattern of openings in the photoresist layer may be transferred through the second-tier structure (232, 242, 265, 270, 72) by a second anisotropic etch process to form various second-tier openings (249, 229) concurrently, i.e., during the second anisotropic etch process. The various second-tier openings (249, 229) may include second-tier memory openings 249 and second-tier support openings 229.

The second-tier memory openings 249 are formed directly on a top surface of a respective one of the sacrificial first-tier memory opening fill portions 148. The second-tier support openings 229 are formed directly on a top surface of a respective one of the sacrificial first-tier support opening fill portions 128. Further, each second-tier support openings 229 may be formed through a horizontal surface within the second stepped surfaces, which include the interfacial surfaces between the second alternating stack (232, 242) and the second retro-stepped dielectric material portion 265. Locations of steps Sin the first-tier alternating stack (132, 142) and the second-tier alternating stack (232, 242) are illustrated as dotted lines in FIG. 7B.

The second anisotropic etch process may include an etch step in which the materials of the second-tier alternating stack (232, 242) are etched concurrently with the material of the second retro-stepped dielectric material portion 265. The chemistry of the etch step may alternate to optimize etching of the materials in the second-tier alternating stack (232, 242) while providing a comparable average etch rate to the material of the second retro-stepped dielectric material portion 265. The second anisotropic etch process may use, for example, a series of reactive ion etch processes or a single reaction etch process (e.g., $CF_4/O_2/Ar$ etch). The sidewalls of the various second-tier openings (249, 229) may be substantially vertical, or may be tapered. A bottom periphery of each second-tier opening (249, 229) may be laterally offset, and/or may be located entirely within, a periphery of a top surface of an underlying sacrificial first-tier opening fill portion (148, 128). The photoresist layer may be subsequently removed, for example, by ashing.

Figure 55:
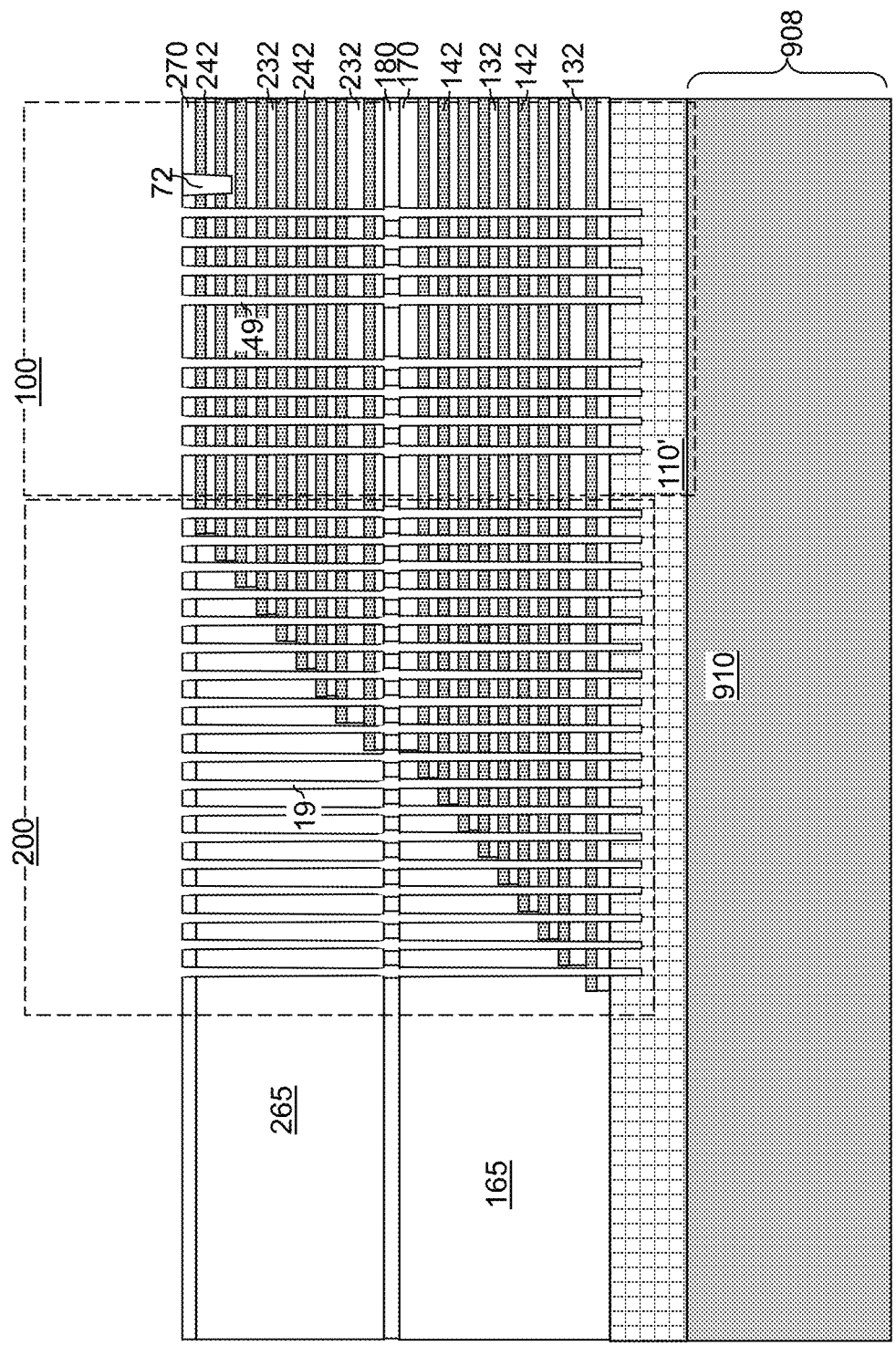
FIG. 55 is a vertical cross-sectional view of the third exemplary structure after formation of inter-tier memory openings and inter-tier support openings according to the third embodiment of the present disclosure.

Referring to FIG. 55, the sacrificial first-tier fill material of the sacrificial first-tier opening fill portions (148, 128) may be removed using an etch process that etches the sacrificial first-tier fill material selective to the materials of the first and second insulating layers (132, 232), the first and second sacrificial material layers (142,242), the first and second insulating cap layers (170, 270), and the inter-tier dielectric layer 180. A memory opening 49, which is also referred to as an inter-tier memory opening 49, is formed in each combination of a second-tier memory openings 249 and a volume from which a sacrificial first-tier memory opening fill portion 148 is removed. A support opening 19, which is also referred to as an inter-tier support opening 19, is formed in each combination of a second-tier support openings 229 and a volume from which a sacrificial first-tier support opening fill portion 128 is removed.

FIGS. 56A-56D provide sequential cross-sectional views of a memory opening 49 during formation of a memory opening fill structure. The same structural change occurs in each of the memory openings 49 and the support openings 19.

Referring to FIG. 56A, a memory opening 49 in the third exemplary device structure of FIG. 55 is illustrated. The memory opening 49 extends through the first-tier structure and the second-tier structure.

Referring to FIG. 56B, a stack of layers including a blocking dielectric layer 52, a charge storage layer 54, a tunneling dielectric layer 56, and a semiconductor channel material layer 360L may be sequentially deposited in the memory openings 49. The blocking dielectric layer 52 may include a single dielectric material layer or a stack of a plurality of dielectric material layers. In one embodiment, the blocking dielectric layer may include a dielectric metal oxide layer consisting essentially of a dielectric metal oxide. As used herein, a dielectric metal oxide refers to a dielectric material that includes at least one metallic element and at least oxygen. The dielectric metal oxide may consist essentially of the at least one metallic element and oxygen, or may consist essentially of the at least one metallic element, oxygen, and at least one non-metallic element such as nitrogen. In one embodiment, the blocking dielectric layer 52 may include a dielectric metal oxide having a dielectric constant greater than 7.9, i.e., having a dielectric constant greater than the dielectric constant of silicon nitride. The thickness of the dielectric metal oxide layer may be in a range from 1 nm to 20 nm, although lesser and greater thicknesses may also be used. The dielectric metal oxide layer may subsequently function as a dielectric material portion that blocks leakage of stored electrical charges to control gate electrodes. In one embodiment, the blocking dielectric layer 52 includes aluminum oxide. Alternatively or additionally, the blocking dielectric layer 52 may include a dielectric semiconductor compound such as silicon oxide, silicon oxynitride, silicon nitride, or a combination thereof.

Subsequently, the charge storage layer 54 may be formed. In one embodiment, the charge storage layer 54 may be a continuous layer or patterned discrete portions of a charge trapping material including a dielectric charge trapping material, which may be, for example, silicon nitride. Alternatively, the charge storage layer 54 may include a continuous layer or patterned discrete portions of a conductive material such as doped polysilicon or a metallic material that is patterned into multiple electrically isolated portions (e.g., floating gates), for example, by being formed within lateral recesses into sacrificial material layers (142, 242). In one embodiment, the charge storage layer 54 includes a silicon nitride layer. In one embodiment, the sacrificial material layers (142, 242) and the insulating layers (132, 232) may have vertically coincident sidewalls, and the charge storage layer 54 may be formed as a single continuous layer. Alternatively, the sacrificial material layers (142, 242) may be laterally recessed with respect to the sidewalls of the insulating layers (132, 232), and a combination of a deposition process and an anisotropic etch process may be used to form the charge storage layer 54 as a plurality of memory material portions that are vertically spaced apart. The thickness of the charge storage layer 54 may be in a range from 2 nm to 20 nm, although lesser and greater thicknesses may also be used.

The tunneling dielectric layer 56 includes a dielectric material through which charge tunneling may be performed under suitable electrical bias conditions. The charge tunneling may be performed through hot-carrier injection or by Fowler-Nordheim tunneling induced charge transfer depending on the mode of operation of the monolithic three-dimensional NAND string memory device to be formed. The tunneling dielectric layer 56 may include silicon oxide, silicon nitride, silicon oxynitride, dielectric metal oxides (such as aluminum oxide and hafnium oxide), dielectric metal oxynitride, dielectric metal silicates, alloys thereof, and/or combinations thereof. In one embodiment, the tunneling dielectric layer 56 may include a stack of a first silicon oxide layer, a silicon oxynitride layer, and a second silicon oxide layer, which is commonly known as an ONO stack. In one embodiment, the tunneling dielectric layer 56 may include a silicon oxide layer that is substantially free of carbon or a silicon oxynitride layer that is substantially free of carbon. The thickness of the tunneling dielectric layer 56 may be in a range from 2 nm to 20 nm, although lesser and greater thicknesses may also be used. The stack of the blocking dielectric layer 52, the charge storage layer 54, and the tunneling dielectric layer 56 constitutes a memory film 50 that stores memory bits.

The semiconductor channel material layer 360L includes a p-type semiconductor material such as at least one elemental semiconductor material, at least one III-V compound semiconductor material, at least one II-VI compound semiconductor material, at least one organic semiconductor material, or other semiconductor materials known in the art. In one embodiment, the semiconductor channel material layer 360L may having a uniform doping. In one embodiment, the semiconductor channel material layer 360L has a p-type doping in which p-type dopants (such as boron atoms) are present at an atomic concentration in a range from $1.0\times10^{12}/cm^3$ to $1.0\times10^{18}/cm^3$, such as from $1.0\times10^{14}/cm^3$ to $1.0\times10^{17}/cm^3$. In one embodiment, the semiconductor channel material layer 360L includes, and/or consists essentially of, boron-doped amorphous silicon or boron-doped polysilicon. The thickness of the semiconductor channel material layer 360L may be in a range from 2 nm to 10 nm, although lesser and greater thicknesses may also be used. A cavity 49' is formed in the volume of each memory opening 49 that is not filled with the deposited material layers (52, 54, 56, 360L).

Referring to FIG. 56C, in case the cavity 49' in each memory opening is not completely filled by the semiconductor channel material layer 360L, a dielectric core layer may be deposited in the cavity 49' to fill any remaining portion of the cavity 49' within each memory opening. The dielectric core layer includes a dielectric material such as silicon oxide or organosilicate glass. The dielectric core layer may be deposited by a conformal deposition method such as low pressure chemical vapor deposition (LPCVD), or by a self-planarizing deposition process such as spin coating. The horizontal portion of the dielectric core layer overlying the second insulating cap layer 270 may be removed, for example, by a recess etch. The recess etch continues until top surfaces of the remaining portions of the dielectric core layer are recessed to a height between the top surface of the second insulating cap layer 270 and the bottom surface of the second insulating cap layer 270. Each remaining portion of the dielectric core layer constitutes a dielectric core 62.

Referring to FIG. 56D, an n-type doped semiconductor material may be deposited in cavities overlying the dielectric cores 62. Portions of the deposited doped semiconductor material, the semiconductor channel material layer 360L, the tunneling dielectric layer 56, the charge storage layer 54, and the blocking dielectric layer 52 that overlie the horizontal plane including the top surface of the second insulating cap layer 270 may be removed by a planarization process such as a chemical mechanical planarization (CMP) process.

Each remaining portion of the n-type semiconductor material constitutes a drain region 63. The dopant concentration of the n-type dopants in the drain regions 63 may be in a range from $5.0\times10^{19}/cm^3$ to $2.0\times10^{21}/cm^3$, although lesser and greater dopant concentrations may also be used. The doped semiconductor material may be, for example, doped polysilicon.

Each remaining portion of the semiconductor channel material layer 360L constitutes a vertical semiconductor channel 360 through which electrical current may flow when a vertical NAND device including the vertical semiconductor channel 360 is turned on. A tunneling dielectric layer 56 is surrounded by a charge storage layer 54, and laterally surrounds a vertical semiconductor channel 360. Each adjoining set of a blocking dielectric layer 52, a charge storage layer 54, and a tunneling dielectric layer 56 collectively constitute a memory film 50, which may store electrical charges with a macroscopic retention time. In some embodiments, a blocking dielectric layer 52 may not be present in the memory film 50 at this step, and a blocking dielectric layer may be subsequently formed after formation of backside recesses. As used herein, a macroscopic retention time refers to a retention time suitable for operation of a memory device as a permanent memory device such as a retention time in excess of 24 hours.

Each combination of a memory film 50 and a vertical semiconductor channel 360 (which is a vertical semiconductor channel) within a memory opening 49 constitutes a memory stack structure 55. The memory stack structure 55 is a combination of a vertical semiconductor channel 360, a tunneling dielectric layer 56, a plurality of memory elements comprising portions of the charge storage layer 54, and an optional blocking dielectric layer 52. Each combination of a memory stack structure 55, a dielectric core 62, and a drain region 63 within a memory opening 49 constitutes a memory opening fill structure 58. The in-process source-level material layers 110', the first-tier structure (132, 142, 170, 165), the second-tier structure (232, 242, 270, 265, 72), the inter-tier dielectric layer 180, and the memory opening fill structures 58 collectively constitute a memory-level assembly.

Figure 57:
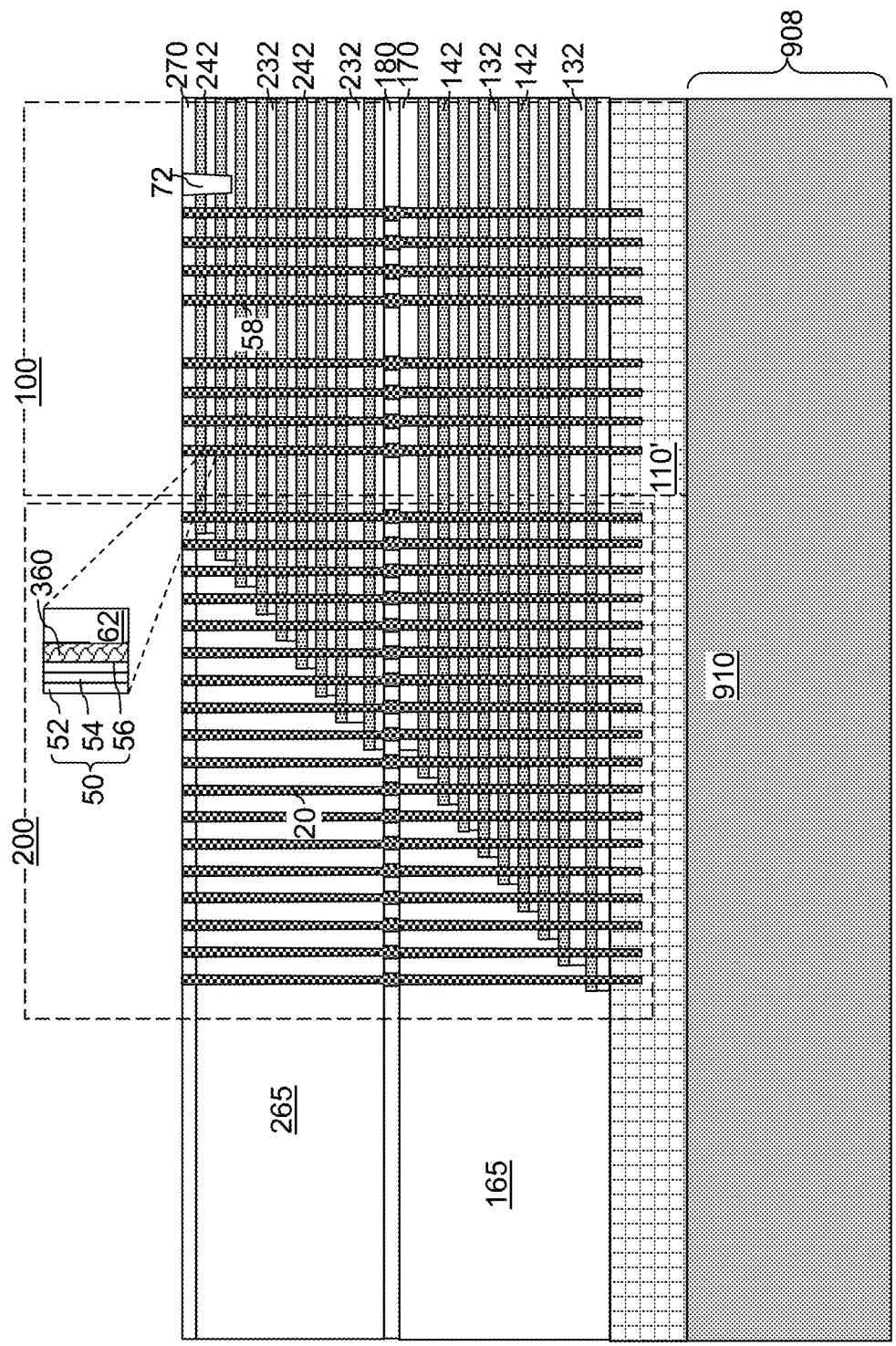

Referring to FIG. 57, the third exemplary structure is illustrated after formation of the memory opening fill structures 58. Support pillar structures 20 are formed in the support openings 19 concurrently with formation of the memory opening fill structures 58. Each support pillar structure 20 may have a same set of components as a memory opening fill structure 58.

Figure 58A:
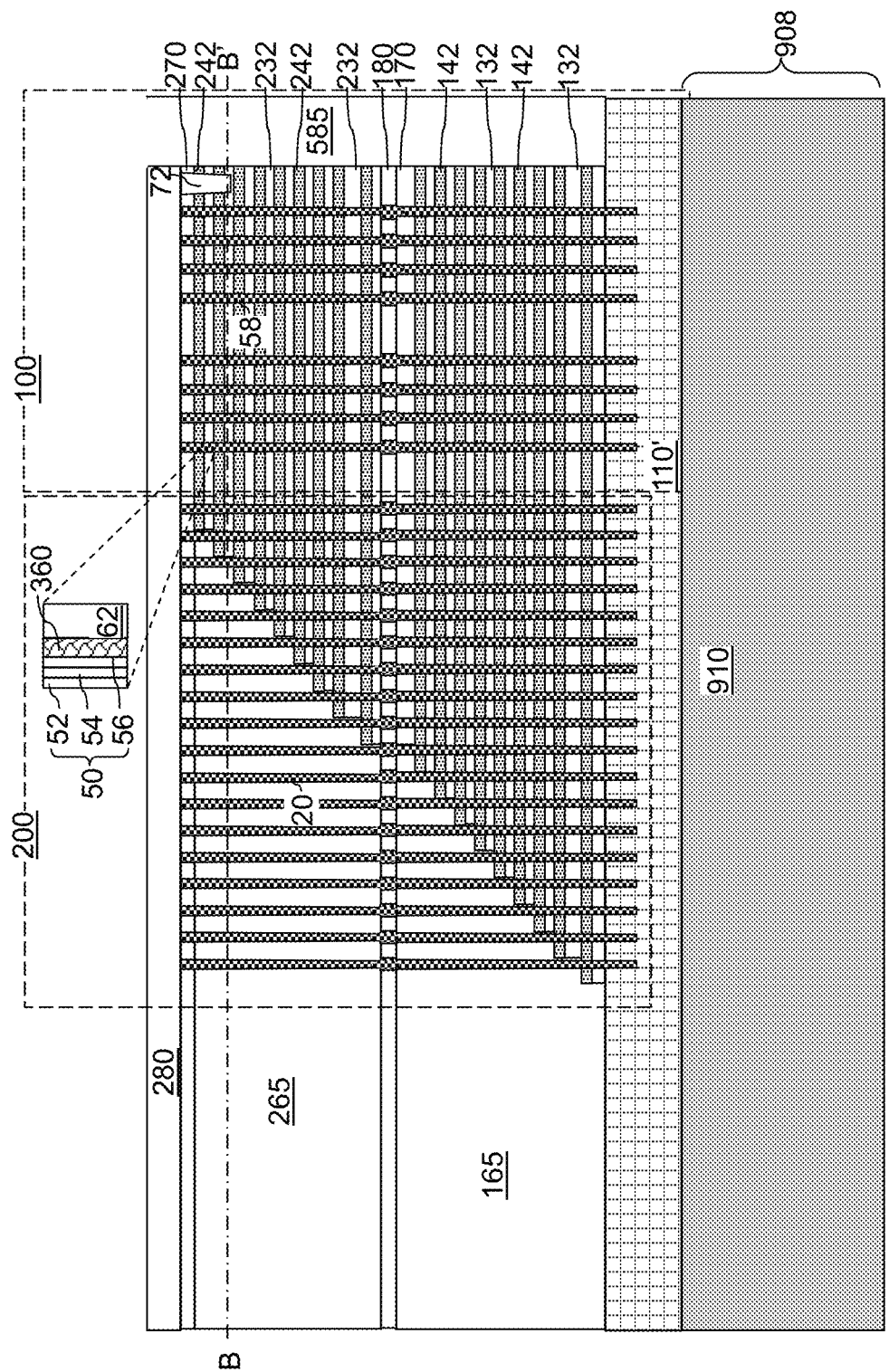
Figure 58B:
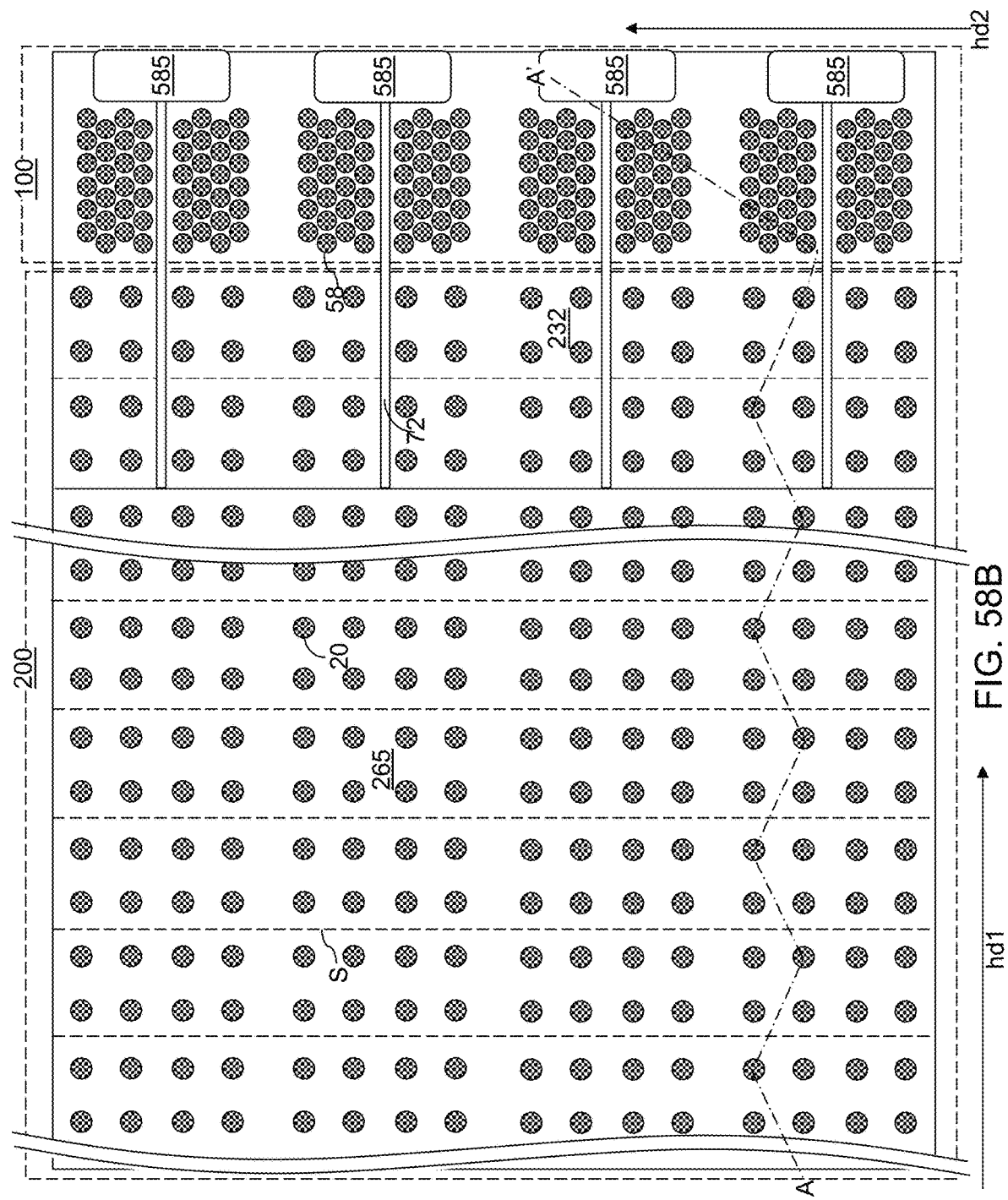

Referring to FIGS. 58A and 58B, a first contact level dielectric layer 280 may be formed over the second-tier structure (232, 242, 270, 265, 72). The first contact level dielectric layer 280 includes a dielectric material such as silicon oxide, and may be formed by a conformal or non-conformal deposition process. For example, the first contact level dielectric layer 280 may include undoped silicate glass and may have a thickness in a range from 100 nm to 600 nm, although lesser and greater thicknesses may also be used.

A photoresist layer (not shown) may be applied over the first contact level dielectric layer 280, and may be lithographically patterned to form discrete openings within the area of the memory array region 100 in which memory opening fill structures 58 are not present. An anisotropic etch may be performed to form vertical interconnection region cavities 585 having substantially vertical sidewalls that extend through the first contact level dielectric layer 280, the second-tier structure (232, 242, 270, 265, 72), and the first-tier structure (132, 142, 170, 165) may be formed underneath the openings in the photoresist layer. A top surface of a lower-level metal interconnect structure 780 may be physically exposed at the bottom of each vertical interconnection region cavity 585. The photoresist layer may be removed, for example, by ashing.

Figure 59:
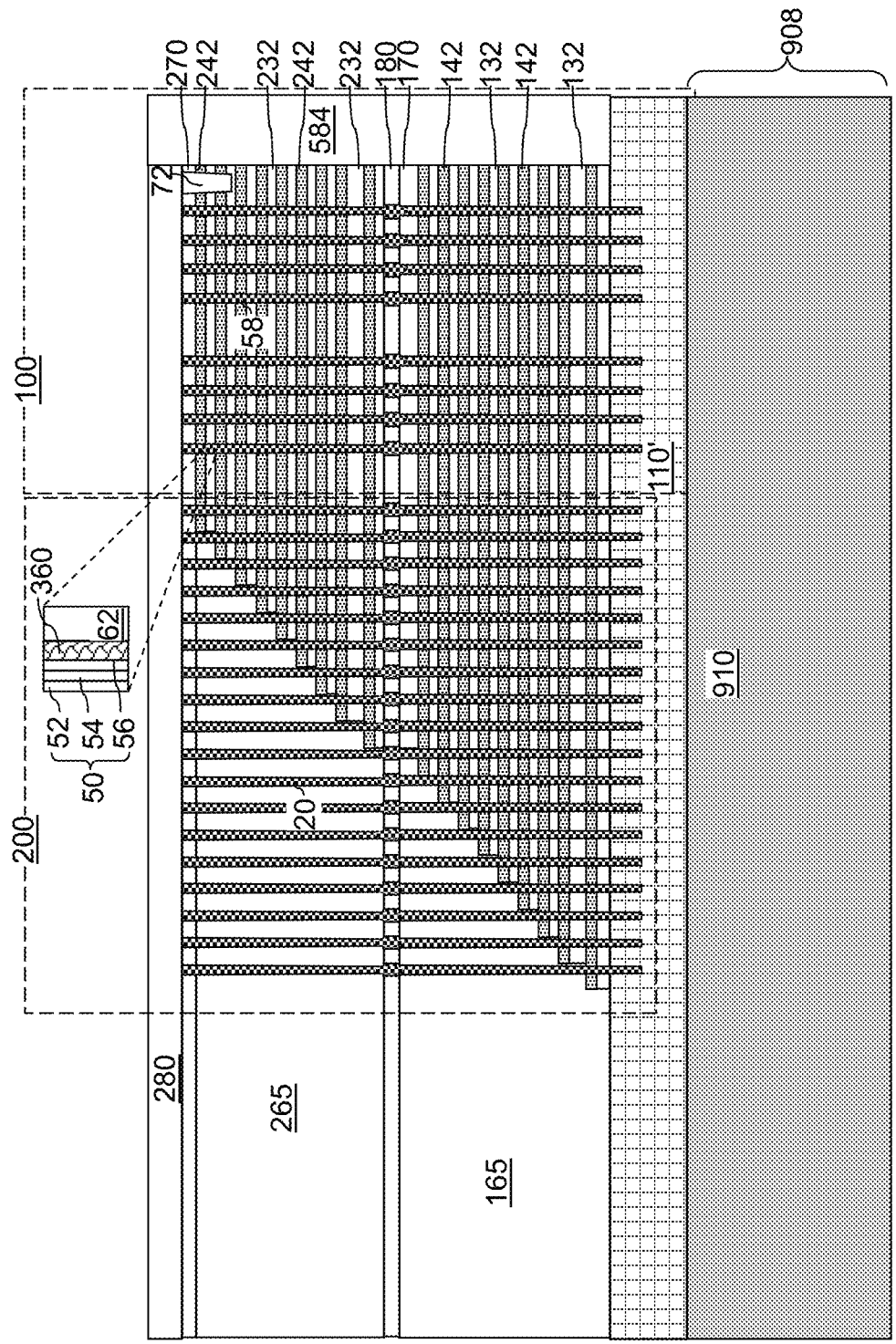

Referring to FIG. 59, a dielectric material such as silicon oxide may be deposited in the vertical interconnection region cavities 585 by a conformal deposition process (such as low pressure chemical vapor deposition) or a self-planarizing deposition process (such as spin coating). Excess portions of the deposited dielectric material may be removed from above the top surface of the first contact level dielectric layer 280 by a planarization process. Remaining portions of the dielectric material in the vertical interconnection region cavities 585 constitute interconnection region dielectric fill material portions 584.

Figure 60A:
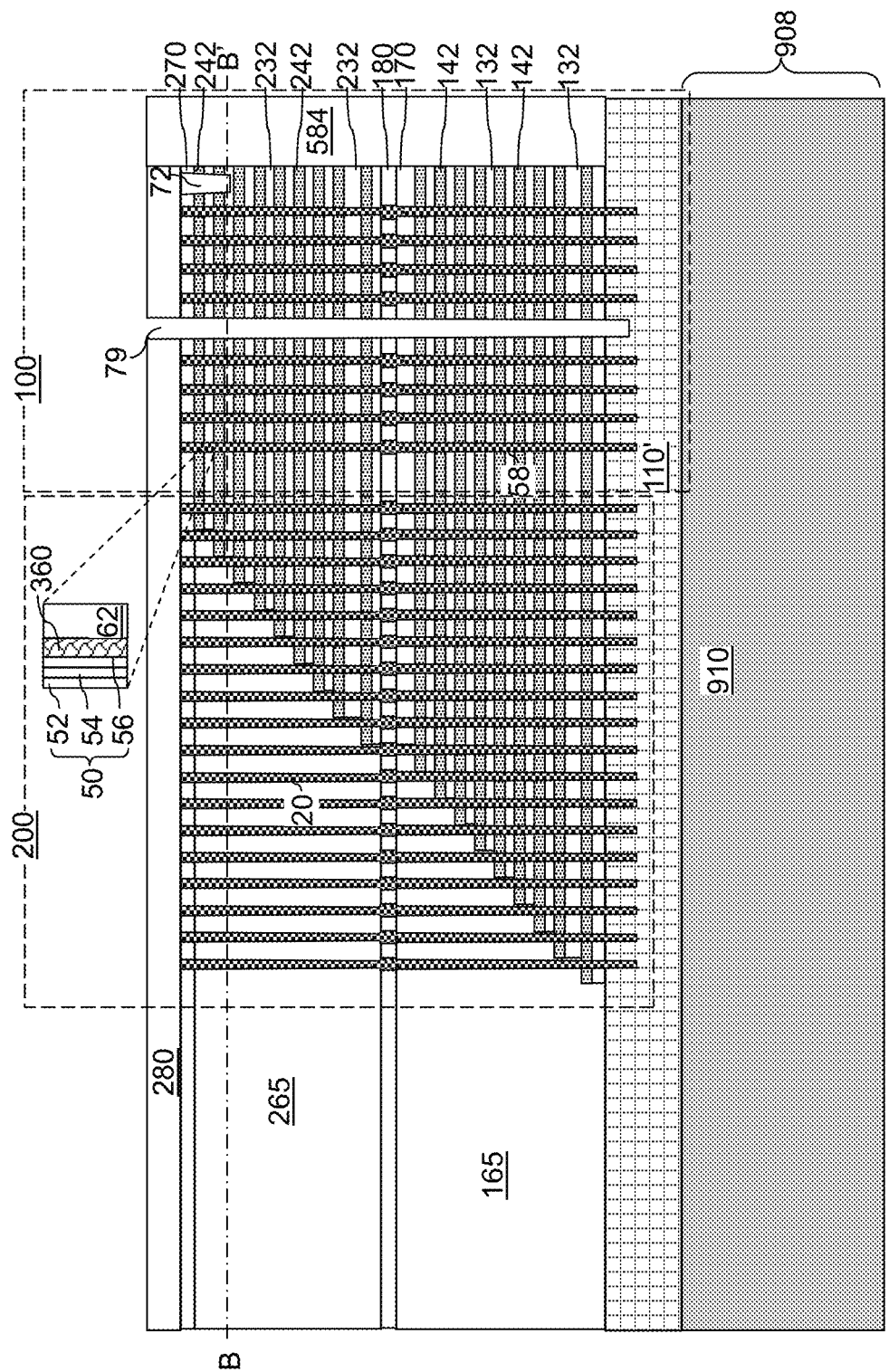

Referring to FIGS. 60A and 60B, a photoresist layer may be applied over the first contact level dielectric layer 280 and may be lithographically patterned to form elongated openings that extend along the first horizontal direction hd1 between clusters of memory opening fill structures 58. Backside trenches 79 may be formed by transferring the pattern in the photoresist layer (not shown) through the first contact level dielectric layer 280, the second-tier structure (232, 242, 270, 265, 72), and the first-tier structure (132, 142, 170, 165), and into the in-process source-level material layers 110'. Portions of the first contact level dielectric layer 280, the second-tier structure (232, 242, 270, 265, 72), the first-tier structure (132, 142, 170, 165), and the in-process source-level material layers 110' that underlie the openings in the photoresist layer may be removed to form the backside trenches 79. In one embodiment, the backside trenches 79 may be formed between clusters of memory stack structures 55. The clusters of the memory stack structures 55 may be laterally spaced apart along the second horizontal direction hd2 by the backside trenches 79.

The upper semiconductor layer 218 can be employed as an endpoint detection layer during the anisotropic etch process that forms the backside trenches. In one embodiment, the anisotropic etch process can include an etch step that etches materials of the alternating stack (32, 42) selective to the doped semiconductor material of the upper semiconductor layer 218. Subsequently, the upper semiconductor layer 218 can be etched through employing the upper etch stop dielectric liner 107 as an etch stop layer. The upper etch stop dielectric liner 107 can be subsequently etched through employing an etch chemistry that is selective to the material of the sacrificial source-level material layer 104. The backside trenches 79 are formed within areas in which the sacrificial recess trench fill portions 104A are present. The sacrificial recess trench fill portions 104A provide protection against process variations in which the depth of the backside trenches 79 exceeds a target depth. Specifically, the additional thickness of the sacrificial source-level material layer 104 provided by the sacrificial recess trench fill portions 104A prevents extension of the bottom portions of the backside trenches 79 into the lower semiconductor layer 212. Generally, each backside trench 79 can be formed through the alternating stack (32, 42) such that a bottom surface of each backside trench 79 is formed within an area of a recess trench in the lower semiconductor layer 212. The bottom surface of each backside trench 79 can be formed between a top surface of the sacrificial source-level material layer 104 and the recessed surface of the lower semiconductor layer 212.

Figure 61:
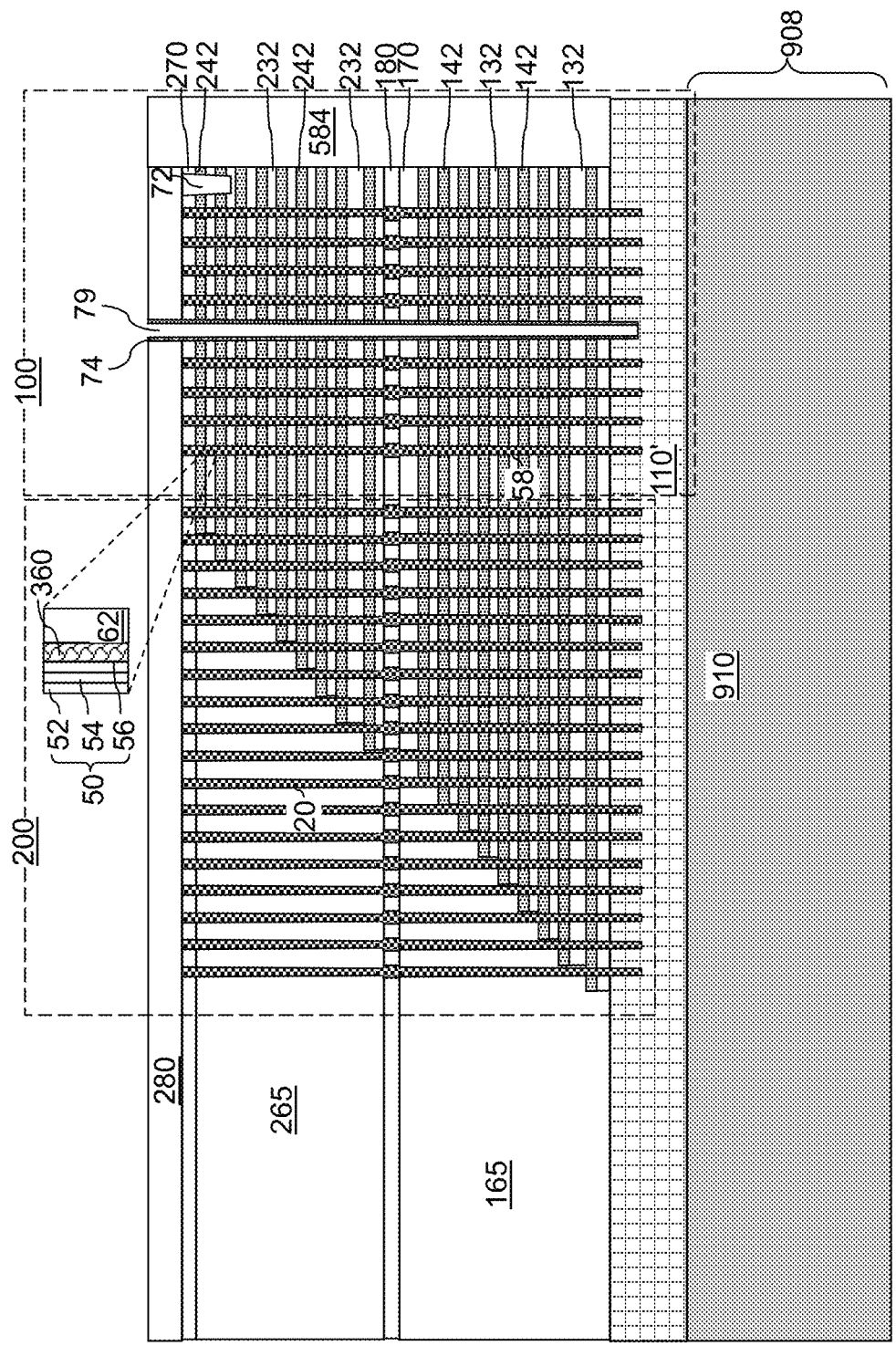
Figure 62A:
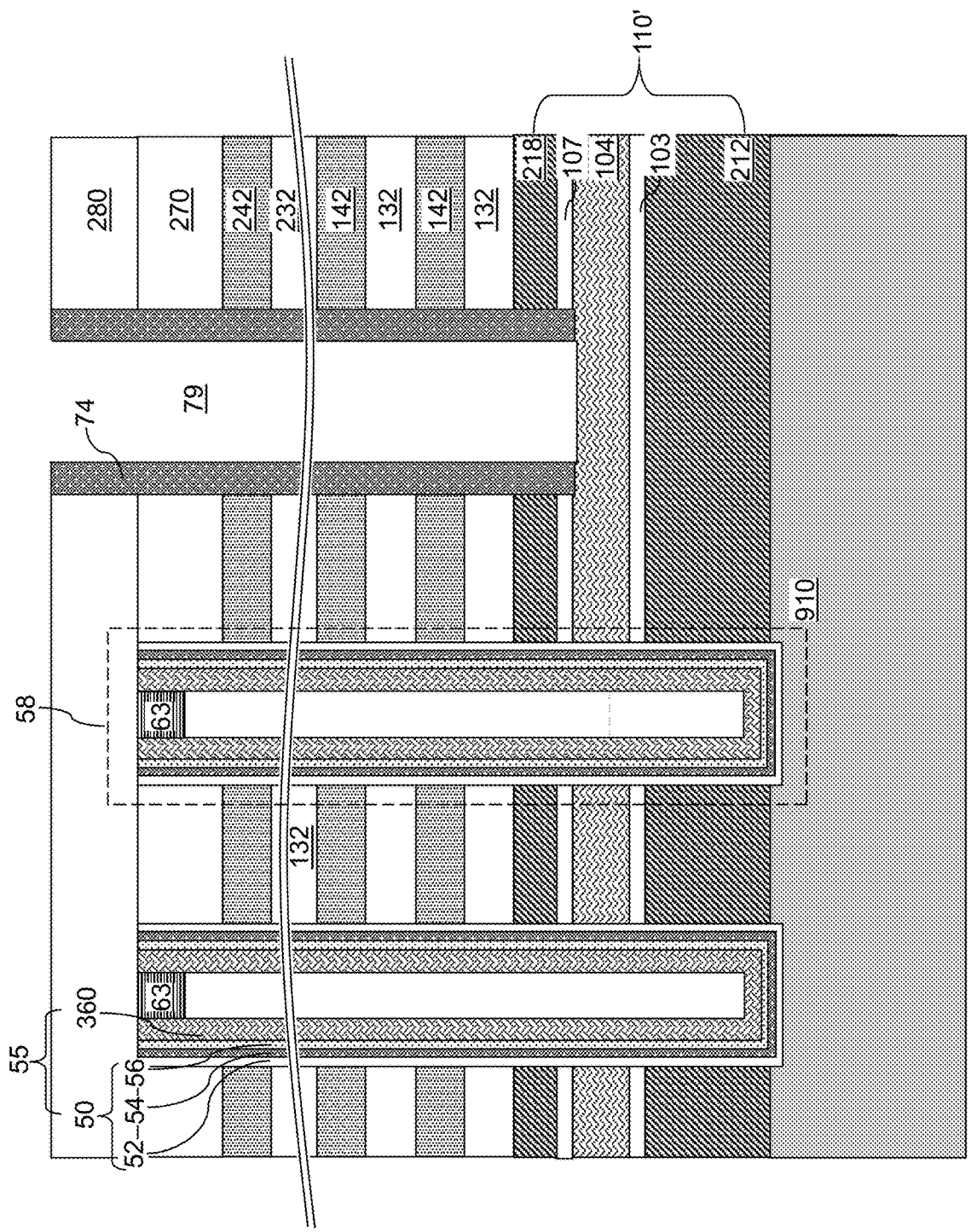

Referring to FIGS. 61 and 62A, a backside trench spacer 74 may be formed on sidewalls of each backside trench 79. For example, a conformal spacer material layer may be deposited in the backside trenches 79 and over the first contact level dielectric layer 280, and may be anisotropically etched to form the backside trench spacers 74. The backside trench spacers 74 include a material that is different from the material of the sacrificial source-level material layer 104. For example, the backside trench spacers 74 may include silicon nitride.

Figure 62B:
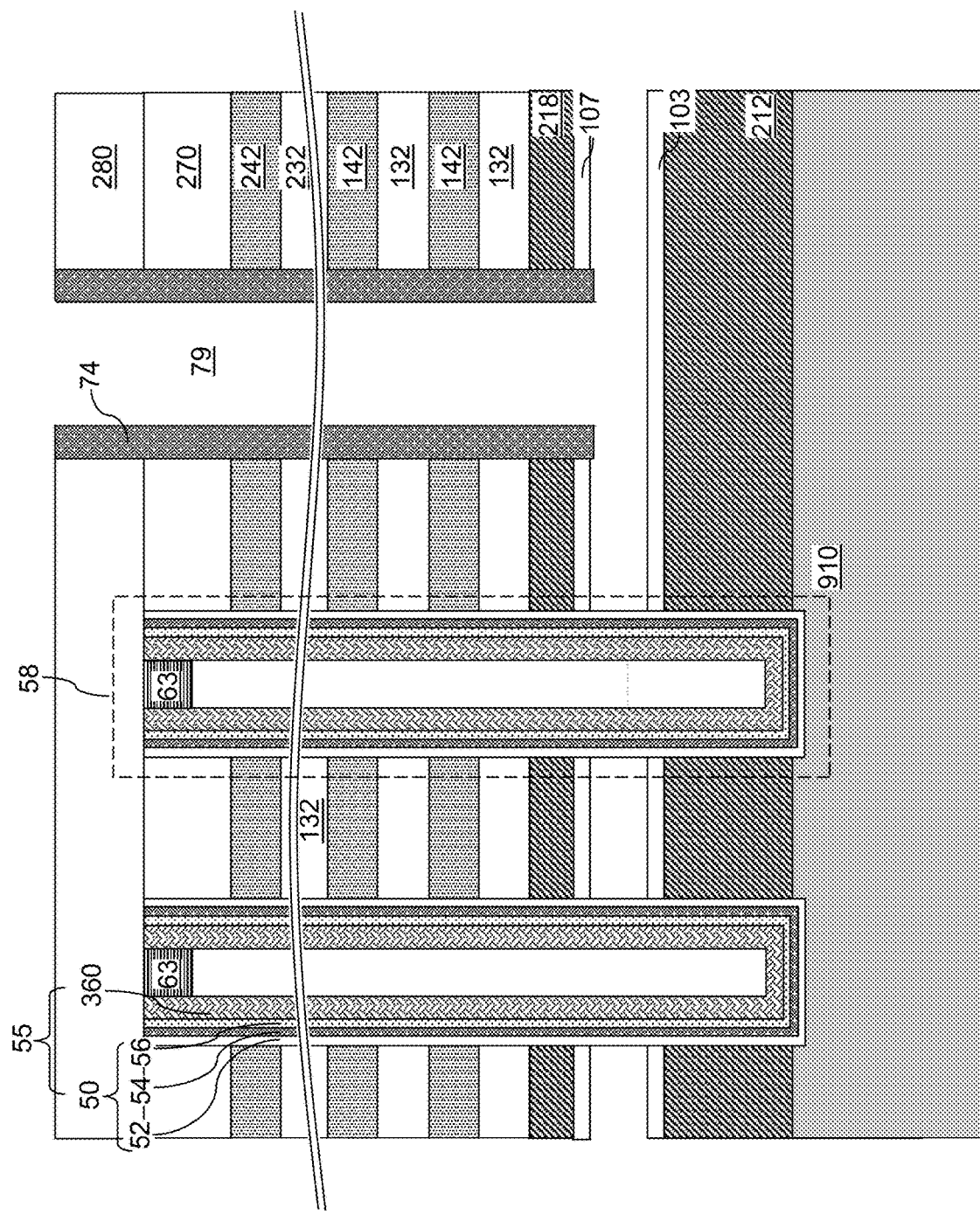

Referring to FIG. 62B, an etchant that etches the material of the sacrificial source-level material layer 104 selective to the materials of the first alternating stack (132, 142), the second alternating stack (232, 242), the first and second insulating cap layers (170, 270), the first contact level dielectric layer 280, the upper etch stop dielectric liner 107, and the lower etch stop dielectric liner 103 may be introduced into the backside trenches in an isotropic etch process. For example, if the sacrificial source-level material layer 104 includes undoped polysilicon, undoped amorphous silicon or undoped amorphous silicon-germanium alloy, the backside trench spacers 74 include silicon nitride, and the upper and lower etch stop liners (107, 103) include silicon oxide, a wet etch process using hot trimethyl-2 hydroxyethyl ammonium hydroxide ("hot TMY") or tetramethyl ammonium hydroxide (TMAH) may be used to remove the sacrificial source-level material layer 104 selective to the backside trench spacers 74 and the upper and lower etch stop liners (107, 103). A source cavity 109 is formed in the volume from which the sacrificial source-level material layer 104 is removed.

Wet etch chemicals such as hot TMY and TMAH selectively etch undoped silicon compared to the boron doped silicon materials, such as the boron doped silicon materials of the upper semiconductor layer 218 and/or the lower semiconductor layer 212. Thus, use of selective wet etch chemicals such as hot TMY and TMAH for the wet etch process that forms the source cavity 109 provides a large process window against etch depth variation during formation of the backside trenches 79. Specifically, even if sidewalls of the upper semiconductor layer 218 are physically exposed or even if a surface of the lower semiconductor layer 212 is physically exposed upon formation of the source cavity 109 and/or the backside trench spacers 74, collateral etching of the upper semiconductor layer 218 and/or the lower semiconductor layer 212 is minimal, and the structural change to the third exemplary structure caused by accidental physical exposure of the surfaces of the upper semiconductor layer 218 and/or the lower semiconductor layer 212 during manufacturing steps do not result in device failures. Each of the memory opening fill structures 58 is physically exposed to the source cavity 109. Specifically, each of the memory opening fill structures 58 includes a sidewall and that are physically exposed to the source cavity 109.

Figure 62C:
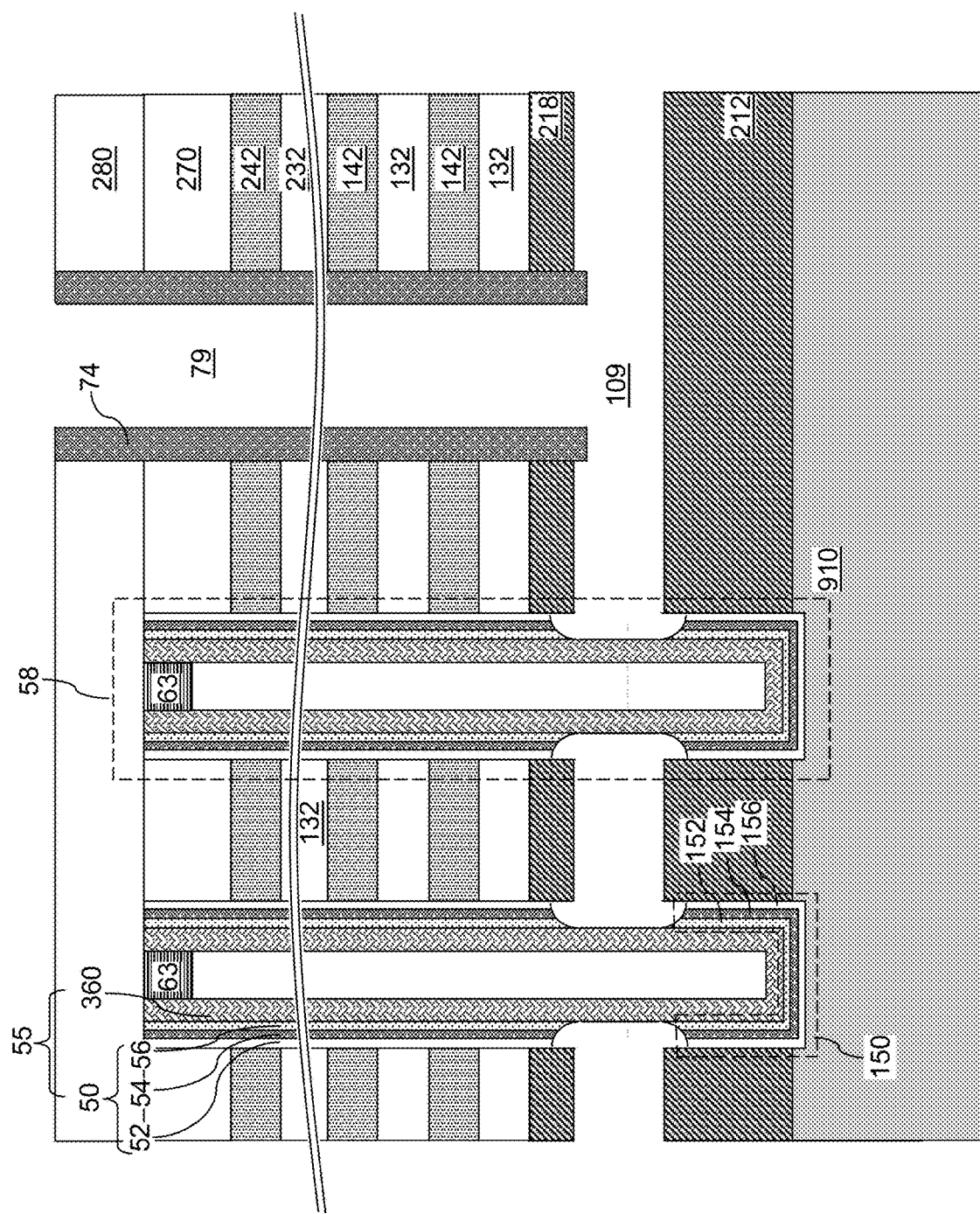

Referring to FIG. 62C, a sequence of isotropic etchants, such as wet etchants, may be applied to the physically exposed portions of the memory films 50 to sequentially etch the various component layers of the memory films 50 from outside to inside, and to physically expose cylindrical surfaces of the vertical semiconductor channels 360 at the level of the source cavity 109. The upper and lower etch stop liners (107, 103) may be collaterally etched during removal of the portions of the memory films 50 located at the level of the source cavity 109. The lower etch stop dielectric liner 103, the upper etch stop dielectric liner 107, and portions of the memory films 50 physically exposed to the source cavity 109 are removed such that sidewalls of the vertical semiconductor channels 360 are physically exposed. The source cavity 109 may be expanded in volume by removal of the portions of the memory films 50 at the level of the source cavity 109 and the upper and lower etch stop liners (107, 103). A top surface of the lower semiconductor layer 212 and a bottom surface of the upper semiconductor layer 218 may be physically exposed to the source cavity 109. The source cavity 109 is expanded by isotropically etching the sacrificial source-level material layer 104 and a bottom portion of each of the memory films 50 selective to at least one source-level semiconductor layer (such as the lower semiconductor layer 212 and the upper semiconductor layer 218) and the vertical semiconductor channels 360.

Each remaining portion of the memory films 50 that remain underneath the source cavity 109 constitutes a dielectric cap structure 150. The dielectric cap structures 150 are embedded within the lower semiconductor layer 212 below the source cavity 109, and surround and contact a respective one of the vertical semiconductor channels 360. In one embodiment, each of the memory films 50 comprises a first layer stack including a charge storage layer 54 and a tunneling dielectric 56, and each of the dielectric cap structures 150 comprises a second layer stack including a dielectric material layer 154 having a same thickness as, and a same material composition as, the charge storage layer 54 and another dielectric material layer 156 having a same thickness as, and a same material composition as, the tunneling dielectric 56. In one embodiment, the first layer stack can include a blocking dielectric 52, and the second layer stack can include yet another dielectric layer 152 having a same thickness as, and a same material composition as, the blocking dielectric 52.

Figure 62D:
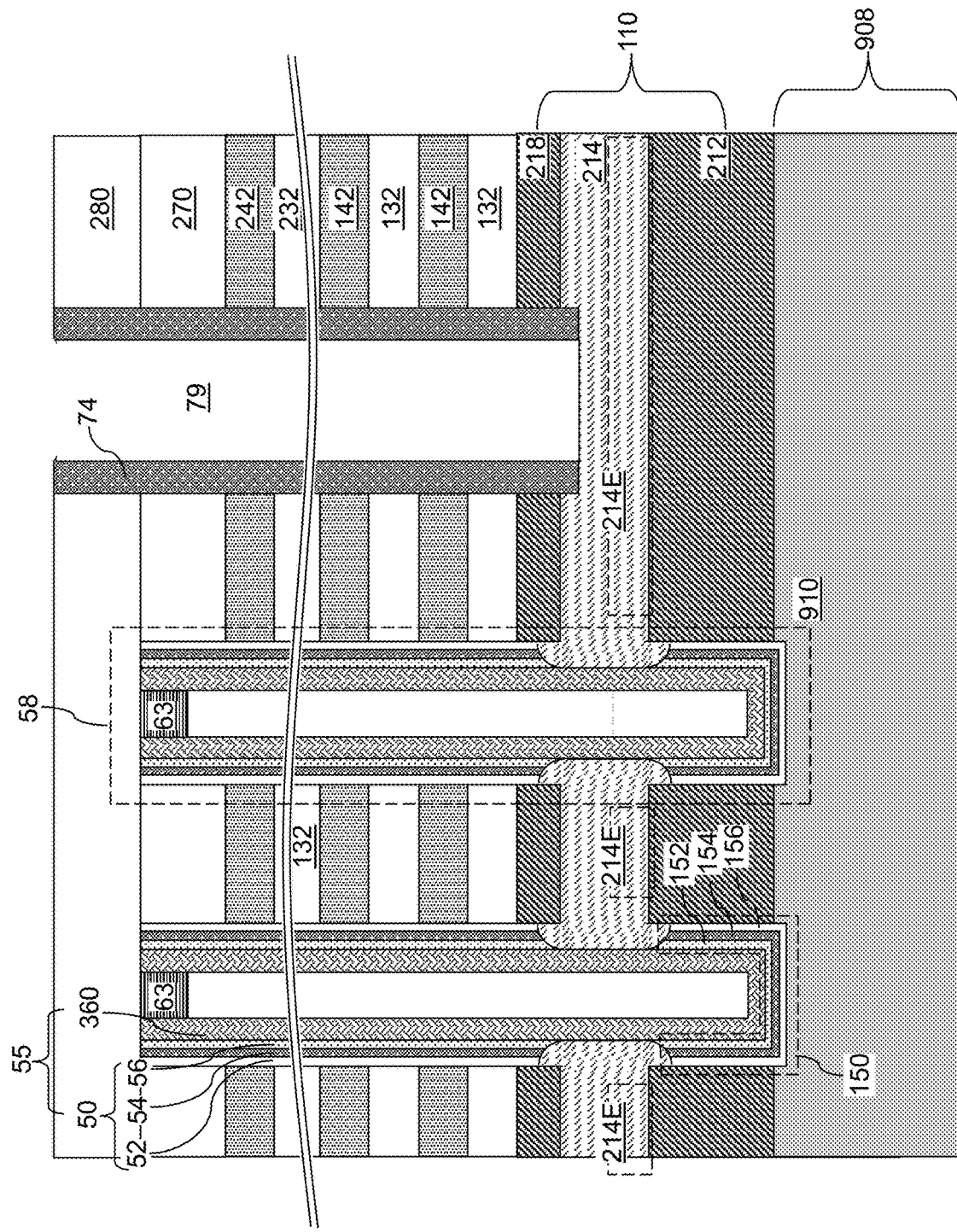

Referring to FIG. 62D, a semiconductor material may be deposited on the physically exposed semiconductor surfaces around the source cavity 109. The physically exposed semiconductor surfaces include bottom portions of outer sidewalls of the vertical semiconductor channels 360 and a horizontal surface of the at least one source-level semiconductor layer (such as a bottom surface of the upper semiconductor layer 218 and/or a top surface of the lower semiconductor layer 212). For example, the physically exposed semiconductor surfaces may include the bottom portions of outer sidewalls of the vertical semiconductor channels 360, the physically exposed surfaces of the lower semiconductor layer 212, and the bottom surface of the upper semiconductor layer 218.

In one embodiment, the semiconductor material may be deposited on the physically exposed semiconductor surfaces around the source cavity 109 by a selective semiconductor deposition process. A semiconductor precursor gas, an etchant, and an optional dopant gas may be flowed concurrently into a process chamber including the third exemplary structure during the selective semiconductor deposition process. For example, the semiconductor precursor gas may include silane, disilane, or dichlorosilane, the etchant gas may include gaseous hydrogen chloride, and the dopant gas may include a hydride of p-type dopant atom such as diborane. In this case, the selective semiconductor deposition process grows a p-type semiconductor material from physically exposed semiconductor surfaces around the source cavity 109. The deposited doped semiconductor material forms a source contact layer 214, which may contact sidewalls of the vertical semiconductor channels 360. The atomic concentration of the p-type dopants in the deposited semiconductor material may be in a range from $1.0 \times 10^{14}/cm^3$ to $2.0 \times 10^{21}/cm^3$, such as from $1.0 \times 10^{18}/cm^3$ to $5.0 \times 10^{20}/cm^3$.

In one embodiment, the source contact layer 214 may be deposited as an intrinsic semiconductor material, into which boron atoms and carbon atoms diffuse from the lower semiconductor layer 212 and from the upper semiconductor layer 218. In another embodiment, the source contact layer 214 may be deposited within in-situ p-type doping such that boron atoms are incorporated the source contact layer 214 from a dopant gas, and carbon atoms and additional boron atoms diffuse from the lower semiconductor layer 212 and from the upper semiconductor layer 218 into the source contact layer 214. In yet another embodiment, the source contact layer 214 may be deposited within in-situ carbon doping and with in-situ p-type doping such that carbon atoms and boron atoms are incorporated the source contact layer 214 from dopant gases, and carbon atoms and additional boron atoms diffuse from the lower semiconductor layer 212 and from the upper semiconductor layer 218 into the source contact layer 214. Thus, the source contact layer 214 can consist include semiconductor atoms, in-situ doped and/or diffused boron atoms, and in-situ doped and/or diffused carbon.

Alternatively, at least one non-selective doped semiconductor material deposition process may be used to form the source contact layer 214 in lieu of a selective semiconductor material deposition process. The material composition of the source contact layer 214 can be the same in this case as in the case of a selective semiconductor material deposition process. Optionally, one or more etch back processes may be used in combination with a plurality of selective or non-selective deposition processes to provide a seamless and/or voidless source contact layer 214. The source contact layer 214 is formed in the source cavity 109 directly on the sidewalls of the vertical semiconductor channels 360.

The duration of the selective semiconductor deposition process may be selected such that the source cavity 109 is filled with the source contact layer 214 except volumes that overlie the recess trenches in the lower semiconductor layer 212. The source contact layer 214 may contact bottom end portions of outer sidewalls of the backside trench spacers 74. In one embodiment, the source contact layer 214 may be formed by selectively depositing a p-type from semiconductor surfaces around the source cavity 109. In one embodiment, the doped semiconductor material may include doped polysilicon.

Thus, the sacrificial source-level material layer 104 may be replaced with the source contact layer 214. The layer stack including the lower semiconductor layer 212, the source contact layer 214, and the upper semiconductor layer 218 constitutes source-level material layers 110. In one embodiment, the vertical semiconductor channels 360 comprise a p-type semiconductor material, and the source contact layer 214 can be formed by conformal deposition of a third p-type semiconductor material within the source cavity 109. In this case, the atomic concentration of boron atoms in the source contact layer 214 may be less than the atomic concentration of boron atoms in the upper semiconductor layer 218 and/or in the lower semiconductor layer 212 to reduce boron diffusion into the vertical semiconductor channels 60.

In one embodiment, each of the vertical semiconductor channels 360 comprises a p-type semiconductor material having a lower atomic concentration of boron atoms than the source contact layer 214. In one embodiment, the source contact layer 214 comprises an epitaxial semiconductor material portion 214E that is epitaxially aligned to the single crystalline semiconductor material of the substrate 908 through the doped single crystalline semiconductor material of the lower semiconductor layer 212. The source contact layer 214 can further comprise polycrystalline semiconductor material portion formed by growth of a polycrystalline semiconductor material from surfaces of the upper semiconductor layer 218 and the vertical semiconductor channels 360. Carbon atoms can diffuse outward from the lower semiconductor layer 212 and the upper semiconductor layer 218 into the source contact layer 214 during growth of the source contact layer 214 and into the vertical semiconductor channels 360. Each of the vertical semiconductor channels 60 can have a bottom portion having a graded carbon dopant concentration that decreases with a distance from the source contact layer 214. Generally, the sacrificial source-level material layer 104 is replaced with the source contact layer 214 comprising a boron-doped semiconductor material. If desired, an anneal may be performed to diffuse boron into the materials at the bottom of the backside trench 79 to form dense boron doped polysilicon region or regions.

Figure 62E:
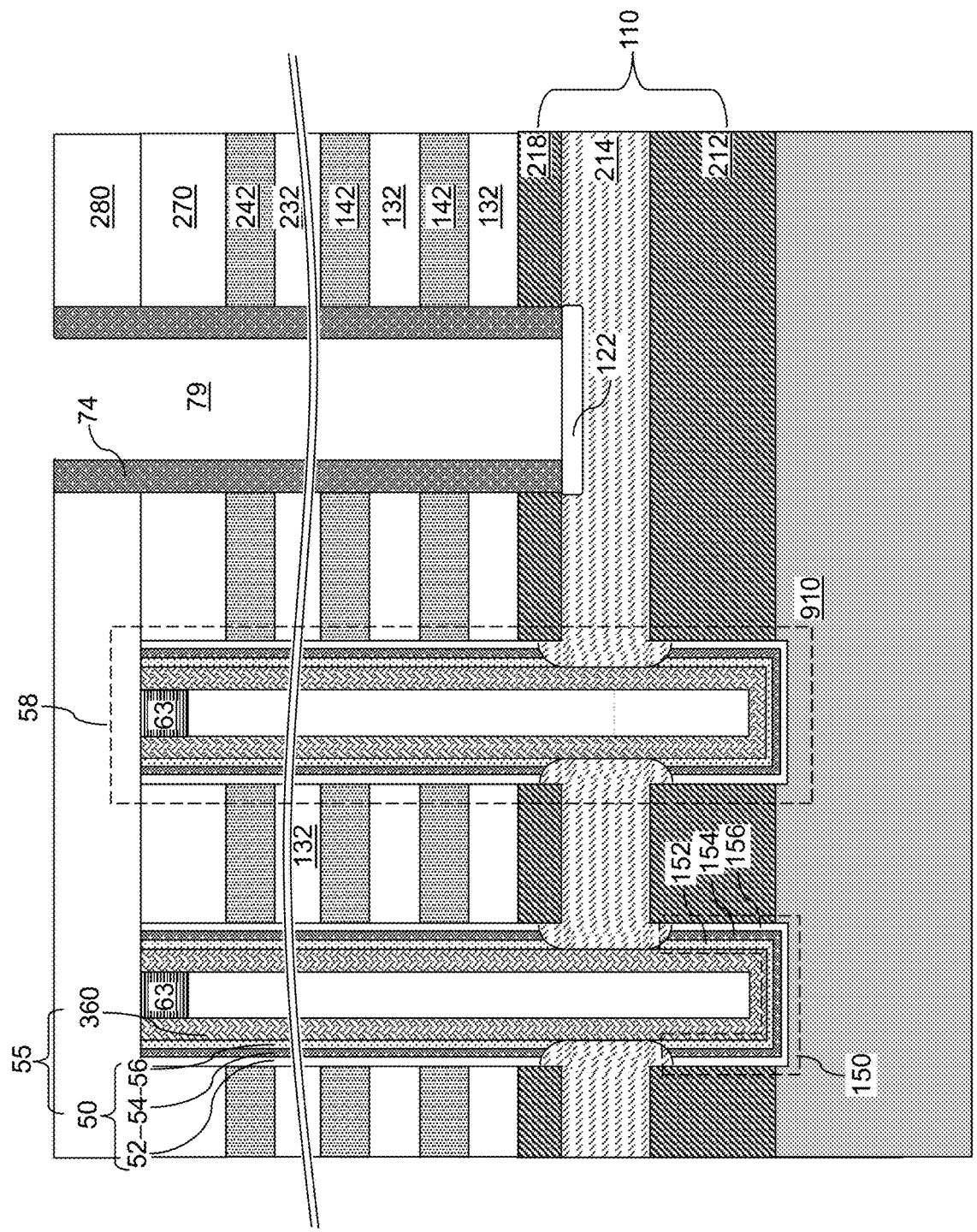

Referring to FIG. 62E, an optional semiconductor oxide liner 122 can be formed at the bottom of each backside trench 79, for example, by thermal oxidation of the semiconductor materials of physically exposed surface portions of the source contact layer 214. Each semiconductor oxide liner 122 can have a thickness in a range from 3 nm to 30 nm, although lesser and greater thicknesses can also be employed. Alternatively, the liner 122 may be omitted if dense boron doped polysilicon regions are formed in a prior step.

Figure 63:
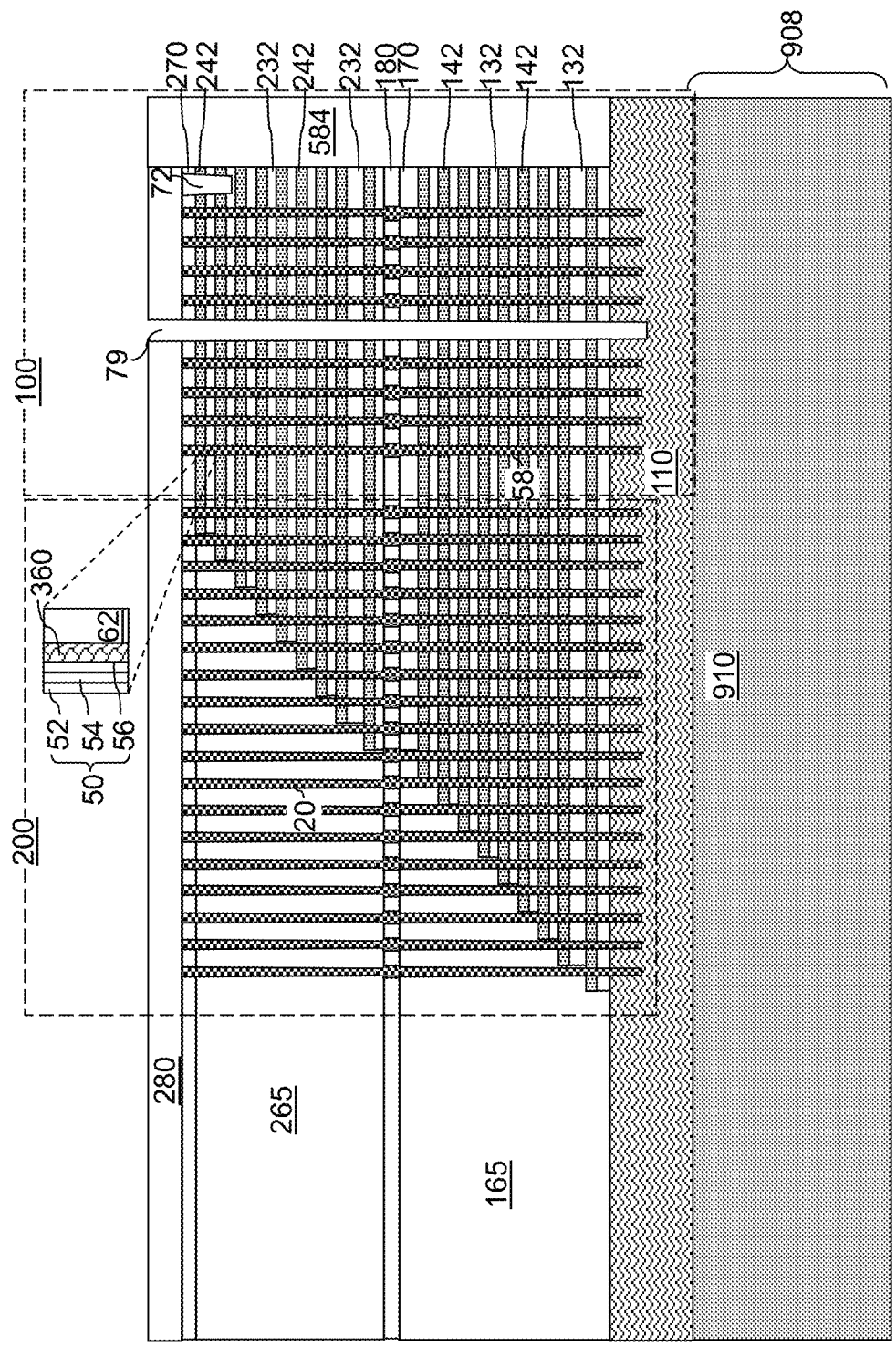

Referring to FIG. 63, the backside trench spacers 74 may be removed selective to the insulating layers (132, 232), the first and second insulating cap layers (170, 270), the first contact level dielectric layer 280, and the semiconductor oxide liners 122 using an isotropic etch process. For example, if the backside trench spacers 74 include silicon nitride, a wet etch process using hot phosphoric acid may be performed to remove the backside trench spacers 74. In one embodiment, the isotropic etch process that removes the backside trench spacers 74 may be combined with a subsequent isotropic etch process that etches the sacrificial material layers (142, 242) selective to the insulating layers (132, 232), the first and second insulating cap layers (170, 270), the first contact level dielectric layer 280, and the semiconductor oxide liners 122.

Figure 64:
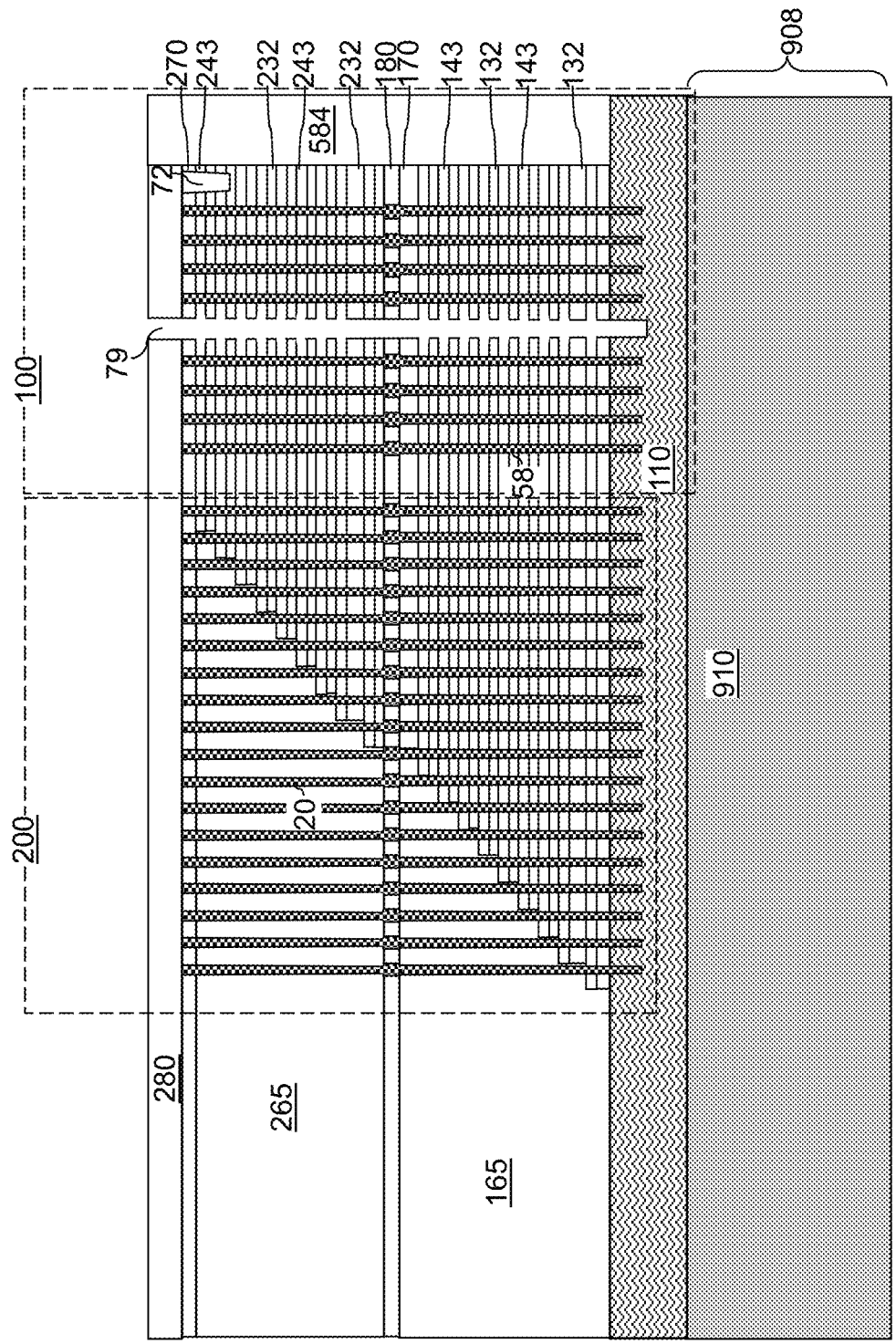

Referring to FIG. 64, the sacrificial material layers (142, 242) are may be removed selective to the insulating layers (132, 232), the first and second insulating cap layers (170, 270), the first contact level dielectric layer 280, and the source contact layer 214, the dielectric semiconductor oxide plates 122, and the annular dielectric semiconductor oxide spacers 124. For example, an etchant that selectively etches the materials of the sacrificial material layers (142, 242) with respect to the materials of the insulating layers (132, 232), the first and second insulating cap layers (170, 270), the retro-stepped dielectric material portions (165, 265), and the material of the outermost layer of the memory films 50 may be introduced into the backside trenches 79, for example, using an isotropic etch process. For example, the sacrificial material layers (142, 242) may include silicon nitride, the materials of the insulating layers (132, 232), the first and second insulating cap layers (170, 270), the retro-stepped dielectric material portions (165, 265), and the outermost layer of the memory films 50 may include silicon oxide materials.

The isotropic etch process may be a wet etch process using a wet etch solution, or may be a gas phase (dry) etch process in which the etchant is introduced in a vapor phase into the backside trench 79. For example, if the sacrificial material layers (142, 242) include silicon nitride, the etch process may be a wet etch process in which the third exemplary structure is immersed within a wet etch tank including phosphoric acid, which etches silicon nitride selective to silicon oxide, silicon, and various other materials used in the art.

Backside recesses (143, 243) are formed in volumes from which the sacrificial material layers (142, 242) are removed. The backside recesses (143, 243) include first backside recesses 143 that are formed in volumes from which the first sacrificial material layers 142 are removed and second backside recesses 243 that are formed in volumes from which the second sacrificial material layers 242 are removed. Each of the backside recesses (143, 243) may be a laterally extending cavity having a lateral dimension that is greater than the vertical extent of the cavity. In other words, the lateral dimension of each of the backside recesses (143, 243) may be greater than the height of the respective backside recess (143, 243). A plurality of backside recesses (143, 243) may be formed in the volumes from which the material of the sacrificial material layers (142, 242) is removed. Each of the backside recesses (143, 243) may extend substantially parallel to the top surface of the substrate semiconductor layer 9. A backside recess (143, 243) may be vertically bounded by a top surface of an underlying insulating layer (132, 232) and a bottom surface of an overlying insulating layer (132, 232). In one embodiment, each of the backside recesses (143, 243) may have a uniform height throughout.

Figure 65A:
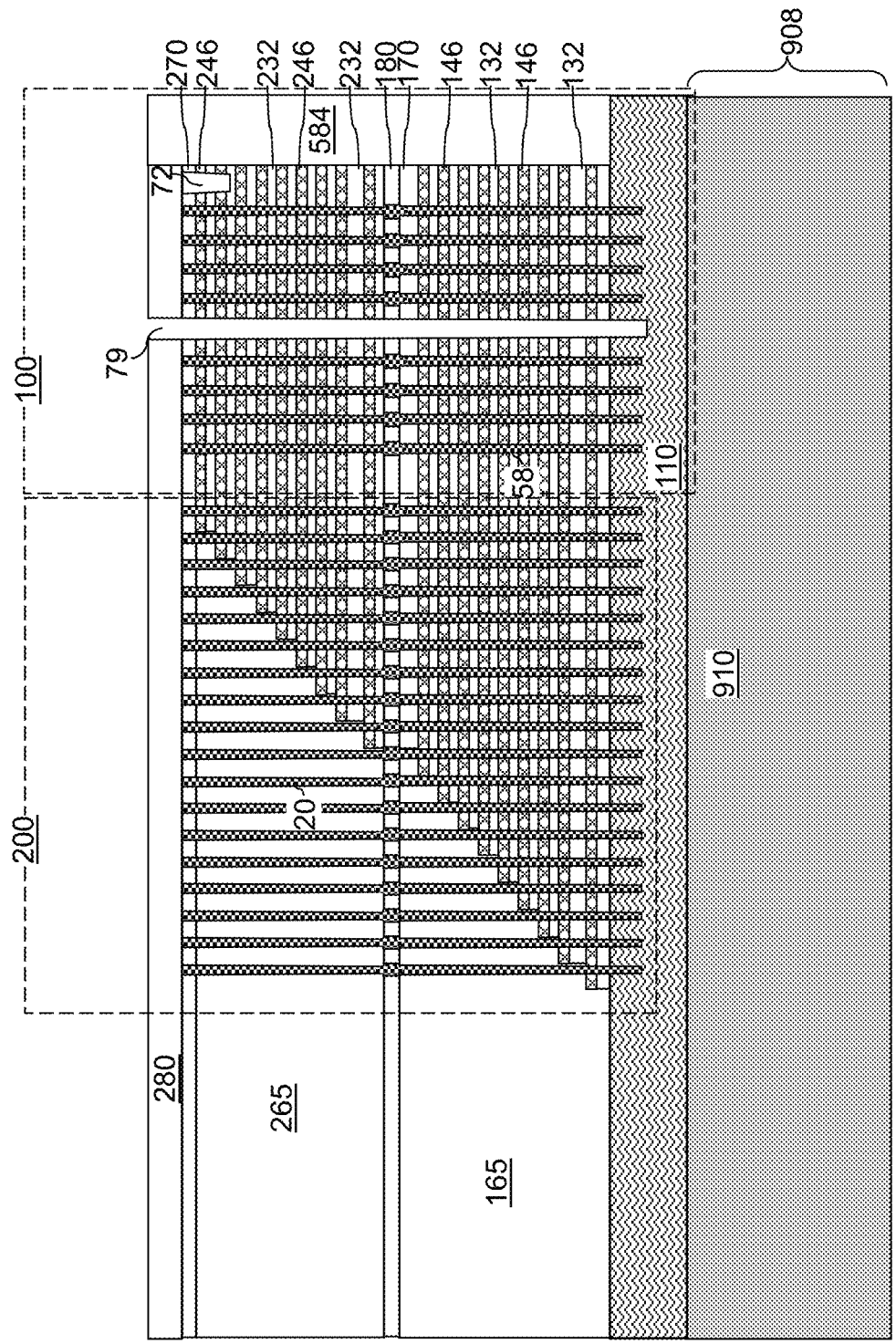
Figure 65B:
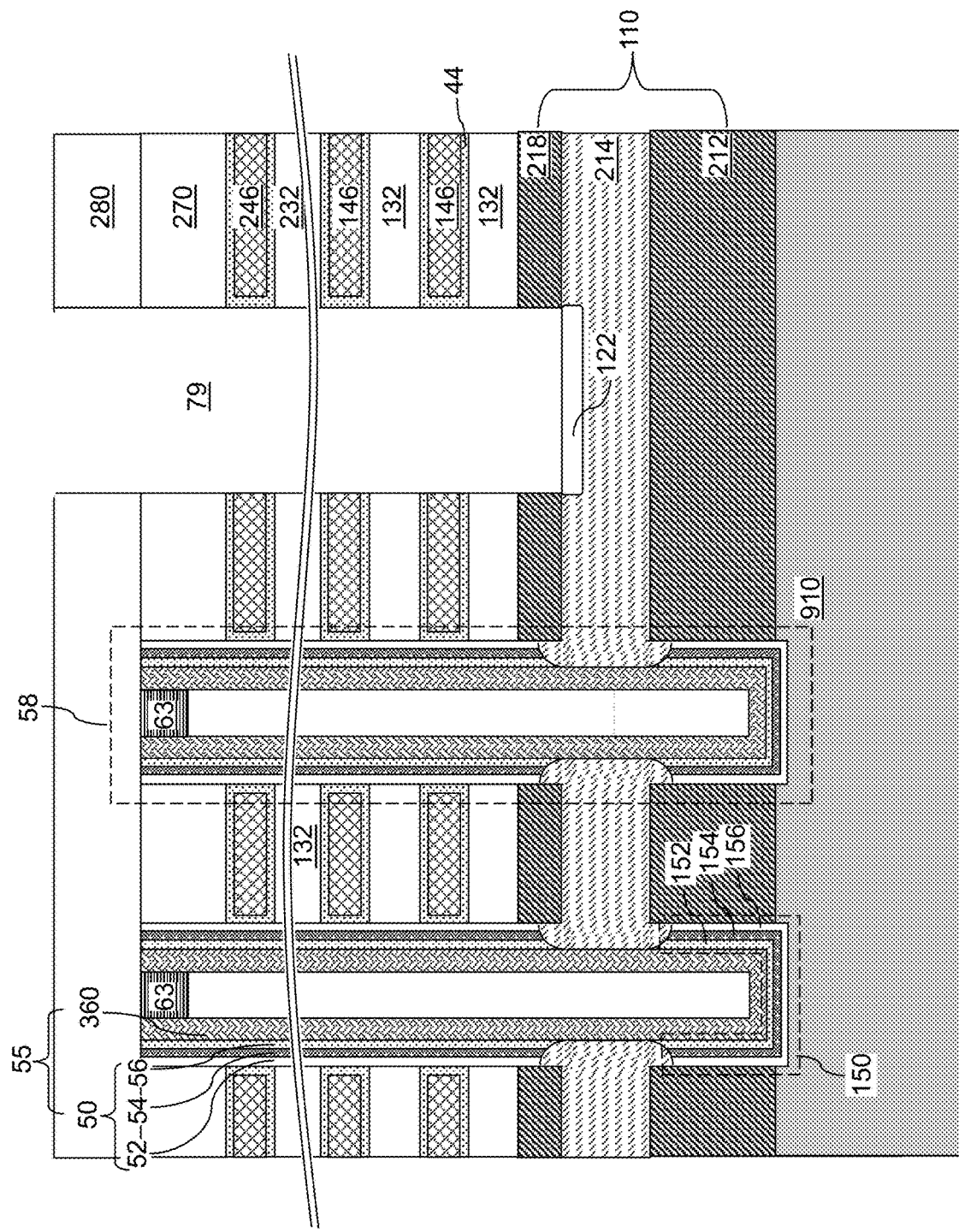

Referring to FIGS. 65A and 65B, a backside blocking dielectric layer 44 may be optionally deposited in the backside recesses (143, 243) and the backside trenches 79 and over the first contact level dielectric layer 280. The backside blocking dielectric layer 44 includes a dielectric material such as a dielectric metal oxide, silicon oxide, or a combination thereof. For example, the backside blocking dielectric layer 44 may include aluminum oxide. The backside blocking dielectric layer 44 may be formed by a conformal deposition process such as atomic layer deposition or chemical vapor deposition. The thickness of the backside blocking dielectric layer 44 may be in a range from 1 nm to 20 nm, such as from 2 nm to 10 nm, although lesser and greater thicknesses may also be used.

At least one conductive material may be deposited in the plurality of backside recesses (143, 243), on the sidewalls of the backside trenches 79, and over the first contact level dielectric layer 280. The at least one conductive material may be deposited by a conformal deposition method, which may be, for example, chemical vapor deposition (CVD), atomic layer deposition (ALD), electroless plating, electroplating, or a combination thereof. The at least one conductive material may include an elemental metal, an intermetallic alloy of at least two elemental metals, a conductive nitride of at least one elemental metal, a conductive metal oxide, a conductive doped semiconductor material, a conductive metal-semiconductor alloy such as a metal silicide, alloys thereof, and combinations or stacks thereof.

In one embodiment, the at least one conductive material may include at least one metallic material, i.e., an electrically conductive material that includes at least one metallic element. Non-limiting exemplary metallic materials that may be deposited in the backside recesses (143, 243) include tungsten, tungsten nitride, titanium, titanium nitride, tantalum, tantalum nitride, cobalt, and ruthenium. For example, the at least one conductive material may include a conductive metallic nitride liner that includes a conductive metallic nitride material such as TiN, TaN, WN, or a combination thereof, and a conductive fill material such as W, Co, Ru, Mo, Cu, or combinations thereof. In one embodiment, the at least one conductive material for filling the backside recesses (143, 243) may be a combination of titanium nitride layer and a tungsten fill material.

Electrically conductive layers (146, 246) may be formed in the backside recesses (143, 243) by deposition of the at least one conductive material. A plurality of first electrically conductive layers 146 may be formed in the plurality of first backside recesses 143, a plurality of second electrically conductive layers 246 may be formed in the plurality of second backside recesses 243, and a continuous metallic material layer (not shown) may be formed on the sidewalls of each backside trench 79 and over the first contact level dielectric layer 280. Each of the first electrically conductive layers 146 and the second electrically conductive layers 246 may include a respective conductive metallic nitride liner and a respective conductive fill material. Thus, the first and second sacrificial material layers (142, 242) may be replaced with the first and second electrically conductive layers (146, 246), respectively. Specifically, each first sacrificial material layer 142 may be replaced with an optional portion of the backside blocking dielectric layer and a first electrically conductive layer 146, and each second sacrificial material layer 242 may be replaced with an optional portion of the backside blocking dielectric layer and a second electrically conductive layer 246. A backside cavity is present in the portion of each backside trench 79 that is not filled with the continuous metallic material layer.

Residual conductive material may be removed from inside the backside trenches 79. Specifically, the deposited metallic material of the continuous metallic material layer may be etched back from the sidewalls of each backside trench 79 and from above the first contact level dielectric layer 280 and from within the backside trenches 79, for example, by an anisotropic etch process and/or an isotropic etch process. Each remaining portion of the deposited metallic material in the first backside recesses constitutes a first electrically conductive layer 146. Each remaining portion of the deposited metallic material in the second backside recesses constitutes a second electrically conductive layer 246. Sidewalls of the first electrically conductive material layers 146 and the second electrically conductive layers may be physically exposed to a respective backside trench 79.

Each electrically conductive layer (146, 246) may be a conductive sheet including openings therein. A first subset of the openings through each electrically conductive layer (146, 246) may be filled with memory opening fill structures 58. A second subset of the openings through each electrically conductive layer (146, 246) may be filled with the support pillar structures 20. Each electrically conductive layer (146, 246) may have a lesser area than any underlying electrically conductive layer (146, 246) because of the first and second stepped surfaces. Each electrically conductive layer (146, 246) may have a greater area than any overlying electrically conductive layer (146, 246) because of the first and second stepped surfaces.

In some embodiment, drain-select-level isolation structures 72 may be provided at topmost levels of the second electrically conductive layers 246. A subset of the second electrically conductive layers 246 located at the levels of the drain-select-level isolation structures 72 constitutes drain select gate electrodes. A subset of the electrically conductive layer (146, 246) located underneath the drain select gate electrodes may function as combinations of a control gate and a word line located at the same level. The control gate electrodes within each electrically conductive layer (146, 246) are the control gate electrodes for a vertical memory device including the memory stack structure 55.

Each of the memory stack structures 55 comprises a vertical stack of memory elements located at each level of the electrically conductive layers (146, 246). A subset of the electrically conductive layers (146, 246) may comprise word lines for the memory elements. The semiconductor devices in the underlying peripheral device region 700 may comprise word line switch devices configured to control a bias voltage to respective word lines. The memory-level assembly is located over the substrate semiconductor layer 9. The memory-level assembly includes at least one alternating stack (132, 146, 232, 246) and memory stack structures 55 vertically extending through the at least one alternating stack (132, 146, 232, 246).

Referring to FIGS. 66A-66D, a dielectric material layer may be conformally deposited in the backside trenches 79 and over the first contact level dielectric layer 280 by a conformal deposition process. The dielectric material layer may include, for example, silicon oxide. The thickness of the dielectric material can be in a range from 10 nm to 50 nm, although lesser and greater thicknesses can also be employed. An anisotropic etch process can be performed to remove horizontal portions of the dielectric material layer. Horizontal portions of the dielectric material layer can be removed from above the first contact level dielectric layer 280 and at the bottom of each backside trench 79. Further, a center portion of a semiconductor oxide liner 122 can be removed from underneath each backside trench 79 to physically expose a surface of the source contact layer 214. Each remaining portion of the dielectric material layer located at peripheral portion of a backside trench 79 constitutes an insulating spacer 124.

At least one conductive material can be deposited in unfilled volumes of the backside trenches 79. Excess portions of the at least one conductive material can be removed from above the top surface of the first contact level dielectric layer 280 by a planarization process. The planarization process may employ a recess etch process or a chemical mechanical planarization process. Each remaining portion of the at least one conductive material filling a backside trench 79 constitutes a backside contact via structure 76. Each backside contact via structure 76 can be formed directly on an inner sidewall of a respective insulating spacer 124 and directly on a surface of the source contact layer 214.

Referring to FIGS. 67A and 67B, a second contact level dielectric layer 282 may be formed over the first contact level dielectric layer 280. The second contact level dielectric layer 282 includes a dielectric material such as silicon oxide, and may have a thickness in a range from 100 nm to 600 nm, although lesser and greater thicknesses may also be used.

A photoresist layer (not shown) may be applied over the second contact level dielectric layer 282, and may be lithographically patterned to form various contact via openings. For example, openings for forming drain contact via structures may be formed in the memory array region 100, and openings for forming staircase region contact via structures may be formed in the staircase region 200. An anisotropic etch process is performed to transfer the pattern in the photoresist layer through the second and first contact level dielectric layers (282, 280) and underlying dielectric material portions. The drain regions 63 and the electrically conductive layers (146, 246) may be used as etch stop structures. Drain contact via cavities may be formed over each drain region 63, and staircase-region contact via cavities may be formed over each electrically conductive layer (146. 246) at the stepped surfaces underlying the first and second retro-stepped dielectric material portions (165, 265). The photoresist layer may be subsequently removed, for example, by ashing.

Drain contact via structures 88 are formed in the drain contact via cavities and on a top surface of a respective one of the drain regions 63. Staircase-region contact via structures 86 are formed in the staircase-region contact via cavities and on a top surface of a respective one of the electrically conductive layers (146, 246). The staircase-region contact via structures 86 may include drain select level contact via structures that contact a subset of the second electrically conductive layers 246 that function as drain select level gate electrodes. Further, the staircase-region contact via structures 86 may include word line contact via structures that contact electrically conductive layers (146, 246) that underlie the drain select level gate electrodes and function as word lines for the memory stack structures 55.

Referring to FIG. 68, at least one additional dielectric layer may be formed over the contact level dielectric layers (280, 282), and additional metal interconnect structures (herein referred to as upper-level metal interconnect structures) may be formed in the at least one additional dielectric layer. For example, the at least one additional dielectric layer may include a line-level dielectric layer 290 that is formed over the contact level dielectric layers (280, 282). The upper-level metal interconnect structures may include bit lines 98 contacting a respective one of the drain contact via structures 88, and interconnection line structures 96 contacting, and/or electrically connected to, at least one of the staircase-region contact via structures 86.

Referring to all drawings and according to various embodiments of the present disclosure, a three-dimensional memory device is provided, which comprises: source-level material layers 110 located over a substrate 908 and comprising a lower semiconductor layer 212, a source contact layer 214, and an upper semiconductor layer 218, wherein the lower semiconductor layer 212 comprises a first boron-doped semiconductor material, the upper semiconductor layer 218 comprises a carbon doped second boron-doped semiconductor material, and the source contact layer 214 comprises a boron-doped semiconductor material; an alternating stack of insulating layers (132, 232) and electrically conductive layers (146, 246) located over the source-level material layers 110; and memory stack structures 55 vertically extending through the alternating stack {(132, 246), (232, 246)}, the upper semiconductor layer, and the source contact layer, wherein each of the memory stack structures comprises a respective memory film and a respective vertical semiconductor channel that contacts the source contact layer.

In one embodiment, each of the first boron-doped semiconductor material and the second boron-doped semiconductor material comprise silicon layers that include carbon atoms at an atomic concentration in a range from $1.0 \times 10^{15}/cm^3$ to $1.0 \times 10^{19}/cm^3$. In one embodiment, each of the first boron-doped semiconductor material and the second boron-doped semiconductor material includes boron atoms at an atomic concentration in a range from $1.0 \times 10^{19}/cm^3$ to $2.0 \times 10^{21}/cm^3$. In one embodiment, the source contact layer 214 comprises a third boron-doped semiconductor material comprising silicon containing boron atoms at an atomic concentration in a range from $1.0 \times 10^{18}/cm^3$ to $1.0 \times 10^{21}/cm^3$.

In one embodiment, the three-dimensional memory device comprises: a backside trench 79 vertically extending through the alternating stack {(132, 146), (232, 246)}; and a backside contact via structure 76 extending through the backside trench 79 and contacting the source contact layer 214. In one embodiment, the three-dimensional memory device comprises an insulating spacer 124 located in the backside trench 79 and laterally surrounding the backside contact via structure 76 and contacting sidewalls of layers within the alternating stack {(132, 146), (232, 246)} and a surface of the source contact layer 214.

In one embodiment, each of the vertical semiconductor channels 60 comprises a p-type semiconductor material having a lesser atomic concentration of boron atoms than the source contact layer 214. In one embodiment, each of the memory films 50 contacts a respective annular surface portion of the source contact layer 214. Each annular surface of the source contact layer 214 can be a convex annular surface.

In one embodiment, each of the memory films 50 comprises a charge storage layer 54 and a tunneling dielectric layer 56 that contacts a respective one of the vertical semiconductor channels 60. In one embodiment, a bottom end of each of the vertical semiconductor channels 60 is embedded within a respective dielectric layer stack 150 that includes a dielectric material layer 154 having a same composition as, and a same thickness as, the charge storage layers 54 and another dielectric material layer 156 having a same composition as, and a same thickness as, the tunneling dielectric layers 56.

In one embodiment, the substrate 910 comprises a single crystalline semiconductor material that is free of carbon; and the first boron-doped semiconductor material comprises a doped single crystalline semiconductor material that is epitaxially aligned to the single crystalline semiconductor material of the substrate 908. In one embodiment, the source contact layer 214 comprises an epitaxial semiconductor material portion 214E that is epitaxially aligned to the single crystalline semiconductor material of the substrate 908 through the doped single crystalline semiconductor material of the lower semiconductor layer 212.

In one embodiment, each of the vertical semiconductor channels 60 has a bottom portion having a graded carbon dopant concentration that decreases with a distance from the source contact layer 214.

In one embodiment, the three-dimensional memory device comprises a monolithic three-dimensional NAND memory device, the electrically conductive strips (146, 246) comprise, or are electrically connected to, a respective word line of the monolithic three-dimensional NAND memory device, the substrate 908 comprises a silicon substrate, the monolithic three-dimensional NAND memory device comprises an array of monolithic three-dimensional NAND strings over the silicon substrate, and at least one memory cell in a first device level of the array of monolithic three-dimensional NAND strings is located over another memory cell in a second device level of the array of monolithic three-dimensional NAND strings. The silicon substrate may contain an integrated circuit comprising a driver circuit for the memory device located thereon, the electrically conductive strips (146, 246) comprise a plurality of control gate electrodes having a strip shape extending substantially parallel to the top surface of the substrate 908, the plurality of control gate electrodes comprise at least a first control gate electrode located in the first device level and a second control gate electrode located in the second device level. The array of monolithic three-dimensional NAND strings comprises a plurality of semiconductor channels 360, wherein at least one end portion of each of the plurality of semiconductor channels 360 extends substantially perpendicular to a top surface of the substrate 908, and one of the plurality of semiconductor channels including the vertical semiconductor channel 360. The array of monolithic three-dimensional NAND strings comprises a plurality of charge storage elements (comprising portions of the memory films 50), each charge storage element located adjacent to a respective one of the plurality of semiconductor channels 360.

Embodiments of the present disclosure prevent unwanted boron diffusion into vertical semiconductor channels 60 in boost read operations. In boost read operations, a source contact layer 214 has a p-type doping with a higher boron concentration than the vertical semiconductor channels 60. A negative threshold voltage setting can be employed for a source select electrode (i.e., the bottommost first electrically conductive layer 146) and drain select electrode (i.e., topmost second electrically conductive layers 246). The carbon atoms suppress diffusion of boron atoms into the vertical semiconductor channels 60, which improves the device threshold voltage and reduces unwanted channel leakage current in non-selected blocks of memory stack structures 55. The boron-doping in the source contact layer 214 permits hole injection into the vertical semiconductor channels 60.

One of the advantages of embodiments of the present disclosure is that the source contact layer 214 can be formed at least partly with epitaxial alignment with a single crystalline material in the substrate 908 to provide high charge carrier mobility. Further, there is no need to generate gate-induced drain leakage (GIDL) current in the devices of some embodiments of the present disclosure because the source contact layer 214 can generate sufficient amount of holes, which can be injected into the vertical semiconductor channels 60.

Although the foregoing refers to particular embodiments, it will be understood that the claims are not so limited. It will occur to those of ordinary skill in the art that various modifications may be made to the disclosed embodiments and that such modifications are intended to be within the scope of the claims. Compatibility is presumed among all embodiments that are not alternatives of one another. The word "comprise" or "include" contemplates all embodiments in which the word "consist essentially of" or the word "consists of" replaces the word "comprise" or "include," unless explicitly stated otherwise. Where an embodiment using a particular structure and/or configuration is illustrated in the present disclosure, it is understood that the claims may be practiced with any other compatible structures and/or configurations that are functionally equivalent provided that such substitutions are not explicitly forbidden or otherwise known to be impossible to one of ordinary skill in the art. All of the publications, patent applications and patents cited herein are incorporated herein by reference in their entirety.

What is claimed is:

1. A three-dimensional memory device, comprising:
   source-level material layers located over a substrate and comprising a lower semiconductor layer, a source contact layer, and an upper semiconductor layer, wherein the lower semiconductor layer comprises a first boron-doped semiconductor material, the upper semiconductor layer comprises a carbon doped second boron-doped semiconductor material, and the source contact layer comprises a boron-doped semiconductor material;
   an alternating stack of insulating layers and electrically conductive layers located over the source-level material layers; and
   memory stack structures vertically extending through the alternating stack, the upper semiconductor layer, and the source contact layer, wherein each of the memory stack structures comprises a respective memory film and a respective vertical semiconductor channel that contacts the source contact layer.

2. The three-dimensional memory device of claim 1, wherein each of the first boron-doped semiconductor material and the second boron-doped semiconductor material comprise silicon layers containing carbon atoms at an atomic concentration in a range from $1.0 \times 10^{15}/cm^3$ to $1.0 \times 10^{19}/cm^3$.

3. The three-dimensional memory device of claim 2, wherein each of the first boron-doped semiconductor material and the second boron-doped semiconductor material includes boron atoms at an atomic concentration in a range from $1.0 \times 10^{18}/cm^3$ to $2.0 \times 10^{21}/cm^3$.

4. The three-dimensional memory device of claim 2, wherein the source contact layer comprises a silicon layer containing boron atoms at an atomic concentration in a range from $1.0 \times 10^{17}/cm^3$ to $1.0 \times 10^{21}/cm^3$.

5. The three-dimensional memory device of claim 1, further comprising:
   a backside trench vertically extending through the alternating stack; and
   a backside contact via structure extending through the backside trench and contacting the source contact layer.

6. The three-dimensional memory device of claim 5, further comprising an insulating spacer located in the backside trench and laterally surrounding the backside contact via structure and contacting sidewalls of layers within the alternating stack and a surface of the source contact layer.

7. The three-dimensional memory device of claim 1, wherein each of the vertical semiconductor channels comprises a p-type semiconductor material having a lesser atomic concentration of boron atoms than the source contact layer.

8. The three-dimensional memory device of Clam 7, wherein each of the memory films contacts a respective annular surface portion of the source contact layer.

9. The three-dimensional memory device of claim 7, wherein each of the memory films comprises a charge storage layer and a tunneling dielectric layer that contacts a respective one of the vertical semiconductor channels.

10. The three-dimensional memory device of claim 9, wherein a bottom end of each of the vertical semiconductor channels is embedded within a respective dielectric layer stack that includes a dielectric material layer having a same composition as, and a same thickness as, the charge storage layers and another dielectric material layer having a same composition as, and a same thickness as, the tunneling dielectric layers.

11. The three-dimensional memory device of claim 1, wherein:
   the substrate comprises a single crystalline semiconductor material; and
   the first boron-doped semiconductor material comprises a doped single crystalline semiconductor material that is epitaxially aligned to the single crystalline semiconductor material of the substrate.

12. The three-dimensional memory device of claim 11, wherein the source contact layer comprises an epitaxial semiconductor material portion that is epitaxially aligned to the single crystalline semiconductor material of the substrate through the doped single crystalline semiconductor material of the lower semiconductor layer.

13. The three-dimensional memory device of claim 1, wherein each of the vertical semiconductor channels has a bottom portion having a graded carbon dopant concentration that decreases with a distance from the source contact layer.

14. A three-dimensional memory device, comprising:
   source-level material layers located over a substrate and comprising a lower semiconductor layer, a source contact layer, and an upper semiconductor layer, wherein the substrate comprises a single crystalline semiconductor material, and the lower semiconductor layer comprises a first boron-doped semiconductor material that includes a doped single crystalline semiconductor material that is epitaxially aligned to the single crystalline semiconductor material of the substrate;

an alternating stack of insulating layers and electrically conductive layers located over the source-level material layers; and memory stack structures vertically extending through the alternating stack, the upper semiconductor layer, and the source contact layer, wherein each of the memory stack structures comprises a respective memory film and a respective vertical semiconductor channel that contacts the source contact layer.

15. The three-dimensional memory device of claim 14, wherein:

the upper semiconductor layer comprises a second boron-doped semiconductor material; and and the source contact layer comprises a boron-doped semiconductor material.

16. The three-dimensional memory device of claim 14, wherein:

each of the first boron-doped semiconductor material and the second boron-doped semiconductor material comprise layers containing boron atoms at an atomic concentration in a range from $1.0 \times 10^{18}/cm^3$ to $2.0 \times 10^{21}/cm^3$ and carbon atoms at an atomic concentration in a range from $1.0 \times 10^{15}/cm^3$ to $1.0 \times 10^{19}/cm^3$; and the source contact layer comprises a silicon layer which includes boron atoms at an atomic concentration in a range from $1.0 \times 10^{18}/cm^3$ to $1.0 \times 10^{21}/cm^3$.

* * * * *